(12) United States Patent  (10) Patent No.: US 8,174,271 B2
Hirasaka et al.  (45) Date of Patent: May 8, 2012

(54) CAPACITANCE CHANGE MEASURING CIRCUIT OF CAPACITIVE SENSOR DEVICE, CAPACITIVE SENSOR MODULE, METHOD OF MEASURING CAPACITANCE CHANGE OF CAPACITIVE SENSOR DEVICE, AND ELECTRONIC DEVICE

(75) Inventors: Hisato Hirasaka, Tokyo (JP); Osamu Nakamura, Kanagawa (JP); Toshiyuki Hirose, Kanagawa (JP); Toshihiko Hirose, Kanagawa (JP); Hitoshi Ozawa, Tokyo (JP); Akira Itou, Tokyo (JP)

(73) Assignee: Sony Corporation, Tokyo (JP)

( * ) Notice: Subject to any disclaimer, the term of this patent is extended or adjusted under 35 U.S.C. 154(b) by 453 days.

(21) Appl. No.: 12/537,757

(22) Filed: Aug. 7, 2009

(65) Prior Publication Data

US 2010/0066391 A1    Mar. 18, 2010

(30) Foreign Application Priority Data

Aug. 8, 2008  (JP) ................................ 2008-206443
Sep. 22, 2008  (JP) ................................ 2008-243081

(51) Int. Cl.
  *G01R 27/26* (2006.01)
  *G06K 9/00* (2006.01)
(52) U.S. Cl. .......................... 324/672; 324/686; 382/124
(58) Field of Classification Search .................. 324/672, 324/663, 658, 649, 600, 661, 686, 519, 750.17, 324/754.28; 382/125, 124
  See application file for complete search history.

(56) References Cited

U.S. PATENT DOCUMENTS

| | | | |
|---|---|---|---|
| 7,170,488 B2 * | 1/2007 | Kehlstadt et al. | ............. 345/157 |
| 7,486,809 B2 * | 2/2009 | Hara et al. | ..................... 382/124 |
| 2005/0226478 A1 * | 10/2005 | Fujiyoshi | ..................... 382/124 |
| 2007/0139379 A1 * | 6/2007 | Kehlstadt et al. | ............. 345/163 |

FOREIGN PATENT DOCUMENTS

| | | |
|---|---|---|
| EP | 1131641 A1 | 6/2000 |
| JP | 2002-530680 | 9/2002 |

\* cited by examiner

*Primary Examiner* — Hoai-An D Nguyen
(74) *Attorney, Agent, or Firm* — Robert J. Depke; Rockey, Depke & Lyons, LLC

(57) ABSTRACT

Scanning rate in a capacitance change measuring circuit for a capacitive sensor device is enhanced. The circuit includes: an electrode drive section line-sequentially applying an input pulse signal to a plurality of columns of first electrode patterns in the capacitive sensor device; a peak hold circuit storing a peak level of a detection signal extracted from each column of second electrode patterns into a capacitive element as a corresponding potential; a current source initializing the potential in the capacitive element within one period of the input pulse signal; a comparator comparing the potential in the capacitive element with a reference value; and determination sections each determining whether or not an input operation using a human body or the like is executed, based on a timing information and a reference timing information, the timing information representing a timing when the potential held in the capacitive element crosses the reference value.

18 Claims, 88 Drawing Sheets

| PANEL POSITION | PATH | CARBON WIRING RESISTANCE (PULSE LINE) | ITO ELECTRODE CONSTANT (PULSE LINE) | ITO ELECTRODE CONSTANT (SENSE LINE) | CARBON WIRING RESISTANCE (SENSE LINE) |
|---|---|---|---|---|---|
| I | C→B | 100Ω | SMALL | SMALL | 100Ω |
| II | C→A | 100Ω | LARGE | SMALL | 1kΩ |
| III | D→B | 1kΩ | SMALL | LARGE | 100Ω |
| IV | D→A | 1kΩ | LARGE | LARGE | 1kΩ |

FIG. 18

| [X][Y] | FREQUENCY |
|---|---|
| [1][1] | 500kHz |
| [2][1] | 500kHz |
| [3][1] | 1MHz |
| [4][1] | 1MHz |
| [1][2] | 500kHz |
| [2][2] | 1MHz |
| [3][2] | 1MHz |
| [4][2] | 1MHz |
| [1][3] | 1MHz |
| [2][3] | 1MHz |
| [3][3] | 1MHz |
| [4][3] | 1.5MHz |
| [1][4] | 1MHz |
| [2][4] | 1MHz |
| [3][4] | 1.5MHz |
| [4][4] | 1.5MHz |

FIG. 24

| [X][Y] | CURRENT VALUE |
|---|---|
| [1][1] | 20 μA |
| [2][1] | 20 μA |
| [3][1] | 10 μA |
| [4][1] | 10 μA |
| [1][2] | 20 μA |
| [2][2] | 10 μA |
| [3][2] | 10 μA |
| [4][2] | 10 μA |
| [1][3] | 10 μA |
| [2][3] | 10 μA |
| [3][3] | 10 μA |
| [4][3] | 10 μA |
| [1][4] | 10 μA |
| [2][4] | 10 μA |
| [3][4] | 10 μA |
| [4][4] | 10 μA |

FIG. 28

| [X][Y] | FREQUENCY |
| --- | --- |
| [1][1] | 1MHz |
| [2][1] | 1MHz |
| [3][1] | 1MHz |
| [4][1] | 1MHz |
| [1][2] | 1MHz |
| [2][2] | 1MHz |
| [3][2] | 1MHz |
| [4][2] | 1MHz |
| [1][3] | 1MHz |
| [2][3] | 1MHz |
| [3][3] | 1MHz |
| [4][3] | 1.5MHz |
| [1][4] | 1MHz |
| [2][4] | 1MHz |
| [3][4] | 1.5MHz |
| [4][4] | 1.5MHz |

FIG. 30

| [X][Y] | REFERENCE POTENTIAL |
|---|---|
| [1][1] | Vref2 |
| [2][1] | Vref2 |
| [3][1] | Vref1 |
| [4][1] | Vref1 |
| [1][2] | Vref2 |
| [2][2] | Vref1 |
| [3][2] | Vref1 |
| [4][2] | Vref1 |
| [1][3] | Vref1 |
| [2][3] | Vref1 |
| [3][3] | Vref1 |
| [4][3] | Vref1 |
| [1][4] | Vref1 |
| [2][4] | Vref1 |
| [3][4] | Vref1 |
| [4][4] | Vref1 |

FIG. 34

| [X][Y] | FREQUENCY |
|---|---|
| [1][1] | 1MHz |
| [2][1] | 1MHz |
| [3][1] | 1MHz |
| [4][1] | 1MHz |
| [1][2] | 1MHz |
| [2][2] | 1MHz |
| [3][2] | 1MHz |
| [4][2] | 1MHz |
| [1][3] | 1MHz |
| [2][3] | 1MHz |
| [3][3] | 1MHz |
| [4][3] | 1.5MHz |
| [1][4] | 1MHz |
| [2][4] | 1MHz |
| [3][4] | 1.5MHz |
| [4][4] | 1.5MHz |

FIG. 36

| PANEL POSITION | PATH | CARBON WIRING RESISTANCE (PULSE LINE) | ITO ELECTRODE CONSTANT (PULSE LINE) | ITO ELECTRODE CONSTANT (SENSE LINE) | CARBON WIRING RESISTANCE (SENSE LINE) |
|---|---|---|---|---|---|
| MEASUREMENT POINT I | C→B | 100 Ω | SMALL | SMALL | 100 Ω |
| MEASUREMENT POINT II | C→A | 100 Ω | LARGE | SMALL | 1k Ω |
| MEASUREMENT POINT III | D→B | 1k Ω | SMALL | LARGE | 100 Ω |
| MEASUREMENT POINT IV | D→A | 1k Ω | LARGE | LARGE | 1k Ω |

FIG. 52

| [X][Y] | CURRENT VALUE |
|---|---|
| [1][1] | 60 μA |
| [2][1] | 60 μA |
| [3][1] | 20 μA |
| [4][1] | 20 μA |
| [1][2] | 60 μA |
| [2][2] | 20 μA |
| [3][2] | 20 μA |
| [4][2] | 20 μA |
| [1][3] | 20 μA |
| [2][3] | 20 μA |
| [3][3] | 20 μA |
| [4][3] | 10 μA |
| [1][4] | 20 μA |
| [2][4] | 20 μA |
| [3][4] | 10 μA |
| [4][4] | 10 μA |

FIG. 57

CAPACITANCE CHANGE MEASURING CIRCUIT OF CAPACITIVE SENSOR DEVICE, CAPACITIVE SENSOR MODULE, METHOD OF MEASURING CAPACITANCE CHANGE OF CAPACITIVE SENSOR DEVICE, AND ELECTRONIC DEVICE

The present application claims priority to Japanese Patent Application JP 2008-206443 filed in the Japanese Patent Office on Aug. 8, 2008, and Japanese Patent Application JP 2008-243081 filed in the Japan Patent Office on Sep. 22, 2008, the entire contents of which are hereby incorporated by reference.

BACKGROUND OF THE INVENTION

1. Field of the Invention

The present invention described in the specification relates to a detection technology of input operation or position input to a capacitive sensor device. Particularly, the invention proposed in the specification relates to a capacitance change measuring circuit of a capacitive sensor device, a capacitive sensor module, a method of measuring capacitance change of a capacitive sensor device, and an electronic device.

2. Description of the Related Art

In recent years, various types of position input devices exist. Examples thereof include a sensor device using a finger or an exclusive pointing device having electric characteristics equal to those of a finger. For such a sensor device, various types exist as usage. Discussion will be hereinafter made on a capacitive sensor module which includes a capacitive sensor device and a drive circuit thereof (capacitance change measuring circuit).

FIG. 1 and FIG. 2 illustrate an example of schematic structure of capacitive sensor modules. The capacitive sensor module includes a capacitive sensor device 1 and a circuit detecting the capacitance change thereof (hereinafter referred to as "capacitance change measuring circuit") 11. The sensor device 1 has a structure in which a plurality of electrode patterns 5 are wired on one face of a tabular base material 3, and a plurality of electrode patterns 7 are wired on the other face of the tabular base material 3.

For example, the electrode patterns 5 on the top face side are wired to extend in the Y-axis direction, and the electrode patterns 7 on the bottom face side are wired to extend in the X-axis direction. The surface of the electrode patterns 5 on the top face side are covered with a protective film (not illustrated). Further, at each intersection of each electrode pattern 5 and each electrode pattern 7, a minute capacitance is formed, through which the electrode patterns 5 on the top face side are electrically connected to the electrode patterns 7 on the bottom face side.

In the case of the capacitive sensor device 1 that is used as a touch panel arranged on the surface of a display device, the base material 3, the electrode patterns 5, and the electrode patterns 7 are respectively made of a material having high transmissive characteristics in order to view the display screen. For example, for the base material 3, a glass substrate or a plastic film is used. Further, for example, for the electrode patterns 5 and the electrode patterns 7, an ITO electrode is used.

The capacitance change measuring circuit 11 is structured so that a closed circuit between the capacitance change measuring circuit 11 and the capacitive sensor device 1 is formed, and change of electric characteristics generated in the closed circuit is detected, through which presence of operation and an operation position are able to be detected. The closed circuit includes an extraction wiring pattern, the electrode patterns 5, the capacitance formed in the intersection of the electrode patterns, the electrode patterns 7, an extraction wiring pattern, and the capacitance change measuring circuit 11. For details of an equivalent circuit, a description will be given later.

FIG. 3 illustrates an example of existing circuit of capacitive sensor modules. The example of existing circuit corresponds to the invention disclosed in Published Japanese Translation No. 2002-530680 (JP2002-530680A) of the PCT International Publication. The structure of the capacitive sensor device 1 illustrated in FIG. 3 illustrates capacitance components of the closed circuit as a measurement target in each processing timing. Ctp is a capacitance component statically formed in each intersection of each electrode pattern 5 and each electrode pattern 7.

Cbulk is a static capacitance component obtained by the total of a capacitance component of the electrode patterns 5 and 7, a capacitance component of the extraction wiring connecting the electrode patterns 5 and 7 to the capacitance change measuring circuit 11, a capacitance component of the base material 3, and a capacitance component of an IC pin. Cf is a dynamic capacitance component generated between a finger or a device having electric characteristics equal to those of a finger and the electrode patterns 5/7. In FIG. 3, the all capacitance components existing on the measurement path (closed circuit) are expressed by Cx.

Further, the capacitance change measuring circuit 11 illustrated in FIG. 3 includes a voltage source Vr, a capacitance Cref, three analog switches S1, S2, and S3, a comparator 13, and a counter 15. In the circuit structure, the capacitance change measuring circuit 11 sequentially executes the following operations, and determines presence of input operation.

1. First, the all analog switches S1, S2, and S3 are controlled to be on-state. By this operation, electric charges of the capacitances Cref and Cx are discharged.
2. After the electric charges of the capacitances Cref and Cx are all discharged, the all analog switches S1, S2, and S3 are controlled to be off-state.
3. After that, only the analog switch S1 is controlled to be on-state. At this time, according to Kirchhoff low, a charge Q with a size equal to that of Cref and Cx is charged.
4. Next, the all analog switches S1, S2, and S3 are controlled to be off-state. After that, only the analog switch S2 is controlled to be on-state. Thereby, only the capacitance Cx on the measurement path is discharged.
5. The foregoing operations 2 to 4 are repeatedly executed. In result, as illustrated in FIG. 4, the voltage of the capacitance Cref is gradually increased. When a voltage in point A of FIG. 3 exceeds reference potential Vref, determination output of the comparator 13 is changed. Further, through the change of determination output, the repetition operations are controlled to be stopped.
6. As described above, until the determination output of the comparator 13 is changed, a count value of the counter 15 is outputted. The count value is a measurement value of the capacitance Cx on the measurement path. The size of the capacitance Cx on the measurement path in the case where a finger exists on the measurement path is different from the size of the capacitance Cx on the measurement path in the case where a finger does not exist on the measurement path. That is, the former size is different from the latter size by the portion of Cf. Therefore, by comparing the measured count value to the count value in the case where a finger does not exist, presence of a finger is able to be determined.

SUMMARY OF THE INVENTION

In the invention described in JP2002-530680A, the time period in on-state of the analog switch S1 is momentary. In addition, operation mode in the time period in on-state is current mode. Therefore, they say that the capacitance change measuring circuit 11 described in JP2002-530680A has a high noise resistance.

On the other hand, switching control of the analog switches S1, S2, and S3 is executed with about 500 kHz cycle. Thus, until the voltage in point A reaches the reference voltage Vref, approximately 1000 times of switching operations are necessitated. That is, the capacitance change measuring circuit 11 described in JP2002-530680A has the following disadvantage. That is, though its detection precision is high, it takes time to execute detection operation, which means the capacitance change measuring circuit 11 described in JP2002-530680A is not suitable for high speed input.

For example, in the case of driving with 500 kHz, 1 pulse period is 2 μs. Therefore, measurement time necessary for one line measurement path is 2 ms (=2 μs*1000). Therefore, in the case where the number of the electrode patterns 5 is ten, time necessary for scan-inputting an input pulse signal in all lines is 20 ms.

Accordingly, a technology capable of addressing high-speed input is proposed.

[A. Capacitance Change Measuring Circuit of Capacitive Sensor Device]

For example, a capacitance change measuring circuit of a capacitive sensor device including the following devices is proposed.

(1) An electrode drive section line-sequentially applying an input pulse signal with a given period to a plurality of columns of first electrode patterns in the capacitive sensor device.

(2) A peak hold circuit storing a peak level of a detection signal, which is extracted from each of a plurality of columns of second electrode patterns crossing the first electrode patterns in other layer, into a capacitive element as a corresponding potential.

(3) A current source initializing the potential of the capacitive element within one period of the input pulse signal.

(4) A comparator comparing the potential held in the capacitive element with a reference value.

(5) A plurality of determination sections each determining whether or not an input operation using a human body or an object having electric characteristics equal to those of the human body is executed, based on a timing information and a reference timing information, the timing information representing a timing when the potential held in the capacitive element crosses the reference value.

Advantageously, the reference timing information is provided for each of measurement points corresponding to intersection positions of the first and the second electrode patterns.

Advantageously, the timing information is defined as elapsed time from edge detection timing of the input pulse signal to timing when the potential held in the capacitive element crosses the reference value, and the reference timing information is defined as the elapsed time in no operation.

Advantageously, start timing of discharge operation by the current source is determined to be on or after timing when a prospective peak level of the detection signal comes on. In this case, only peak level change is able to be measured accurately without being affected by variation of the emergence timing of the peak level.

Advantageously, a pulse frequency of the input pulse signal is set for each of operation regions based on a total propagation path length determined by combination of a first propagation path length on the first and the second electrode patterns and a second propagation path length up to each electrode pattern. Further advantageously, for a first operation region in which the total propagation path length is shorter than a predetermined value, the pulse frequency of the input pulse signal is set to a first pulse frequency F1, and for a second operation region in which the total propagation path length is longer than the predetermined value, the pulse frequency of the input pulse signal is set to a second pulse frequency F2 (>F1).

In general, the peak level of the detection signal obtained from the first operation region is high, and the peak level of the detection signal obtained from the second operation region is low. Thus, in the second operation region, time for detecting presence of input operation is relatively shorter than that in the first operation region. Therefore, by setting the pulse frequency of the input pulse signal inputted to the second operation region to the higher level, the detection rate is able to be increased.

Advantageously, in the capacitance change measuring circuit having the foregoing devices (1) to (5), a current amount of the current source is set for each of operation regions based on a total propagation path length determined by combination of a first propagation path length on the first and the second electrode patterns and a second propagation path length up to each electrode pattern.

Further advantageously, for a first operation region in which the total propagation path length is shorter than a predetermined value, the current amount is set to a first current amount I1, and for a second operation region in which the total propagation path length is longer than the predetermined value, the current amount is set to a second current amount I2 (<I1). That is, it is preferable that the current amount in the operation region in which the peak level is high be set to a higher level. As a result, it becomes possible to reduce time necessary for detection of presence of input operation.

Therefore, for a third operation region in which the total propagation path length is shorter than a predetermined value, the pulse frequency of the input pulse signal is set to a first pulse frequency F1, and for a fourth operation region in which the total propagation path length is longer than the predetermined value, the pulse frequency of the input pulse signal is set to a second pulse frequency F2 (>F1). That is, by combination with controlling the current amount, it becomes possible to further reduce time necessary for detection of presence of input operation.

Advantageously, in the capacitance change measuring circuit having the foregoing devices (1) to (5), the reference value of the comparator is set for each of operation regions based on a total propagation path length determined by combination of a first propagation path length on the first and the second electrode patterns and a second propagation path length up to each electrode pattern. In this case, compared to a case that the reference value of the comparator is fixed, the pulse frequency of the input pulse signal inputted to each operation region is able to be speeded up.

Further advantageously, for a first operation region in which the total propagation path length is longer than a predetermined value, the reference value is set to a first reference value R1, and for a second operation region in which the total propagation path length is shorter than the predetermined value, the reference value is set to a second reference value R2 (>R1).

Advantageously, the peak hold circuit in the capacitance change measuring circuit having the foregoing devices (1) to (5) retains a peak level of a positive period of the detection signal. Alternatively, the peak hold circuit retains a peak level of a negative period of the detection signal.

Advantageously, in the case where absolute values of a peak level of a positive period and a peak level of a negative period are detected, if the potential of the capacitive element is set to be able to be initialized within half a period of the input pulse signal by current drive ability of the current source, speeding up the determination operation is able to be realized without speeding up the pulse frequency of the input pulse signal.

[B. Capacitive Sensor Module]

Further, for example, a capacitive sensor module including the following devices is proposed.
(1) A capacitive sensor device having a plurality of columns of first electrode patterns, to which an input pulse signal with a given period is line-sequentially applied, and a plurality of columns of second electrode patterns crossing the first electrode patterns in other layer.
(2) A peak hold circuit storing a peak level of a detection signal, which is extracted from each of the plurality of columns of second electrode patterns, into a capacitive element as a corresponding potential.
(3) A current source initializing the potential of the capacitive element within one period of the input pulse signal.
(4) A comparator comparing the potential held in the capacitive element with a reference value.
(5) A plurality of determination sections each determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal.

[C. Method of Measuring Capacitance Change of Capacitive Sensor Device]

Further, for example, a method of measuring capacitance change of a capacitive sensor device including the following steps is proposed.
(1) Line-sequentially applying an input pulse signal with a given period to a plurality of columns of first electrode patterns in the capacitive sensor device.
(2) Storing a peak level of a detection signal, which is extracted from each of a plurality of columns of second electrode patterns crossing the first electrode patterns in other layer, into a capacitive element as a corresponding potential.
(3) Initializing the potential of the capacitive element within one period of the input pulse signal.
(4) Comparing the potential held in the capacitive element with a reference value.
(5) Determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal.

[D. Electronic Device]

Further, for example, an electronic device including the following devices is proposed.
(1) A display device.
(2) A capacitive sensor device arranged on a surface of the display device, and having a plurality of columns of first electrode patterns, to which an input pulse signal with a given period is line-sequentially applied, and a plurality of columns of second electrode patterns crossing the first electrode patterns in other layer.
(3) A peak hold circuit storing a peak level of a detection signal, which is extracted from each of the plurality of columns of second electrode patterns, into a capacitive element as a corresponding potential.
(4) A current source initializing the potential of the capacitive element within one period of the input pulse signal.
(5) A comparator comparing the potential held in the capacitive element with a reference value.
(6) A plurality of determination sections each determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal.
(7) A system control section controlling operation of a whole system.

[E. Electronic Device]

Further, for example, an electronic device including the following devices is proposed.
(1) A capacitive sensor device formed from a transparent material, and having a plurality of columns of first electrode patterns, to which an input pulse signal with a given period is line-sequentially applied, and a plurality of columns of second electrode patterns crossing the first electrode patterns in other layer.
(2) A peak hold circuit storing a peak level of a detection signal, which is extracted from each of the plurality of columns of second electrode patterns, into a capacitive element as a corresponding potential.
(3) A current source initializing the potential of the capacitive element within one period of the input pulse signal.
(4) A comparator comparing the potential held in the capacitive element with a reference value.
(5) A plurality of determination sections each determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal.
(6) A system control section controlling operation of a whole system.

In the case of the embodiments of the invention, the node resistance is high since operation is executed in current mode. In addition, retention of the peak level by the peak hold circuit and determination operation of input operation are completed within one period of the input pulse signal. Therefore, significantly high-speed scan operation is enabled compared to the existing technologies.

BRIEF DESCRIPTION OF THE DRAWINGS

FIG. 18 is a diagram illustrating schematic characteristics of the propagation paths.

FIG. 24 is a diagram illustrating an example of frequency table.

FIG. 28 is a diagram illustrating an example of current value table.

FIG. 30 is a diagram illustrating an example of frequency table.

FIG. 34 is a diagram illustrating a correspondence relation between a reference potential table and a measurement point.

FIG. 36 is a diagram illustrating an example of frequency table.

FIG. 52 is a diagram illustrating schematic characteristics of the propagation paths formed on the operation face.

FIG. 57 is a diagram illustrating an example of current value table.

DETAILED DESCRIPTION OF THE PREFERRED EMBODIMENTS

Descriptions will be given of embodiments of the invention. For the points not particularly illustrated in the figures or described in the specification, a well-known or known technology in the relevant technical field is applied thereto. Further, the embodiments hereinafter described are illustrated as an example of the invention, and the invention is not limited thereto.

[First Embodiment]
[A. Appearance structure of capacitive sensor module]

Figure 5:
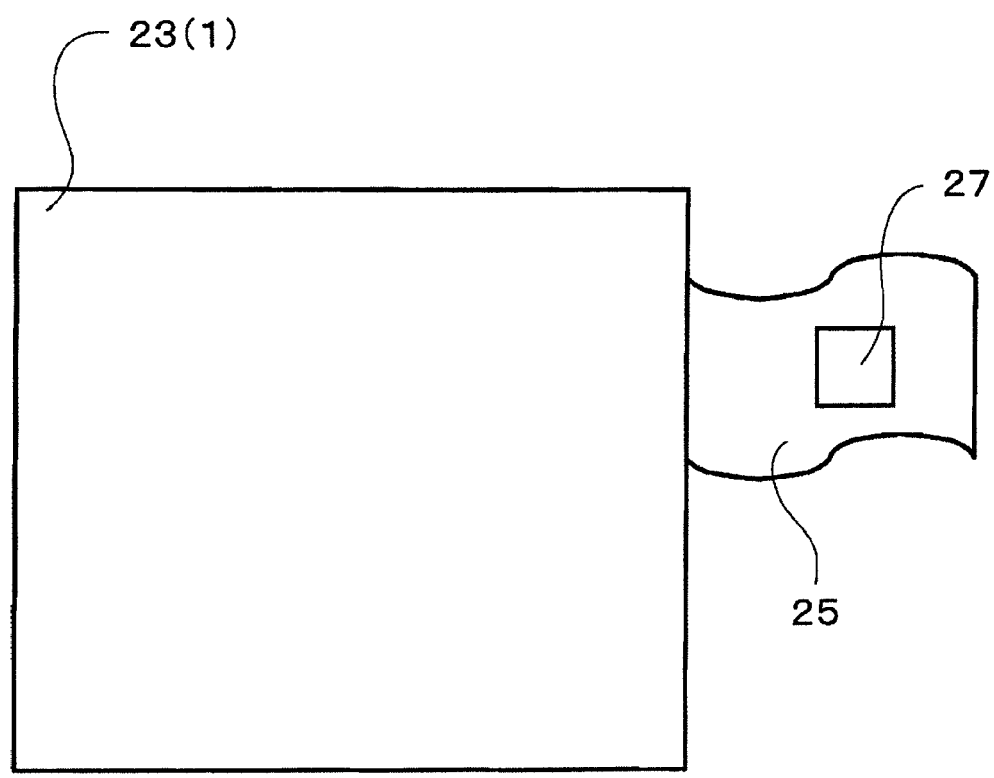
FIG. 5 is a diagram illustrating an example of appearance structure of a capacitive sensor module according to a first embodiment of the invention.

FIG. 5 illustrates an example of appearance structure of capacitive sensor modules. A capacitive sensor module 21 includes a capacitive sensor device 23, an FPC (flexible printed circuit board) 25 as an extraction wiring thereof, and a capacitance change measuring circuit 27.

The capacitive sensor device 23 has a structure in which electrode patterns are formed on the both faces of a base material in a reticular pattern as described above. Further, the capacitance change measuring circuit 27 has a circuit function in which as described above, a closed circuit is line-sequentially selected, an input pulse signal is inputted, and presence of capacitance change is measured based on the detection signal thereof.

The capacitance change measuring circuit 27 is formed as a semiconductor integrated circuit in some cases, and is formed as a circuit pattern on the FPC in some cases. Further, part of processing of the capacitance change measuring circuit 27 may be realized through application processing by a computer.

[B. First Example]
[B-1. Detection Principle]

Figure 6:
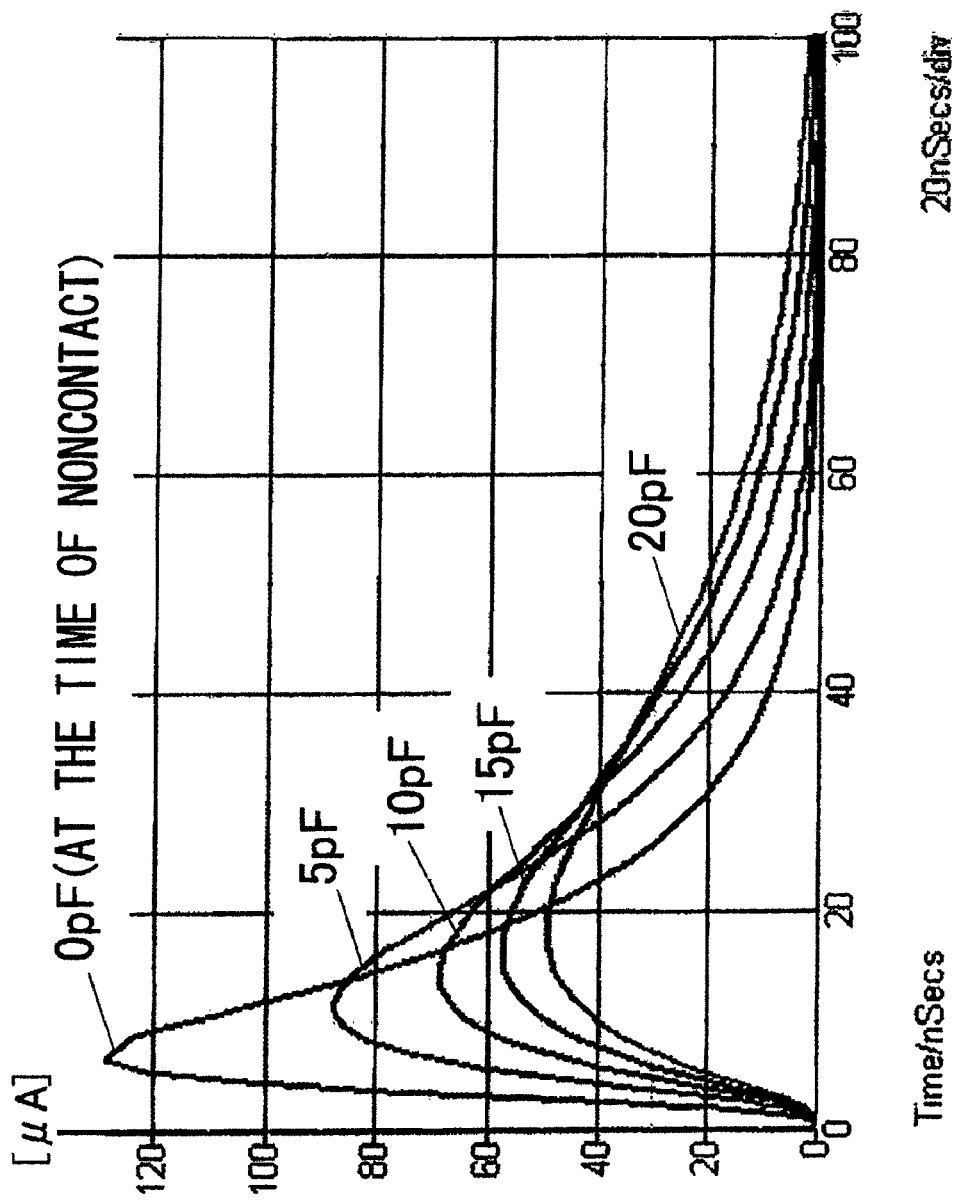
FIG. 6 is a diagram for explaining waveform change of a detection pulse.

In this example, attention is focused on a peak level of a positive waveform of a detection pulse generated at the rising timing of an input pulse signal. FIG. 6 illustrates waveform change of detection pulses focusing attention on a certain measurement point (closed circuit). In the figure, the horizontal axis indicates elapsed time from rising timing of an input pulse signal. In the figure, the vertical axis indicates a current amount corresponding to a detection signal.

As illustrated in FIG. 6, the peak level in the case where a finger does not touch the operation face is the highest. As a capacity component formed between the finger and the operation face is larger, the peak level is smaller. That is, as the contact area between the finger and the operation face is increased, the peak level is decreased. The amplitude size and the variation width size of the peak level vary according to the position on the operation face as described later. However, in any position, peak level change as illustrated in FIG. 6 is shown.

Therefore, attention is focused on the peak level change, and a technology for detecting presence of finger touch and the finger touch position by detecting the peak level change of each closed circuit as a measurement target is proposed. Further, a technology for detecting the peak level change as change of a time length necessary for lowering a potential of capacitance C structuring a peak hold circuit down to a given level is proposed. At this time, by setting a rate of a current source that determines a lowering rate to within 1 period of the input pulse signal, determination operation of input operation for one closed path is able to be completed within one period.

A description will be hereinafter given of an example of a capacitive sensor module adopting such a detection principle.

[B-2. System Configuration]

Figure 7:
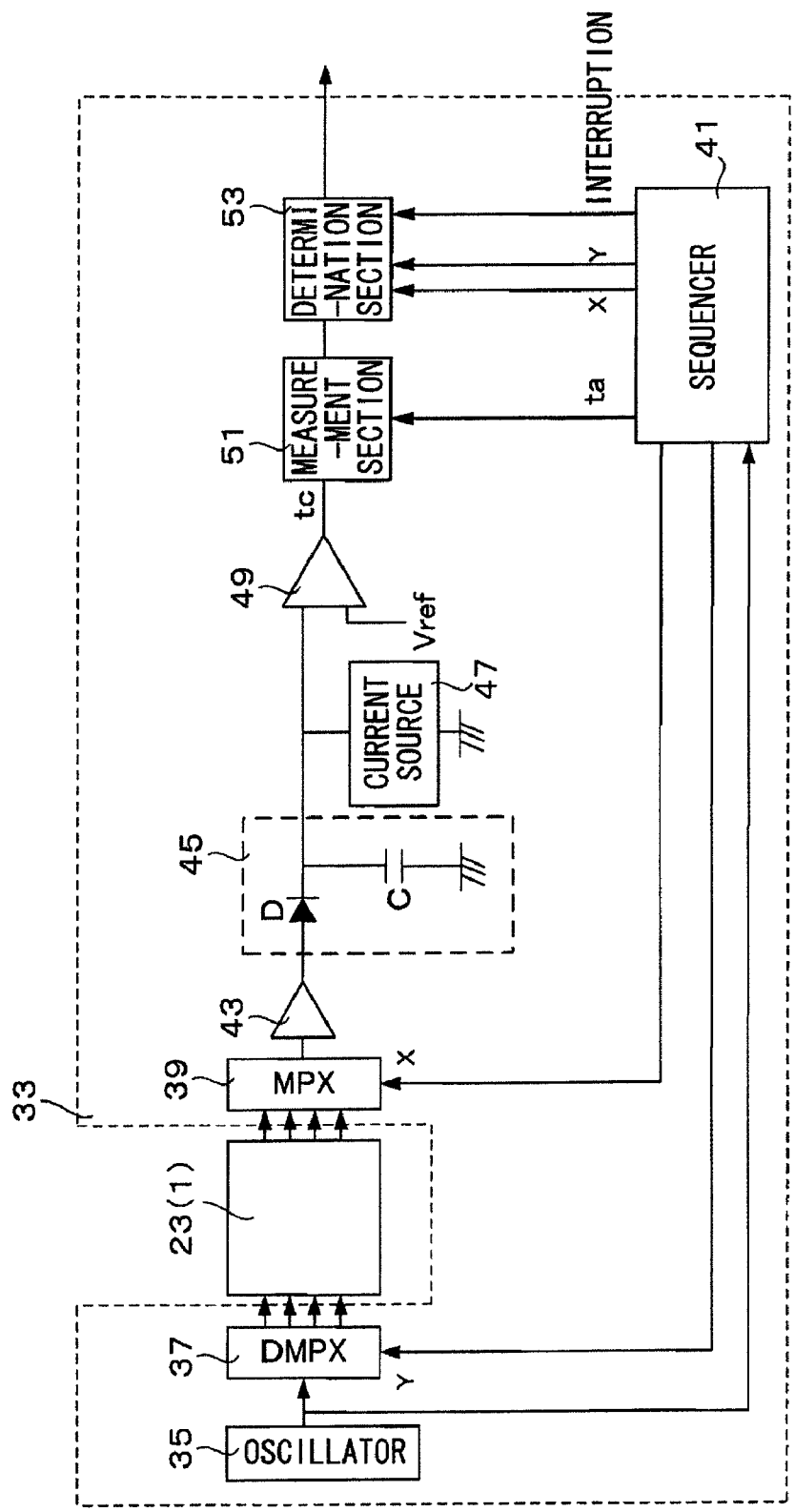
FIG. 7 is a diagram for explaining an example of system of a capacitive sensor module.

FIG. 7 illustrates an example of system configuration of a capacitive sensor module 31 according to this example. In the capacitive sensor module 31, the capacitive sensor device 23 is simply illustrated.

The capacitive sensor module 31 includes the capacitive sensor device 23 and a capacitance change measuring circuit 33.

The capacitance change measuring circuit 33 includes an oscillator 35, a de-multiplexer 37, a multiplexer 39, a sequencer 41, a current input voltage output type amplifier 43, a peak hold circuit 45, a current source 47, a comparator 49, a measurement section 51, and a determination section 53.

The oscillator 35 is a circuit that generates an input pulse signal in the shape of a square with a previously set fixed frequency. However, the waveform of the input pulse signal is not limited to the square wave, but may be other shape such as a sine wave and a triangle wave. In this example, the oscillator 35 generates an input pulse signal with frequency of 500 kHz.

The de-multiplexer 37 is a circuit to switch a supply destination of the input pulse signal in the order directed by the sequencer 41. The supply destination of the input pulse signal is one of the plurality of electrode patterns 5.

The multiplexer 39 is a circuit to switch among the electrode patterns 7 from which a detection signal is extracted in the order directed by the sequencer 41.

The sequencer 41 is a circuit that outputs connection order to the electrode patterns 5 to which the input pulse signal is supplied and connection order to the electrode patterns 7 as an extraction source of the detection signal in sync with the input pulse signal. The sequencer 41 manages control timing based on rising edge of the input pulse signal.

The current input voltage output type amplifier 43 is a circuit to amplify the detection signal. In the current input voltage output type amplifier 43, the detection signal is converted from current style to voltage style.

The peak hold circuit 45 is a circuit to detect a peak level on the positive side of the detection signal. As illustrated in FIG. 7, the peak hold circuit 45 includes a diode D and a capacitance C. The diode D is used to extract only the positive section of the detection signal by rectification function. Further, the capacitance C is used to store a potential corresponding to the peak level of the detection signal.

The current source 47 is a constant current circuit, and is used to discharge an electric charge of the capacitance C. The size of a current value of the current source 47 is set so that determination operation is able to be finished within one period after starting application of the input pulse signal. Specifically, setting is made so that within a time period until the next input pulse signal is inputted, discharge is made so that the potential of the capacitance C as a measurement target is lowered down to reference potential Vref or less. In the specification, the discharge operation is referred to as "initialization operation".

Figure 8:
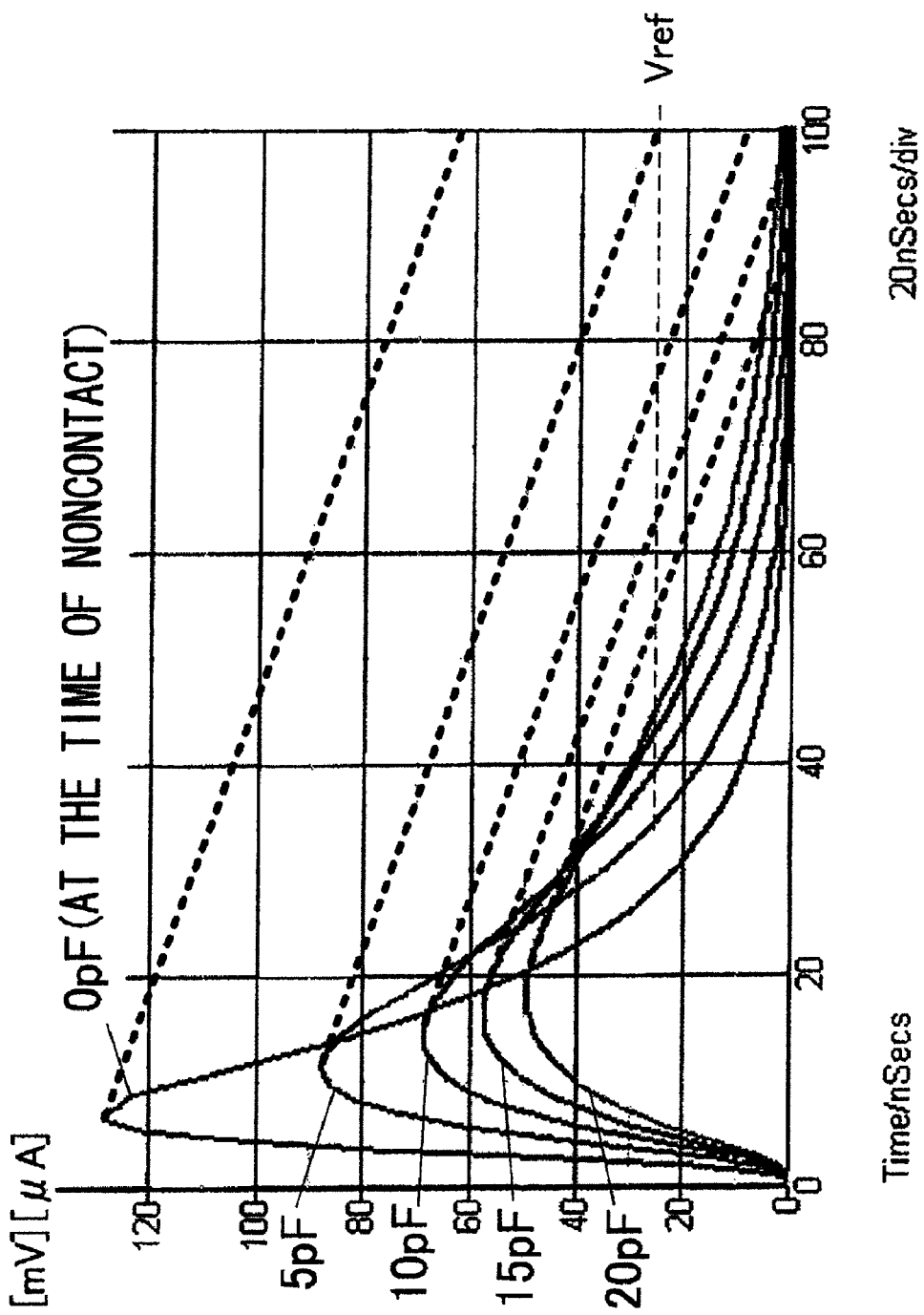
FIG. 8 is a diagram for explaining a relation between potential change due to discharge and a reference potential.

The comparator 49 is a circuit to compare the potential of the capacitance C to the reference potential Vref. Therefore, an output level of the comparator 49 is changed at the time when the potential of the capacitance C crosses the reference potential Vref. As illustrated in FIG. 8, the reference potential Vref is set to a value smaller than the prospective minimum value of peak levels. The timing when the potential of the capacitance C is lowered down to the reference potential Vref or less is hereinafter referred to as "discharge completion timing".

The measurement section 51 is a circuit to measure elapsed time T from rising timing ta of the input pulse signal to discharge completion timing tc (=tc−ta). The timing ta is given from the sequencer 41. The timing tc is given from change of the output level of the comparator 49.

Figure 9:
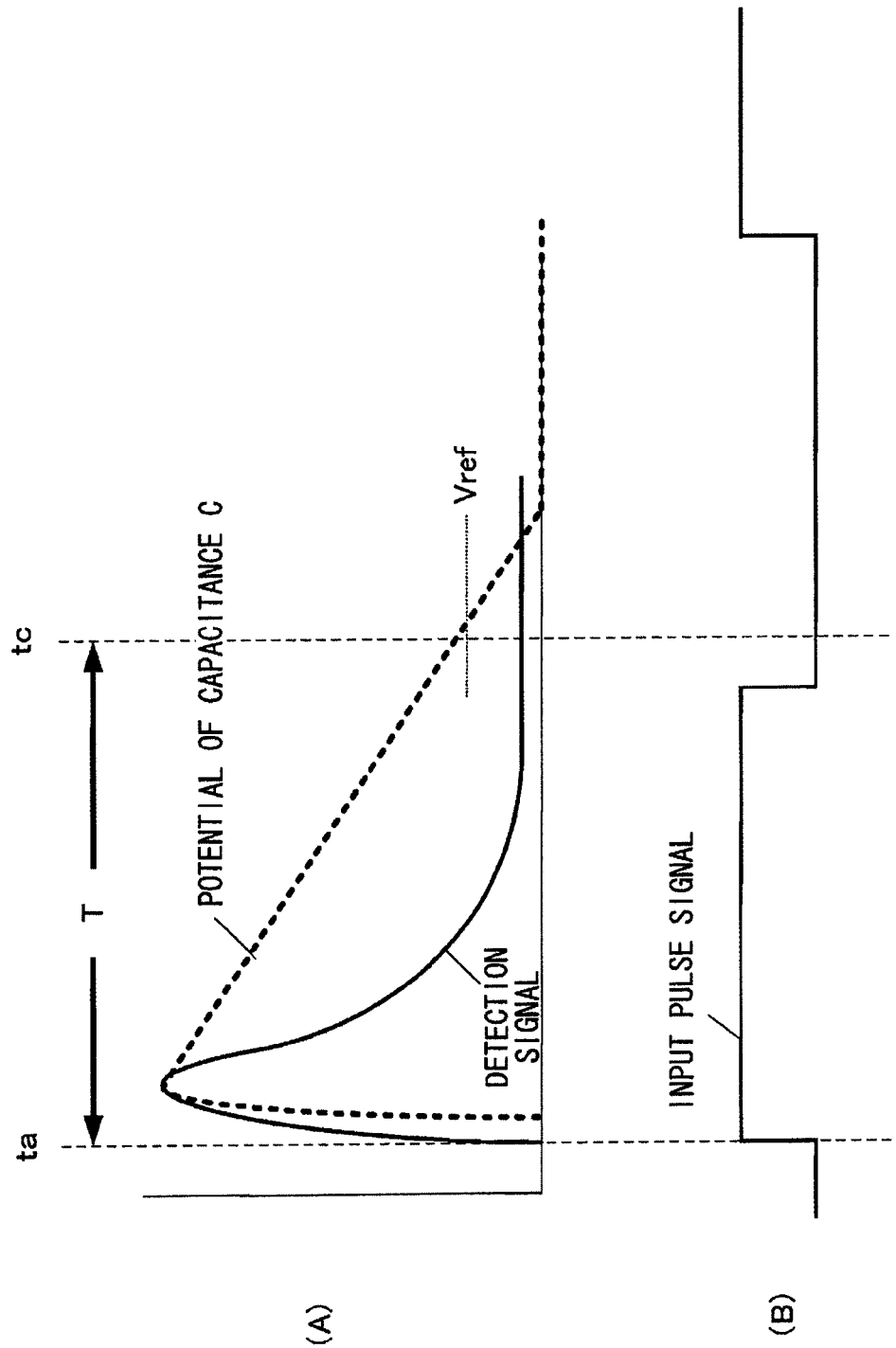
FIG. 9 is a diagram for explaining a relation between potential change due to discharge and elapsed time necessary for determination.

FIG. 9 illustrates a relation between the elapsed time T as a measurement target of the measurement section 51 and each timing. Part (A) of FIG. 9 is a diagram for explaining a relation between the detection signal and potential change of the capacitance C. Part (B) of FIG. 9 is a diagram illustrating a phase relation of the input pulse signal.

The determination section 53 is a circuit that compares the measured elapsed time T to reference elapsed time T0 (set for every measurement point), and determines that a finger touches a measurement point in the case where difference larger than a measurement error exists between the foregoing both times. As illustrated in FIG. 8, as the contact area between the operation face and a finger is increased (capacitance is increased), the elapsed time T is smaller than the reference elapsed time T0. As the reference elapsed time T0, a value previously measured in a state that a finger does not touch the operation face.

In this case, the foregoing elapsed times are compared to each other. However, the timing when the potential of the capacitance C crosses the reference potential Vref may be compared to the reference timing. It is needless to say that the reference timing is elapsed time in the case where a finger does not touch the operation face.

For reference, the measurement section 51 and the determination section 53 may be realized as program processing executed on a CPU, or as a logic circuit.

[B-3 Contents of Processing Operation]

Figure 10:
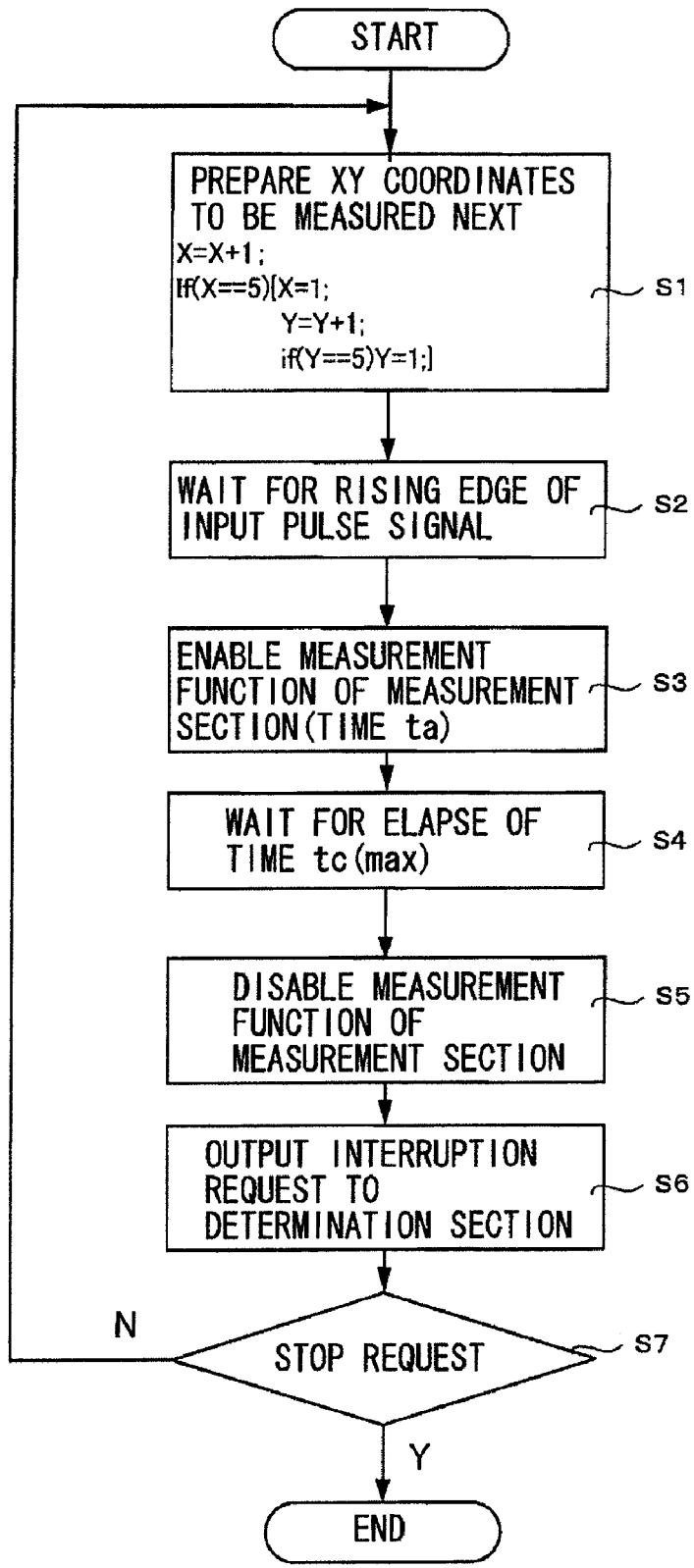
FIG. 10 is a diagram for explaining an operation example of a sequencer.

A description will be hereinafter given of processing operation of the capacitive sensor module 31 according to the operation flow of the sequencer 41 (FIG. 10). FIG. 10 illustrates a case that both the number of the electrode patterns 5 on the top face side and the number of the electrode patterns 7 on the bottom face side are four.

First, the sequencer 41 generates coordinates to designate the position on the operation face as a measurement target (S1). The sequencer 41 increases coordinate value X of the electrode patterns 5 on the top face side by only "1" for every one period of an input pulse signal. In the case of FIG. 10, if the increased coordinate value X reaches "5," the sequencer 41 returns the coordinate value X back to "1," and increases coordinate value Y of the electrode patterns on the bottom face side by only "1". If the increased coordinate value Y reaches "5," the sequencer 41 returns the coordinate value Y back to "1".

The coordinate values X and Y generated as above are given to the de-multiplexer 37, the multiplexer 39, and the determination section 53. In the case where the frequency of the input pulse signal is 500 kHz (1 period is 2 μs). determination operation of 16 coordinate points determined by the four electrode patterns 5 and the four electrode patterns 7 is able to be executed within 32 μs.

Next, the sequencer 41 waits for detection of rising edge of the input pulse signal (S2). If the edge is detected, the sequencer 41 outputs an enable signal to the measurement section 51 (S3). The output timing of the enable signal corresponds to the foregoing rising timing ta. In response to input of the enable signal, measurement function of the determination section 51 becomes effective. That is, measurement of the elapsed time T is started.

After that, the sequencer 41 waits for elapse of the timing tc (max) corresponding to the reference elapsed time T0 (S4).

If the elapse of the time tc (max) is detected, the sequencer 41 outputs a disable signal to the measurement section 51 (S5). In response to input of the disable signal, the measurement function of the determination section 51 becomes ineffective, since it is not necessary to continue measurement operation even after the possible maximum value of the elapsed time T. It is needless to say that after the measurement function becomes ineffective, the elapsed time T measured while the measurement function is effective is retained as well.

After that, the sequencer 41 outputs an interruption request to the determination section 53 (S6). The determination section 53 to which the interruption request is inputted determines whether or not a finger touches the coordinate position given from the sequencer 41 based on a result of comparison between the detected elapsed time T and the reference elapsed time T0 (set for every measurement point). For the comparison processing, the reference elapsed time T0 corresponding to the XY coordinate values of the measurement point given from the sequencer 41 is used.

After that, the sequencer 41 determines whether or not a stop request exists (S7). If the stop request is not confirmed, the sequencer 41 returns to the generation operation of the XY coordinates again to repeat the foregoing operation. If the stop request is confirmed, the sequencer 41 finishes the operation.

[B-4. Conclusion]

As described above, due to adoption of the capacitance change measuring circuit 33 according to the first example, extremely high speed determination operation is enabled compared to the existing technologies. For example, in the case where determination processing for 10 locations is executed, time of 20 ms has been necessitated in the existing technologies. On the other hand, in the case of this example, it is enough to take time of 20 μs. Thus, addressing high-speed input that has been difficult to deal in the existing technologies is enabled.

It is needless to say that the capacitance change measuring circuit 33 according to this example is able to be used for multi-location detection as well.

Further, since operation is executed in the current mode until input stage of the current input voltage output amplifier 43. Thus, high noise resistance is prospective. That is, the capacitance change measuring circuit 33 according to this example is prospective to realize practically sufficient precision with regard to detection precision as well.

[C. Second Example]

[C-1. Detection Principle]

In this example, a description will be given of a technique capable of improving measurement precision of the elapsed time T even in the case where an emergence position of a peak level is shifted according to the state of contact between the operation face and a finger.

Figure 11:
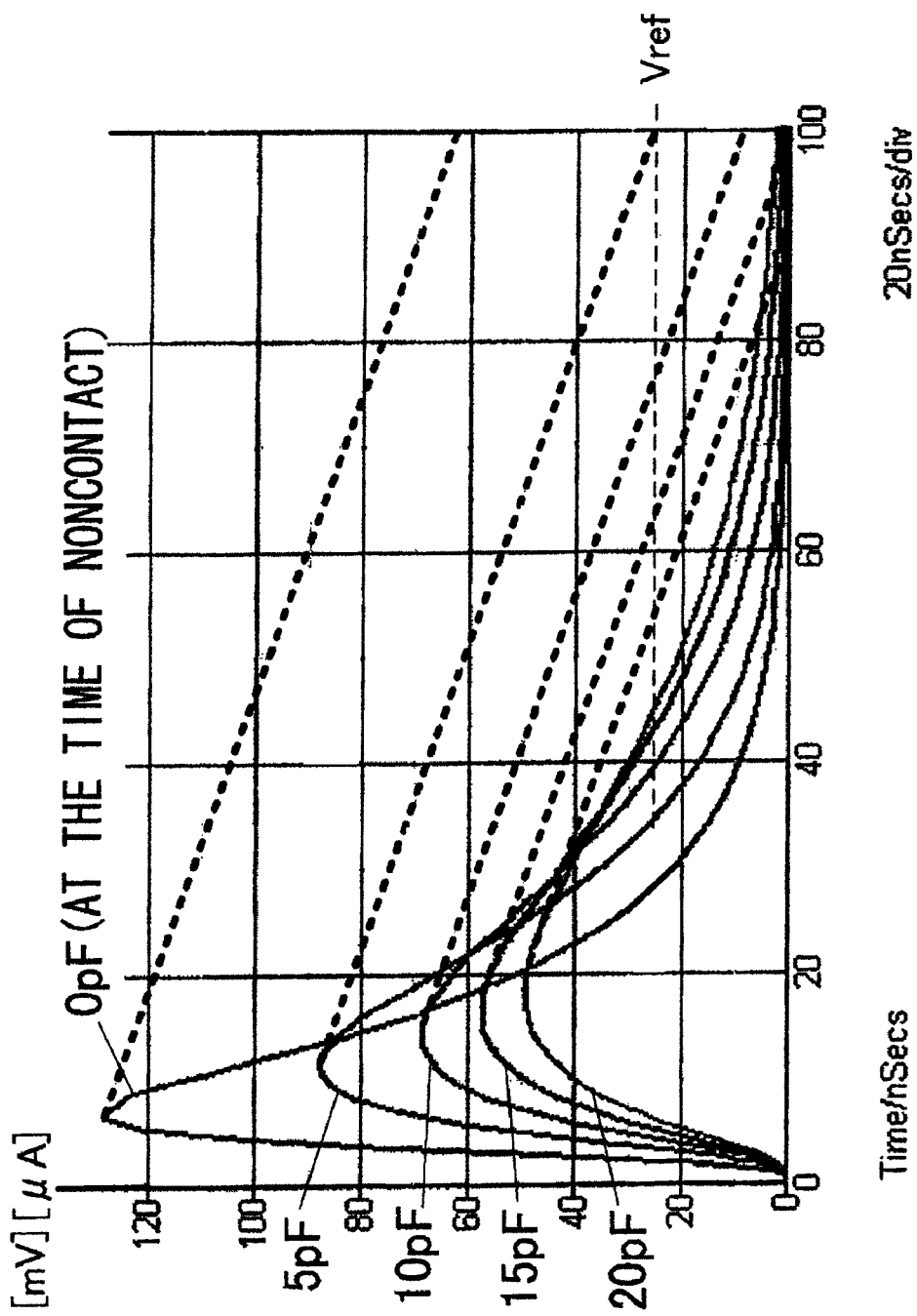
FIG. 11 is a diagram for explaining a relation between potential change due to discharge and a reference potential.

FIG. 11 illustrates a relation between detection waveforms and potential change of the capacitance C adopted in the first example. As described above, the capacitance change measuring circuit 33 according to the first example is able to execute high-speed determination operation compared to the existing technologies.

However, as illustrated in FIG. 11, the emergence position of the peak level tends to be shifted in the time axis direction according to the state of contact between the operation face and a finger. It is needless to say that if the shift amount is small, no disadvantage occurs in measurement precision. However, if time difference between the peak position in the case where a capacitance Cf is 0 pF and the peak position in the case where the capacitance Cf is 20 pF is 10 ns or more, such a shift amount size is not negligible for measuring the elapsed time T.

Further, a discharge rate of the capacitance C is demanded to be set so that an output level of the comparator 48 is not inverted before the time when an attenuation curve of a detection signal that is changed most moderately crosses the reference potential Vref. The attenuation curve of the detection signal that is changed most moderately corresponds to the case that the capacitance generated between the operation face and a finger is 20 pF. Thus, in the case of the first example, the current amount of the current source 47 is not able to be increased, and accordingly the elapsed time T becomes longer.

Figure 12:
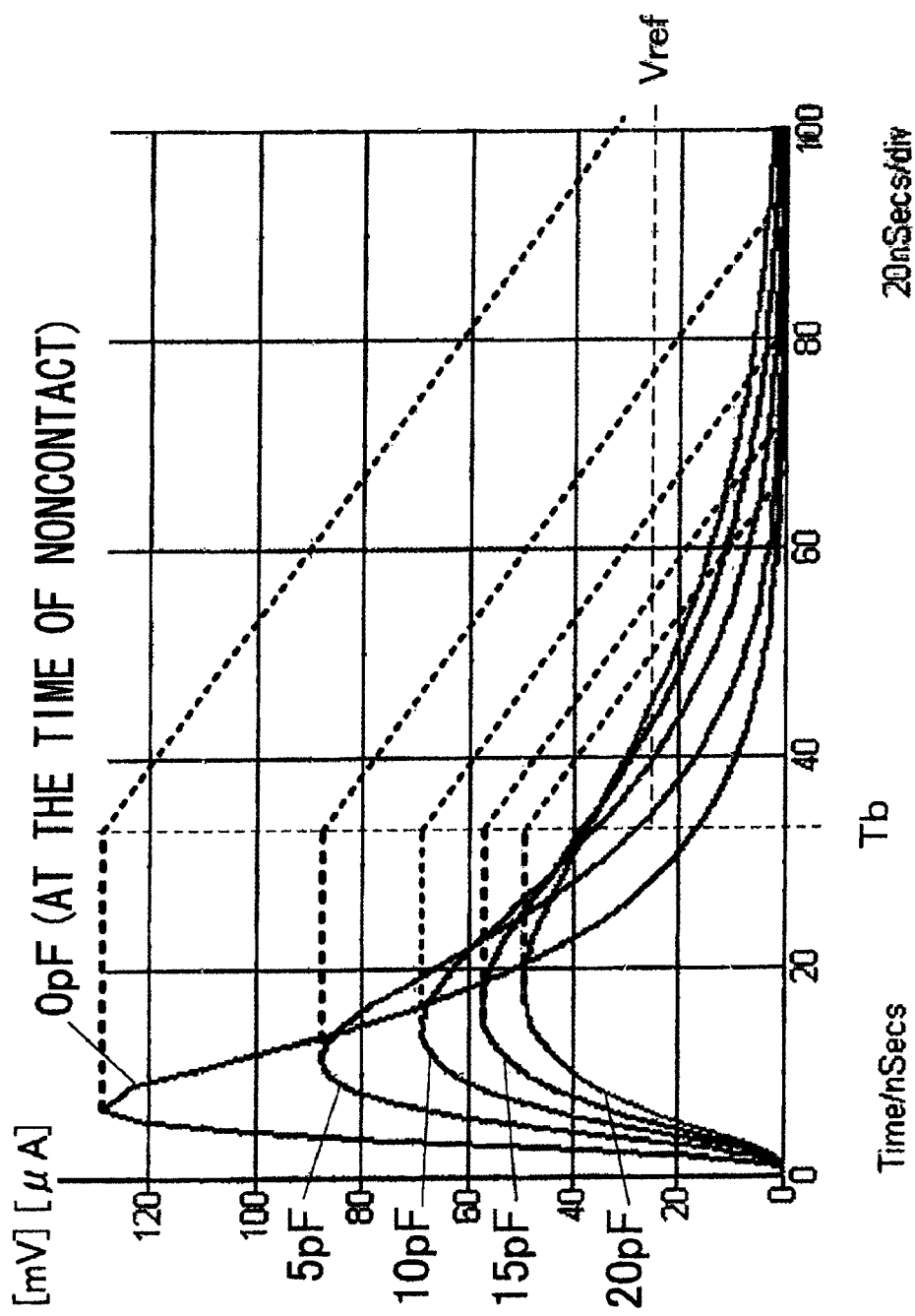
FIG. 12 is a diagram for explaining a relation between potential change due to discharge and a reference potential.

FIG. 12 illustrates discharge operation of the peak hold circuit adopted in this example. As illustrated in FIG. 12, in the case of this example, after emergence timings of all prospective peak levels, discharge operation by the current source 47 is started. In FIG. 12, discharge start timing is indicated by tb. In the case of FIG. 12, it can be seen therefrom that time after discharge start depends on only the peak level. Thus, the measurement precision of the elapsed time T is able to be improved.

Further, the discharge start time is on and after the emergence timings of the all prospective peak levels. Thus, it is able to increase the discharge rate by increasing the current amount of the current source 47. As illustrated in FIG. 12, if the discharge rate is increased, measurement time of the elapsed time T for the all peak levels is able to be decreased.

A description will be hereinafter given of the example of a capacitive sensor module adopting the detection principle.

[C-2. System Configuration]

Figure 13:
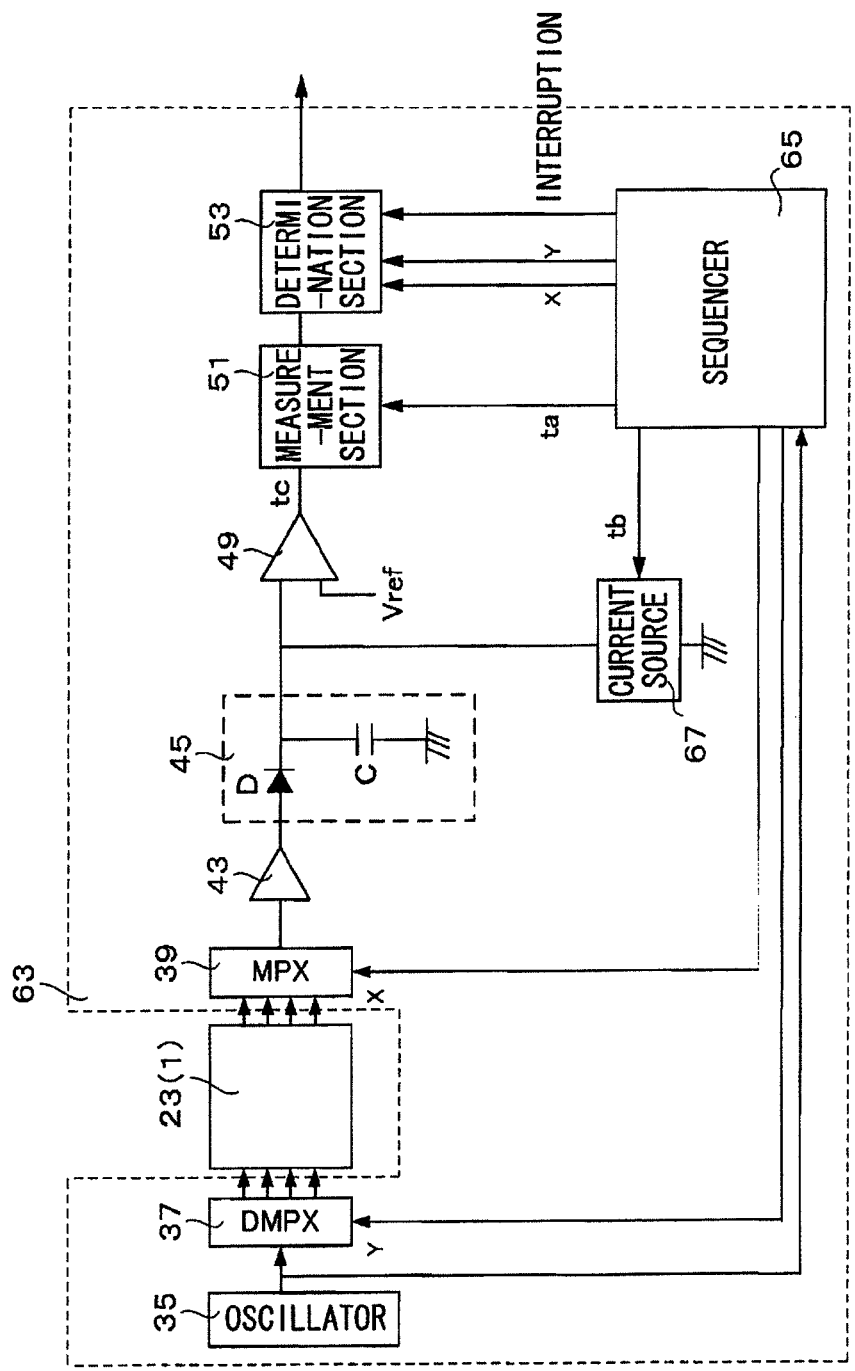
FIG. 13 is a diagram for explaining an example of system of a capacitive sensor module.

FIG. 13 illustrates an example of system configuration of a capacitive sensor module 61 according to this example. In FIG. 13, the same referential symbols are affixed to the elements corresponding to those of FIG. 7 according to the first example.

The capacitive sensor module 61 includes the capacitive sensor device 23 and a capacitance change measuring circuit 63.

The capacitance change measuring circuit 63 includes the oscillator 35, the de-multiplexer 37, the multiplexer 39, the current input voltage output type amplifier 43, the peak hold circuit 45, the comparator 49, the measurement section 51, the determination section 53, a sequencer 65, and a current source 67.

A description will be hereinafter given of the sequencer 65 and the current source 67 including change points. The sequencer 65 also has a function to output connection order to the electrode patterns 5 to which the input pulse signal is supplied and connection order to the electrode patterns 7 as an extraction source of the detection signal in sync with the input pulse signal. The sequencer 65 also has a function to manage execution start timing of discharge operation by the current source 67. Managing the timing is executed based on detection of rising timing of the input pulse signal.

The current source 67 is a constant current circuit, and is used to discharge an electric charge of the capacitance C. In the case of this example, a switch element (for example, a transistor) is arranged on the path on which a current is extracted from the condenser C. By opening or closing the switch, execution and stop of discharge operation is able to be switched. Such a function is able to be realized by a switch element to switch between supply and stop of a drive power source for the current source 67.

In the case of this example, the size of a current value of the current source 67 is set so that determination operation is finished within one period after rising edge of the input pulse signal as well. However, as described above, the current value is set to a value larger than that of the first example. Thereby, after discharge start, the potential of the capacitance C is able to be promptly lowered from the peak level down to the reference potential Vref or less.

[C-3. Contents of Processing Operation]

Figure 14:
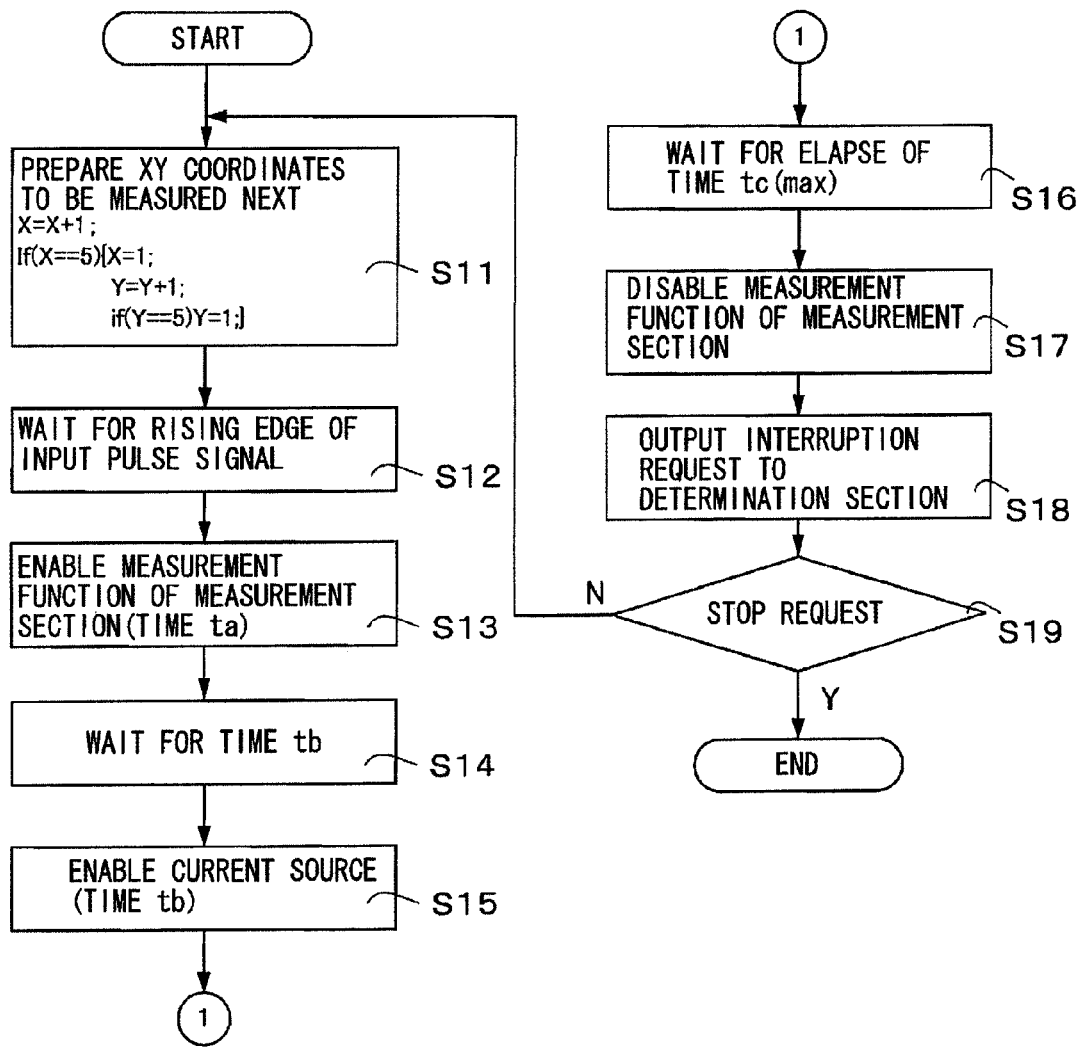
FIG. 14 is a diagram for explaining an operation example of a sequencer.

A description will be hereinafter given of processing operation of the capacitive sensor module 61 according to the operation flow of the sequencer 65 (FIG. 14). FIG. 14 also illustrates a case that both the number of the electrode patterns 5 on the top face side and the number of the electrode patterns 7 on the bottom face side are four.

First, the sequencer 65 generates coordinates to designate the position on the operation face as a measurement target (S11). The operation is the same as that of the processing S1 of the sequencer 41 described in the first example. The coordinate values X and Y generated as above are given to the de-multiplexer 37, the multiplexer 39, and the determination section 53.

Next, the sequencer 65 waits for detection of rising edge of the input pulse signal (S12). If the edge is detected, the sequencer 65 outputs an enable signal to the measurement section 51 (S13). The output timing of the enable signal corresponds to the foregoing rising timing ta. In response to input of the enable signal, measurement function of the determination section 51 becomes effective. That is, measurement of the elapsed time T is started.

After that, the sequencer 65 waits for incoming of the timing tb when discharge by he current source 67 is started (S14).

If incoming of the timing tb is detected, the sequencer 65 enables the current source 67, and starts discharge of the capacitance C (S15).

Next, the sequencer 65 waits for elapse of the time tc (max) corresponding to the reference elapsed time T0 (S16). The time tc (max) is given as timing when the potential crosses the reference potential Vref in the case where the peak level detected for the detection signal when the capacitance formed between the operation face and a finger is 0 (zero) is discharged from the timing of the time tb.

In this example, if elapse of the time tc (max) is detected, the sequencer 65 outputs a disable signal to the measurement section 51 as well (S17). In response to input of the disable signal, the measurement function of the measurement section 51 becomes ineffective, since it is not necessary to continue measurement operation after the possible maximum value of the elapsed time T. It is needless to say that after the measurement function becomes ineffective, the elapsed time T measured while the measurement function is effective is retained as well.

Figure 15:
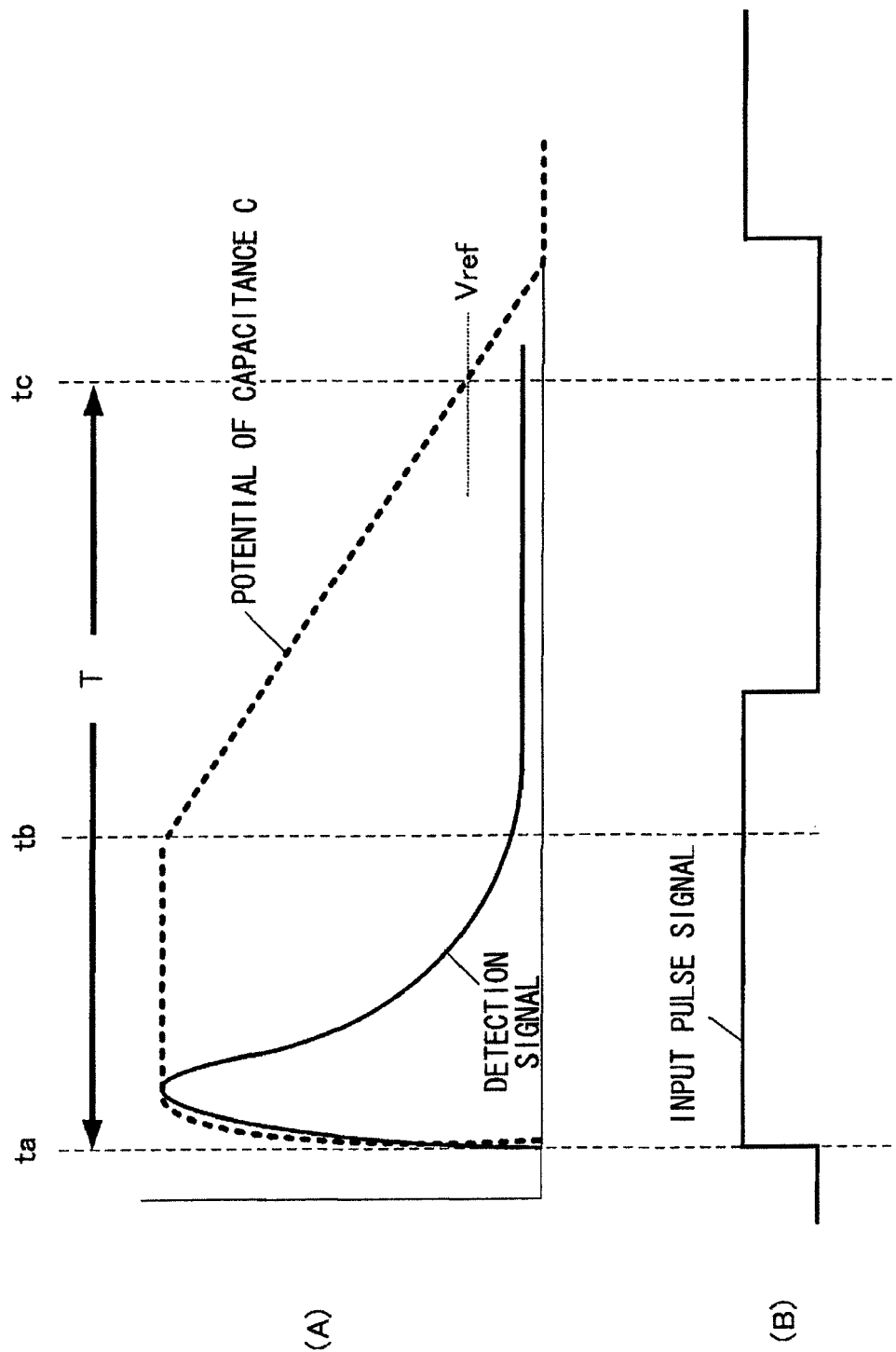
FIG. 15 is a diagram for explaining a relation between potential change due to discharge and elapsed time necessary for determination.

FIG. 15 illustrates a relation between the elapsed time T as a measurement target of the measurement section 51 and each timing. Part (A) of FIG. 15 is a diagram for explaining a relation between the detection signal and potential change of the capacitance C. Part (B) of FIG. 15 is a diagram illustrating phase relation of the input pulse signal.

After that, the sequencer 65 outputs an interruption request to the determination section 53 (S18). The determination section 53 to which the interruption request is inputted determines whether or not a finger touches the coordinate position given from the sequencer 65 based on a result of comparison between the detected elapsed time T and the reference elapsed time T0 (set for every measurement point). For the comparison processing, the reference elapsed time T0 corresponding to the measurement point given from the sequencer 65 is used.

After that, the sequencer 65 determines whether or not a stop request exists (S19). If the stop request is not confirmed, the sequencer 65 returns to the generation operation of the XY coordinates again to repeat the foregoing operation. If the stop request is confirmed, the sequencer 65 finishes the operation.

[C-4. Conclusion]

As described above, due to adoption of the capacitance change measuring circuit 63 according to the second example, extremely high-speed determination operation compared to the existing technologies is able to be realized as in the first example.

Further, in the second example, even if emergence timing of the peak level is largely shifted according to the size of a capacitance formed between the operation face and a finger, accurate measurement of the elapsed time T is enabled. Therefore, determination precision of input operation is able to be improved.

[D. Third Example]
[D-1. Detection Principle]

In this example, a description will be hereinafter given of a method of optimizing measurement operation of the elapsed time T according to the position of a measurement point on the operation face.

A description will be hereinafter given of effect of difference of measurement position on the operation face on a detection signal for the capacitive sensor device 23 having the electrode pattern structure illustrated in FIG. 16.

Figure 16:
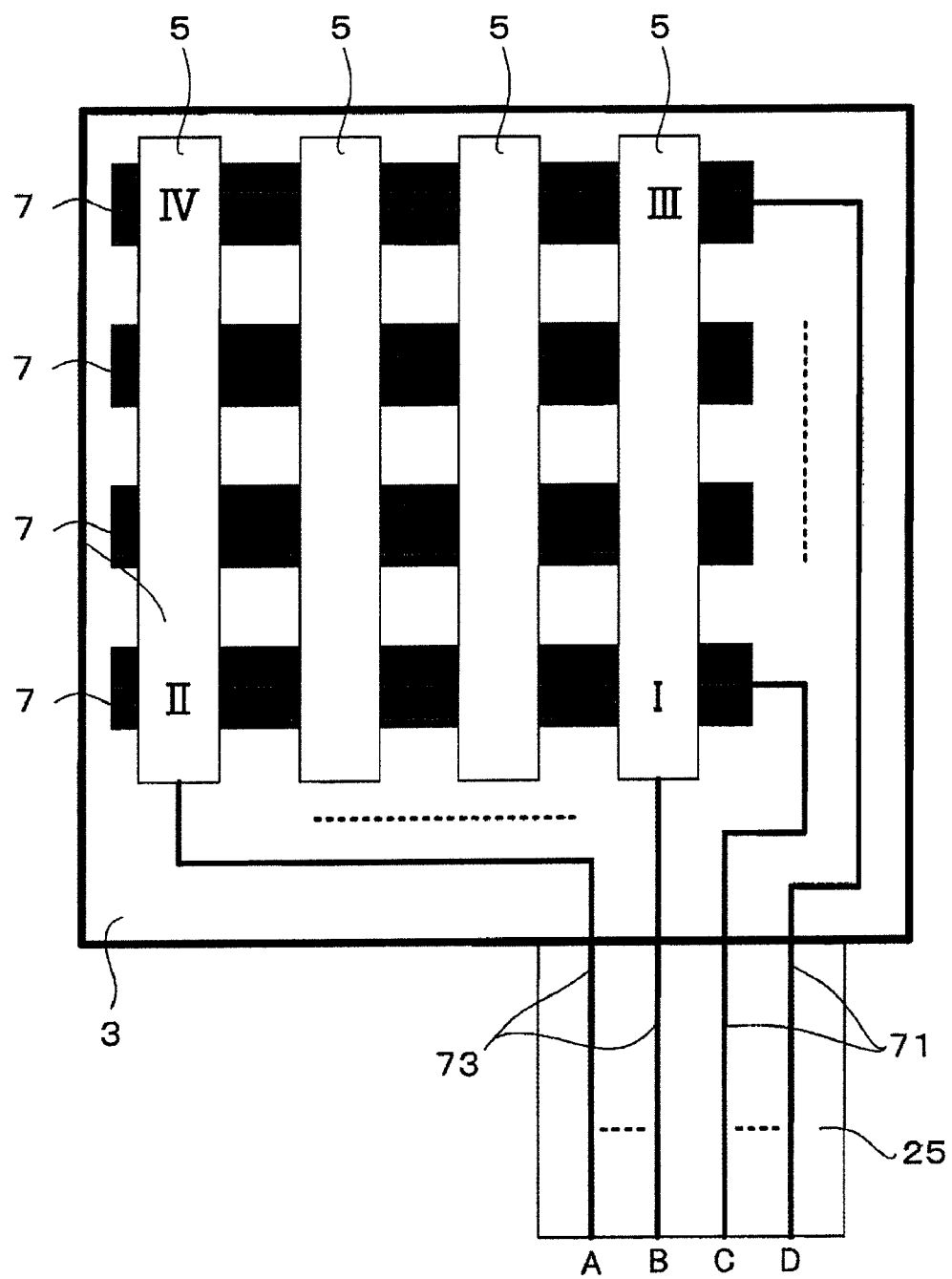
FIG. 16 is a diagram for explaining short and long propagation paths.

FIG. 16 is a planar structure of the capacitive sensor device 23 in which the four electrode patterns 5 are formed on the top face side of the base material 3 and the four electrode patterns 7 are formed on the bottom face side. Thus, 16 measurement points are formed on the operation face.

As illustrated in FIG. 16, the total of 8 electrode patterns are respectively connected to a conductive wire (for example, a carbon conductive wire) 71 of the flexible printed circuit board 25.

As illustrated in FIG. 16, a propagation path passing through each measurement point is determined by a combination of the length of the conductive wire 71 and the length of the electrode patterns 5 and 7. Thus, it can be seen that the length of the propagation path varies according to every measurement point.

A description will be given of difference of characteristics of corresponding propagation paths by allocating numbers from I to IV to each measurement point located in the four corners of the operation face.

Figure 17:
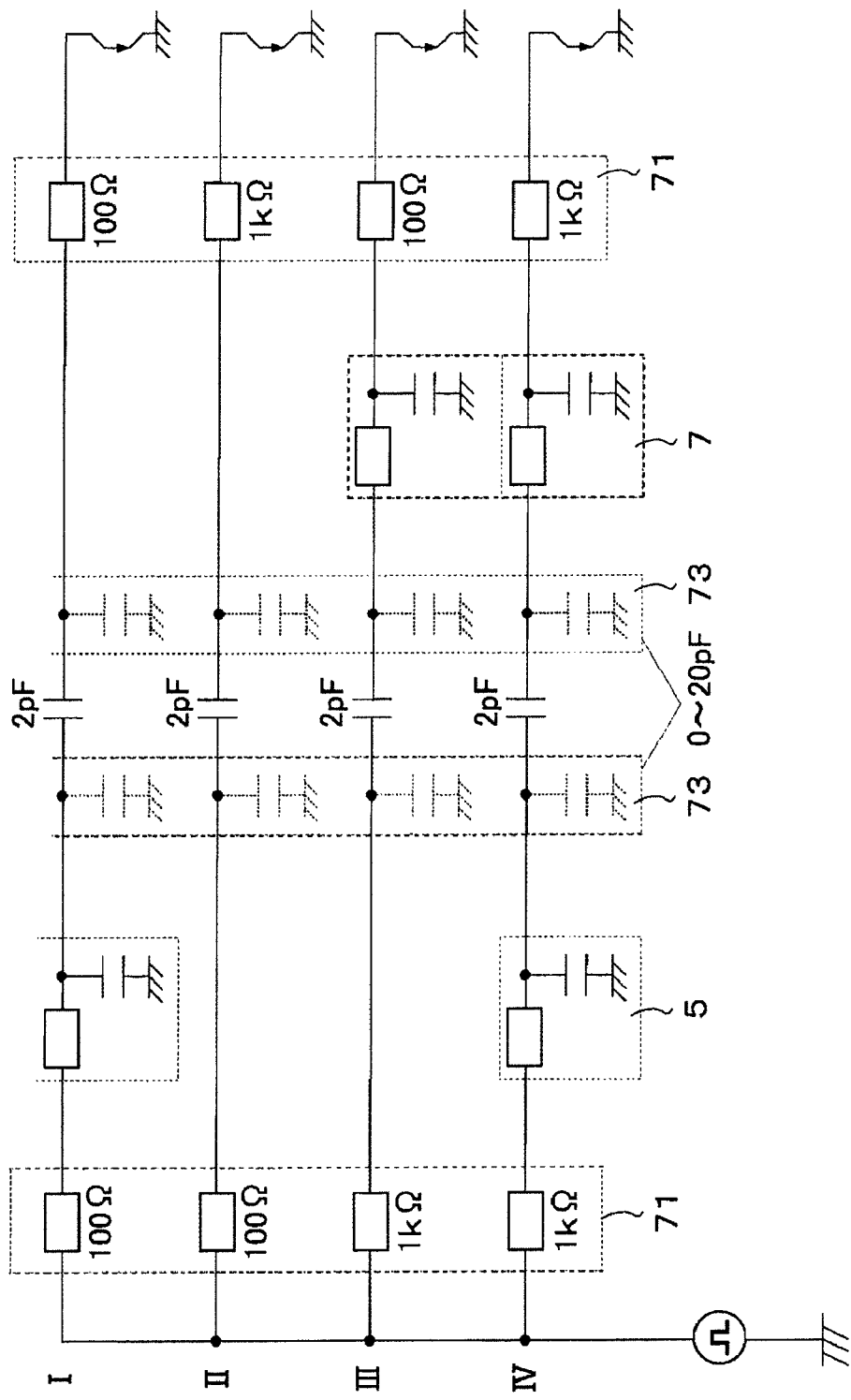
FIG. 17 is a diagram illustrating an equivalent circuit of the propagation paths.

FIG. 17 illustrates an equivalent circuit of the propagation paths corresponding to each measurement point. As illustrated in FIG. 17, a resistance component of the conductive wire 71 with a short propagation path is about 100Ω, and a resistance component of the conductive wire 71 with a long propagation path is about 1 kn. Further, the electrode patterns 5 and 7 with a short propagation path is able to be regarded as a distributed constant low pass filter which includes the resistance component of about 100Ω and a capacitance component of about 4.7 pF.

A series capacitance indicated by a full line in the figure (about 2 pF) is a capacitance component statically formed between the electrode pattern 5 and the electrode pattern 7. Further, a parallel capacitance 73 indicated by a dotted line in the figure respectively represents a capacitance component formed between the electrode pattern 5 and a finger and a capacitance component formed between the electrode pattern 7 and a finger. FIG. 17 illustrates a fact that the total of the capacitance component on the top face side and the capacitance component on the bottom face side is changed in the range from 0 pF to 20 pF both inclusive.

FIG. 18 illustrates a summary of combination states of electric characteristics of the propagation paths corresponding to the four measurement points I to IV.

Figure 19:
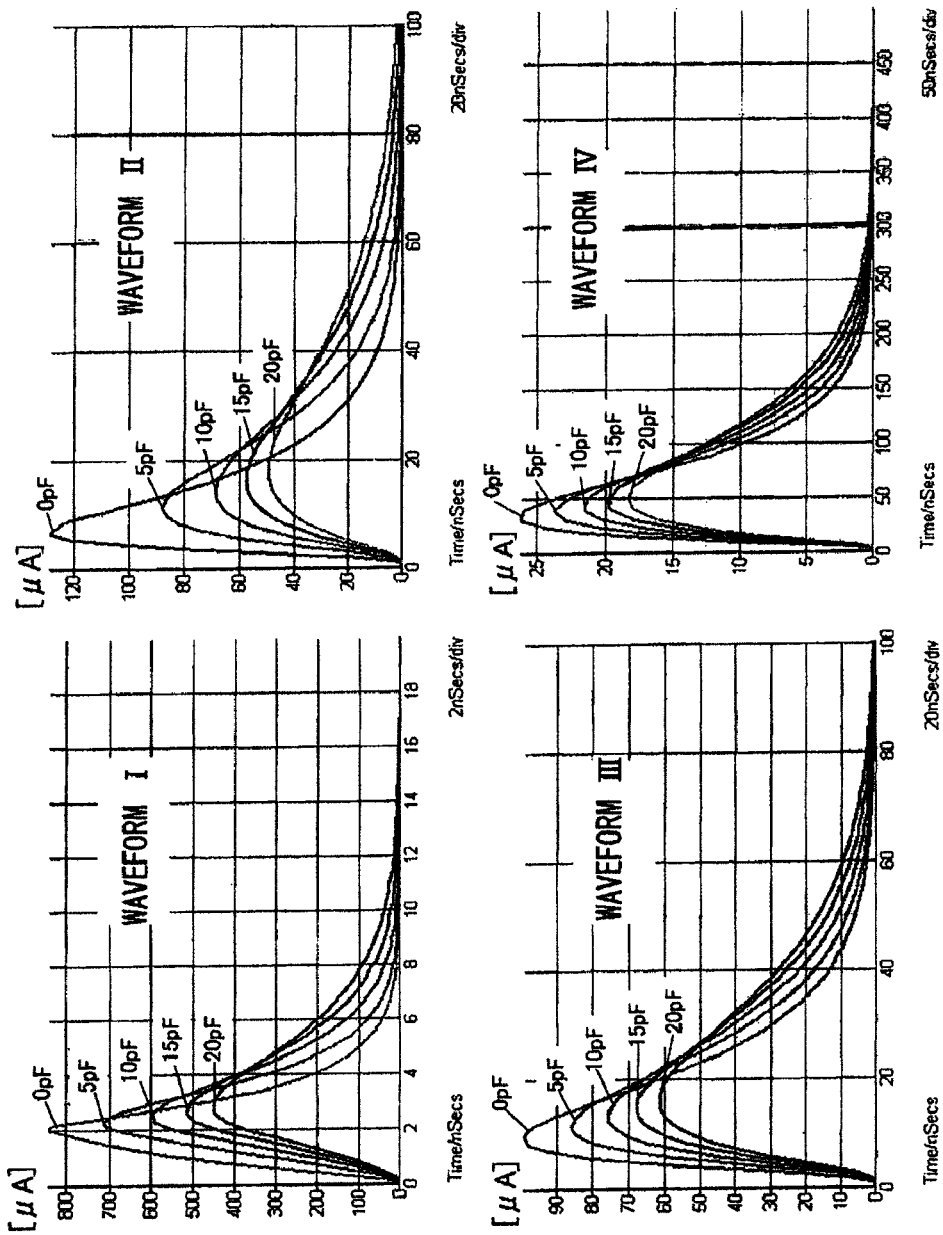
FIG. 19 is a diagram illustrating an example of emergence of detection signals corresponding to the location on an operation face.

FIG. 19 illustrates waveforms of detection signals corresponding to the four measurement points Ito IV. The vertical axis of the four graphs illustrated in FIG. 19 indicates a current value μA and the horizontal axis indicates time [ns]. From FIG. 19, it can also be seen that the peak level in the case where a finger is not contacted with the operation face is the maximum, and the peak level in the case where the capacitance component formed between the operation face and a finger is the maximum (20 pF) is the minimum.

If comparison is made between each of the four graphs of FIG. 19, it can be seen that each scale of the vertical axis and each scale of the horizontal axis are largely different from each other.

Figure 20:
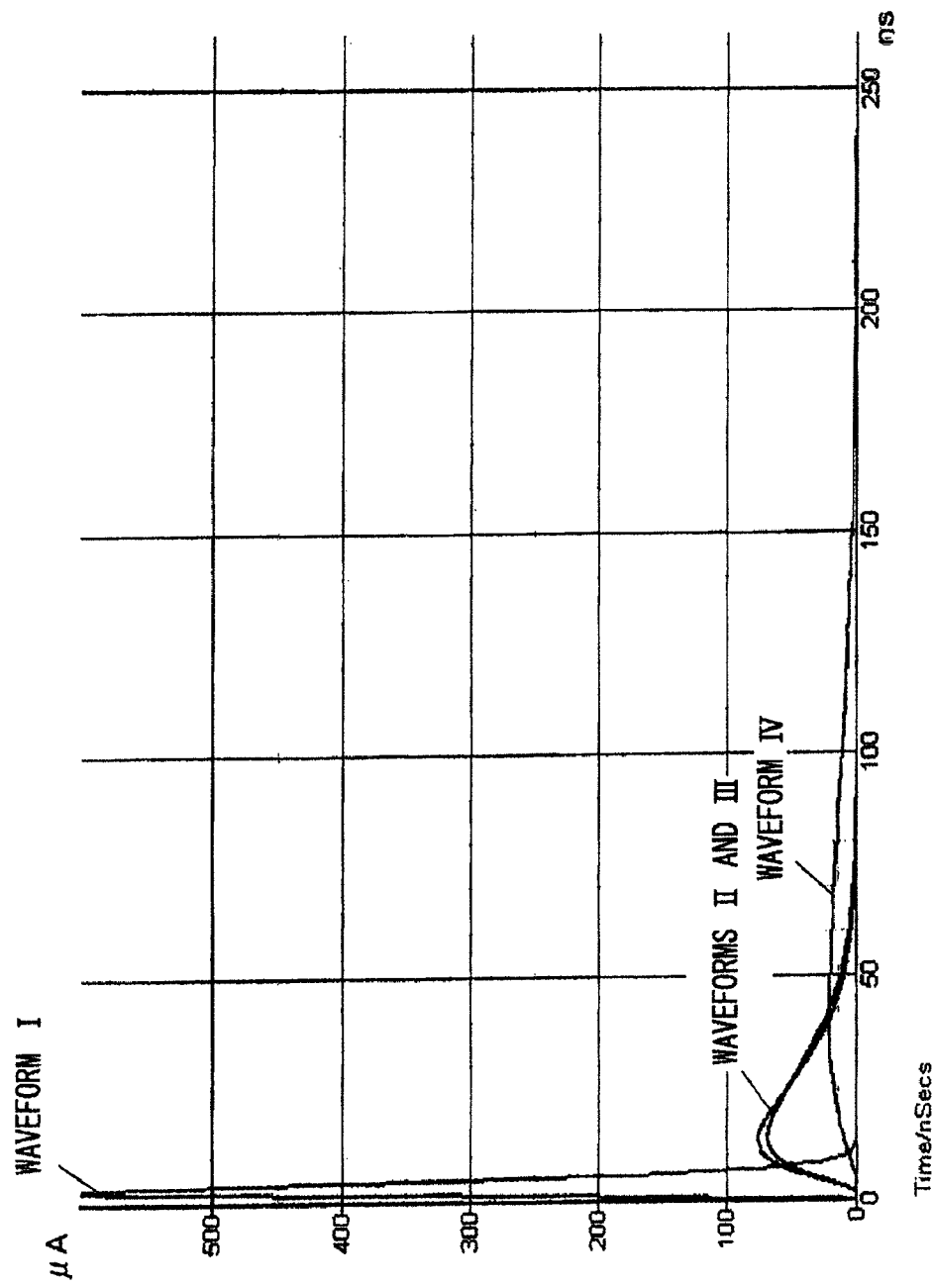
FIG. 20 is a diagram for explaining difference of amplitude of the detection signals corresponding to the location on the operation face.

Thus, FIG. 20 is illustrated so that the difference of scale of the four graphs is clearly shown. FIG. 20 is a diagram illustrating mapped waveforms of four detection signals on the same scale. In FIG. 20, only the four detection signals corresponding to a case of noncontact (0 pF) are illustrated.

As illustrated in FIG. 20, in the case where positions on the operation face are different (propagation path lengths are different), the amplitudes and the emergence positions of the peak levels are largely different from each other.

However, though such a difference exists, the measurement technology described in the first example and the second example effectively functions, and significant effect is prospective compared to the existing technologies.

However, based on the difference of peak level and the difference of emergence timing of each peak level, it can be seen that there is a considerable difference of time necessary for determination operation. In this example, attention is focused on the time difference.

Figure 21:
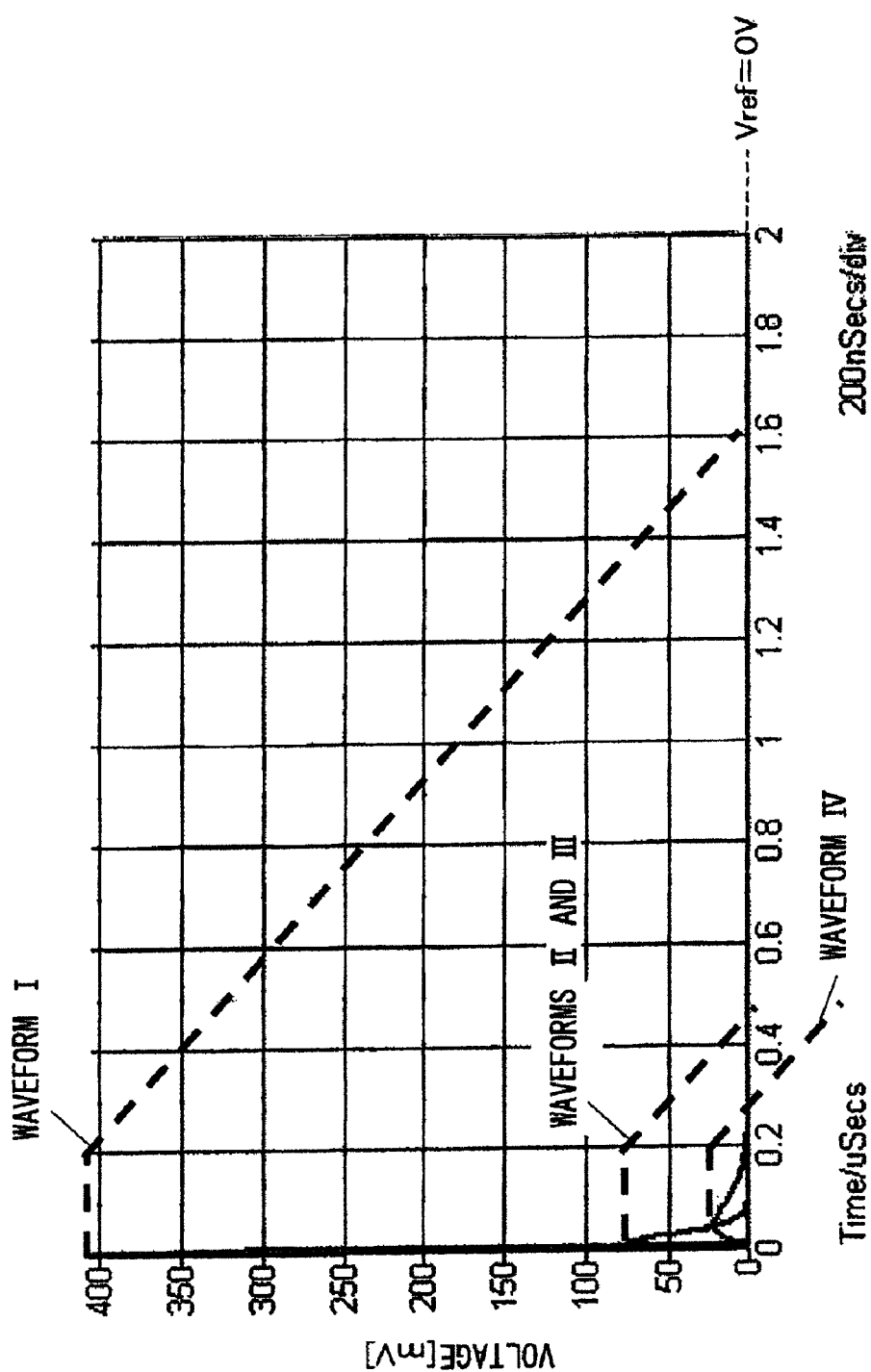
FIG. 21 is a diagram for explaining a relation between potential change due to discharge and elapsed time necessary for determination.

FIG. 21 illustrates a diagram in which the vertical axis of the precedent figure is changed to a peak hold voltage [mV], and the time scale of the horizontal axis is octupled. FIG. 21 illustrates a case that the reference voltage Vref to which the comparator 49 refers is 0 (zero) V.

In FIG. 21, discharge operation of the capacitance C by the current source 67 is started 0.2 μs after rising edge of the input pulse signal. In this case, difference of discharge time indicated by dotted lines in the figure is confirmed. For example, it can be seen that in the measurement point I having the maximum peak level, discharge operation is completed about 1.6 μs after rising edge of the input pulse signal. On the other hand, it can be seen that in the measurement points II, III, and IV having a small peak level, discharge operation is completed about 0.3 μs to 0.5 μs after rising edge of the input pulse signal.

The foregoing result means that in the method of the first example and the second example in which the same drive conditions are applied to the all measurement points, time waste is generated in the measurement points II, III, and IV compared to in the measurement point I.

Figure 22:
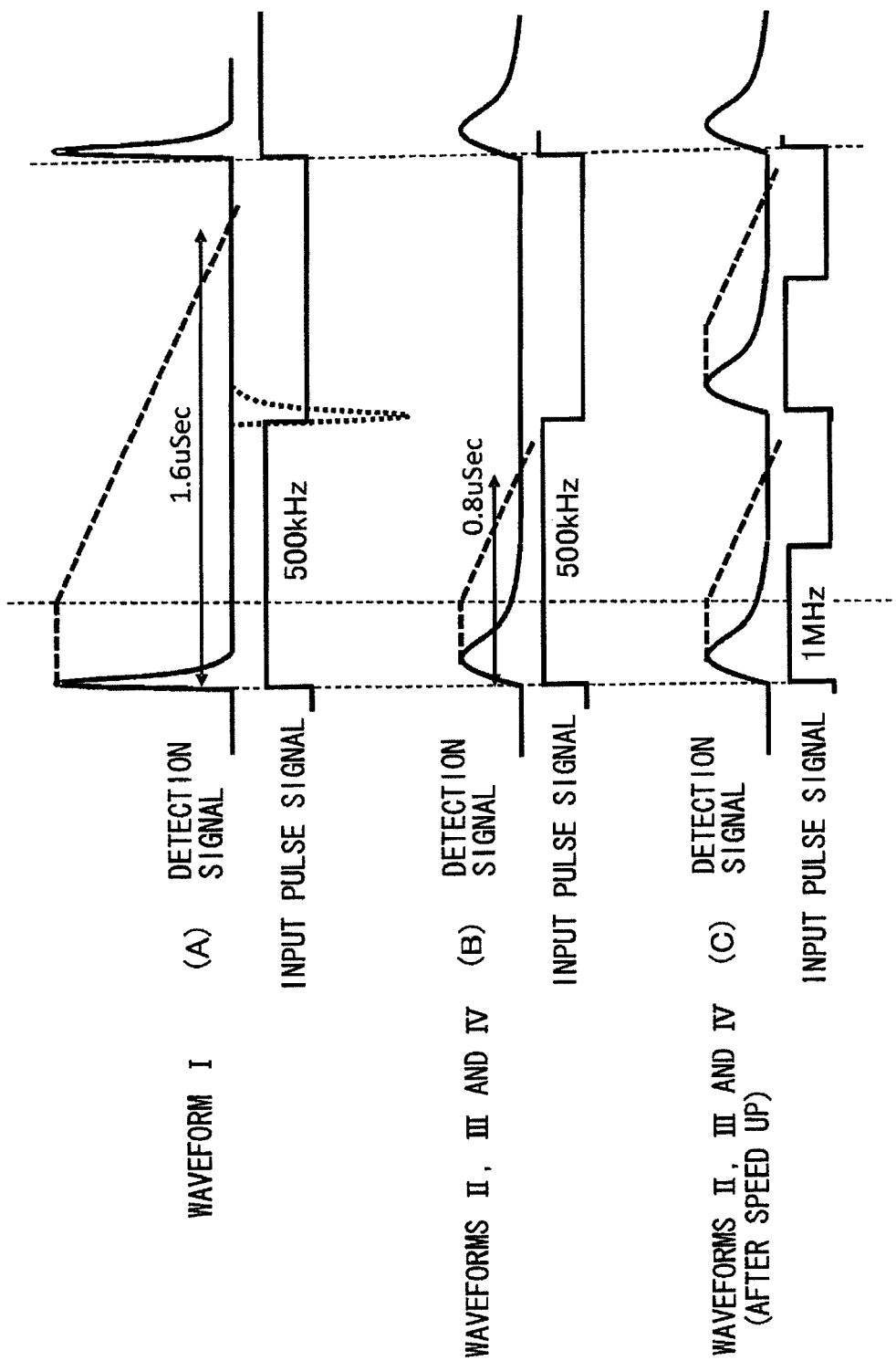
FIG. 22 is a diagram for explaining a speeding up technology of an input pulse signal.

A description will be hereinafter given by using parts (A) to (C) of FIG. 22. Part (A) of FIG. 22 illustrates a relation between a detection waveform of the measurement point I in which the peak level is the maximum and discharge completion. As described above, time of about 1.6 μs is necessitated from rising edge of the input pulse signal to the discharge completion.

Therefore, it can be seen that as illustrated in part (A) of FIG. 22, if the frequency of the input pulse signal is speeded up, 500 kHz is the upper limit.

Part (B) of FIG. 22 illustrates a relation between the waveforms of the measurement points II, III, and IV and discharge completion. As described above, to the discharge completion, time of about 0.8 μs after rising edge of the input pulse signal is necessitated. In the case where the input pulse signal is inputted with 500 kHz as in part (B) of FIG. 22, there is enough time.

Thus, as illustrated in part (C) of FIG. 22, the frequency of the input pulse signal for the measurement points II, III, and IV is increased to 1 MHz. It can be seen that in part (C) of FIG. 22, even though the frequency of the input pulse signal is 1 MHz, discharge is completed within one period.

A description will be hereinafter given of the example of a capacitive sensor module in which a frequency of the input pulse signal is optimized according to each measurement region.

[D-2. System Configuration]

Figure 23:
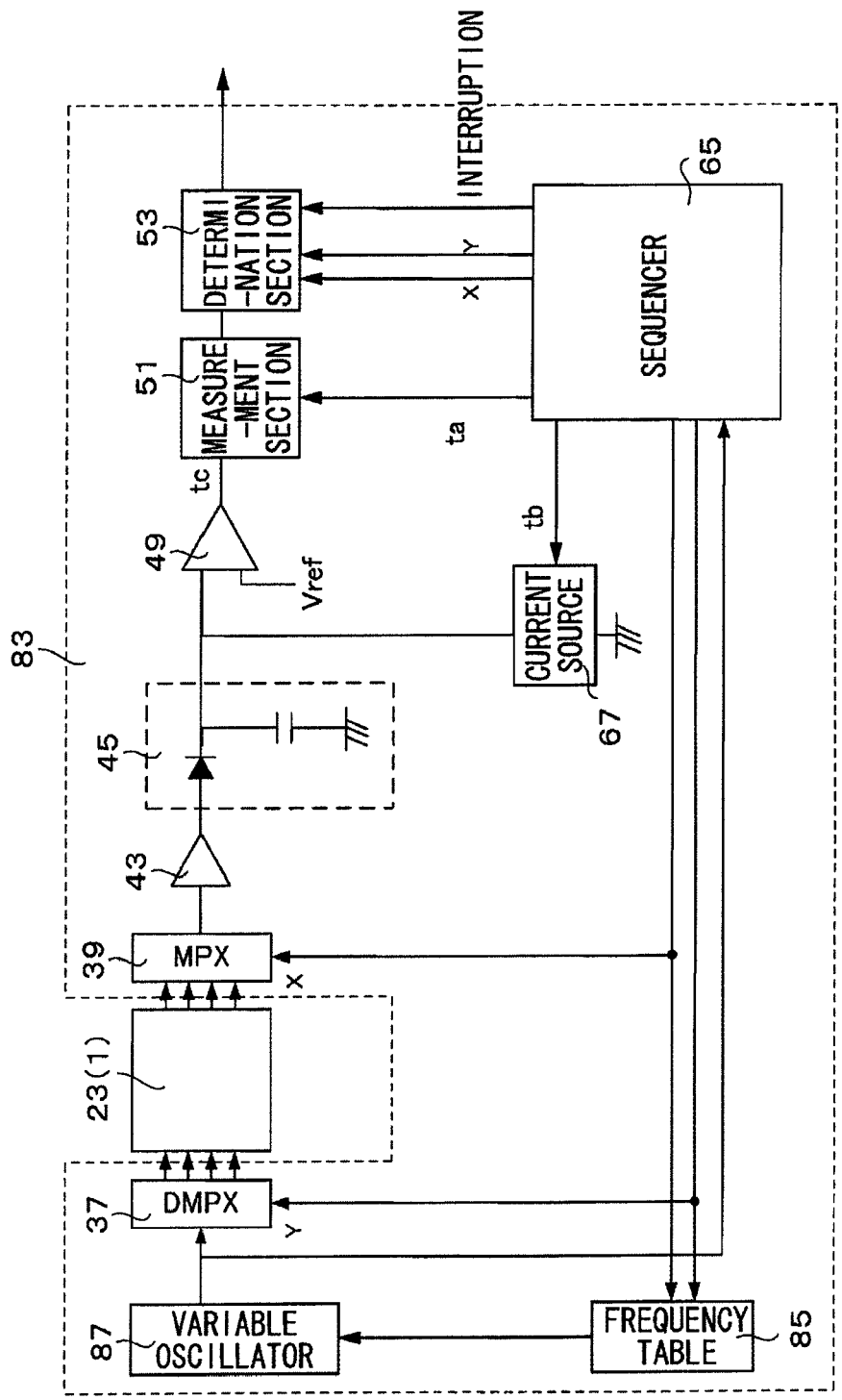
FIG. 23 is a diagram for explaining an example of system of a capacitive sensor module.

FIG. 23 illustrates an example of system configuration of a capacitive sensor module 81 according to this example. In FIG. 23, the same referential symbols are affixed to the elements corresponding to those of FIG. 13 according to the second example.

The capacitive sensor module 81 includes the capacitive sensor device 23 and a capacitance change measuring circuit 83.

The capacitance change measuring circuit 83 includes the de-multiplexer 37, the multiplexer 39, the current amplifier 43, the peak hold circuit 45, the comparator 49, the measurement section 51, the determination section 53, the sequencer 65, the current source 67, a frequency table 85, and a variable oscillator 87.

A description will be hereinafter given of the frequency table 85 and the variable oscillator 87 including change points.

As described above, in the case of this example, the frequency of the input pulse signal is optimized for every measurement point (coordinate position) on the operation face. The frequency table 85 stores a relation between the optimized frequency and the measurement point (coordinate position).

Figure 25:
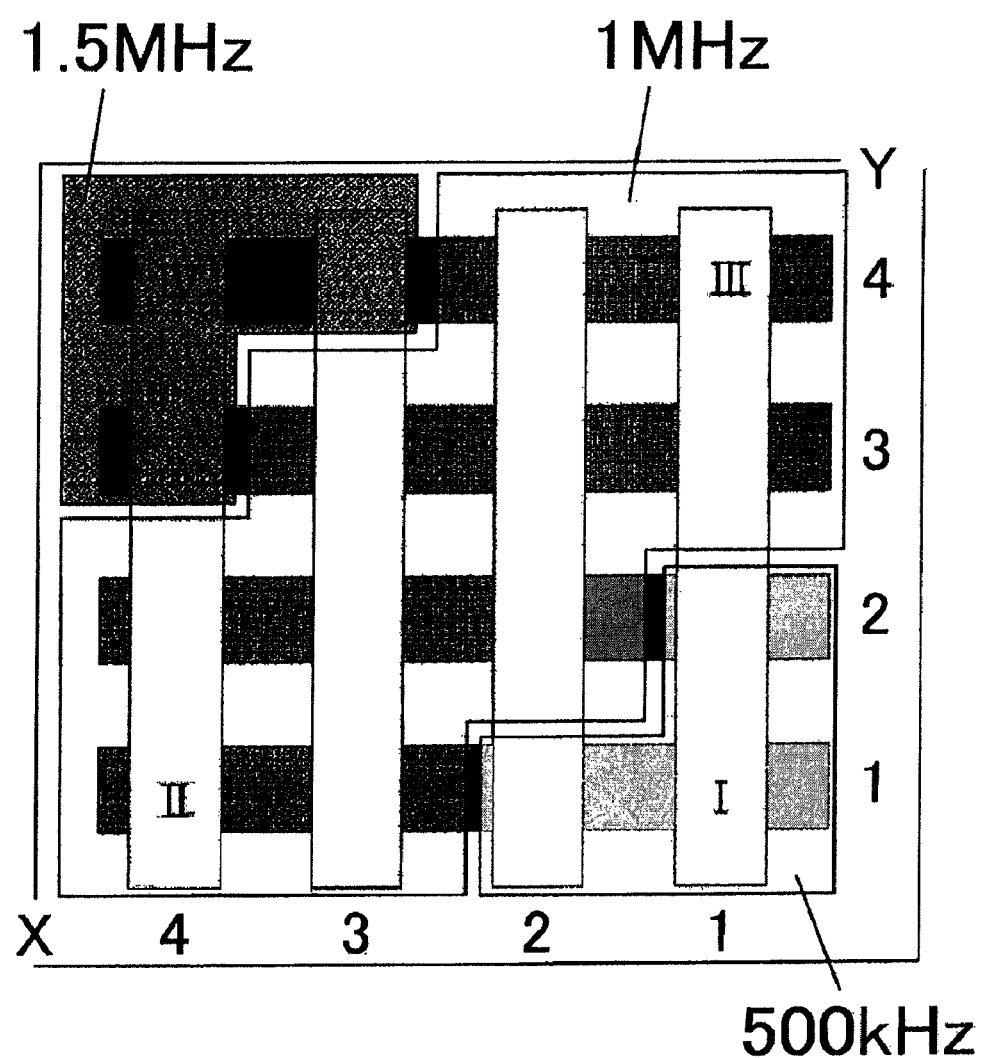
FIG. 25 is a diagram illustrating a correspondence relation between a frequency and a measurement point.

FIG. 24 illustrates a structural example of the frequency table 85. As illustrated in FIG. 24, one frequency is allocated to each combination of each X coordinate and each Y coordinate. FIG. 25 displays the correspondence relation of the frequency table 85 laid on the operation face. As illustrated in FIG. 25, in the case of this example, 500 kHz is allocated to three measurement points in which the peak level of the detection signal is large.

Further, 1 MHz is allocated to 10 measurement points in which the peak level of the detection signal is intermediate level. Further, 1.5 MHz is allocated to three measurement points in which the peak level of the detection signal is small.

Every time when a new coordinate value is given from the sequencer 65, the frequency table 85 reads the corresponding frequency, and gives the same to the variable oscillator 87.

The variable oscillator 87 is a circuit generating an input pulse signal with the given frequency. The variable oscillator 87 may be a single circuit capable of generating a plurality of oscillation frequencies. Further, the variable oscillator 87 may include three oscillators independently from each other that correspond to the foregoing three types of oscillation frequencies and a switch selectively outputs one thereof.

[D-3. Contents of Processing Operation]

In the case of this example, the structure of the sequencer 65 is the same as that of the second example. Thus, the operation flow thereof is the same as that described in FIG. 14. A description will be hereinafter given of processing operation of the capacitive sensor module 81 according to the operation flow of the sequencer 65.

First, the sequencer 65 generates coordinates to designate the position on the operation face as a measurement target (S11). The coordinate values X and Y generated as above are given to the de-multiplexer 37, the multiplexer 39, the determination section 53, and the frequency table 85.

Thereby, a frequency suitable for the next measurement point is given from the frequency table 85 to the variable oscillator 87. The variable oscillator 87 outputs an input pulse signal having the optimal frequency for the measurement point. Further, in preparation for input of the input pulse signal, the de-multiplexer 37 and the multiplexer 39 are switching-controlled.

Meanwhile, the sequencer 65 waits for detection of rising edge of the input pulse signal (S12). If the edge is detected, the sequencer 65 outputs an enable signal to the measurement section 51 (S13). The output timing of the enable signal corresponds to the foregoing rising timing ta. In response to input of the enable signal, measurement function of the determination section 51 becomes effective. That is, measurement of the elapsed time T is started.

After that, the sequencer 65 waits for incoming of the timing tb when discharge operation by the current source 67 is started (S14).

If incoming of the timing tb is detected, the sequencer 65 enables the current source 67, and starts discharge of the capacitance C (S15).

Next, the sequencer 65 waits for elapse of the time tc (max) corresponding to the reference elapsed time T0 (S16). The time tc (max) is given as timing when the potential crosses the reference potential Vref in the case where the peak level detected for the detection signal when the capacitance formed between the operation face and a finger is 0 (zero) is discharged from the timing of the time tb.

In the case of this example, if elapse of the time tc (max) is detected, the sequencer 65 outputs a disable signal to the measurement section 51 as well (S17). In response to input of the disable signal, the measurement function of the determination section 51 becomes ineffective, since it is not necessary to continue measurement operation even after the possible maximum value of the elapsed time T. It is needless to say that after the measurement function becomes ineffective, the elapsed time T measured while the measurement function is effective is retained as well.

After that, the sequencer 65 outputs an interruption request to the determination section 53 (S18). The determination section 53 to which the interruption request is inputted determines whether or not a finger touches the coordinate position given from the sequencer 65 based on a result of comparison between the detected elapsed time T and the reference elapsed time T0 (set for every measurement point). For the comparison processing, the reference elapsed time T0 corresponding to the measurement point given from the sequencer 65 is used.

After that, the sequencer 65 determines whether or not a stop request exists (S19). If the stop request is not confirmed, the sequencer 65 returns to the generation operation of the XY coordinates again to repeat the foregoing operation. If the stop request is confirmed, the sequencer 65 finishes the operation.

[D-4. Conclusion]

As described above, in the case of the capacitance change measuring circuit 83 according to the third example, the frequency of the input pulse signal inputted to each measurement point on the operation face is able to be optimized. That is, time for determination operation in each measurement position is able to be shortened to the minimum. Thereby, the scanning rate in view of the whole operation is able to be speeded up.

[E. Fourth Example]
[E-1 Detection Principle]

In this example as well, a description will be hereinafter given of a method of optimizing measurement operation of the elapsed time T according to the position of a measurement point on the operation face (more specifically, a length of a propagation path).

However, in this example, a technology for further speeding up the scanning rate by variably controlling a current value of a current source is proposed.

Figure 26:
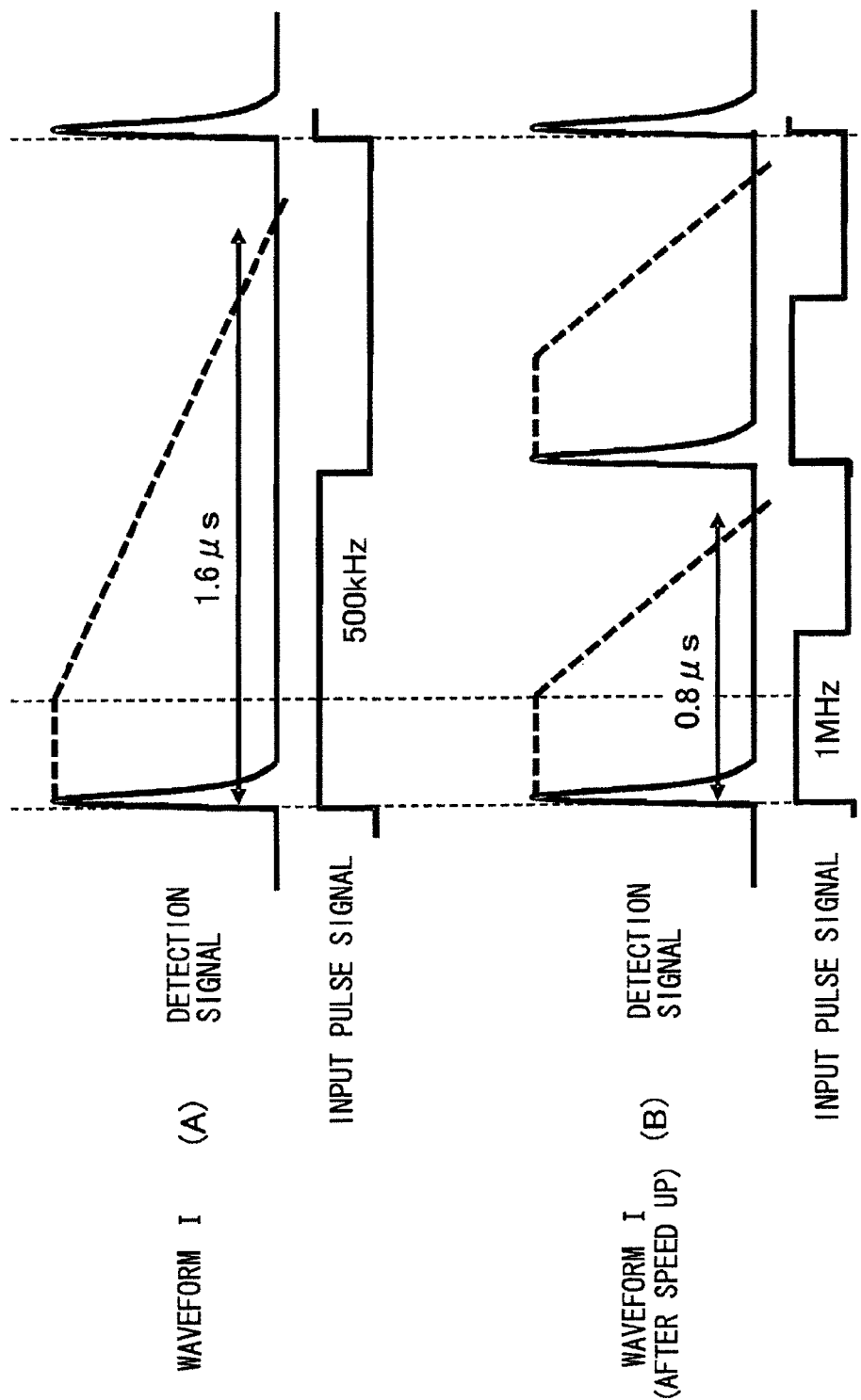
FIG. 26 is a diagram for explaining a speeding up technology of an input pulse signal.

A description will be given of effect of variably controlling the current value of the current source by using parts (A) and (B) of FIG. 26. FIG. 26 illustrates a relation between the input pulse signal corresponding to the measurement point I and time necessary for discharging the peak level.

Part (A) of FIG. 26 illustrates a relation between the input pulse signal and time necessary for discharging the peak level in the third example.

Part (B) of FIG. 26 illustrates a relation between the input pulse signal and time necessary for discharging the peak level in the case where the current value of the current source is set to a value twice that of part (A) of FIG. 26.

In the case of FIG. 26, by doubling the current value of the current source, the necessary discharge time of 1.6 µs is able to be shortened down to 0.8 µs.

If the discharge time is 0.8 µs, even in the case where frequency of the input pulse signal is increased to 1 MHz, presence of input operation is able to be determined within one period thereof.

A description will be hereinafter given of an example of a capacitive sensor module in which a frequency of the input pulse signal and a current value of the current source are optimized according to each measurement region.

[E-2. System Configuration]

Figure 27:
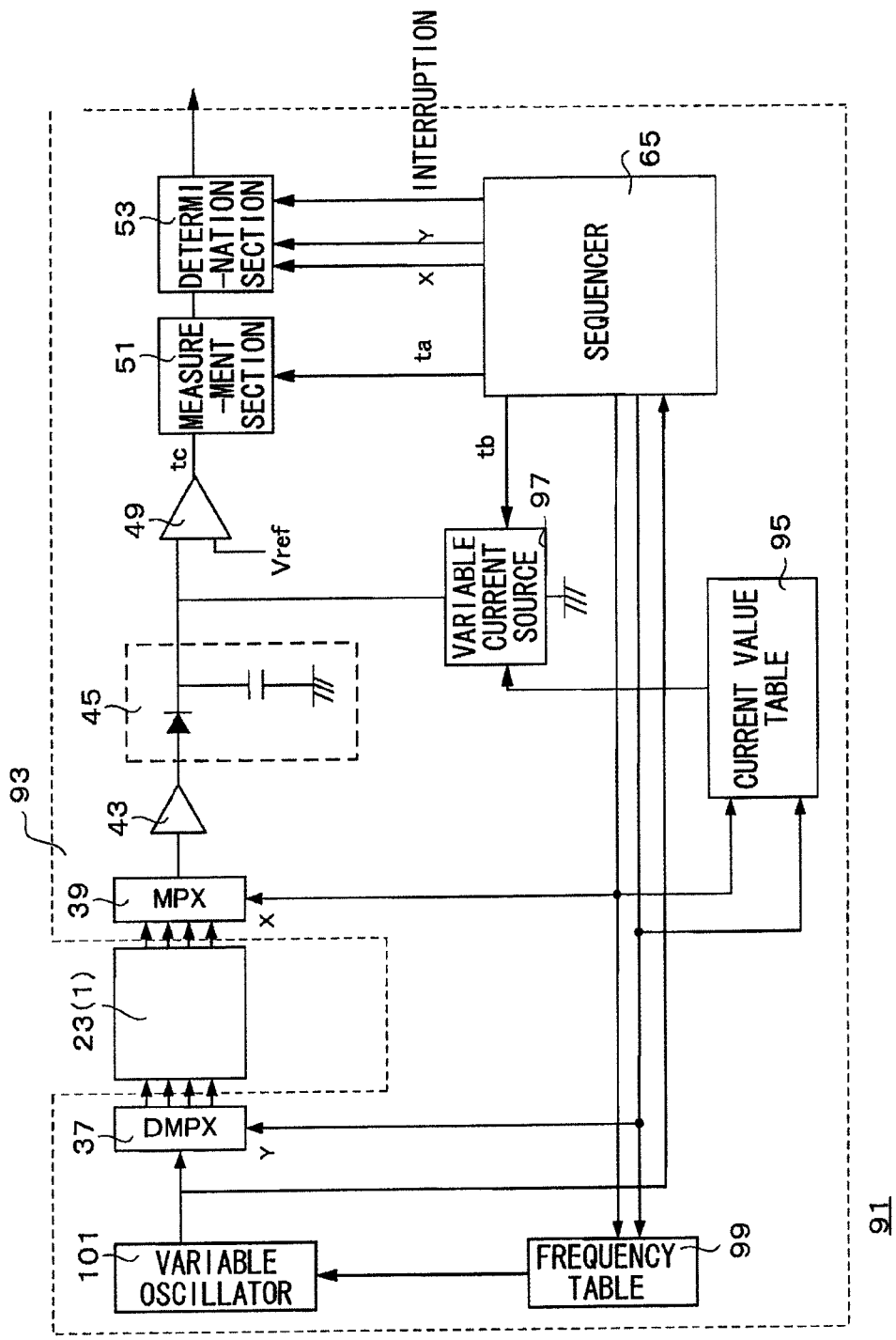
FIG. 27 is a diagram for explaining an example of system of a capacitive sensor module.

FIG. 27 illustrates an example of system configuration of a capacitive sensor module 91 according to this example. In FIG. 27, the same referential symbols are affixed to the elements corresponding to those of FIG. 23 according to the third example.

The capacitive sensor module 91 includes the capacitive sensor device 23 and a capacitance change measuring circuit 93.

The capacitance change measuring circuit 93 includes the de-multiplexer 37, the multiplexer 39, the sequencer 65, the current amplifier 43, the peak hold circuit 45, the comparator 49, the measurement section 51, the determination section 53, a current value table 95, a variable current source 97, a frequency table 99, and a variable oscillator 101.

A description will be hereinafter given of the current value table 95, the variable current source 97, the frequency table 99, and the variable oscillator 101 including change points.

As described above, in the case of this example, the frequency of the input pulse signal and the current value of the variable current source 97 are optimized for every measurement point (coordinate position) on the operation face.

Of the foregoing, it is the current value table 95 that stores a relation between the optimized current value and the measurement point (coordinate position).

Figure 29:
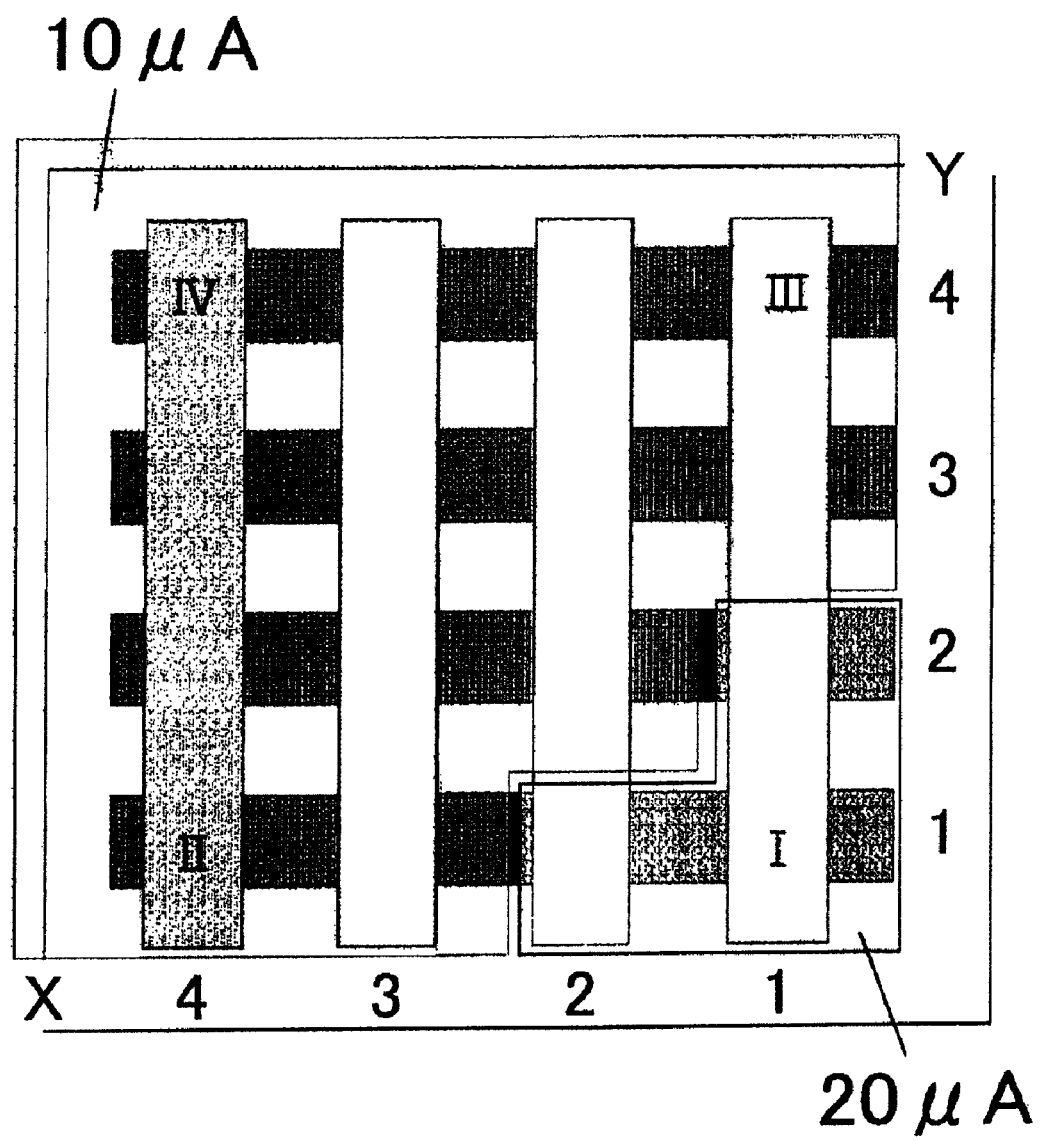
FIG. 29 is a diagram illustrating a correspondence relation between a current value and a measurement point.

FIG. 28 illustrates a structural example of the current value table 95. As illustrated in FIG. 28, in the current value table 95, one current value is allocated to each combination of each X coordinate and each Y coordinate. FIG. 29 displays the correspondence relation of the current value table 95 laid on the operation face. As illustrated in FIG. 29, in the case of this example, 20 µA is allocated to three measurement points in which the peak level of the detection signal is large, and 10 µA is allocated to the other 13 measurement points. That is, in the case of this example, the current value of the variable current source 97 is switched between two stages.

Every time when a new coordinate value is given from the sequencer 65, the current value table 95 reads the corresponding current value, and gives the same to the variable current source 97.

The variable current source 97 is a constant current circuit selectively generating the given current value. The variable current source 97 may be a single circuit capable of generating a plurality of current values. Further, the variable current source 97 may include two current sources independently from each other corresponding to the foregoing two types of current values and a switch connecting one thereof to the capacitance C.

The frequency table 99 is a storage region that stores a relation between the optimized frequency and the measurement point (coordinate position).

Figure 31:
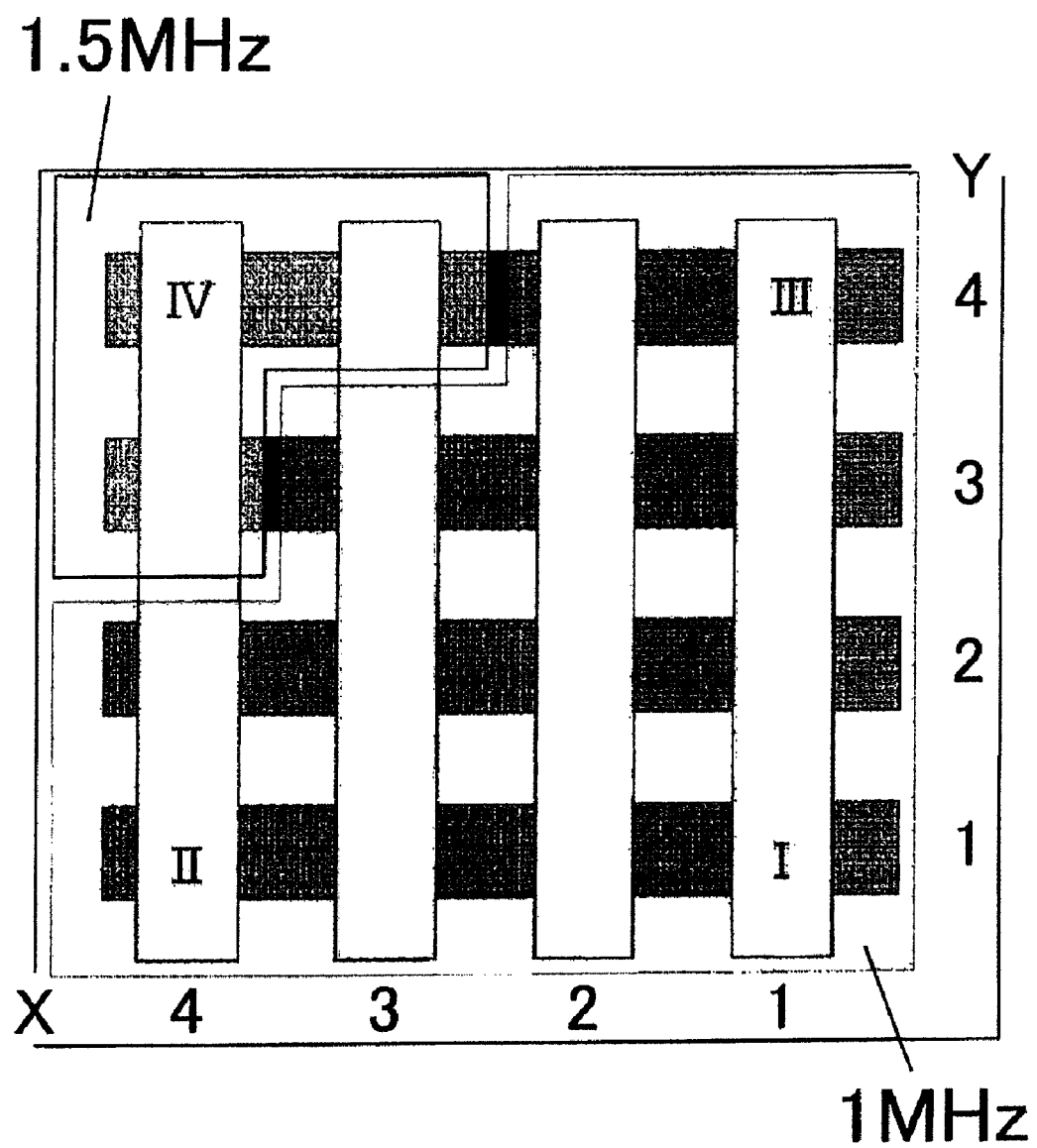
FIG. 31 is a diagram illustrating a correspondence relation between a frequency and a measurement point.

FIG. 30 illustrates a structural example of the frequency table 99. As illustrated in FIG. 30, in the frequency table 99, one frequency is allocated to each combination of each X coordinate and each Y coordinate. FIG. 31 displays the correspondence relation of the frequency table 99 laid on the operation face. As illustrated in FIG. 31, in the case of this example, 1.5 MHz is allocated to three measurement points in which the peak level of the detection signal is small, and 1 MHz is allocated to the other 13 measurement points.

The difference between FIG. 31 (fourth example) and FIG. 25 (third example) is as follows. That is, in the fourth example, the frequency of the input pulse signal corresponding to the three points in which the peak level is large is speeded up from 500 kHz of the third example to 1 MHz. That is, in the case of this example, the frequency of the variable oscillator 101 is able to be switched between two stages. Every time when a new coordinate value is given from the sequencer 65, the frequency table 99 reads the corresponding frequency, and gives the same to the variable oscillator 101.

The variable oscillator 101 is a circuit generating an input pulse signal with the given frequency. The variable oscillator 101 may be a single circuit capable of generating two types of oscillation frequencies. Further, the variable oscillator 101 may include two oscillators independently from each other that correspond to the foregoing two types of oscillation frequencies and a switch that selectively outputs one thereof.

[E-3. Contents of Processing Operation]

In the case of this example, the structure of the sequencer 65 is the same as that of the second example. Thus, the operation flow thereof is the same as that described in FIG. 14. A description will be hereinafter given of processing operation of the capacitive sensor module 91 according to the operation flow of the sequencer 65.

First, the sequencer 65 generates coordinates to designate the position on the operation face as a measurement target (S11). The coordinate values X and Y generated as above are given to the de-multiplexer 37, the multiplexer 39, the determination section 53, the current value table 95, and the frequency table 99.

Thereby, a current value suitable for the next measurement point is given from the current value table 95 to the variable current source 97. At the same time, a frequency suitable for the next measurement point is given from the frequency table 99 to the variable oscillator 101.

The variable current source 97 changes setting so that the current value suitable for the next measurement point is flown. The variable oscillator 101 outputs an input pulse signal having the optimal frequency for the measurement point. Further, in preparation for input of the input pulse signal, the de-multiplexer 37 and the multiplexer 39 are switching-controlled.

Meanwhile, the sequencer 65 waits for detection of rising edge of the input pulse signal (S12). If the edge is detected, the sequencer 65 outputs an enable signal to the measurement section 51 (S13). The output timing of the enable signal corresponds to the foregoing rising timing ta. In response to input of the enable signal, measurement function of the determination section 51 becomes effective. That is, measurement of the elapsed time T is started.

After that, the sequencer 65 waits for incoming of the timing tb when discharge operation by the current source 67 is started (S14).

If incoming of the timing tb is detected, the sequencer 65 enables the current source 67, and starts discharge of the capacitance C (S15).

Next, the sequencer 65 waits for elapse of the time tc (max) corresponding to the reference elapsed time T0 (S16). The time tc (max) is given as timing when the potential crosses the reference potential Vref in the case where the peak level detected for the detection signal when the capacitance formed between the operation face and a finger is 0 (zero) is discharged from the timing of the time tb.

In this example, if elapse of the time tc (max) is detected, the sequencer 65 outputs a disable signal to the measurement section 51 as well (S17). In response to input of the disable signal, the measurement function of the measurement section 51 becomes ineffective, since it is not necessary to continue measurement operation after the possible maximum value of the elapsed time T. It is needless to say that after the measurement function becomes ineffective, the elapsed time T measured while the measurement function is effective is retained as well.

After that, the sequencer 65 outputs an interruption request to the determination section 53 (S18). The determination section 53 to which the interruption request is inputted determines whether or not a finger touches the coordinate position given from the sequencer 65 based on a result of comparison between the detected elapsed time T and the reference elapsed time T0 (set for every measurement point). For the comparison processing, the reference elapsed time T0 corresponding to the measurement point given from the sequencer 65 is used.

After that, the sequencer 65 determines whether or not a stop request exists (S19). If the stop request is not confirmed, the sequencer 65 returns to the generation operation of the XY coordinates again to repeat the foregoing operation. If the stop request is confirmed, the sequencer 65 finishes the operation.

[E-4. Conclusion]

As described above, in the case of the capacitance change measuring circuit 93 according to the fourth example, the frequency of the input pulse signal inputted to each measurement point on the operation face and the current value of the current source 97 are able to be optimized.

Thereby, in the measurement region in which the frequency of the input pulse signal has been 500 kHz in the third example, the frequency is able to be speeded up to 1 MHz in this example.

It means that the minimum frequency of the input pulse frequency is increased from 500 kHz to 1 MHz. Accordingly, the scanning rate in view of the whole operation is able to be further speeded up.

[F. Fifth Example]

[F-1 Detection Principle]

In this example, a description will be hereinafter given of a method of optimizing measurement operation of the elapsed time T according to the position of a measurement point on the operation face (more specifically, a propagation path length).

However, in this example, a technology for further speeding up the scanning rate by variably controlling the reference potential Vref of the comparator is proposed.

Figure 32:
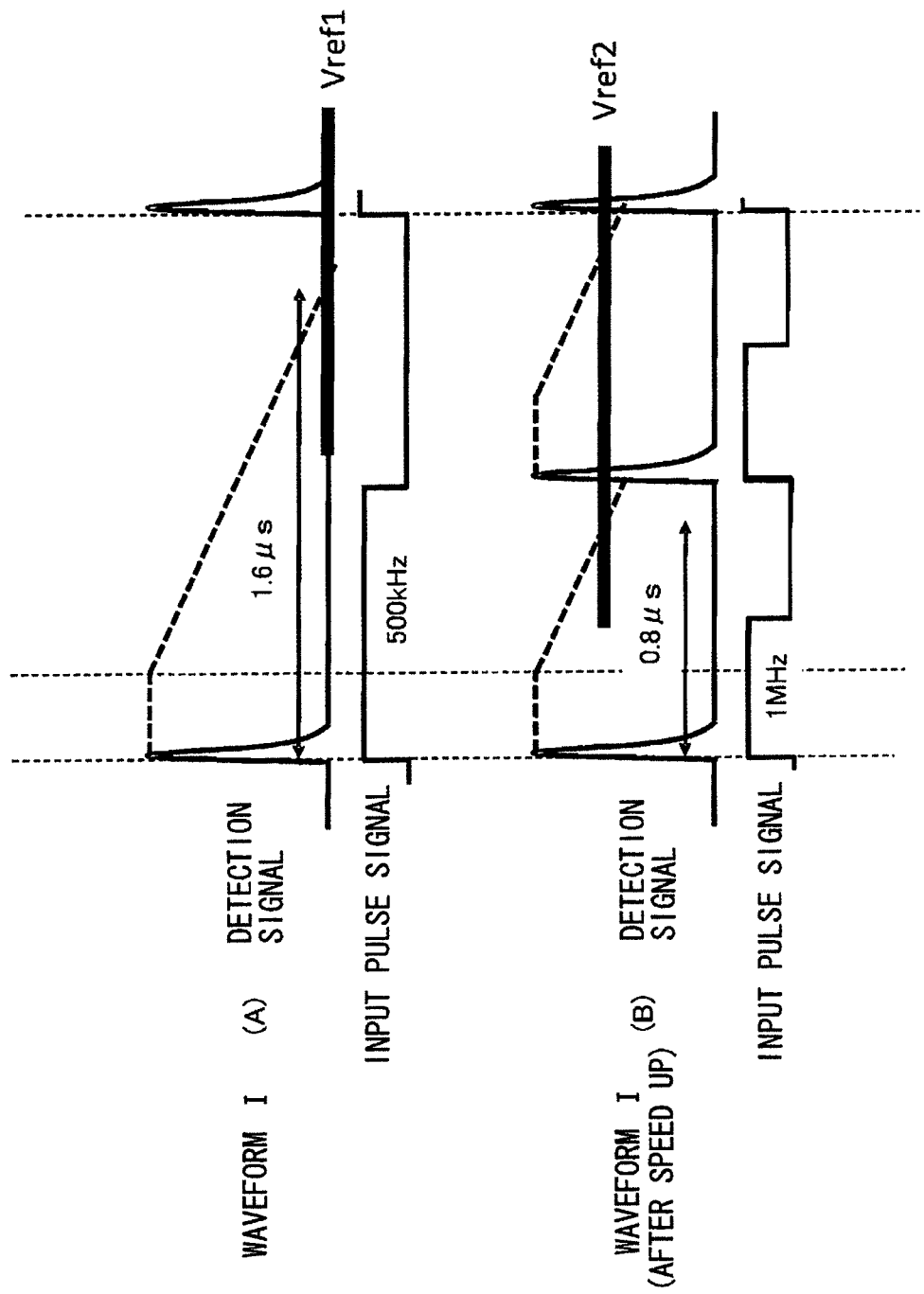
FIG. 32 is a diagram for explaining a speeding up technology of an input pulse signal.

A description will be given of effect of variably controlling the reference potential Vref of the comparator by using parts (A) and (B) of FIG. 32. FIG. 32 illustrates a relation between the input pulse signal corresponding to the measurement point I and time necessary for determination.

Part (A) of FIG. 32 illustrates a relation between the input pulse signal and time necessary for discharge of the peak level in the third example. In this case, for determining input operation, reference potential Vref1 corresponding to 0 (zero) V is used.

Part (B) of FIG. 32 illustrates a relation between the input pulse signal and time necessary for determination in the case where reference potential Vref2 of the comparator (>Vref1) is used.

It can be seen that in the case of FIG. 32, by switching the reference potential Vref1 to the reference potential Vref2, the necessary discharge time of 1.6 µs able to be shortened down to 0.8 µS.

If the discharge time is 0.8 μs, even in the case where the frequency of the input pulse signal is increased to 1 MHz, presence of input operation is able to be determined within 1 period thereof.

A description will be hereinafter given of an example of a capacitive sensor module in which the frequency of the input pulse signal and the reference potential Vref of the comparator are optimized according to each measurement region.

[F-2. System Configuration]

Figure 33:
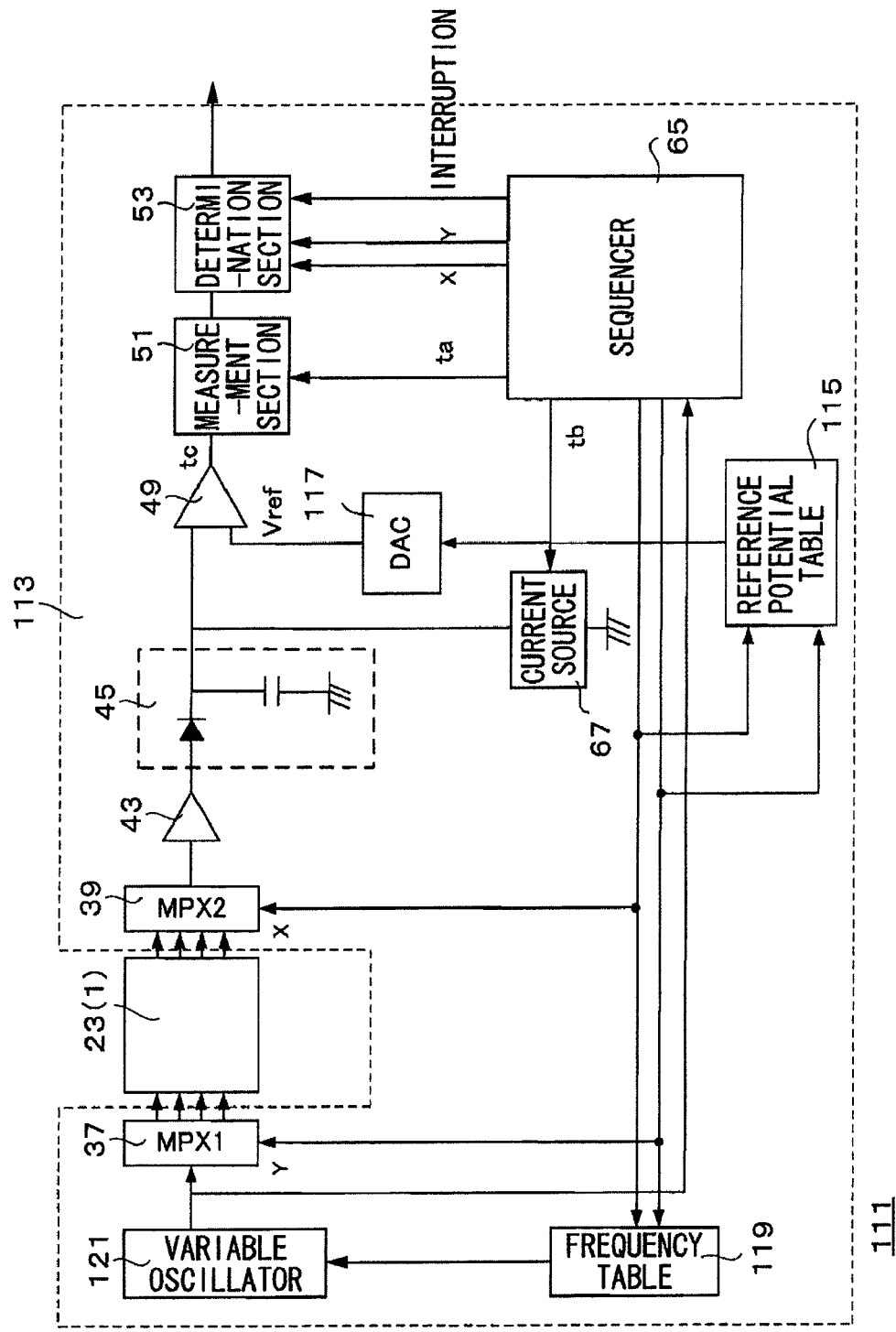
FIG. 33 is a diagram for explaining an example of system of a capacitive sensor module.

FIG. 33 illustrates an example of system configuration of a capacitive sensor module 111 according to this example. In FIG. 33, the same referential symbols are affixed to the elements corresponding to those of FIG. 23 according to the third example.

The capacitive sensor module 111 includes the capacitive sensor device 23 and a capacitance change measuring circuit 113.

The capacitance change measuring circuit 113 includes the de-multiplexer 37, the multiplexer 39, the sequencer 65, the current amplifier 43, the peak hold circuit 45, the comparator 49, the measurement section 51, the determination section 53, a reference potential table 115, a digital analog convertor 117, a frequency table 119, and a variable oscillator 121.

A description will be hereinafter given of the reference potential table 115, the digital analog convertor 117, the frequency table 119, and the variable oscillator 121 including change points.

As described above, in the case of this example, the frequency of the input pulse signal and the reference potential Vref are optimized for every measurement point (coordinate position) on the operation face.

Of the foregoing, it is the reference potential table 115 that stores a relation between the optimized reference potential Vref and the measurement point (coordinate position).

Figure 35:
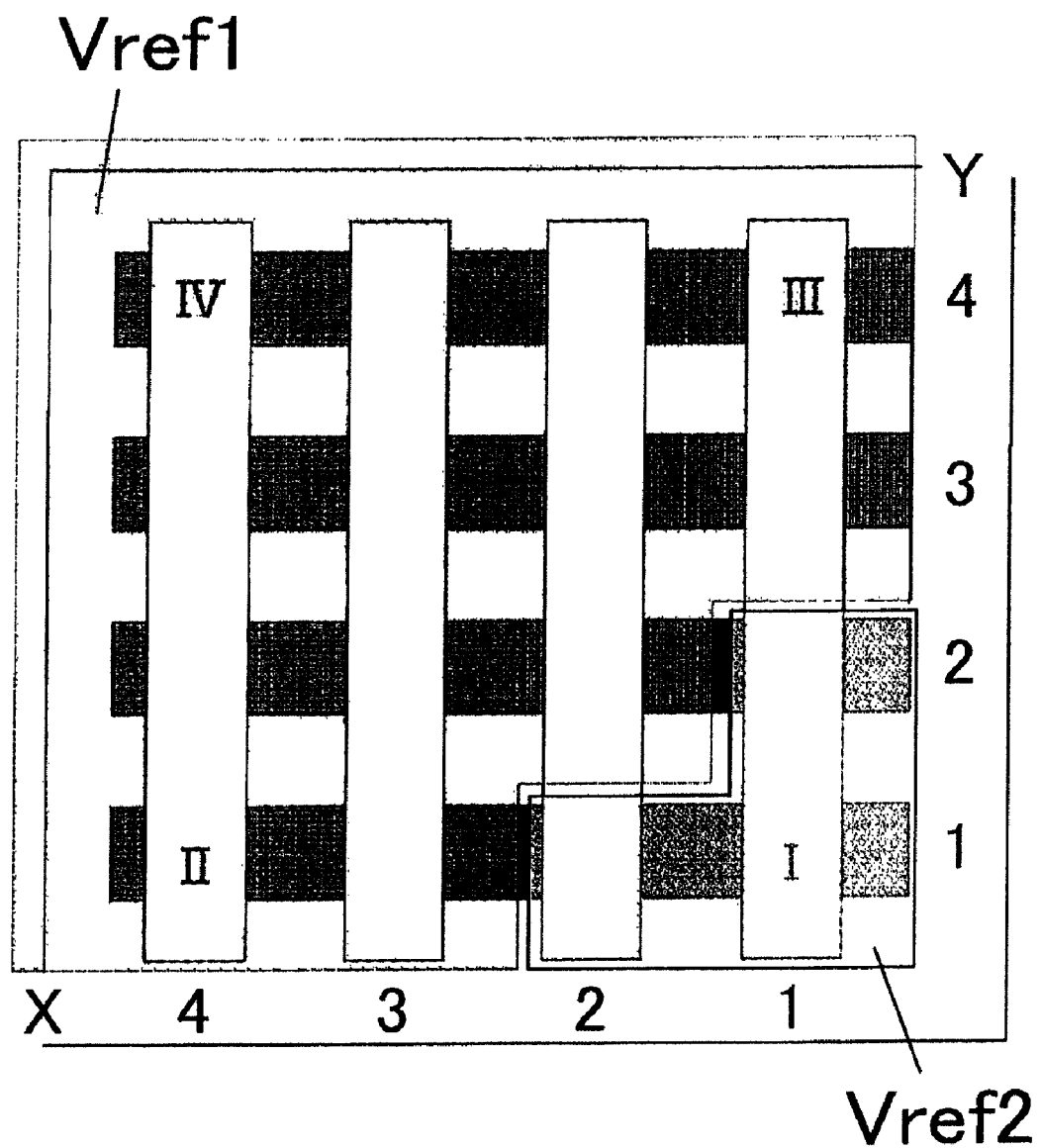
FIG. 35 is a diagram illustrating a correspondence relation between a reference potential and a measurement point.

FIG. 34 illustrates a structural example of the reference potential table 115. As illustrated in FIG. 34, in the reference potential table 115, one Vrf is allocated to each combination of each X coordinate and each Y coordinate. FIG. 35 displays the correspondence relation of the reference potential table 115 laid on the operation face. As illustrated in FIG. 35, in the case of this example, the high order reference potential Vref2 (>Vref1) is allocated to three measurement points in which the peak level of the detection signal is large, and the low order reference potential Vref1 is allocated to the other 13 measurement points. That is, in the case of this example, the reference potential Vref given to the comparator 49 is switched between two stages.

Every time when a new coordinate value is given from the sequencer 65, the reference potential table 115 reads the corresponding reference potential, and gives the same to the digital analog converter 117. The reference potential is read based on a digital value.

The digital analog converter 117 is a circuit converting the given digital value to an analog potential. It is possible to adopt a structure in which two types of voltage sources are prepared instead of the digital analog converter 117, and one thereof is given to the comparator 49. In this case, it is enough that selection information of the two types of voltage sources is written into the reference potential table 115.

The frequency table 119 is a storage region that stores a relation between the optimized frequency and the measurement point (coordinate position).

FIG. 36 illustrates a structural example of the frequency table 119. As illustrated in FIG. 36, in the frequency table 119, one frequency is allocated to each combination of each X coordinate and each Y coordinate.

Figure 37:
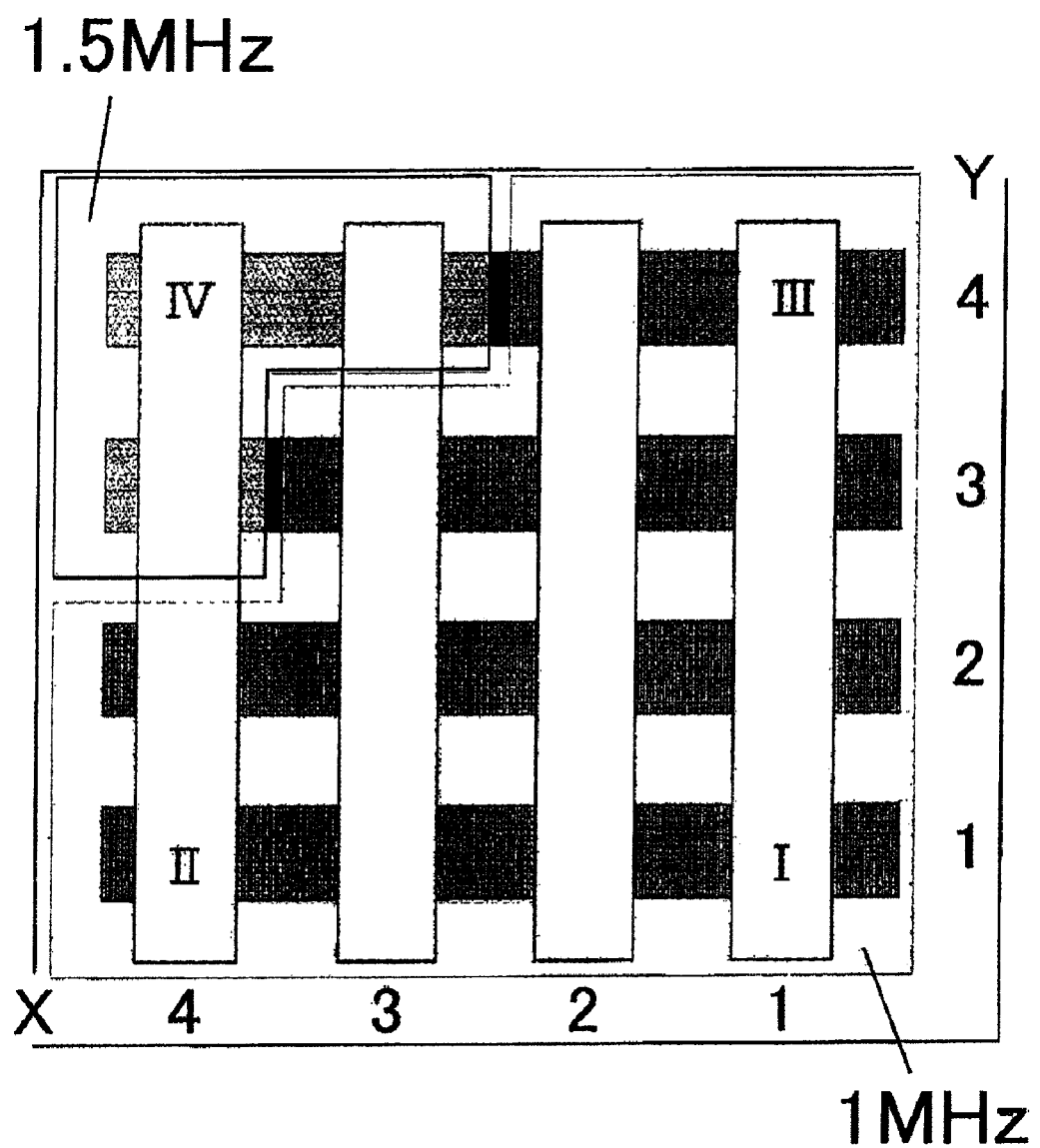
FIG. 37 is a diagram illustrating a correspondence relation between a frequency and a measurement point.

FIG. 37 displays the correspondence relation of the frequency table 119 laid on the operation face. As illustrated in FIG. 37, in the case of this example, 1.5 MHz is allocated to three measurement points in which the peak level of the detection signal is small, and 1 MHz is allocated to the other 13 measurement points.

The difference between FIG. 37 (fifth example) and FIG. 25 (third example) is as follows. That is, in the fifth example, the frequency of the input pulse signal corresponding to the three points in which the peak level is large is speeded up from 500 kHz in the third example to 1 MHz. That is, in the case of this example, the frequency of the variable oscillator 121 is set to be able to be switched between two stages. Every time when a new coordinate value is given from the sequencer 65, the frequency table 119 reads the corresponding frequency, and gives the same to the variable oscillator 121.

The variable oscillator 121 is a circuit generating an input pulse signal with the given frequency. The variable oscillator 121 may be a single circuit capable of generating two types of oscillation frequencies. Further, the variable oscillator 121 may include two oscillators independently from each other corresponding to the foregoing two types of oscillation frequencies and a switch selectively outputs one thereof.

[F-3. Contents of Processing Operation]

In the case of this example, the structure of the sequencer 65 is the same as that of the second example. Thus, the operation flow thereof is the same as that described in FIG. 14. A description will be hereinafter given of processing operation of the capacitive sensor module 111 according to the operation flow of the sequencer 65.

First, the sequencer 65 generates coordinates to designate the position on the operation face as a measurement target (S11). The coordinates values X and Y generated as above are given to the de-multiplexer 37, the multiplexer 39, the determination section 53, the reference potential table 115, and the frequency table 119.

Thereby, a digital value of the reference potential suitable for the next measurement point is given from the reference potential table 115 to the digital analog converter 117. At the same time, a frequency suitable for the next measurement point is given from the frequency table 119 to the variable oscillator 121.

The optimal reference potential Vref for the measurement point in analog potential style is given to the comparator 49. Further, the variable oscillator 121 sets the output frequency to the optimal frequency for the measurement point. Further, in preparation for input of the input pulse signal, the de-multiplexer 37 and the multiplexer 39 are switching-controlled.

Meanwhile, the sequencer 65 waits for detection of rising edge of the input pulse signal (S12). If the edge is detected, the sequencer 65 outputs an enable signal to the measurement section 51 (S13). The output timing of the enable signal corresponds to the foregoing rising timing ta. In response to input of the enable signal, measurement function of the determination section 51 becomes effective. That is, measurement of the elapsed time T is started.

After that, the sequencer 65 waits for incoming of the timing tb when discharge operation by the current source 67 is started (S14).

If incoming of the timing tb is detected, the sequencer 65 enables the current source 67, and starts discharge of the capacitance C (S15).

Next, the sequencer 65 waits for elapse of the time tc (max) corresponding to the reference elapsed time T0 (S16). The time tc (max) is given as timing when the potential crosses the reference potential Vref in the case where the peak level detected for the detection signal when the capacitance formed between the operation face and a finger is 0 (zero) is discharged from the timing of the time tb.

In this example, if elapse of the time tc (max) is detected, the sequencer 65 outputs a disable signal to the measurement section 51 as well (S17). In response to input of the disable signal, the measurement function of the determination section 51 becomes ineffective, since it is not necessary to continue measurement operation even after the possible maximum value of the elapsed time T. It is needless to say that after the measurement function becomes ineffective, the elapsed time T measured while the measurement function is effective is retained as well.

After that, the sequencer 65 outputs an interruption request to the determination section 53 (S18). The determination section 53 to which the interruption request is inputted determines whether or not a finger touches the coordinate position given from the sequencer 65 based on a result of comparison between the detected elapsed time T and the reference elapsed time T0.

For the comparison processing, the reference elapsed time T0 corresponding to the measurement point given from the sequencer 65 is used. It is needless to say that for the reference elapsed time T0, the determined value of a size of the applied reference potential Vref is prepared.

After that, the sequencer 65 determines whether or not a stop request exists (S19). If the stop request is not confirmed, the sequencer 65 returns to the generation operation of the XY coordinates again to repeat the foregoing operation. If the stop request is confirmed, the sequencer 65 finishes the operation.

[F-4. Conclusion]

As described above, in the case of the capacitance change measuring circuit 113 according to the fifth example, the frequency of the input pulse signal inputted to each measurement point on the operation face and the reference potential Vref of the comparator 49 are able to be optimized.

Thereby, for the measurement region in which the frequency of the input pulse signal has been 500 kHz, the frequency is able to be speeded up to 1 MHz in the fifth example.

It means that the minimum frequency of the input pulse frequency is increased from 500 kHz to 1 MHz. Accordingly, the scanning rate in view of the whole operation is able to be further speeded up.

[G. Sixth Example]
[G-1. Detection Principle]

In the case of the foregoing examples, the description has been given of the case that the peak level of positive period of the detection signal corresponding to the input pulse signal is detected. That is, the description has been given of the case that the maximum value is detected, and the elapsed time T necessary for discharging thereof is measured.

The foregoing detection method is also able to be applied to a case that a peak level of negative period corresponding to the input pulse signal is detected. That is, the foregoing detection method is also able to be applied to a case that the minimum value is detected, and the elapsed time T necessary for charging thereof is measured.

Figure 38:
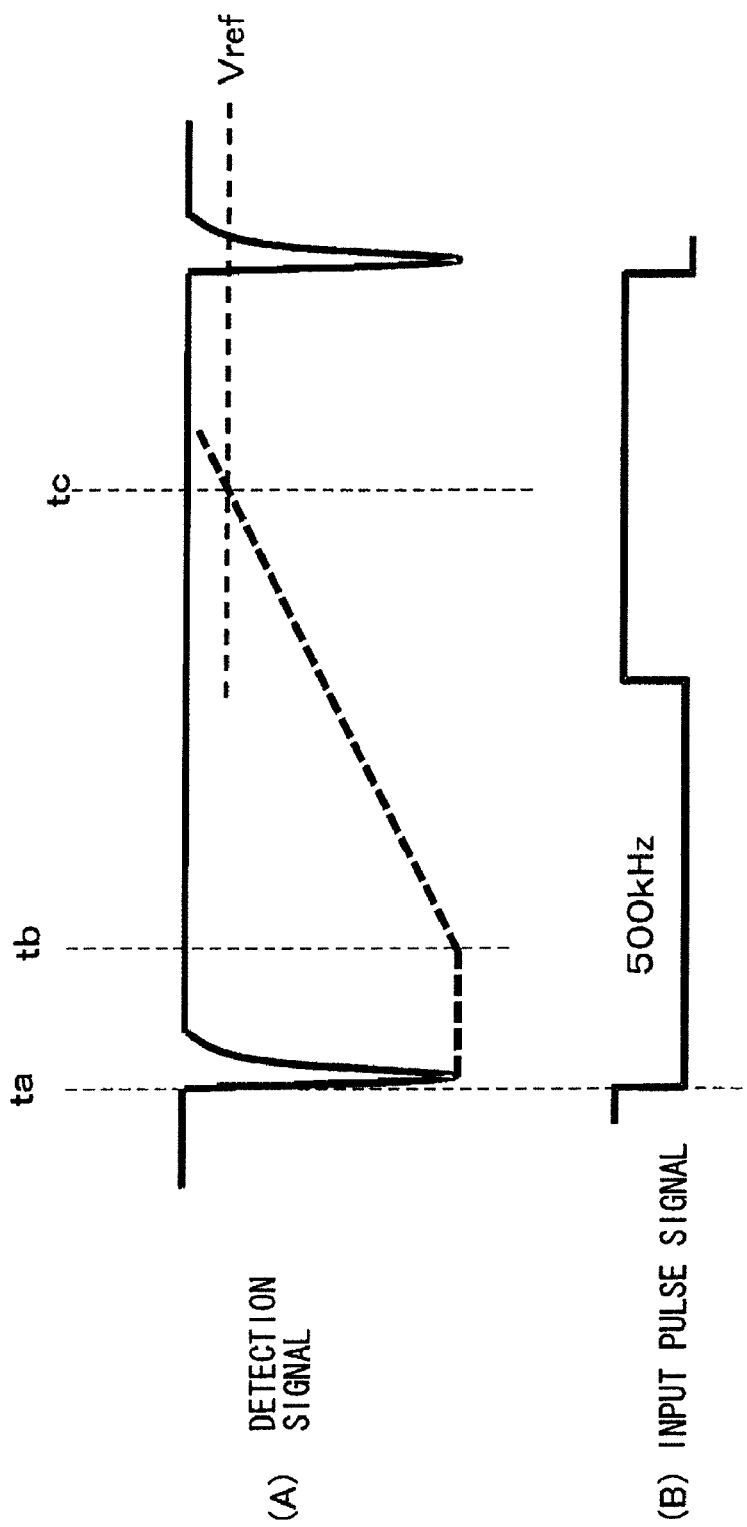
FIG. 38 is a diagram for explaining another example of detection operation of a peak level.

FIG. 38 illustrates processing images. FIG. 38 corresponds to a modified example of the second example. The waveform indicated by a full line in part (A) of FIG. 38 is a detection signal, and the waveform indicated by a dotted line in part (A) of FIG. 38 is a holding potential of the capacitance C. Part (B) of FIG. 38 indicates a waveform of the input pulse signal.

In the case of FIG. 38, the detection signal falls in sync with falling edge of the input pulse signal. The holding potential of the capacitance C peak-holds the minimum value in contradiction to the case of the second example. In the case of part (A) of FIG. 38, supplying a charge current from the current source is started after the time tb set on and after the timing when the prospective all peak levels emerge. Thus, the holding potential of the capacitance C is increased at a constant rate on and after elapse of the time tb, and is increased to exceed the previously set reference potential Vref.

It is needless to say that the current value of the charge current is set to a size with which the potential of the capacitance C is able to be transferred to the reference potential Vref or more within one period of the input pulse signal for the all measurement points on the operation face.

A description will be hereinafter given of an example of a capacitive sensor module adopting the detection principle.

[G-2. System Configuration]

Figure 39:
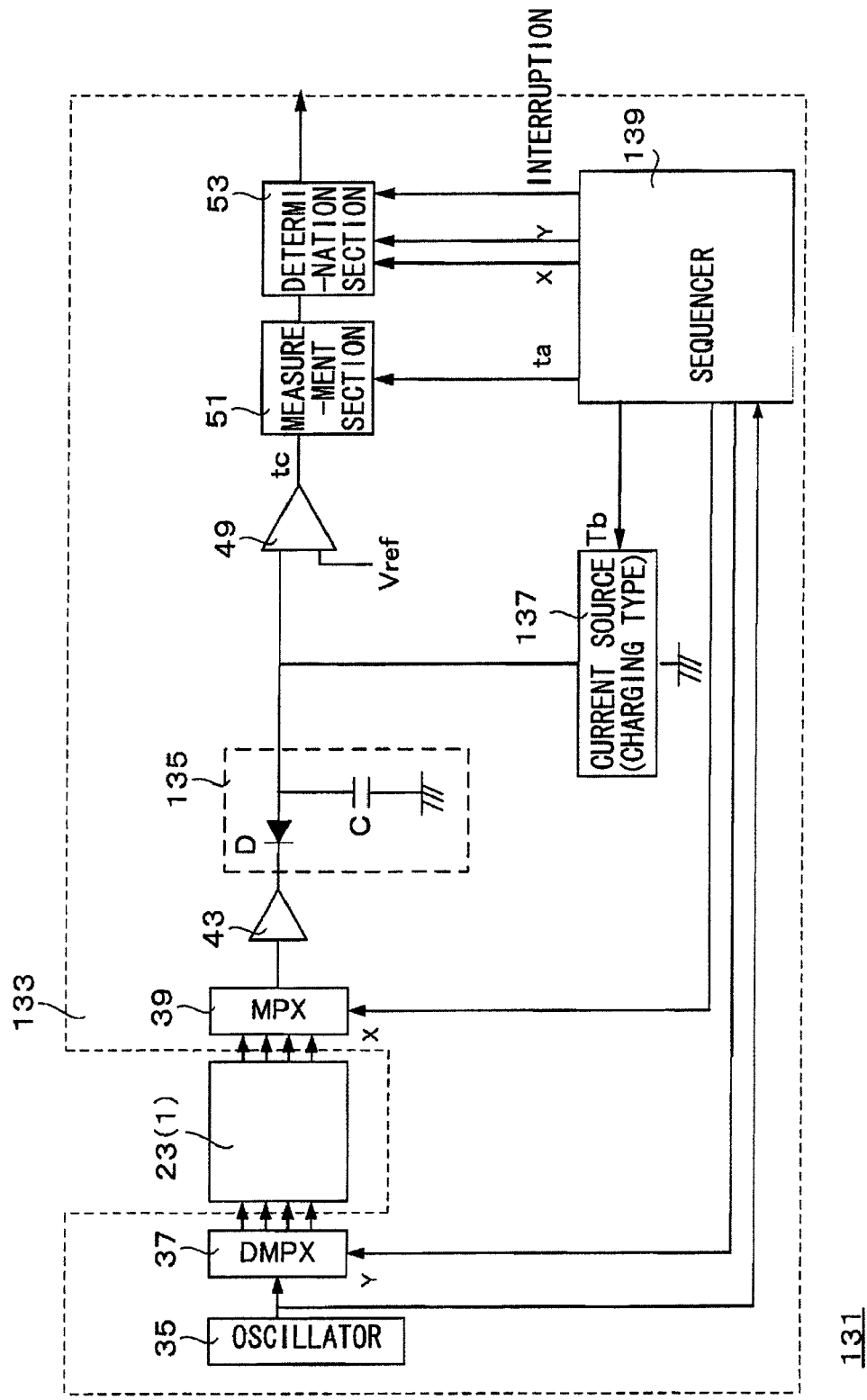
FIG. 39 is a diagram for explaining an example of system of a capacitive sensor module.

FIG. 39 illustrates a system configuration example of a capacitive sensor module 131 according to this example. In FIG. 39, the same referential symbols are affixed to the elements corresponding to those of FIG. 13 according to the second example.

The capacitive sensor module 131 includes the capacitive sensor device 23 and a capacitance change measuring circuit 133.

The capacitance change measuring circuit 133 includes the oscillator 35, the de-multiplexer 37, the multiplexer 39, the current amplifier 43, the comparator 49, the measurement section 51, the determination section 53, a peak hold circuit 135, a current source 137, and a sequencer 139.

A description will be hereinafter given of the peak hold circuit 135, the current source 137, and the sequencer 139 including change points.

In the case of this example, the connection direction of the diode D structuring the peak hold circuit 135 is opposite to that of the second example.

The current source 137 is a charging type constant current circuit, and is used to charge an electric charge of the capacitance C. In the case of the current source 137, a switch element (for example, a transistor) is arranged on the path flowing a current into the condenser C. By opening and closing the switch, execution and stop of discharge operation is able to be switched. Such a function may also be realized by a switch element to switch between supply and stop of a drive power source for the current source 137.

In the case of this example, the size of a current value of the current source 137 is set so that determination operation is able to be finished within one period after starting application of the input pulse signal as well. However, as described above, the current value is set to a value larger than that of the first example. Thereby, after starting charge, the potential of the capacitance C is able to be promptly increased from the peak level to the reference potential Vref or more.

The sequencer 139 has a function to output connection order to the electrode patterns 5 to which the input pulse signal is supplied and connection order to the electrode pattern 7 as an extraction source of the detection signal in sync with the input pulse signal. The sequencer 139 also has a function to manage execution start timing of charge operation by the current source 67. Managing the timing is executed based on detection of falling timing of the input pulse signal.

[G-3. Contents of Processing Operation]

Figure 40:
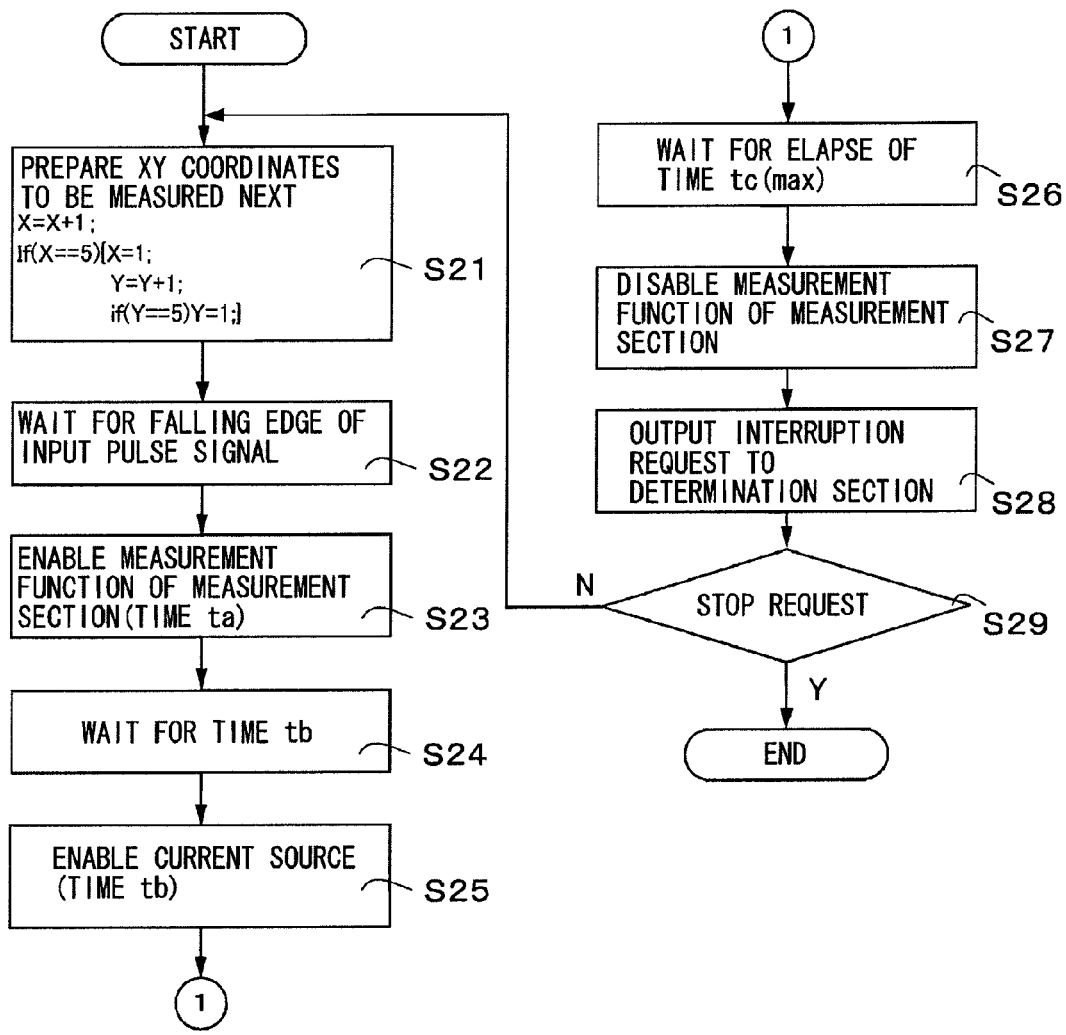
FIG. 40 is a diagram for explaining an example of operation of a sequencer.

A description will be hereinafter given of processing operation of the capacitive sensor module 131 according to the operation flow of the sequencer 139 (FIG. 40). FIG. 40 also illustrates a case that both the number of the electrodes patterns 5 on the top face side and the number of the electrodes patterns 7 on the bottom face side are four.

First, the sequencer 139 generates coordinates to designate the position on the operation face as a measurement target (S21). The operation is the same as that of the processing S1 of the sequencer 37 described in the first example. The coordinates values X and Y generated as above are given to the de-multiplexer 37, the multiplexer 39, and the determination section 53.

Next, the sequencer 139 waits for detection of falling edge of the input pulse signal (S22). If the edge is detected, the sequencer 139 outputs an enable signal to the measurement section 51 (S23). The output timing of the enable signal corresponds to the foregoing falling timing ta. In response to input of the enable signal, measurement function of the measurement section 51 becomes effective. That is, measurement of the elapsed time T is started.

After that, the sequencer 139 waits for incoming of the timing tb when charge by the current source 137 is started (S24).

If incoming of the timing tb is detected, the sequencer 139 enables the current source 137, and starts charge of the capacitance C (S25).

Next, the sequencer 139 waits for elapse of the time tc (max) corresponding to the reference elapsed time T0 (S26). The time tc (max) is given as timing when the potential crosses the reference potential Vref in the case where the peak level detected for the detection signal when the capacitance formed between the operation face and a finger is 0 (zero) is charged from the timing of the time tb.

In this example, if elapse of the time tc (max) is detected, the sequencer 139 outputs a disable signal to the measurement section 51 as well (S27). In response to input of the disable signal, the measurement function of the determination section 51 becomes ineffective, since it is not necessary to continue measurement operation after the possible maximum value of the elapsed time T. It is needless to say that after the measurement function becomes ineffective, the elapsed time T measured while the measurement function is effective is retained as well.

After that, the sequencer 139 outputs an interruption request to the determination section 53 (S28). The determination section 53 to which the interruption request is inputted determines whether or not a finger touches the coordinate position given from the sequencer 139 based on a result of comparison between the detected elapsed time T and the reference elapsed time T0 (set for every measurement point). For the comparison processing, the reference elapsed time T0 corresponding to the measurement point given from the sequencer 139 is used.

After that, the sequencer 139 determines whether or not a stop request exists (S29). If the stop request is not confirmed, the sequencer 139 returns to the generation operation of the XY coordinates again to repeat the foregoing operation. If the stop request is confirmed, the sequencer 139 finishes the operation.

[G-4. Conclusion]

As described above, due to adoption of the capacitance change measuring circuit 133 according to the sixth example, extremely high speed determination operation compared to the existing technologies is able to be realized.

It is needless to say that in the case of the sixth example, even when emergence timing of the peak level is largely shifted according to the size of a capacitance formed between the operation face and a finger, accurate measurement of the elapsed time T is enabled. Therefore, determination precision of input operation is able to be improved.

[H. Seventh Example]
[H-1. Detection Principle]

In the case of the foregoing examples, the descriptions have been given of the cases that the peak level of positive period of the detection signal or the peak level of negative period of the detection signal is detected.

Figure 41:
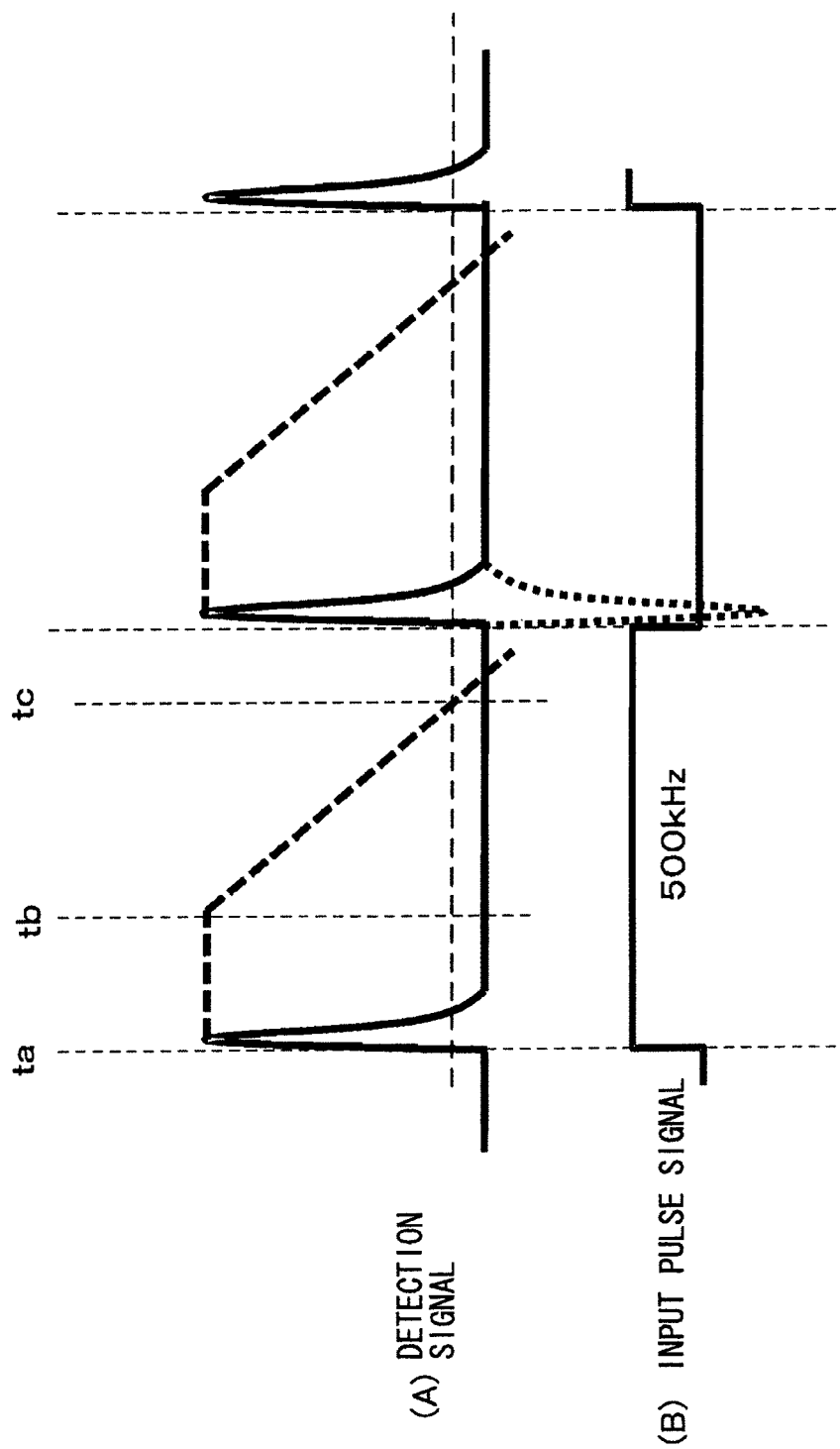
FIG. 41 is a diagram for explaining another example of detection operation of a peak level.

However, as illustrated in FIG. 41, it is possible that by changing the diode of the peak hold circuit to a both wave rectification circuit, both the peak level of positive period and the peak level of negative period may be detected.

The waveform indicated by a full line in part (A) of FIG. 41 is a detection signal, and the waveform indicated by a dotted line in part (A) of FIG. 41 is a holding potential of the capacitance C. Part (B) of FIG. 41 illustrates a waveform of the input pulse signal.

As illustrated in part (A) of FIG. 41, though the frequency of the input pulse signal is 500 kHz, determination operation is able to be executed at the double rate thereof. It is needless to say that it is premised on the condition that time from rising edge of the input pulse signal to determination end is completed within half a period of the input pulse signal.

Thus, as in the case of the foregoing fourth example, the current value of the current source is desirably able to be increased to decrease time necessary for determination.

A description will be given of an example of a capacitive sensor module adopting the detection principle.

[H-2. System Configuration]

Figure 42:
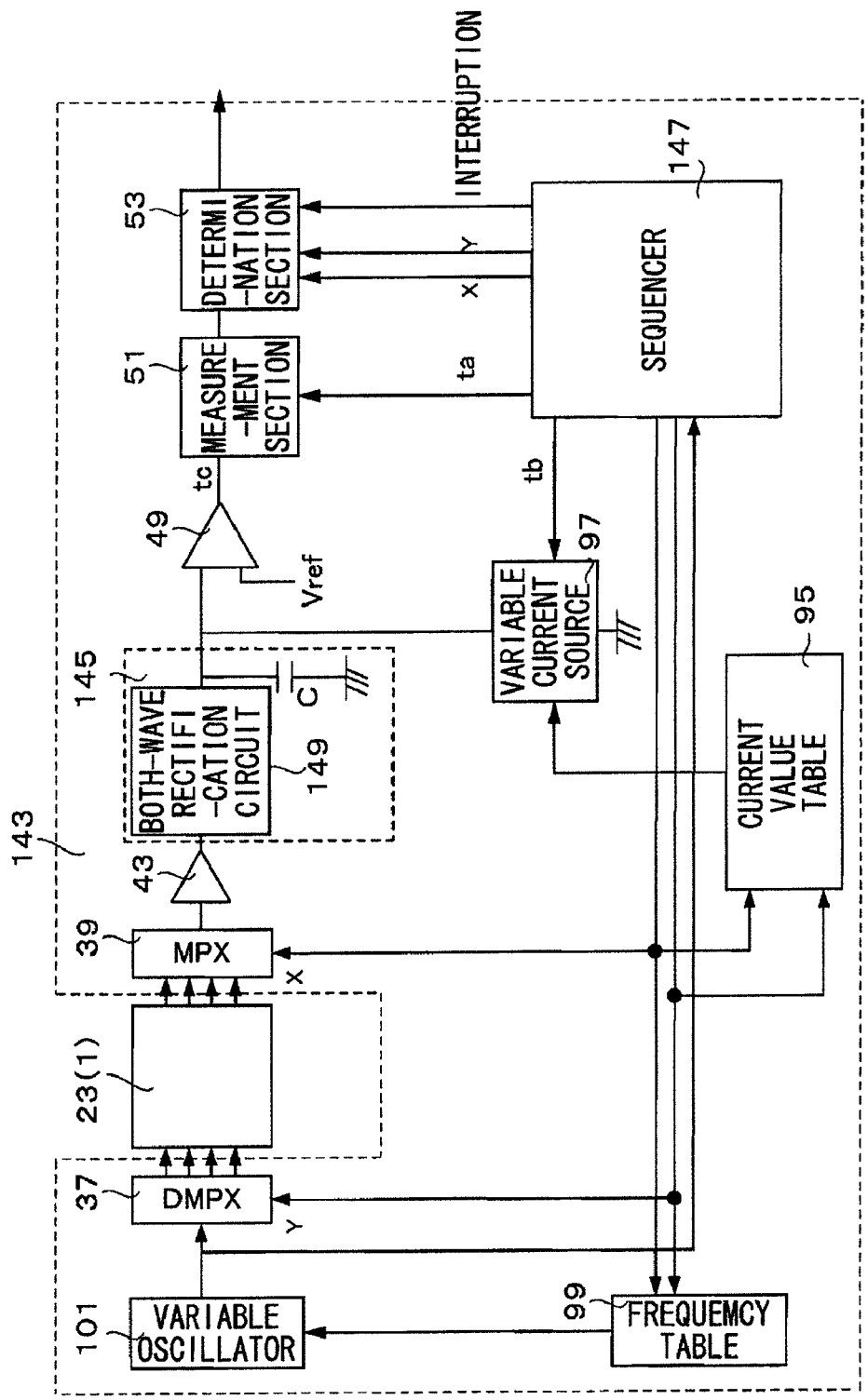
FIG. 42 is a diagram for explaining an example of system of a capacitive sensor module.

FIG. 42 illustrates an example of system configuration of a capacitive sensor module 141 according to this example. In FIG. 42, the same referential symbols are affixed to the elements corresponding to those of FIG. 27 according to the fourth example.

The capacitive sensor module 141 includes the capacitive sensor device 23 and a capacitance change measuring circuit 143.

The capacitance change measuring circuit 143 includes the de-multiplexer 37, the multiplexer 39, the current amplifier 43, the comparator 49, the measurement section 51, the determination section 53, the current value table 95, the variable current source 97, the frequency table 99, the variable oscillator 101, a peak hold circuit 145, and a sequencer 147.

A description will be hereinafter given of the peak hold circuit 145 and the sequencer 147 including change points.

The peak hold circuit 145 includes a both-wave rectification circuit 149 and the capacitance C. The both-wave rectification circuit 149 is a circuit referred to as an absolute value circuit as well.

The sequencer 147 is a circuit that outputs connection order to the electrode patterns 5 to which the input pulse signal is supplied and connection order to the electrode patterns 7 as an extraction source of the detection signal in sync with the input pulse signal. The sequencer 147 manages control timing based on rising edge and falling edge of the input pulse signal.

[H-3. Contents of Processing Operation]

Figure 43:
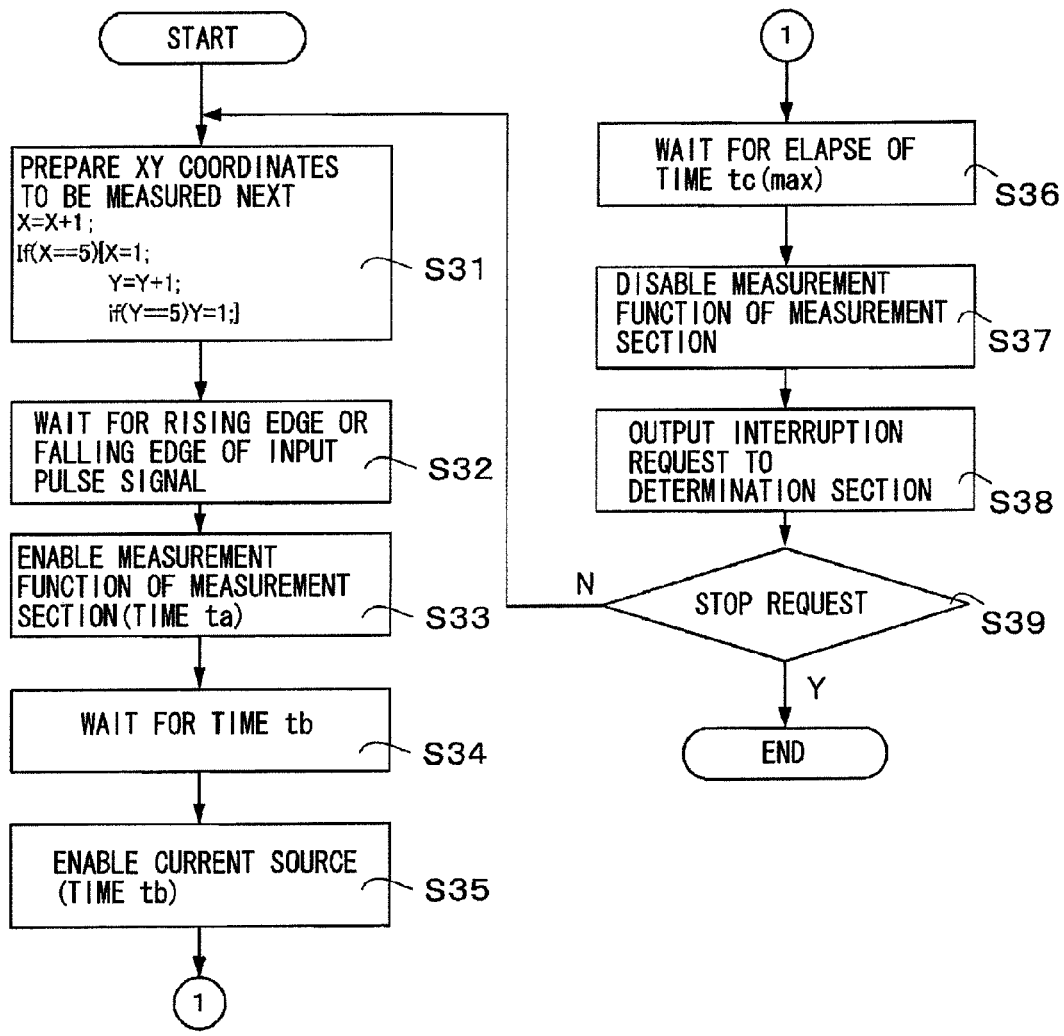
FIG. 43 is a diagram for explaining an example of operation of a sequencer.

A description will be hereinafter given of processing operation of the capacitive sensor module 141 according to the operation flow of the sequencer 147 (FIG. 43). FIG. 43 illustrates a case that both the number of the electrode patterns 5 on the top face side and the number of the electrode patterns 7 on the bottom face side are four.

First, the sequencer 147 generates coordinates to designate the position on the operation face as a measurement target (S31). The coordinates values X and Y generated as above are given to the de-multiplexer 37, the multiplexer 39, the determination section 53, the current value table 95, and the frequency table 97.

Thereby, a current value suitable for the next measurement point is given from the current value table 95 to the variable current source 97. At the same time, a frequency suitable for the next measurement point is given from the frequency table 99 to the variable oscillator 101.

The variable current source 97 changes setting so that a current value suitable for the next measurement point is flown. The variable oscillator 101 outputs an input pulse signal having an optimal frequency for the measurement point. Further, in preparation for input of the input pulse signal, the de-multiplexer 37 and the multiplexer 39 are switching-controlled.

Meanwhile, the sequencer 147 waits for detection of rising edge or falling edge of the input pulse signal (S32). If one of the rising edge and the falling edge is detected, the sequencer 147 outputs an enable signal to the measurement section 51 (S33). The output timing of the enable signal corresponds to the foregoing rising timing ta. In response to input of the enable signal, measurement function of the measurement section 51 becomes effective. That is, measurement of the elapsed time T is started.

After that, the sequencer 147 waits for incoming of the time tb when discharge operation by the variable current source 97 is started (S34).

If incoming of the time tb is detected, the sequencer 147 enables the variable current source 97, and starts discharge of the capacitance C (S35).

Next, the sequencer 147 waits for elapse of the time tc (max) corresponding to the reference elapsed time T0 (S36). The time tc (max) is given as timing when the potential crosses the reference potential Vref in the case where the peak level detected for the detection signal when the capacitance formed between the operation face and a finger is 0 (zero) is discharged from the timing of the time tb.

In the case of this example, if elapse of the time tc (max) is detected, the sequencer 147 outputs a disable signal to the measurement section 51 as well (S37). In response to input of the disable signal, the measurement function of the measurement section 51 becomes ineffective, since it is not necessary to continue measurement operation after the possible maximum value of the elapsed time T. It is needless to say that after the measurement function becomes ineffective, the elapsed time T measured while the measurement function is effective is retained as well.

After that, the sequencer 147 outputs an interruption request to the determination section 53 (S38). The determination section 53 to which the interruption request is inputted determines whether or not a finger touches the coordinate position given from the sequencer 147 based on a result of comparison between the detected elapsed time T and the reference elapsed time T0.

For the comparison processing, the reference elapsed time T0 corresponding to the measurement point given from the sequencer 147 is used. It is needless to say that for the reference elapsed time T0, the determined value of a size of the applied reference potential Vref is prepared.

After that, the sequencer 147 determines whether or not a stop request exists (S39). If the stop request is not confirmed, the sequencer 147 returns to the generation operation of the XY coordinates again to repeat the foregoing operation. If the stop request is confirmed, the sequencer 147 finishes the operation.

[H-4. Conclusion]

As described above, in the case of the capacitance change measuring circuit 143 according to the seventh example, presence of input operation is able to be determined at a double rate of the frequency of the input pulse signal. Thereby, the scanning rate in view of the whole operation is able to be further speeded up.

[I. Other Examples]

[I-1. Other Example 1]

In the foregoing examples, the descriptions have been given of the peak hold circuit having the structure using the diode for detecting the peak level.

However, a peak hold circuit having a structure in which an analog switch is on-controlled in the vicinity of the emergence timing of the peak level may be used.

Figure 44:
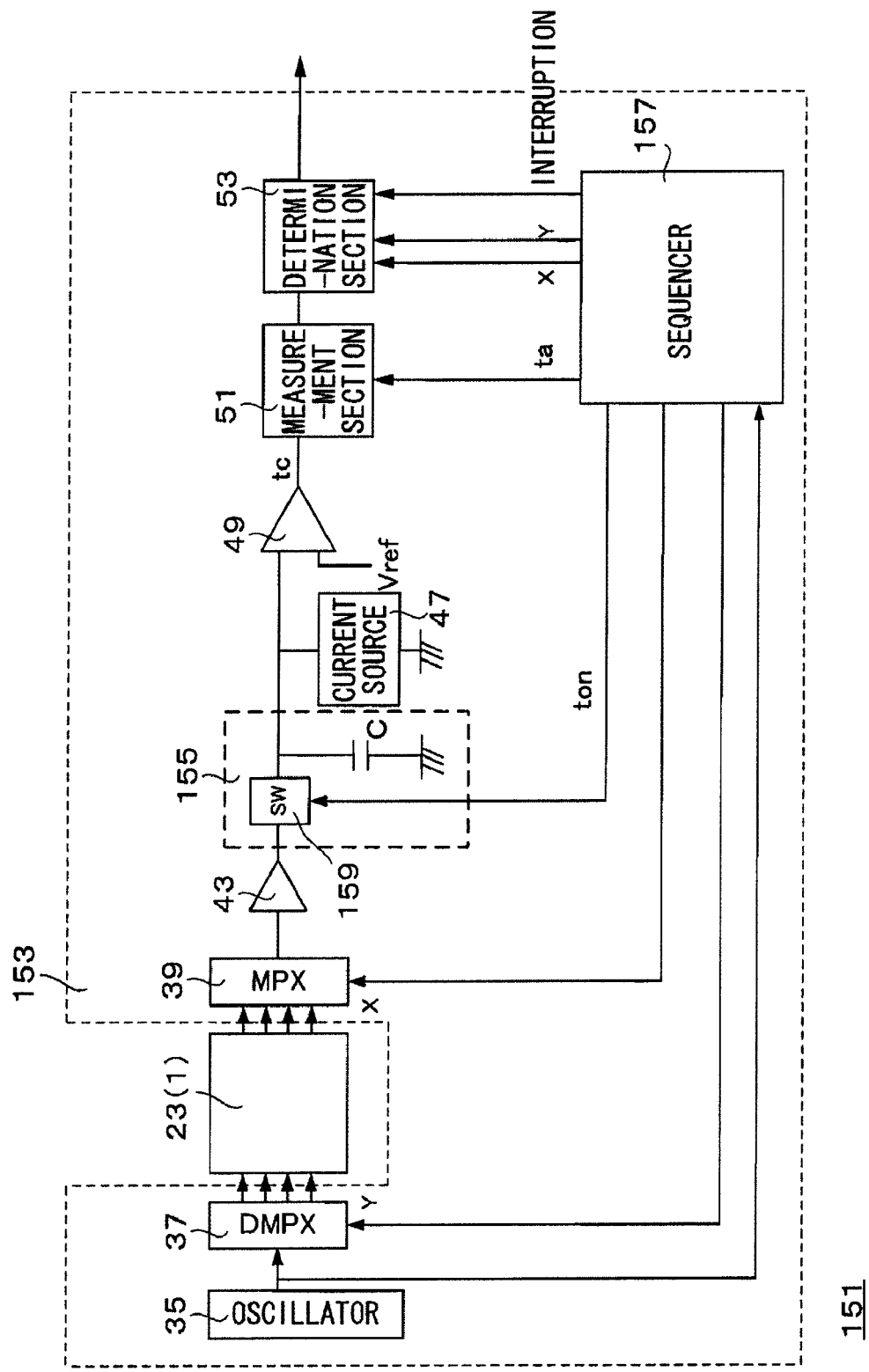
FIG. 44 is a diagram for explaining an example of system of a capacitive sensor module.

FIG. 44 illustrates an example of system configuration of a capacitive sensor module 151 according to this modified example. In FIG. 44, the same referential symbols are affixed to the elements corresponding to those of FIG. 7.

The capacitive sensor module 151 includes the capacitive sensor device 23 and a capacitance change measuring circuit 153.

The capacitance change measuring circuit 153 includes the de-multiplexer 37, the multiplexer 39, the current amplifier 43, the current source 47, the measurement section 51, the determination section 53, a peak hold circuit 155, and a sequencer 157.

The peak hold circuit 155 includes an analog switch 159 and the capacitance C. Opening and closing the analog switch 159 is controlled by the sequencer 157.

[I-2. Other Example 2]

In the foregoing examples, the descriptions have been given of the circuit structure in which the current amplifier is arranged in the precedent stage of the peak hold circuit to convert a detection current to a voltage. However, the current amplifier may not be used.

[I-3. Others]

For the foregoing examples, various modifications may be made within the scope of the invention. Further, various modifications and application examples that are created or combined based on the descriptions of the specification may be made.

[Second Embodiment]

Now, a second embodiment of the invention will be described.

Figure 1:
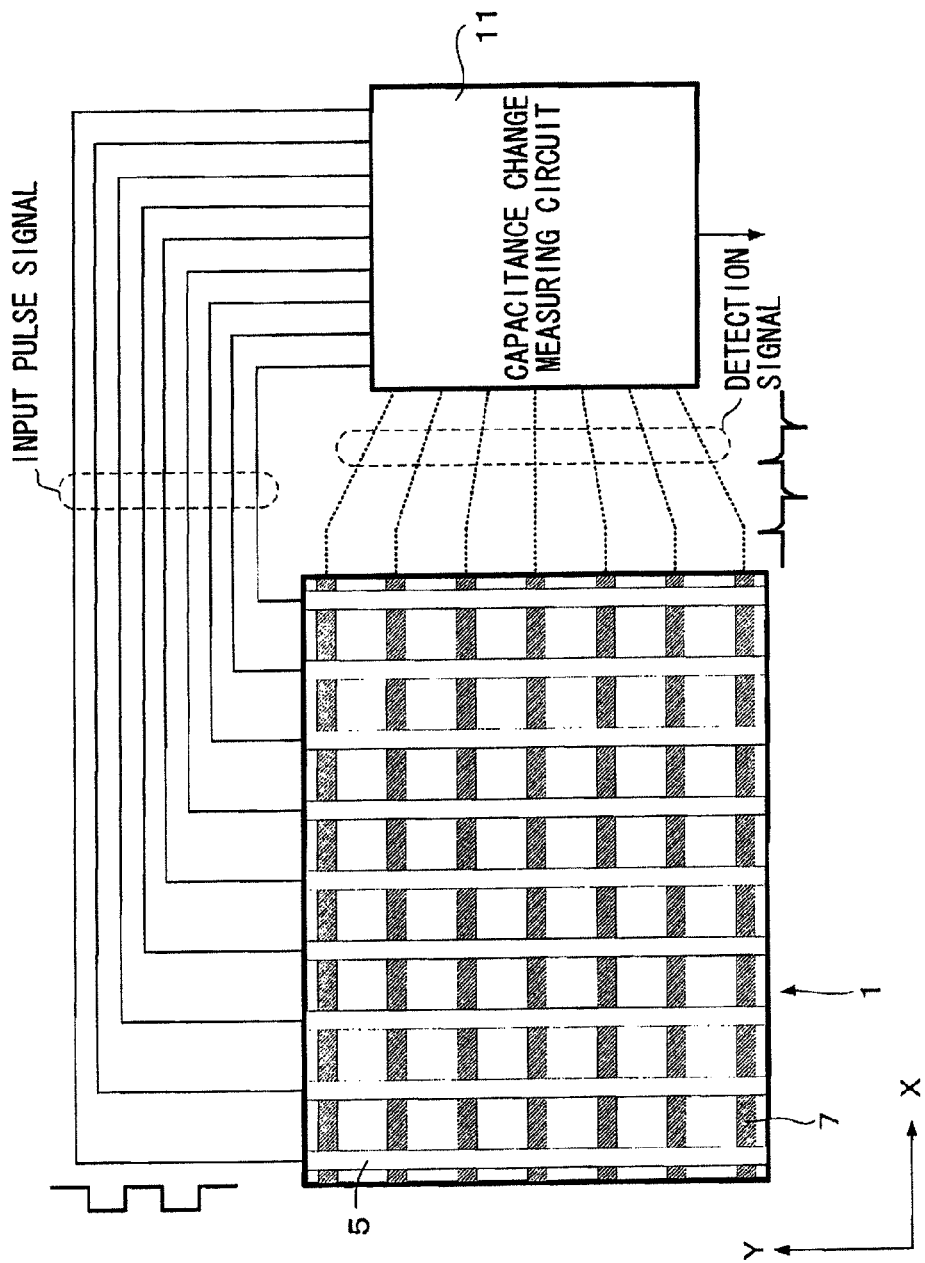
FIG. 1 is a diagram illustrating a schematic planar structure of a capacitive sensor module.
Figure 2:
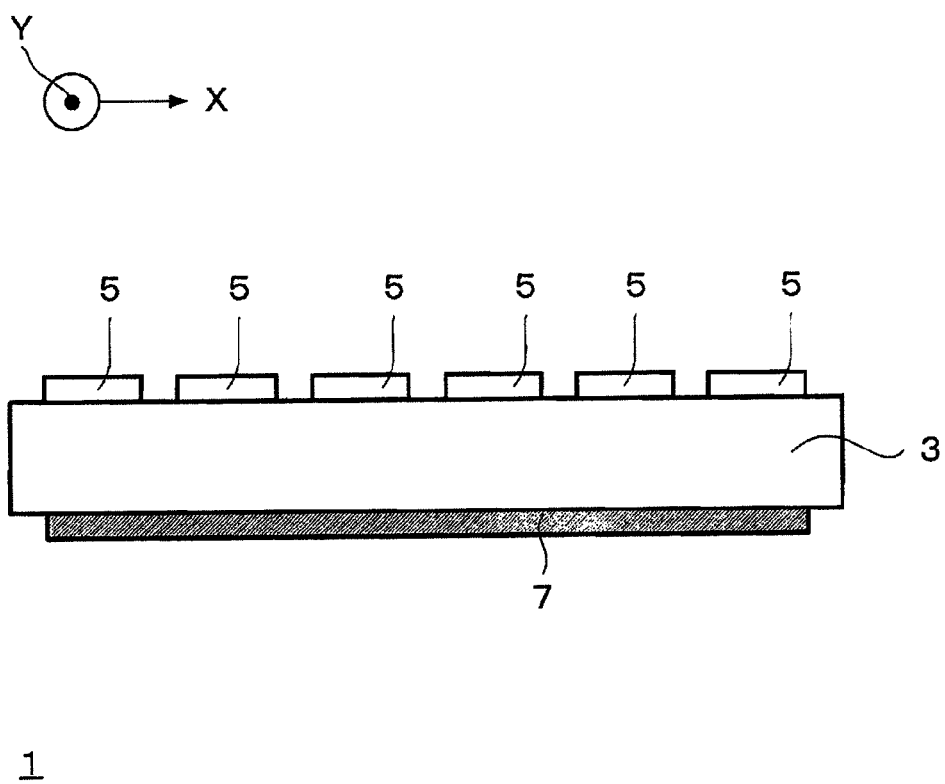
FIG. 2 is a diagram illustrating a schematic cross sectional structure of the capacitive sensor module.
Figure 3:
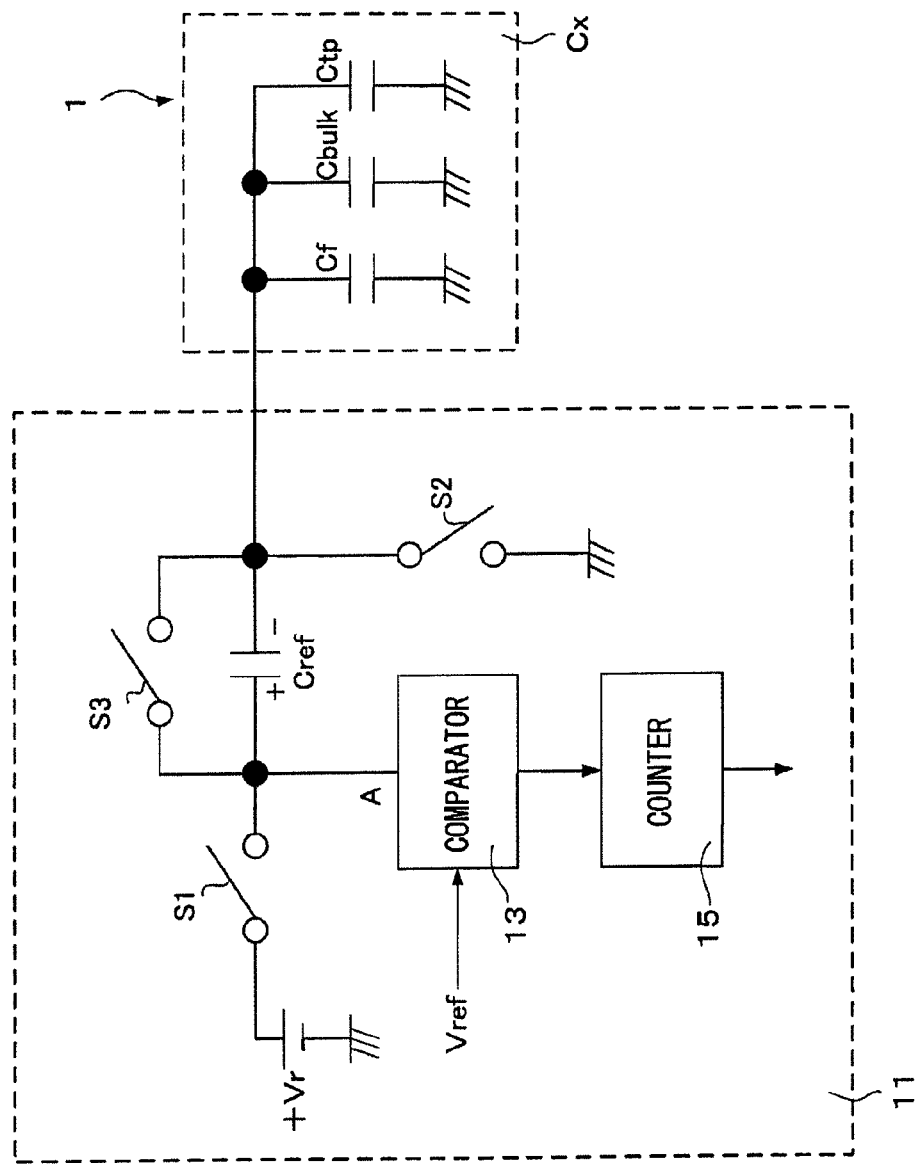
FIG. 3 is a diagram illustrating an existing structure of a capacitance change measuring circuit.
Figure 4:
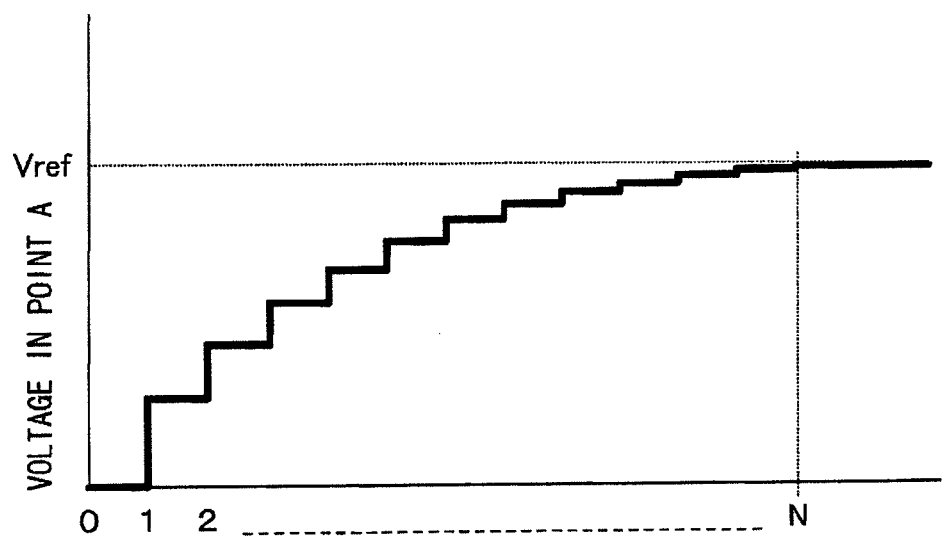
FIG. 4 is a diagram for explaining operation of the existing circuit.

As shown in FIGS. 1 and 2, the change amount of the electric characteristics as a detection target of the capacitance change measuring circuit 11 is generally small. On the other hand, the capacitance change measuring circuit 11 is demanded to have high detection precision. For example, for practical purposes, the capacitance change measuring circuit 11 is demanded to have precision of 2 ns. However, in order to realize such detection precision with the use of general synchronous clock, 500 MHz clock is necessitated.

In this embodiment, a technology using a low frequency operation clock capable of realizing detection precision equal to that of a case using a high frequency operation clock is proposed. Descriptions of the second embodiment of the invention will be given in the following order.

A. Functional structure of capacitive sensor module
B. First example: type of measuring elapsed time after peak hold (single strobe type)
C. Second example: type of measuring elapsed time after peak hold (sequential strobe type)
D. Third example: type of measuring rising time
E Fourth example: type of measuring elapsed time equivalent to pulse width
F. Other examples

[A. Functional Structure of Capacitive Sensor Module]

Figure 45:
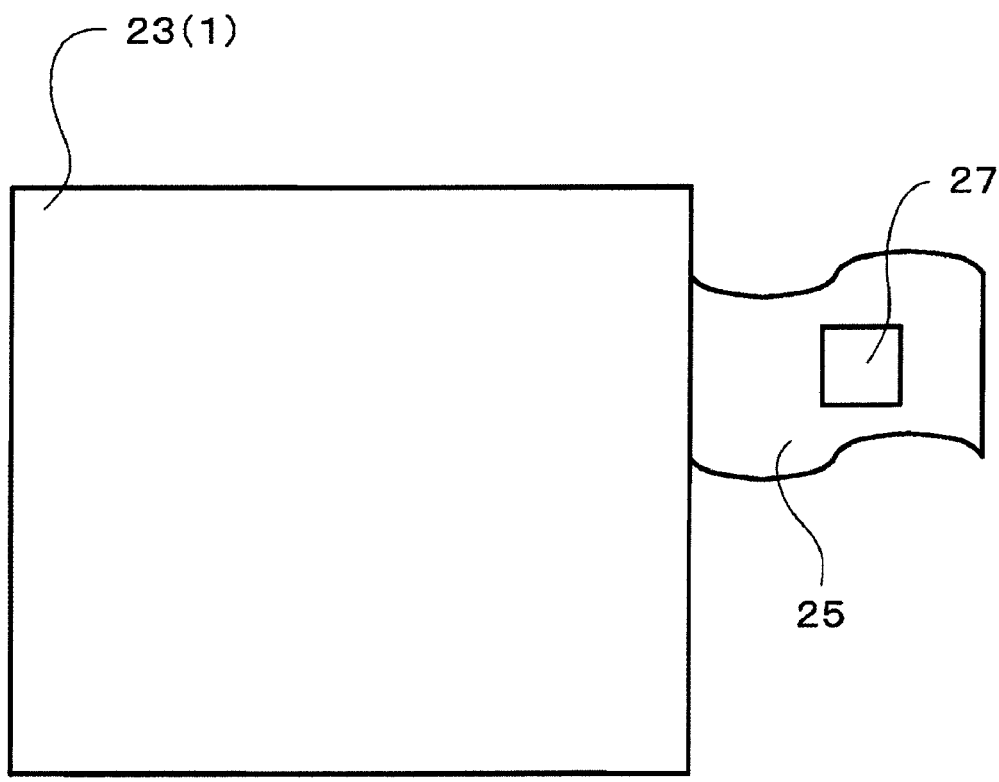
FIG. 45 is a diagram illustrating an example of appearance structure of a capacitive sensor module according to a second embodiment of the invention.
Figure 46:
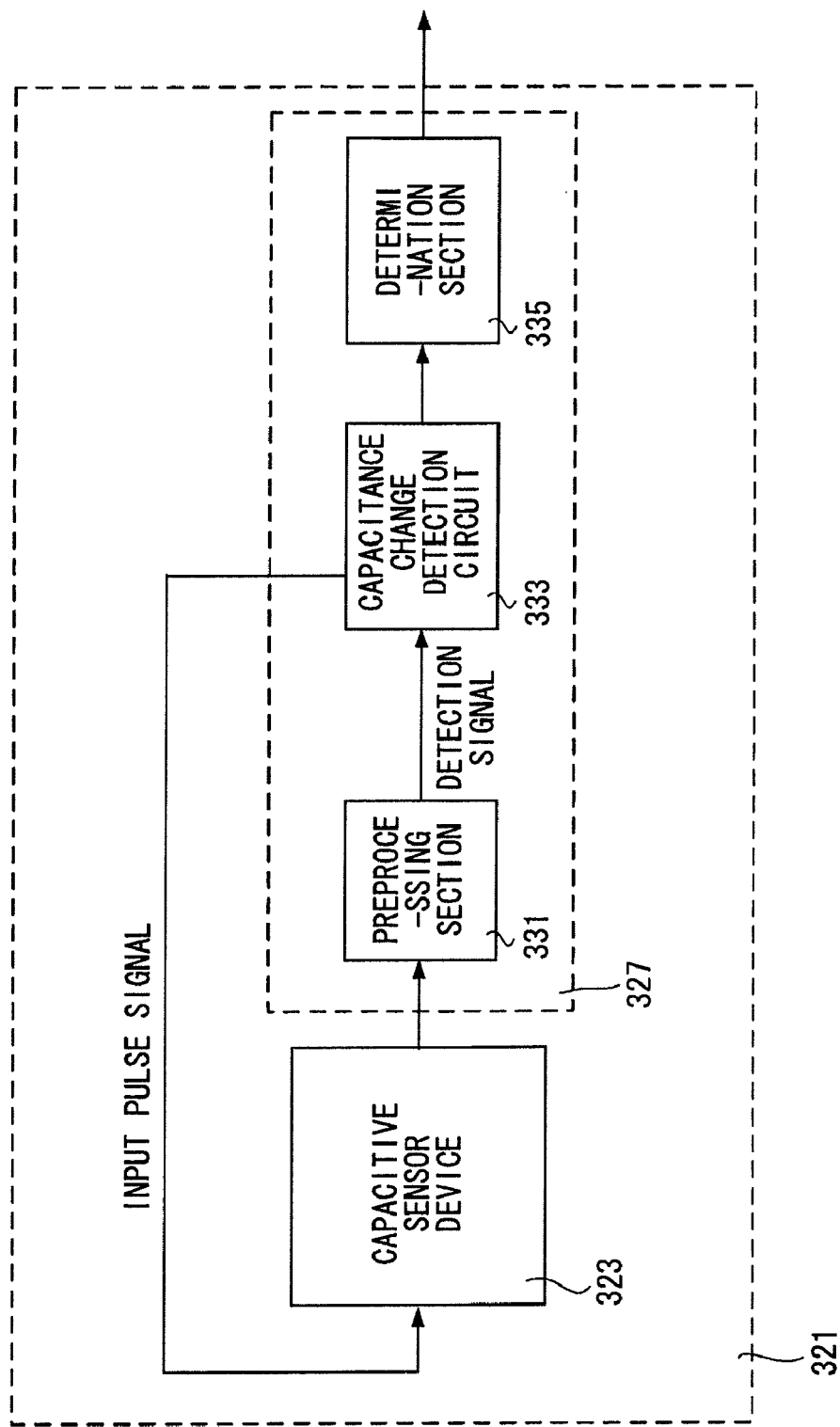
FIG. 46 is a diagram illustrating an example of functional structure of the capacitive sensor module.

FIG. 46 illustrates an example of structure in aspect of a function of a capacitive sensor module. The functional blocks in FIG. 46 corresponding to those in FIG. 45 are affixed with the same referential symbols. A capacitive sensor module 321 viewed from the functional aspect also includes a capacitive sensor device 323 and a capacitance change measuring circuit 327.

The capacitance change measuring circuit 327 is a circuit device realizing a function of supplying an input pulse signal to the capacitive sensor device 323 and a function of measuring change shown in the response waveform thereof. In the case of FIG. 46, the capacitance change measuring circuit 327 basically includes a preprocessing section 331, a capacitance change detection circuit 333, and a determination section 335.

Of the foregoing, the preprocessing section 331 is a processing circuit for executing preprocessing for the response waveform inputted from the capacitive sensor device 323. The preprocessing herein includes, for example, amplification processing of the response waveform, peak hold treatment of the response waveform and the like. Processing type to be executed is determined according to a relation with processing operation of the capacitance change detection circuit 333 and the determination section 335 located in the subsequent stage. In FIG. 46, though the preprocessing section 331 is arranged in the precedent stage of the capacitance change detection circuit 333, the preprocessing section 331 is not always necessary. That is, the minimum structure of the capacitance change measuring circuit 327 includes the capacitance change detection circuit 333 and the determination section 335.

Thus, in the case of using the preprocessing section 331, the detection signal in the specification means an output signal of the preprocessing section 331, and in the case of not using the preprocessing section 331, the detection signal in the specification means an output signal of the capacitive sensor device 323.

The capacitance change detection circuit 333 is a circuit device that detects change generated in a capacitance component of a closed circuit as a measurement target as waveform change of the detection signal. The capacitance change detection circuit 333 detects the waveform change of the detection signal as a measurement amount determined by a change point shown in a result of comparison between the detection signal and a reference value. A specific detection method will be described in the after-mentioned respective examples.

The determination section 335 is a circuit device that determines whether or not change of the capacitance component is generated in the closed circuit as a measurement target based on the detection result of the capacitance change detection circuit 333. That is, the determination section 335 is a circuit device that determines presence of input operation using a human body or an object having electric characteristics equal to those of the human body based on the change of the measurement amount detected by the capacitance change detection circuit 333.

[B. First Example]
[B-1. Detection Method]

Figure 47:
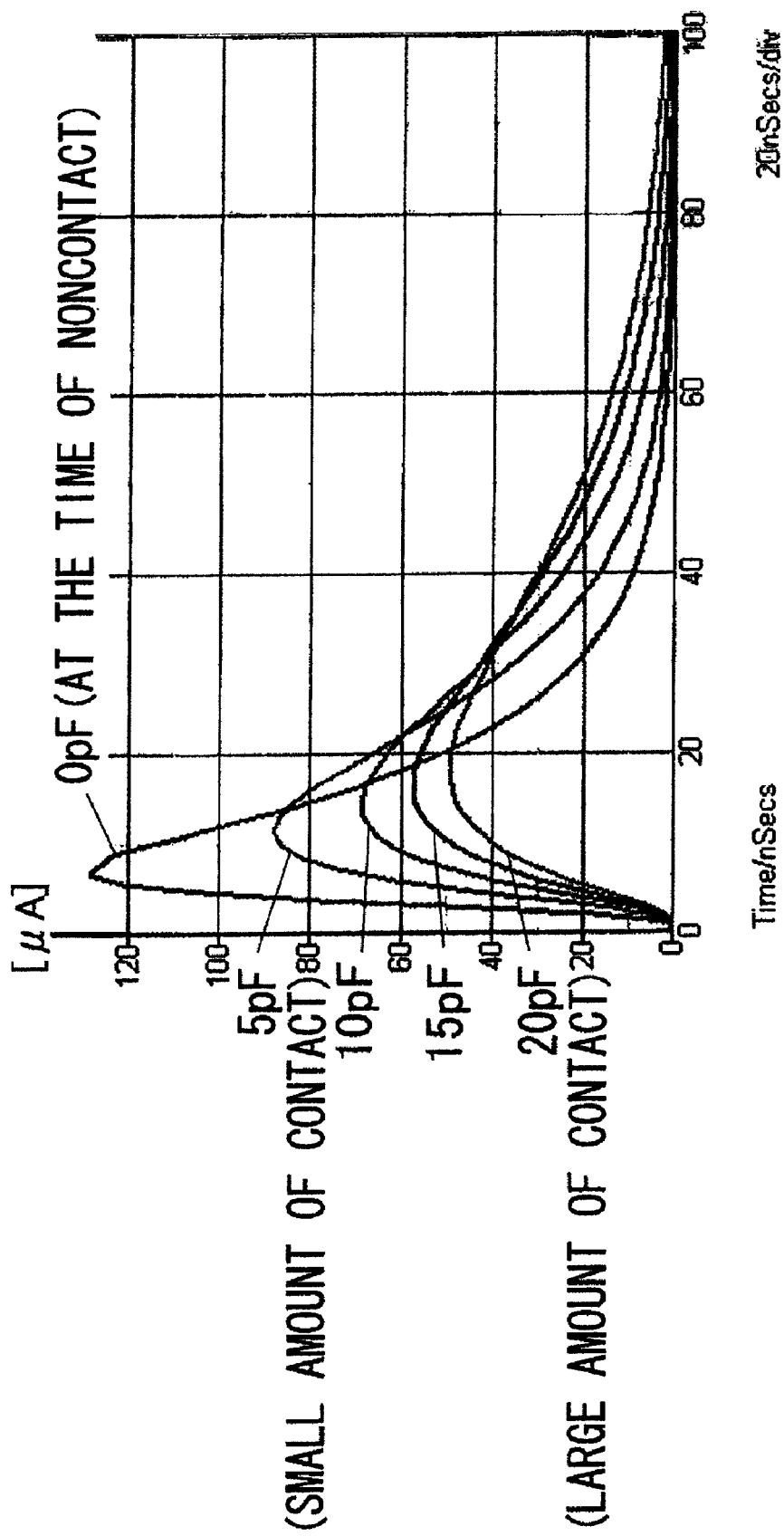
FIG. 47 is a diagram for explaining a shape of a response waveform with respect to an input pulse signal.

In this example, attention is focused on a positive peak level of a response waveform to an input pulse signal. FIG. 47 illustrates waveform change of a response waveform focusing attention on a certain measurement point (closed circuit). In the figure, the horizontal axis indicates elapsed time from falling timing of an input pulse signal. In the figure, the vertical axis indicates a current amount corresponding to the response waveform.

As illustrated in FIG. 47, the peak level in the case where a finger does not touch the operation face is the highest. The larger a capacitance component formed between a finger and the operation face is, the smaller a peak level is. That is, as the contact area between a finger and the operation face is increased, the peak level is decreased. Change in the amplitude direction shown in the peak level is common to any case not depending on the position on the operation face.

Thus, in this example, the peak level of the response waveform is stored in a peak hold circuit, which is extracted by a constant current source, and time until a peak hold voltage becomes a reference value or less is measured, and thereby, the amplitude change of the peak level is detected.

However, an emergence position of the peak level tends to be shifted in the time axis direction according to the state of contact between the operation face and a finger. In the case of FIG. 47, there is a shift of 10 ns or more. It means that there is a shift in each measurement start time, and the measurement results include an error. Thus, it is desirable to obtain a mechanism to exclude the error and improve detection precision. Therefore, in the case of this example, a mechanism to conform time to start extraction of the peak hold voltage is adopted.

Figure 48:
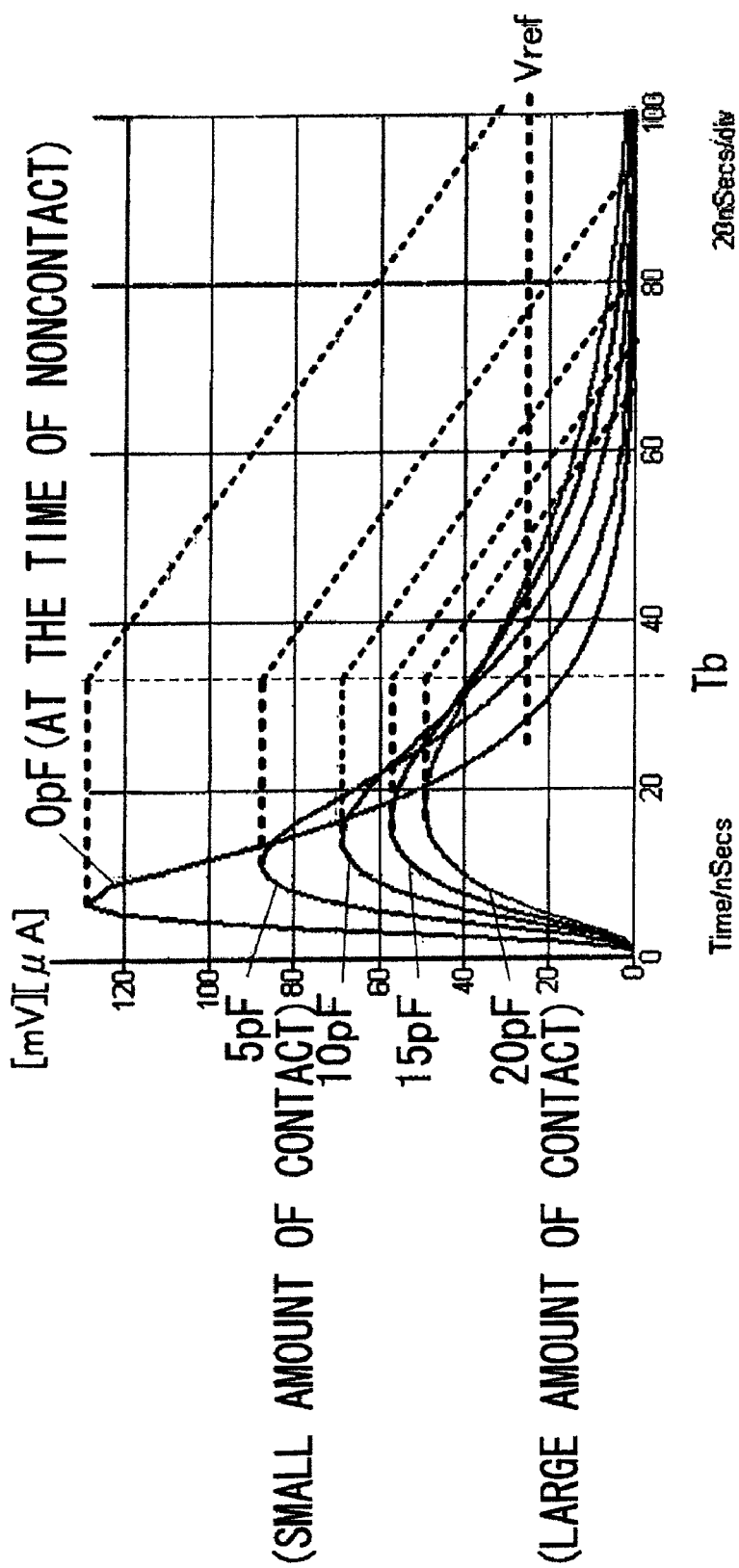
FIG. 48 is a diagram for explaining a potential change when a peak hold voltage is discharged.

FIG. 48 illustrates a mechanism adopted in this example. The horizontal axis in the figure indicates elapsed time from falling timing of the input pulse signal. The vertical axis in the figure indicates a current amount and a voltage corresponding to a response waveform. As illustrated in FIG. 48, in this example, time to start extraction of the peak hold voltage is set to the time Tb after a time position in which a peak level is possibly emerged.

By the foregoing setting, each discharge start time is able to be conformed not depending on the shape of a response waveform. Accordingly, only time difference due to difference of peak level is able to be accurately measured. A description will be hereinafter given of an example of the capacitive sensor device 323 adopting such a detection method.

[B-2. System Configuration]
[1. Whole Structure]

Figure 49:
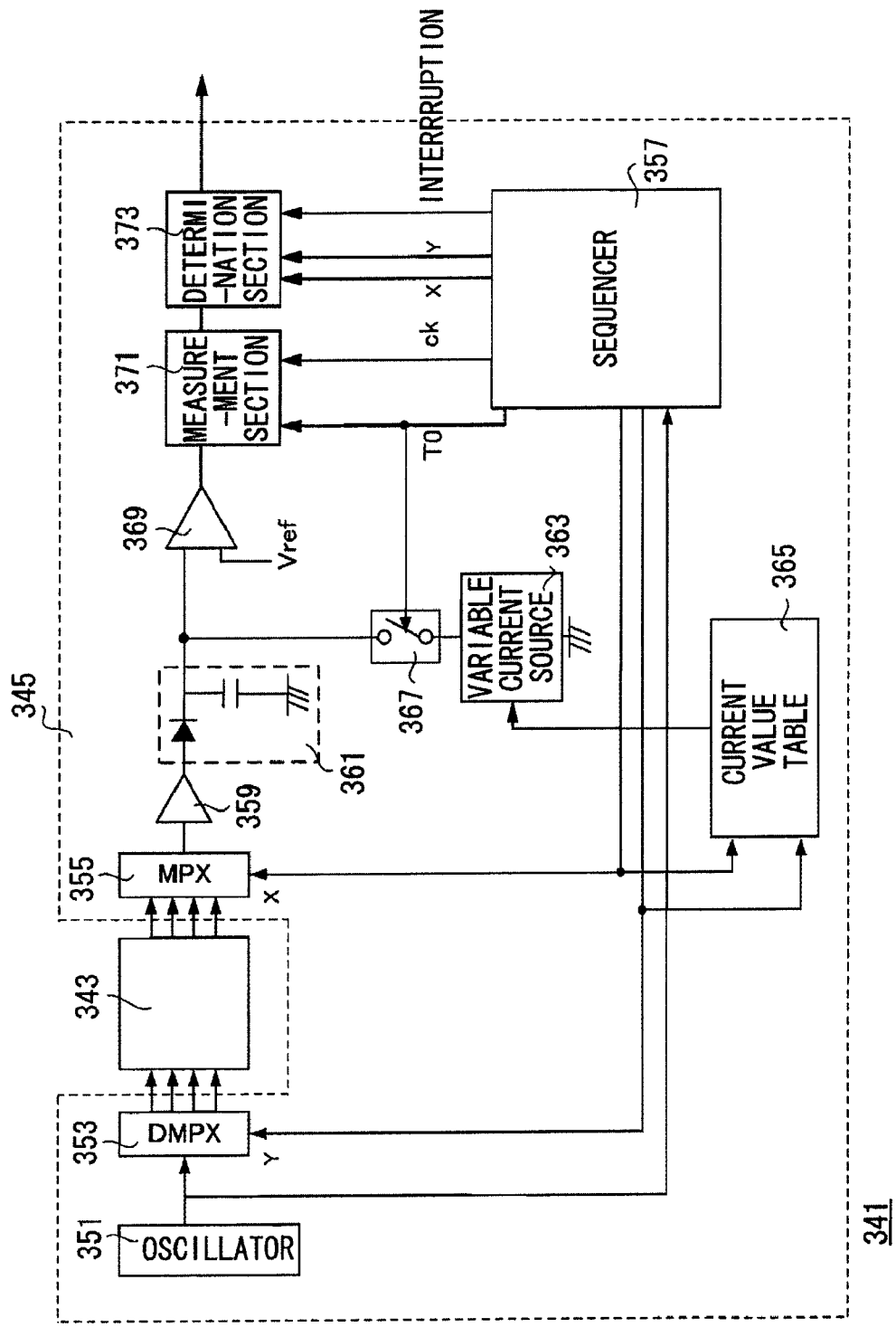
FIG. 49 is a diagram illustrating an example of the capacitive sensor module.
Figure 50:
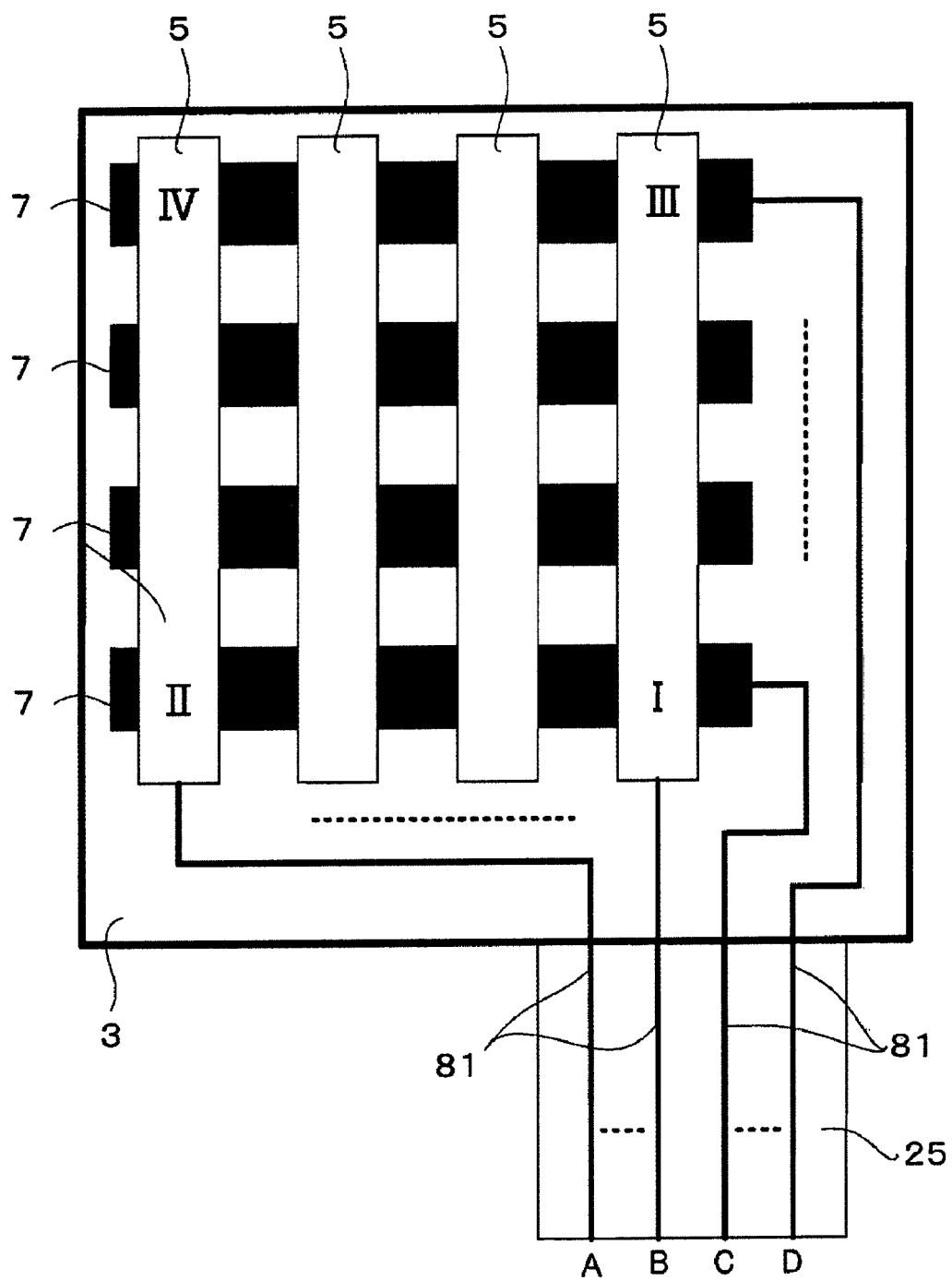
FIG. 50 is a diagram for explaining a difference in length of propagation paths formed on an operation face.
Figure 51:
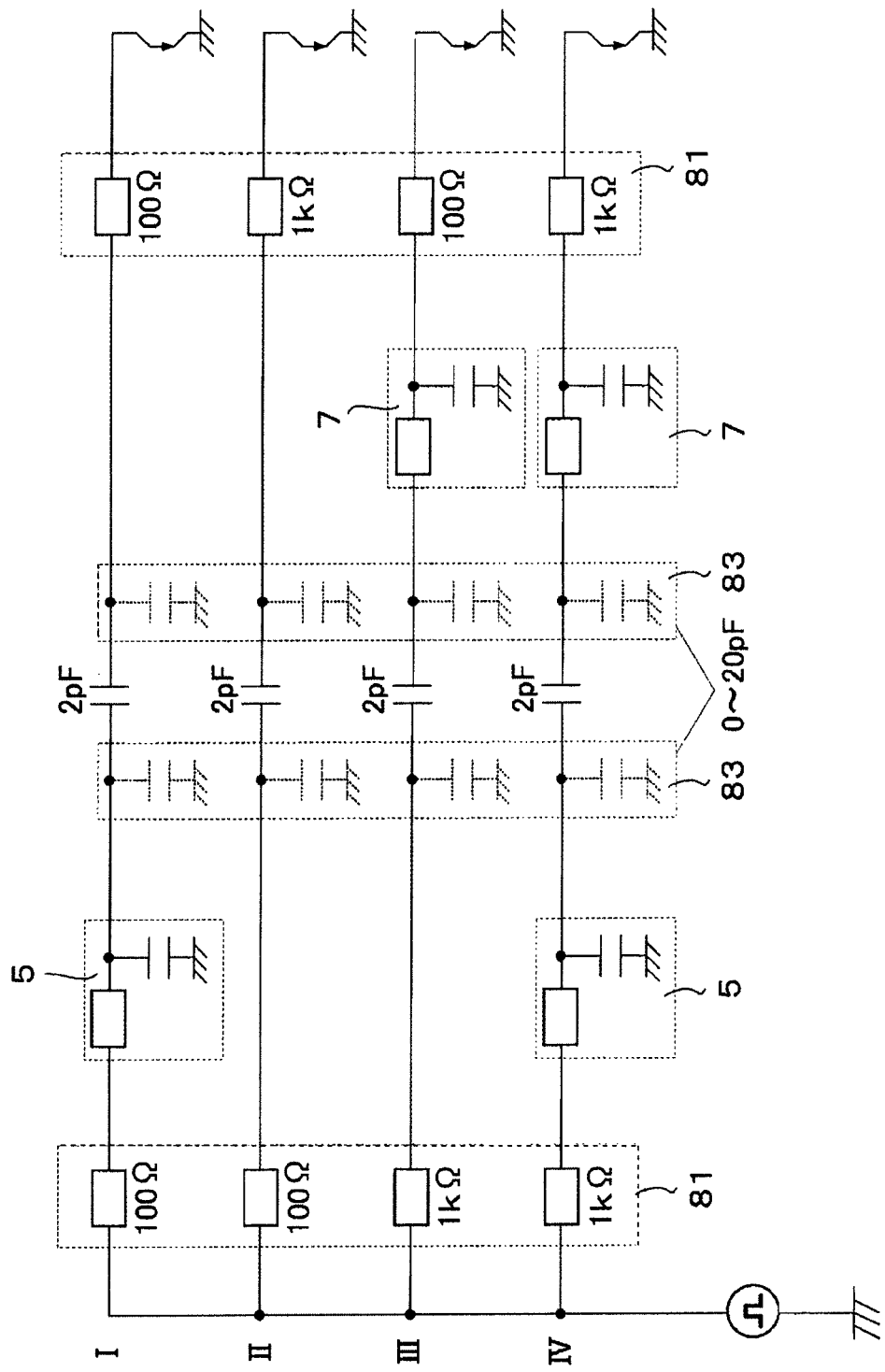
FIG. 51 is a diagram illustrating an equivalent circuit of the propagation paths formed on the operation face.
Figure 53:
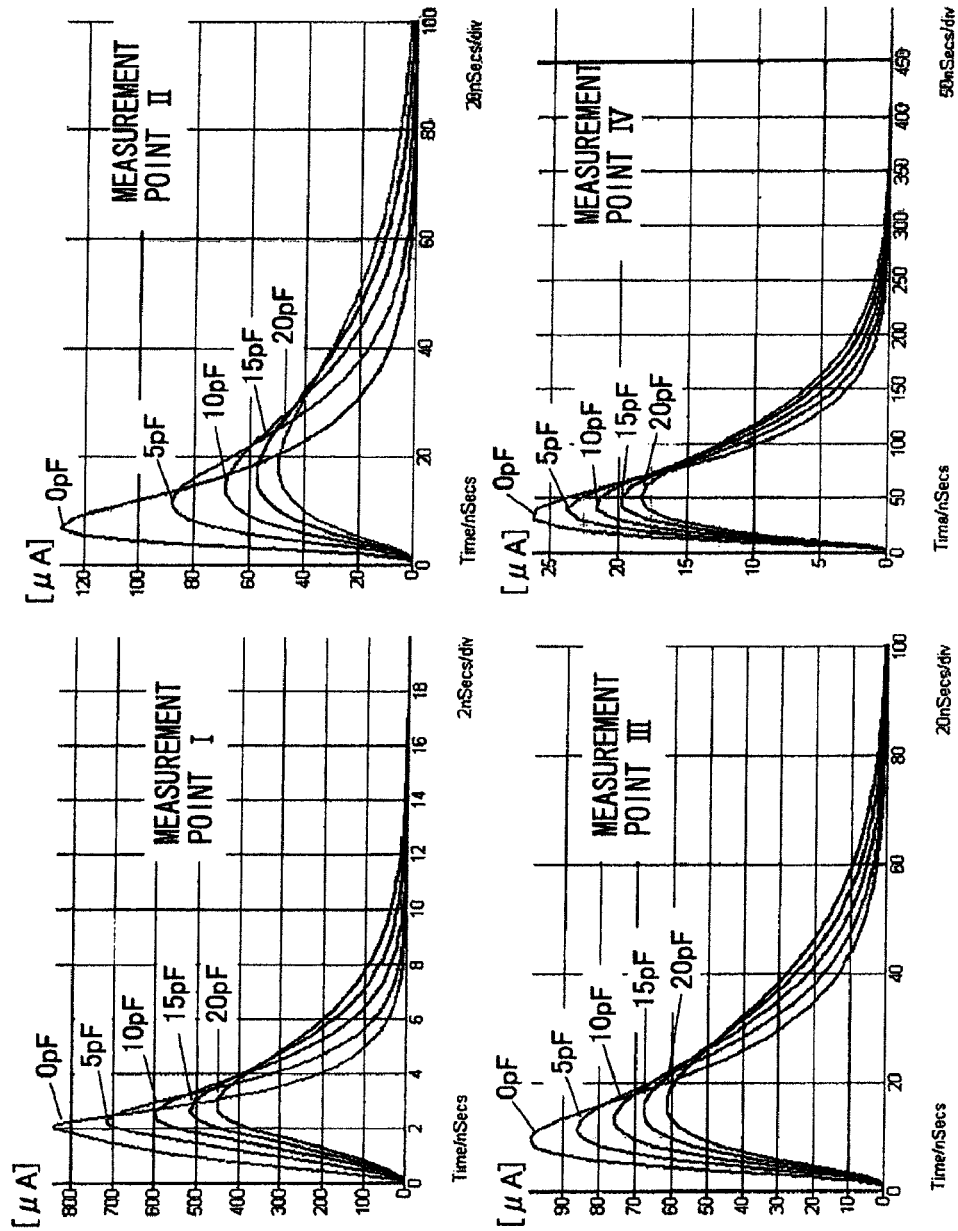
FIG. 53 is a diagram illustrating a change in detection waveform corresponding to each measurement point.

FIG. 49 illustrates an example of system configuration of a capacitive sensor module 341 according to this example. In the capacitive sensor module 341, a capacitive sensor device 343 is simply illustrated.

The capacitive sensor module 341 includes the capacitive sensor device 343 and a capacitance change measuring circuit 345.

The capacitance change measuring circuit 345 includes an oscillator 351, a de-multiplexer 353, a multiplexer 355, a sequencer 357, a current input voltage output type amplifier 359, a peak hold circuit 361, a variable current source 363, a current value table 365, a discharge control switch 367, a comparator 369, a measurement section 371, and a determination section 373.

[2. Oscillator]

The oscillator 351 is a circuit that generates an input pulse signal in the shape of a square with a previously set fixed frequency.

However, the waveform of the input pulse signal is not limited to the square wave, but may be other shape such as a sine wave and a triangle wave. In this example, the oscillator 351 generates an input pulse signal with frequency of 500 kHz.

[3. De-Multiplexer]

The de-multiplexer 353 is a circuit to switch a supply destination of the input pulse signal in the order directed by the sequencer 357. The supply destination of the input pulse signal is one of the plurality of electrode patterns 5.

[4. Multiplexer]

The multiplexer 355 is a circuit to switch among the electrode patterns 7 from which a response waveform is extracted in the order directed by the sequencer 357.

[5. Sequencer]

The sequencer 357 is a circuit that outputs connection order to the electrode pattern 5 to which the input pulse signal is supplied and connection order to the electrode pattern 7 as an extraction source of the response waveform as coordinate information (X, Y). In this example, the sequencer 357 manages control timing in sync with falling edge of the input pulse signal.

In this example, the sequencer 357 generates control timing for the discharge control switch 367, the measurement section 371, the determination section 373 and the like. For example, the sequencer 357 supplies the discharge control switch 367 with a timing pulse to exercise control to close the discharge control switch 367 after the reference time Tb elapses from the falling edge of the input pulse signal. The reference time Tb is timing to start discharge of a peak hold value by the variable current source 363. As described for FIG. 48, the reference time Tb is set to time on and after the timing when the peak level of the response waveform emerges.

Further, for example, the sequencer 357 supplies the measurement section 371 with a timing pulse to give timing when a comparison output signal inputted from the comparator 369 into a storage region. Further, for example, the sequencer 357 supplies the determination section 373 to determine presence of input operation to a measurement point with control timing.

[6. Current Input Voltage Output Type Amplifier]

The current input voltage output type amplifier 359 is a circuit to amplify the response waveform extracted from the capacitive sensor device 343. In the current input voltage output type amplifier 359, the signal format of the response waveform is converted from current format to voltage format.

[7. Peak Hold Circuit]

The peak hold circuit 361 is a circuit to detect the peak level on the positive side of the detection signal. As illustrated in FIG. 49, the peak hold circuit 361 includes the diode D and the capacitance C.

The diode D is used to extract only the positive section of the detection signal by rectification function. Further, the capacitance C is used to store a potential corresponding to the peak level of the detection signal.

[8. Variable Current Source]

The variable current source 363 is a constant current circuit capable of realizing a variability of a current value, and is used to discharge an electric charge of the capacitance C structuring the peak hold circuit 361. The current value of the variable current source 363 is variably designated according to direction of the current value table 365. Any current value is set so that that determination operation is able to be finished within one period after starting application of the input pulse signal. Specifically, setting is made so that in a time period until supplying the next input pulse signal, discharge is made so that the potential of the capacitance C as a measurement target is lowered down to the reference potential Vref or less. In the specification, the discharge operation is referred to as "initialization operation".

[9. Current Value Table]

The current value table 365 is a storage region to store coordinates of a measurement point and the current value to be given to the variable current source 363 correspondingly. The current value is variably changed according to the measurement point, in order to adjust a lowering rate of a hold voltage of the capacitance C. Specifically, the current value is variably changed according to the measurement point, in order to limit emergence range of timing when an electric charge of the capacitance C is lowered down to the reference potential Vref or less to within the measurement range of the measurement section 371. A reason why variable control of the current value is desirable has been already given in detail above with reference to FIGS. 16 to 20.

Figure 54:
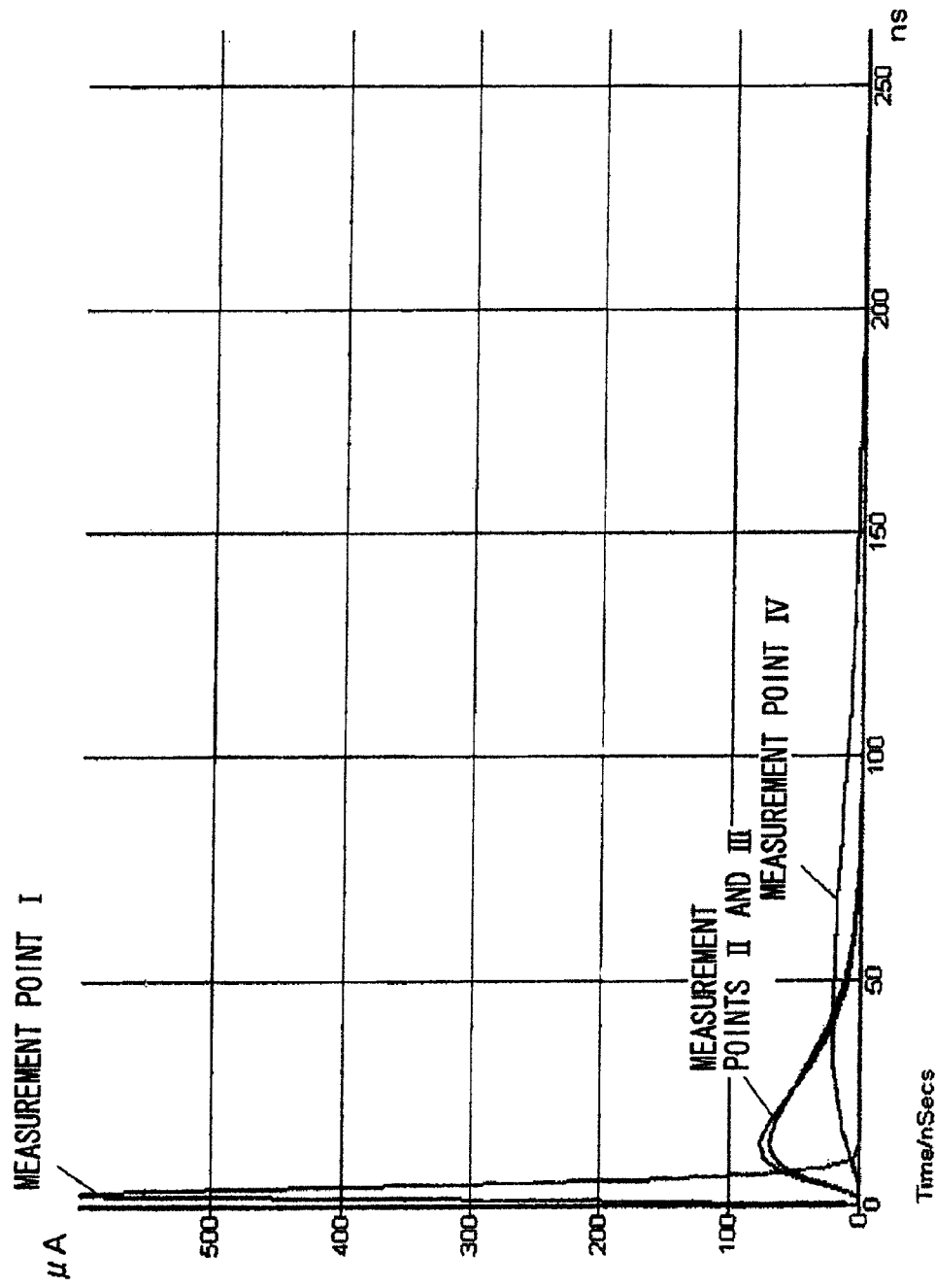
FIG. 54 is a diagram for explaining a difference of amplitudes of the detection waveforms corresponding to the measurement points.
Figure 55:
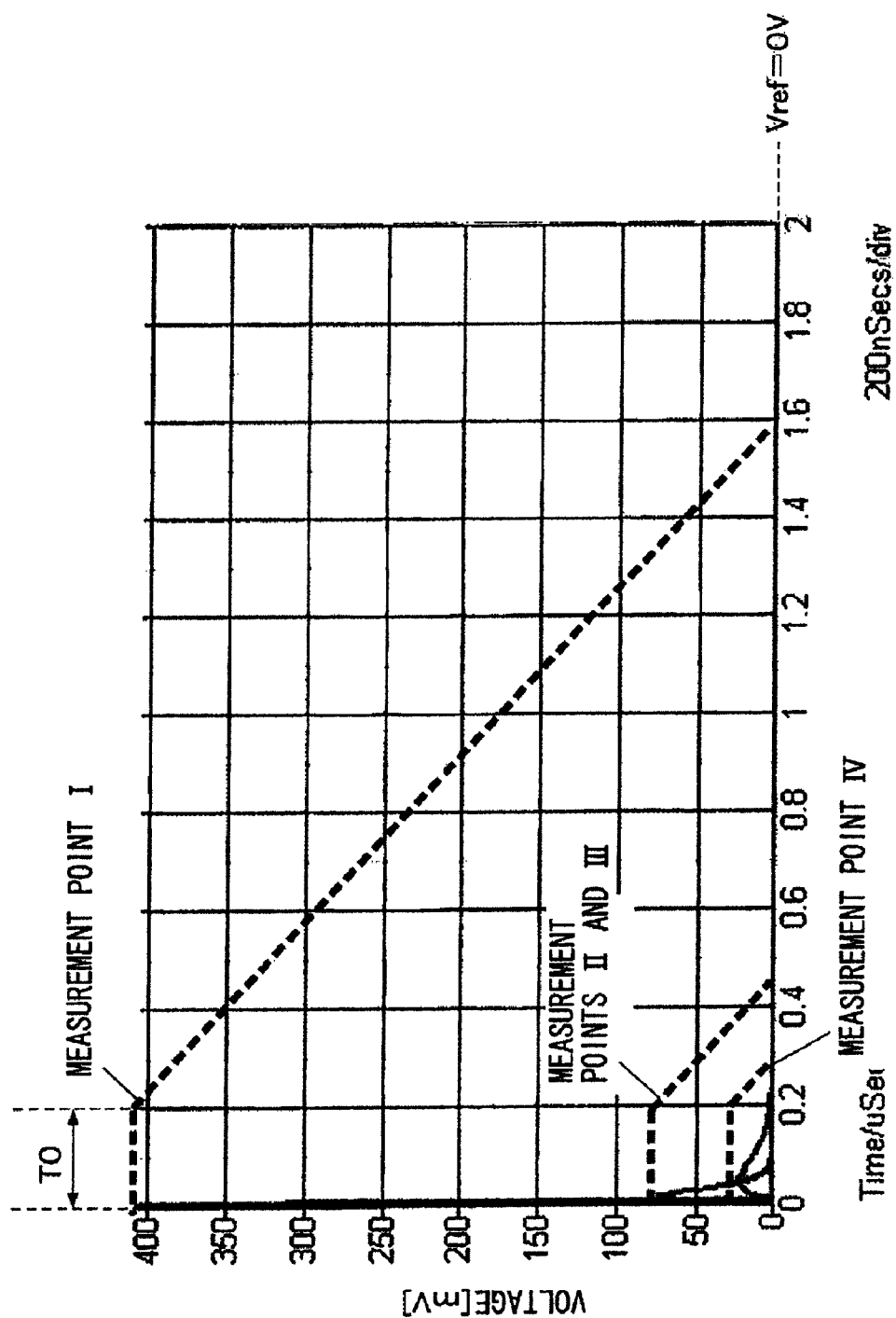
FIG. 55 is a diagram for explaining a difference in measurement time lengths according to the difference of amplitudes of the detection waveforms.

As illustrated in FIG. 54, it can be seen that in the case where a position on the operation face is different from each other (a propagation path length is different from each other), an amplitude and an emergence position of each peak level are largely different from each other. FIG. 55 illustrates a diagram in which the vertical axis of the precedent figure is changed to a peak hold voltage [mV], and the time scale of the horizontal axis is octupled. FIG. 55 illustrates a case that the reference voltage Vref to which the comparator 369 refers is 0 (zero) V, and the current value of the variable current source 363 is fixed in the all regions on the operation face. Further, FIG. 55 illustrates a case that discharge operation of the capacitance C by the variable current source 363 is started 0.2 μs after rising edge of the input pulse signal.

In this case, the lowering rate of the potential of the capacitance C is constant not depending on difference of peak level. Thus, the emergence range of timing when the potential of the capacitance C is lowered down to the reference potential Vref or less largely varies according to the measurement position on the operation face. Further, if the emergence range of the relevant timing according to presence of input operation is dispersed, a monitoring range of the determination section 371 becomes significantly wide.

Figure 56:
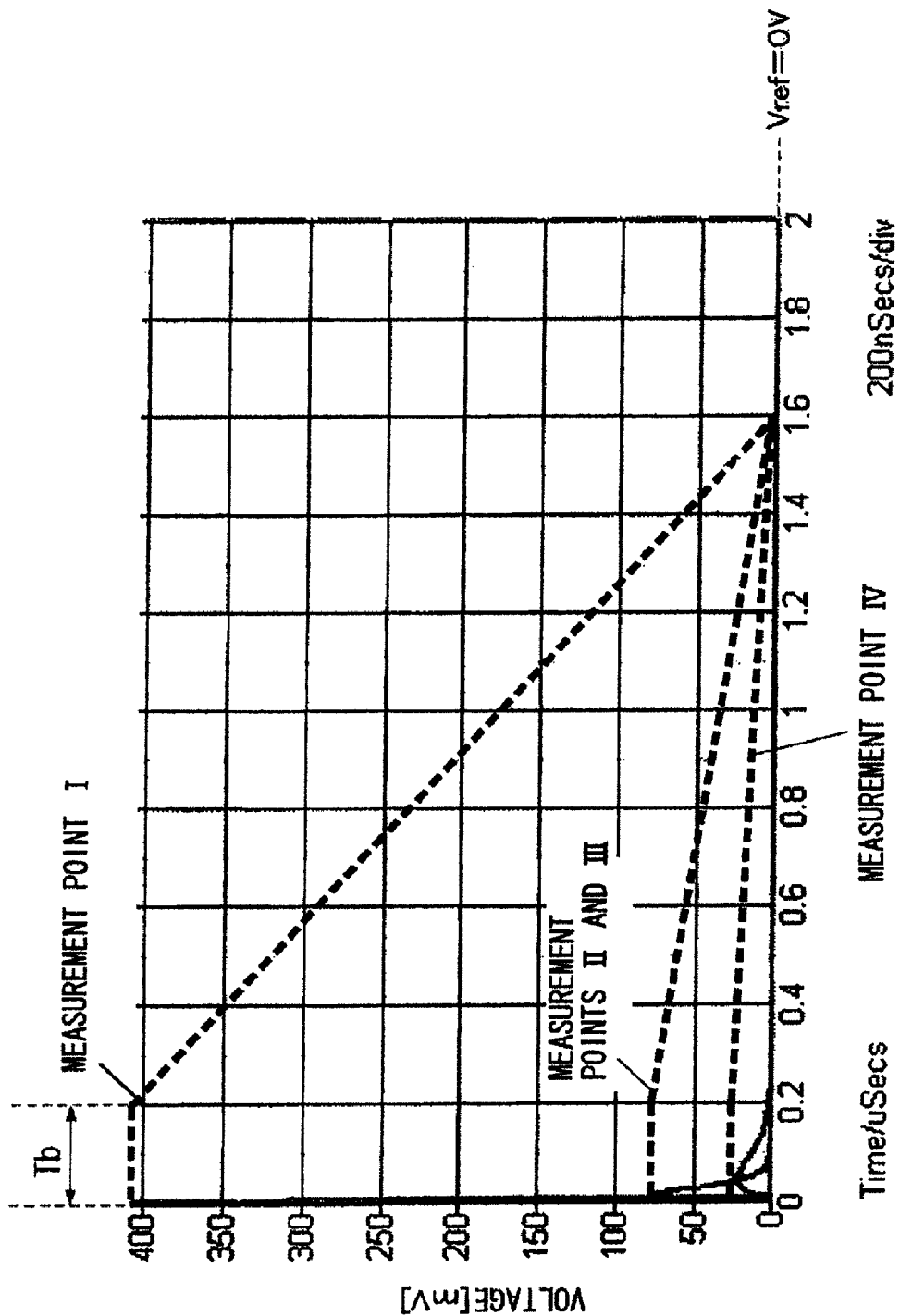
FIG. 56 is a diagram for explaining adjustment of the measurement time length by current control for every measurement point.

Thus, in this example, as illustrated in FIG. 56, the discharge rate of the capacitance C is adjusted. Specifically, for the measurement point I in which the peak level is high, the discharge rate is increased. Meanwhile, for the measurement point IV in which the peak level is low, the discharge rate is decreased. Further, for the measurement points II and III in which the peak level is intermediate, the discharge rate is set to intermediate level. In the case of FIG. 56, by adjusting the discharge rates, for the maximum value of each peak level possibly emerged in each measurement point, each elapsed time from the discharge start to the timing when the potential is lowered down to the reference potential Vref or less is the same. By such setting, the variable range of elapsed time described above associated with peak level change is able to be decreased.

Figure 58:
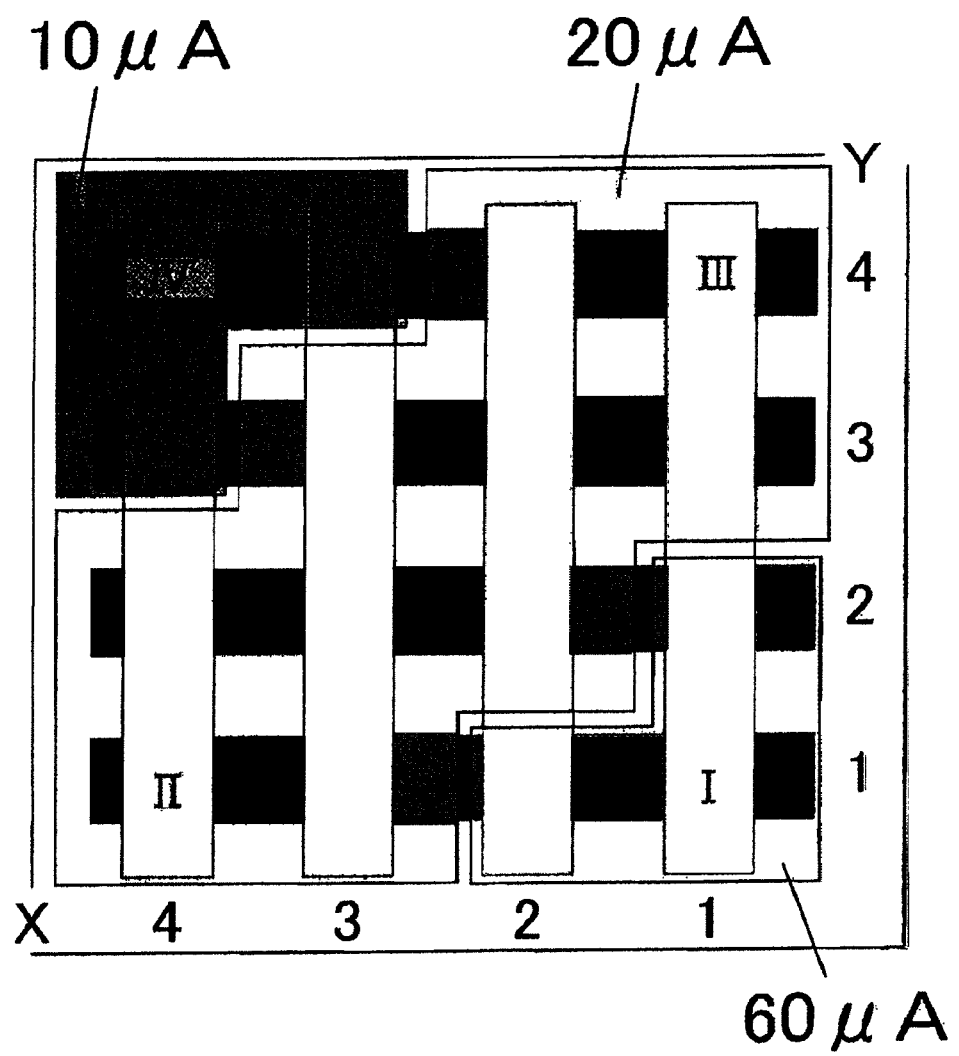
FIG. 58 is a diagram for explaining a correspondence relation between a current value and a measurement point.

In the light of the foregoing description, the correspondence relation illustrated in FIG. 57 is stored in the current value table 365. As illustrated in FIG. 57, one current value is stored correspondingly to each combination of each X coordinate and each Y coordinate. FIG. 58 displays the correspondence relation of the current value table 365 laid on the operation face. As illustrated in FIG. 58, in the case of this example, 60 μA is allocated to the measurement point I, 20 μA is allocated to the measurement points II and III, and 10 μA is allocated to the measurement point IV. Coordinate information of the measurement points is given from the sequencer 357.

[10. Discharge Control Switch]

The discharge control switch 367 is a switch element to mainly control discharge start of the electric charge stored in the capacitance C of the peak hold circuit 361. In this example, as illustrated in FIG. 55 and FIG. 56, discharge start is set to the timing when the reference elapsed time Tb elapses after falling timing of the input pulse signal by the sequencer 357.

[11. Comparator]

The comparator 369 is a circuit device to compare the holding potential of the capacitance C to the reference potential Vref, and constantly outputs the comparison result as a comparison output signal. A logic output level of the comparator 369 is changed at the time when the peak hold potential crosses the reference potential Vref. The crossing timing is the change point as a detection target of the measurement section 371. The reference potential Vref is set to a value smaller than the minimum value of prospective peak levels for all measurement points on the operation face.

[12. Measurement Section]

Figure 59:
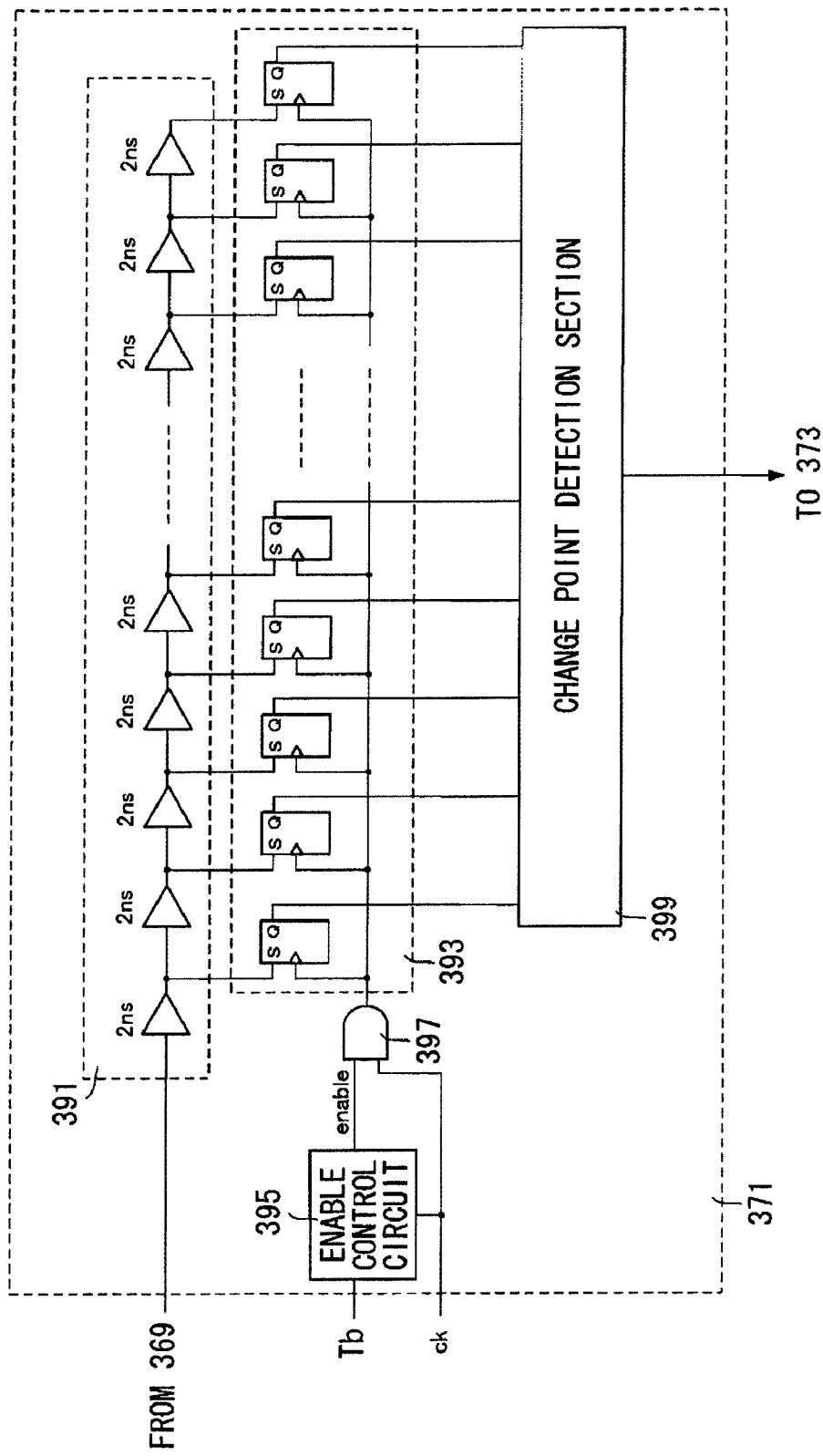
FIG. 59 is a diagram illustrating an example of internal structure of a measurement section.

The measurement section 371 is a circuit device to detect the change point of the logic output level shown in the comparison output signal inputted from the comparator 369. FIG. 59 illustrates an example of structure of the measurement section 371 according to this example. The measurement section 371 includes a delay circuit stage 391, a storage section 393, an enable control circuit 395, an AND circuit 391, and a change point detection section 399.

The delay circuit stage 391 includes a series circuit of delay elements that respectively have the same unit delay time. In this example, the unit delay time at ambient temperature is set to 2 ns. The unit delay time corresponds to detection precision of the change point. A comparison output signal outputted from each output terminal of each delay element will be hereinafter referred to as a delay output signal.

The number of stages of the delay elements is set so that a time length of the delay output signals at a plurality of time points existing in the delay circuit stage 391 is longer than a time range in which the change point of the logic output level possibly emerges in the delay output signal. The storage section 393 includes a storage device that takes in each delay output signal emerging in each output stage of each delay element into a corresponding storage region in sync with a strobe pulse. In this example, the storage section 393 includes the same number of flip-flop circuits as the number of delay elements. Input terminals of the flip-flop circuits are connected to the output terminals of the respectively corresponding delay elements.

Further, output terminals of the flip-flop circuits are respectively connected to the change point detection section 399. Further, a clock terminal of the flip-flop circuit is used to input a strobe signal that specifies take-in timing of a signal value emerging in the input terminal.

The enable control circuit 395 and the AND circuit 397 are for generating the foregoing strobe signal. The enable control circuit 395 generates an enable signal that designates an output enable time period of the strobe signal. For example, the enable control circuit 395 includes a counter. The count operation of the enable control circuit 395 is started at the time point when elapse of the reference time Tb is notified.

At this time, the enable control circuit 395 counts a clock signal inputted with 50 MHz, and finishes the count operation at the time point when the count value reaches a previously set value. The enable control circuit 395 outputs only one enable signal at such an end time point. The AND circuit 397 generates a strobe signal by AND operation of the enable signal and the clock signal.

Figure 60:
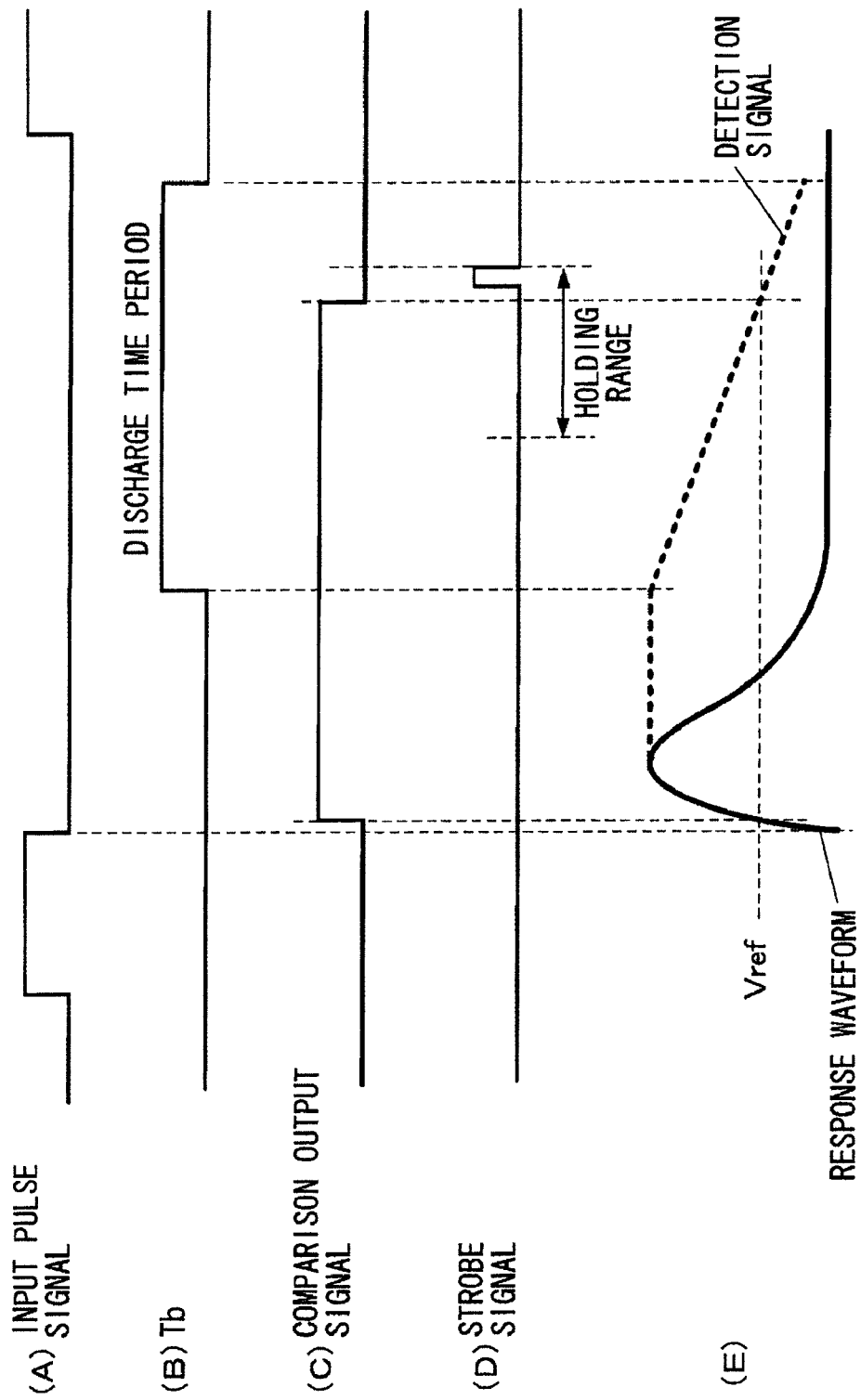
FIG. 60 is a diagram for explaining output timing of a strobe signal.

FIG. 60 illustrates a phase relation between the strobe signal and other signals. Part (A) of FIG. 60 illustrates a waveform of an input pulse signal. Part (B) of FIG. 60 illustrates a waveform of a discharge control signal that controls a discharge time period. Part (C) of FIG. 60 illustrates a waveform of a comparison output signal. In the figure, the time period in which the holding potential of the capacitance C is higher than the reference potential Vref is indicated by "H level," and the time period in which the holding potential of the capacitance C is lower than the reference potential Vref is indicated by "L level." Part (D) of FIG. 60 illustrates a waveform of the strobe signal. The time period indicated by the arrow with double tips is a range of the delay output signal existing in the delay circuit stage 391 at the output time point of the strobe signal. Part (E) of FIG. 60 illustrates a response waveform (full line) and a waveform of a detection signal (dotted line).

The change point detection section 399 is a circuit device to detect timing when the holding potential of the capacitance C is lowered down to the reference potential Vref or less due to discharge operation based on the delay output signals at the plurality of time points taken into the storage section 393 at the output time point of the strobe signal. For example, in the time period in which the holding potential of the capacitance C is larger than the reference potential Vref, it results in a series of "1". Meanwhile, in the time period in which the holding potential of the capacitance C is smaller than the reference potential Vref, it results in a series of "0". In this example, the change point detection section 399 counts the number of "1," and outputs the count value as time period length information until the change point emerges.

Figure 61:
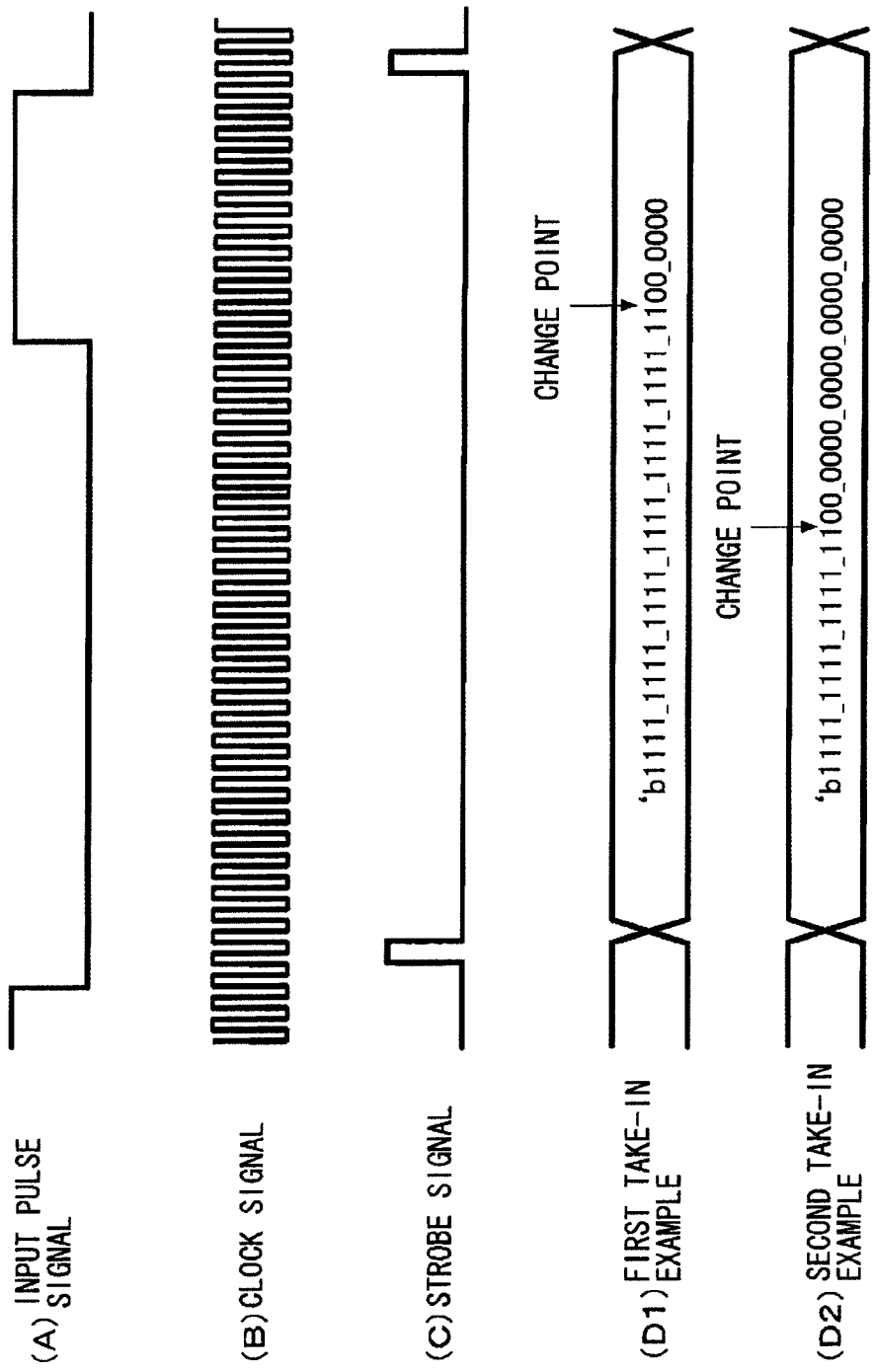
FIG. 61 is a diagram illustrating an example of numerical sequence of a delay output signal taken in by the strobe signal.

FIG. 61 specifically illustrates an example of numerical sequence taken into the change point detection section 399. Part (A) of FIG. 61 illustrates a waveform of an input pulse signal. Part (B) of FIG. 61 illustrates a waveform of a clock signal. As described above, the clock signal is given with 50 MHz (20 ns). Part (C) of FIG. 61 illustrates a waveform of a strobe signal. Part (D1) of FIG. 61 is a numerical sequence of a first take-in example corresponding to a case that no input operation is executed. Part (D2) of FIG. 61 is a numerical sequence of a second take-in example corresponding to a case that input operation is executed. As can be seen from the comparison between parts (D1) and (D2) of FIG. 61, the number of "1" is extremely changed according to presence of input operation.

Count value difference by 1 corresponds to difference by 2 ns (500 MHz). However, to realize accurate execution of determination in the subsequent determination section 373, it is desirable that the number of count values in the case where no input operation is executed emerge in a reference point. That is, calibration operation is desirable.

The unit delay time of the delay element has characteristics that the unit delay time is extremely changed according to change of element temperature due to external temperature or heat generation. That is, the time range stored in the delay circuit stage 391 also tends to be changed according to temperature conditions. Thus, in order to improve measurement precision of the change point, calibration operation is desirably executed before starting measurement operation.

In the case of this example, calibration operation is executed before starting measurement operation. Specifically, calibration operation is executed by shifting the output phase of the strobe signal until the change point is detected at a previously set position.

[13. Determination Section]

The determination section 373 is a circuit device to determine presence of input operation based on detection position information of the change point (that is, the count value outputted from the change point detection section 399). In the case where the count value detected for the measurement point corresponds with the reference value or is in the range of an allowable error, the determination section 373 determines that no input operation for the measurement point is executed. On the other hand, in the case where the count value detected for the measurement point does not correspond with the reference value or is out of the range of the allowable error, the determination section 373 determines that input operation for the measurement point is executed.

[B-3 Contents of Processing Operation]

Figure 62:
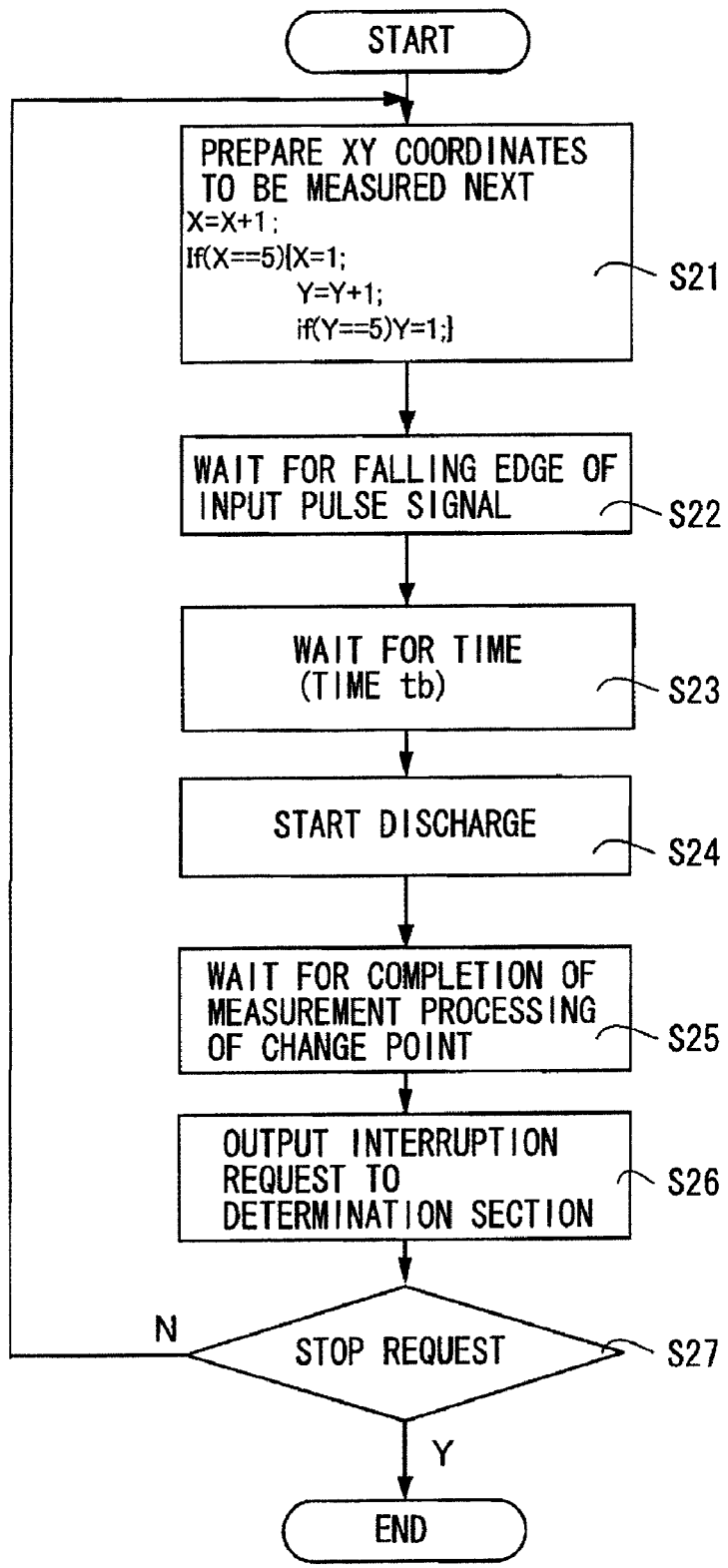
FIG. 62 is a flowchart for explaining an example of operation of a sequencer.

A description will be hereinafter given of processing operation of the capacitive sensor module 341 according to the operation flow of the sequencer 357 (FIG. 62). FIG. 62 illustrates a case that both the number of the electrode patterns 5 on the top face side and the number of the electrode patterns 7 on the bottom face side are four.

First, the sequencer 357 generates coordinates to designate the position on the operation face as a measurement target (S21). The sequencer 357 increases coordinate value X of the electrode patterns 5 on the top face side by only "1" for every one period of an input pulse signal. In the case of FIG. 62, when the increased coordinate value X reaches "5," the sequencer 357 decreases the coordinate value X back to "1," and increases coordinate value Y of the electrode patterns on the bottom face side by only "1." When the increased coordinate value Y reaches "5," the sequencer 357 decreases the coordinate value Y back to "1."

The coordinates values X and Y generated as above are given to the de-multiplexer 353, the multiplexer 355, the current value table 365, and the determination section 373. In the case where the frequency of the input pulse signal is 500 kHz (1 period is 2 μs), determination operation of coordinate points of 16 locations determined by the four electrode patterns 5 and the four electrode patterns 7 is able to be executed within 32 μs.

Next, the sequencer 357 waits for detection of falling edge of the input pulse signal (S22).

If the edge is detected, the sequencer 357 waits for elapse of the reference timing tb as discharge start time (S23).

If elapse of the reference time tb is detected, the sequencer 357 on-controls the discharge control switch 367, and directs discharge of the potential retained in the peak hold circuit 361 (S24). The current value of the variable current source 363 has been switched to the current value according to the measurement point by the direction of the current value table 365 by the time when discharge operation is started. Thus, after discharge start, discharge based on a current value corresponding to each measurement point is started.

At this time, in the delay circuit stage 391, the delay output signals having time difference by every 2 ns are generated. Delay output signals existing in inputting the strobe signal are taken into the storage section 393 all together.

In the change point detection section 399, detection operation of the change point emerging in the comparison output signal is executed. The sequencer 357 waits for completion of the detection processing of the change point (S25). After that, the sequencer 357 outputs an interruption request to the determination section 373 (S26). The determination section 373 to which the interruption request is inputted compares the detected count value to the reference value, and determines presence of input operation to the measurement point based on a result of comparison.

After that, the sequencer 357 determines whether or not a stop request exists (S27). If the stop request is not confirmed, the sequencer 357 returns to the generation operation of the XY coordinates again to repeat the foregoing operation. If the stop request is confirmed, the sequencer 357 finishes the series of operation.

[B-4 Conclusion]

As described above, due to adoption of the capacitance change measuring circuit 345 according to the first example of the present second embodiment, extremely high-speed determination operation is enabled compared to the existing technologies. For example, in the case where determination processing for 10 locations is executed, time of 20 ms is necessitated in the existing technologies. In contrast, in the case of this example, it is enough to take time of 20 μs. Thus, addressing high-speed input that has been difficult to deal in the existing technologies is enabled.

It is needless to say that the capacitance change measuring circuit 345 according to this example is able to be used for multi-location detection as well. Further, operation is executed in the current mode until input stage of the current input voltage output amplifier 359. Thus, high noise resistance is prospective. That is, the capacitance change measuring circuit 345 according to this example is prospective to realize practically sufficient precision with regard to detection precision as well.

Further, in the case of this example, while the operation clock signal with 50 MHz (20 ns) is used, emergence position of the change point is able to be detected to precision equal to that in the case of using a clock signal with 500 MHz (2 ns).

That is, it is able to realize the capacitance change measuring circuit 345 operating with a lower frequency compared to the existing type. Since the frequency of the operation clock is able to be lowered, low electric power consumption of the capacitance change measuring circuit 345 is able to be realized. Such low electric consumption is advantageous to realizing long life of operation time particularly in the case where the capacitive sensor module 341 is mounted on a portable electronic device. Further, in this case, mounting the capacitive sensor module 341 on a portable electronic device is promoted.

Further, since the frequency of the operation clock is lowered, a clock progressive increase circuit such as a PLL (Phase-LockedLoop) circuit is able to be eliminated. Accordingly, integration of the capacitance change measuring circuit 345 is able to be facilitated.

[C. Second Example]

[C-1]

Figure 63:
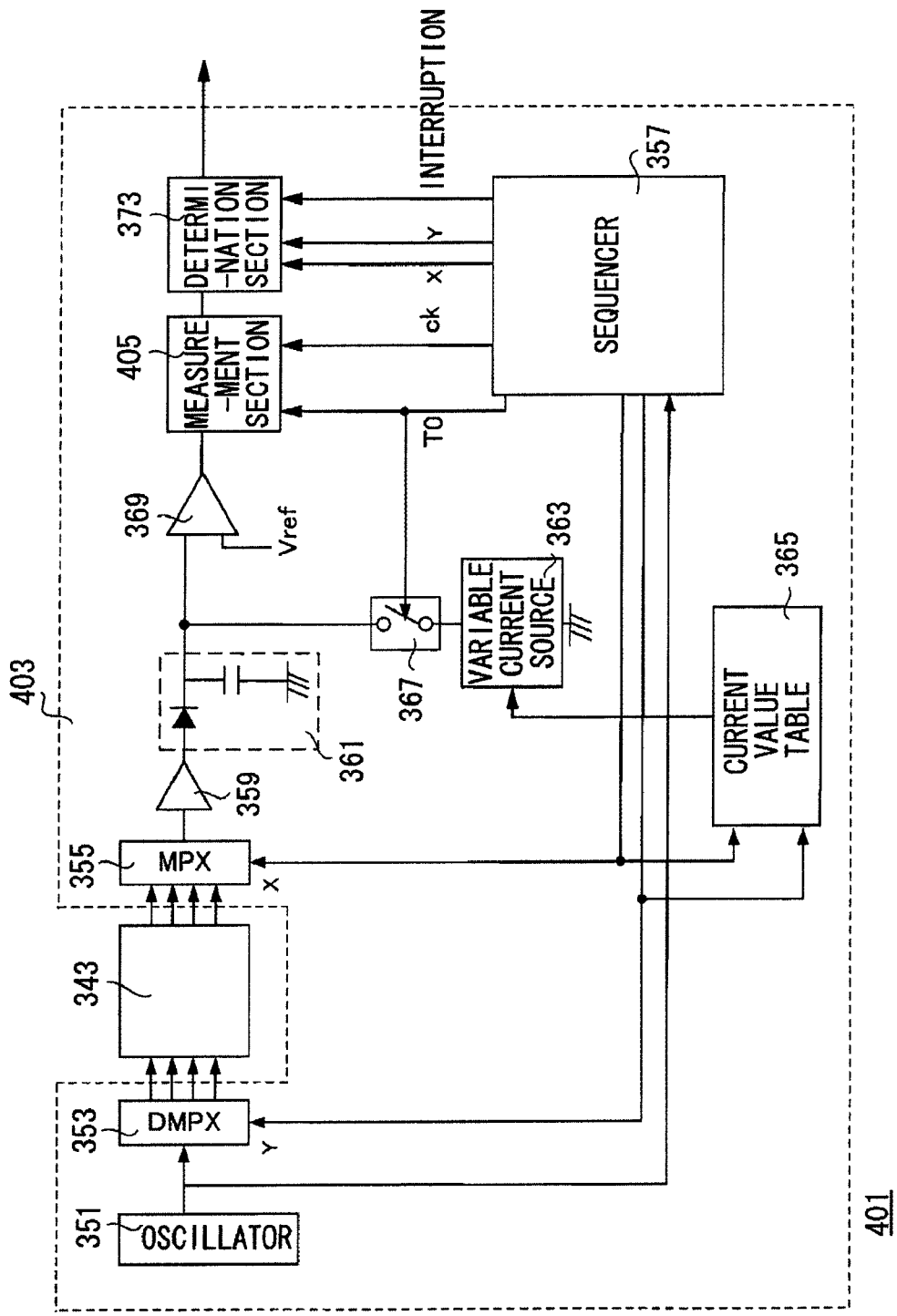
FIG. 63 is a diagram illustrating an example of functional structure of a capacitive sensor module.

FIG. 63 illustrates an example of system configuration of a capacitive sensor module 401 according to this example. In FIG. 63, elements corresponding to those in FIG. 49 according to the first example of the present second embodiment are affixed with the same referential symbols.

The capacitive sensor module 401 includes the capacitive sensor device 343 and a capacitance change measuring circuit 403.

The capacitance change measuring circuit 403 includes the oscillator 351, the de-multiplexer 353, the multiplexer 355, the sequencer 357, the current input voltage output type amplifier 359, the peak hold circuit 361, the variable current source 363, the current value table 365, the discharge control switch 367, the comparator 369, a measurement section 405, and the determination section 373.

Figure 64:
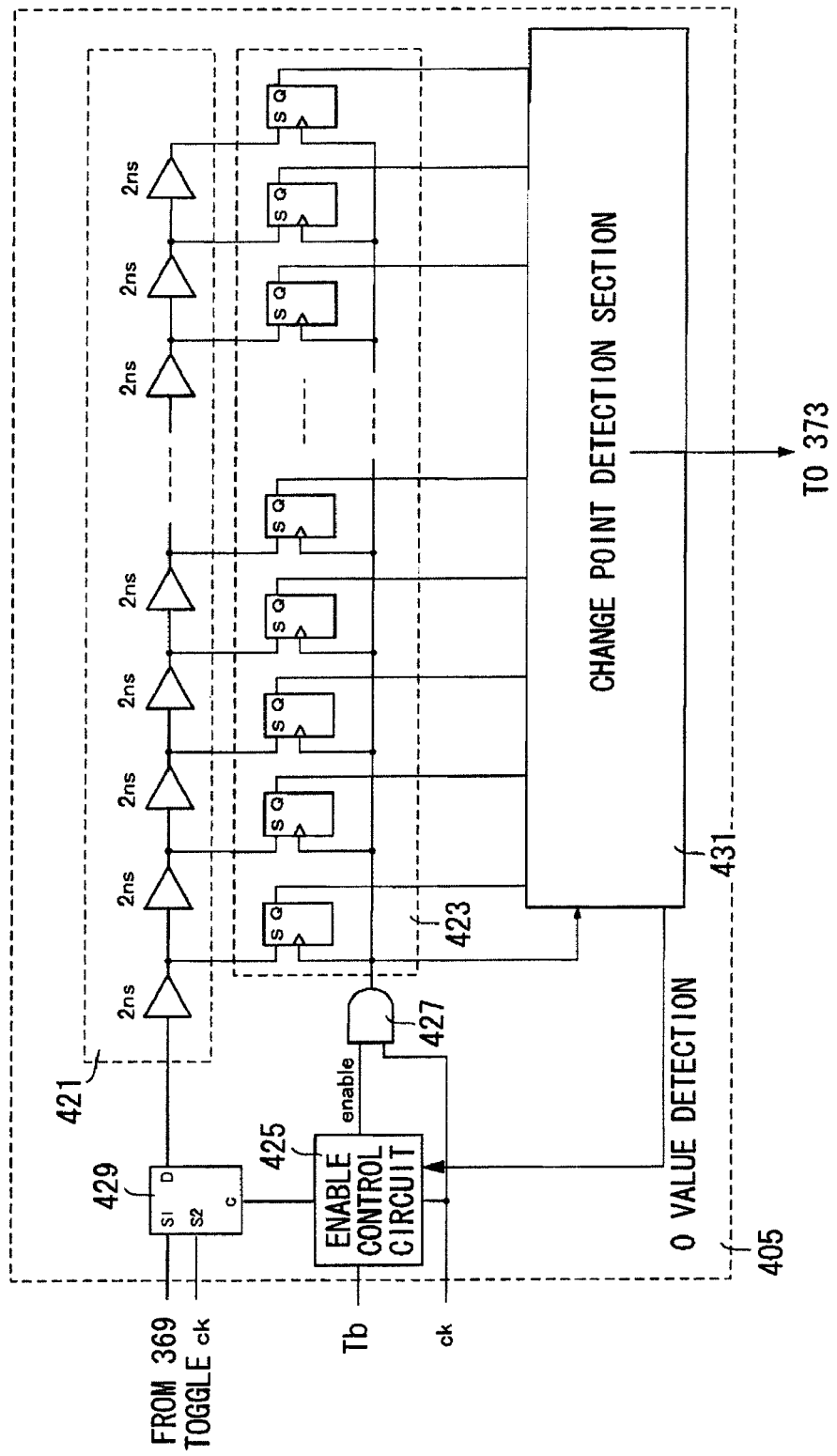
FIG. 64 is a diagram illustrating an example of internal structure of a measurement section.

A description will be hereinafter given of a structure of the measurement section 405 as a change point. FIG. 64 illustrates a structural example of the measurement section 405. The measurement section 405 includes a delay circuit stage 421, a storage section 423, an enable control circuit 425, an AND circuit 427, a multiplexer 429, and a change point detection section 431.

The basic structure of the delay circuit stage 421 is the same as that of the delay circuit stage 391 according to the first example. That is, the delay circuit stage 421 includes a series circuit of delay elements that respectively have the same unit delay time. Further, the unit delay time at ambient temperature of the delay elements is also set to 2 ns.

The different point is the number of stages of the delay elements structuring the delay circuit stage 421. In the case of this example, it is enough that the number of stages of the delay elements structuring the delay circuit stage 421 is the number of stages equivalent to the time length corresponding to the output period of the strobe signal.

In the case of this example, the strobe signal is outputted in sync with a clock signal with 50 MHz. Thus, in the case of this example, the number of stages of delay elements may be as small as possible, but is desirably 10 (=20 ns/2 ns) or more, since in the case of this example, the strobe signal is outputted sequentially a plurality of times. That is, even if the detection range per once is small, the detection range is able to be extended by executing detection operation sequentially a plurality of times. In result, the circuit area of the delay circuit stage 421 is smaller than that of the first example.

The storage section 423 includes a storage device that takes in each delay output signal emerging in each output stage of each delay element into each corresponding storage region in sync with a strobe pulse. In this example, the storage section also includes the same number of flip-flop circuits as the number of delay elements. Thus, the circuit area of the storage section 423 is smaller than that of the first example as well.

Input terminals of the flip-flop circuits are connected to respectively corresponding output terminals of the delay elements. Output terminals of the flip-flop circuits are respectively connected to the change point detection section 431. Further, a clock terminal of the flip-flop circuit is used to input a strobe signal that specifies take-in timing of a signal value emerging in the input terminal. In the case of this example, every time when the strobe signal is inputted, the flip-flop circuit takes in the delay output signal outputted at that time and stores the same.

The enable control circuit 425 and the AND circuit 427 are for generating the foregoing strobe signal. The enable control circuit 425 generates an enable signal that designates an output enable time period of the strobe signal. For example, when elapse of the reference time Tb is notified, the enable control circuit 425 starts outputting the enable signal.

After that, the enable control circuit 425 continues outputting the enable signal until detection of the change point (that is, detection of "0" value) is notified from the change point detection section 431.

When a calibration signal (not illustrated) is inputted, the enable control circuit 425 forcefully generates the enable signal. Further, when the calibration signal is inputted, the enable control circuit 425 outputs a control signal to direct switching the input terminal to the multiplexer 429 in order to switch the signal inputted to the delay circuit stage 421 to a calibration-use signal.

Figure 65:
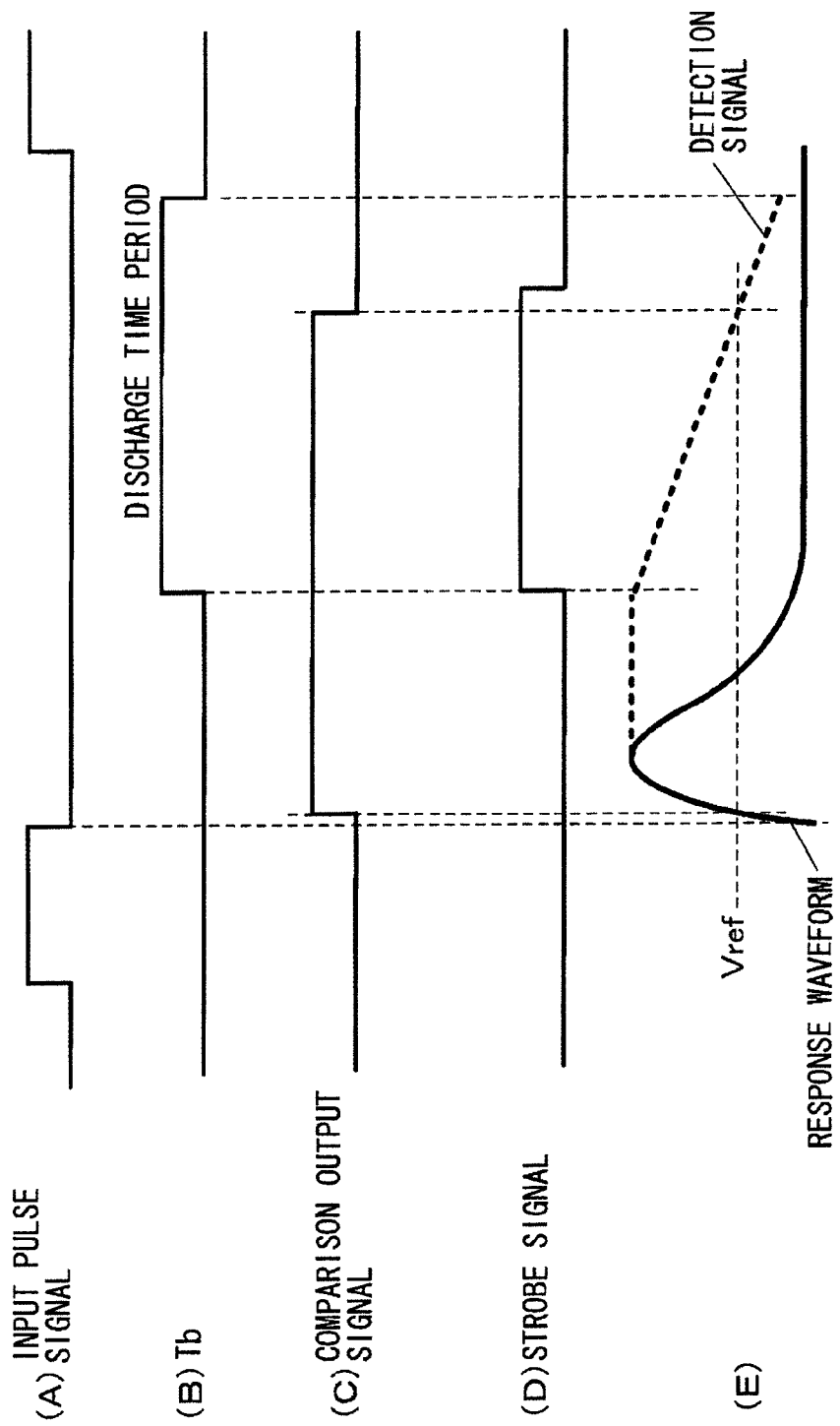
FIG. 65 is a diagram for explaining output timing of a strobe signal.

The AND circuit 427 generates the strobe signal by AND operation of the enable signal and the clock signal. FIG. 65 illustrates a phase relation between the strobe signal and other signals. Part (A) of FIG. 65 illustrates a waveform of an input pulse signal. Part (B) of FIG. 65 illustrates a waveform of a discharge control signal that controls a discharge time period. Part (C) of FIG. 65 illustrates a waveform of a comparison output signal. In the figure, the time period in which the holding potential of the capacitance C is higher than the reference potential Vref is indicated by "H level," and the time period in which the holding potential of the capacitance C is lower than the reference potential Vref is indicated by "L level".

Part (D) of FIG. 65 illustrates a waveform of the strobe signal. As illustrated in part (D) of FIG. 65, in this example, the strobe signal is executed from discharge start until detection of the change point is notified. As illustrated in part (D) of FIG. 65, it can be seen that the output time period length of the strobe signal is long. Part (E) of FIG. 65 illustrates a response waveform (full line) and a waveform of a detection signal (dotted line).

The multiplexer 429 is a circuit device to execute operation of switching between the measurement-use input signal (comparison output signal) and the calibration-use input signal. A measurement-use input terminal is connected to an output terminal of the comparator 369. Meanwhile, a calibration-use input-terminal is connected to a signal source of a toggle clock (not illustrated).

Figure 66:
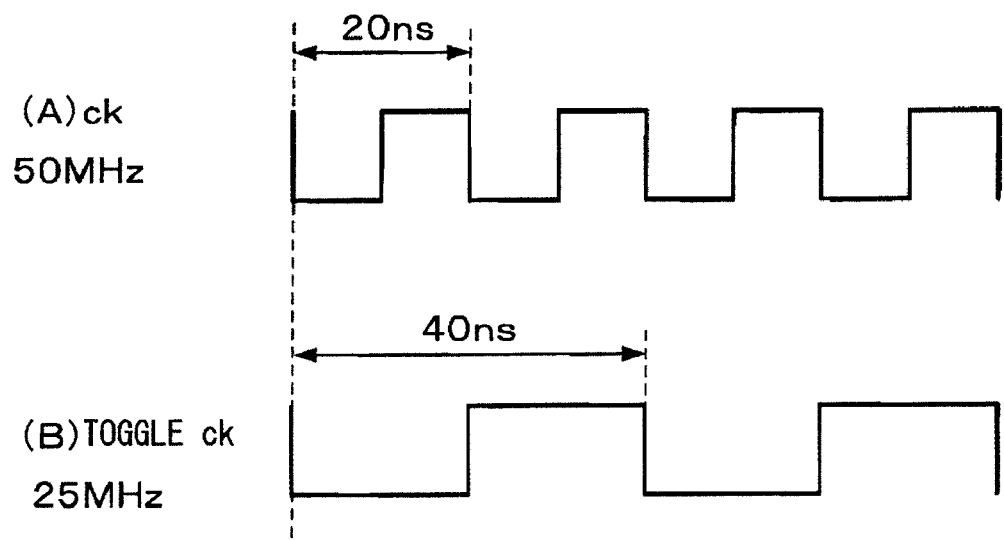
FIG. 66 is a diagram for explaining a toggle clock signal.

A description will be given of a toggle clock signal by using part (A) and (B) of FIG. 66. Part (A) of FIG. 66 illustrates the clock signal. In this case, the description is given for a case of 50 MHz. Part (B) of FIG. 66 illustrates the toggle clock signal. The toggle clock signal is generated by dividing the frequency of the clock signal, resulting in 25 MHz in this case. In result, the time period length in H level or L level of the toggle clock corresponds to one period of the clock signal.

The multiplexer 429 operates to input the toggle clock signal to the delay circuit stage 421 in calibration. Switching between the input terminals is executed through the enable control circuit 425 as described above. The change point detection section 431 detects presence of timing when the holding potential of the capacitance C is lowered down to the reference potential Vref or less based on a set of delay output signals at a plurality of time points taken into the storage section 423 every time when the strobe signal is outputted.

For example, in normal measurement operation, the change point detection section 431 monitors whether or not "0" emerges in the numerical sequence read from the storage section 423 every time when the strobe signal is inputted. At this time, until detecting emergence of "0," the number of outputs of the strobe signal is counted up by 1. In the case of this example, the count value in the case where the first strobe signal is inputted is 0. Thus, the count value herein is given as "the number of outputs of the inputted strobe signals-1."

In the case of this example, the change point detection section 431 calculates emergence position of the change point by the following formula, where the number of delay elements per one strobe signal is A, and the number of "1" until "0" emerges at the time when the strobe signal where "0" emerges is inputted is B, in the following formula.

$$\text{Emergence position} = \text{count value} * A + B$$

Figure 67:
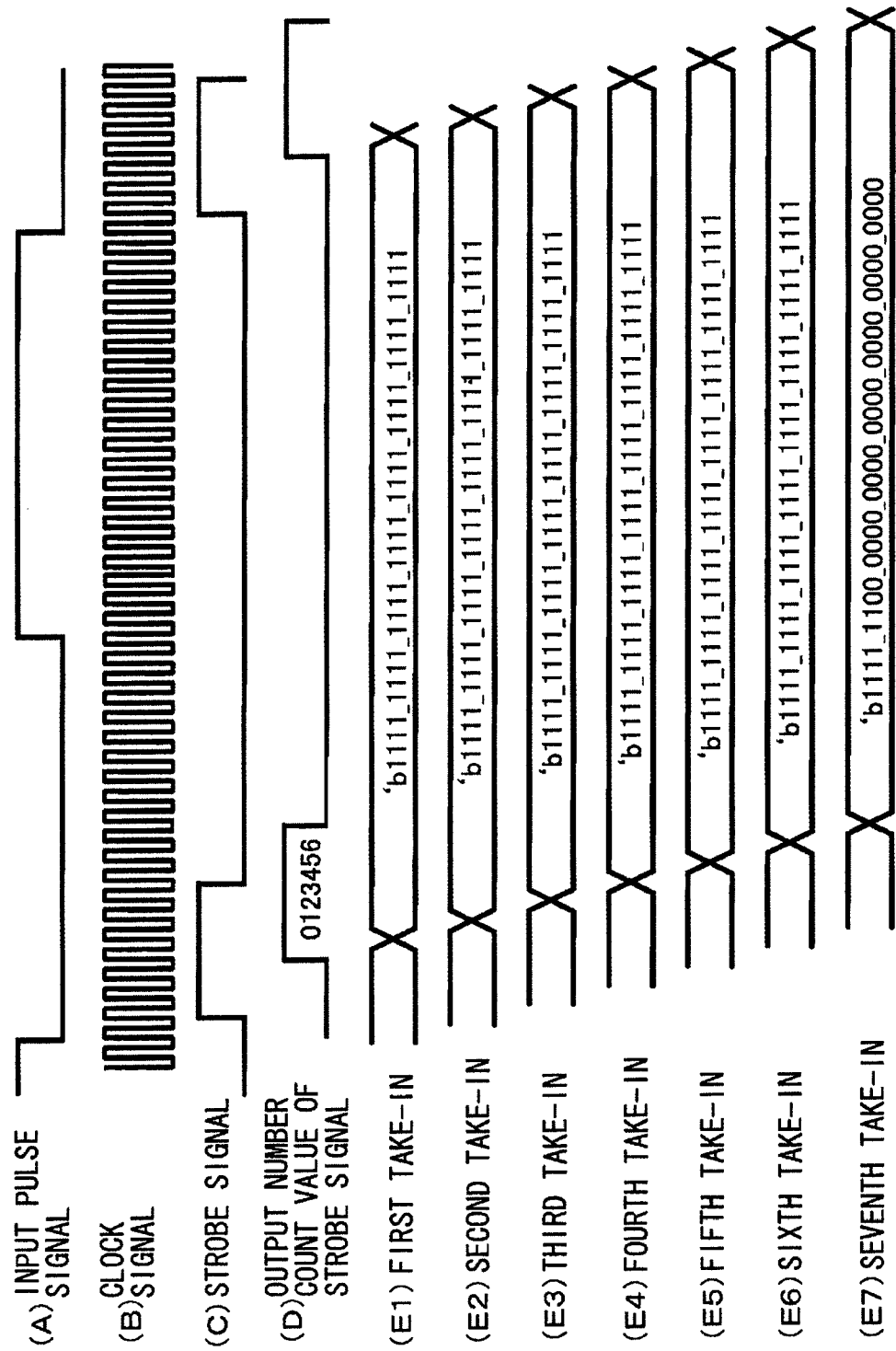
FIG. 67 is a diagram illustrating an example of numerical sequence of a delay output signal taken in sequentially by the strobe signal.

A description will be specifically given of an example of operation of measuring the emergence position described above with reference to FIG. 67. Part (A) of FIG. 67 illustrates a waveform of the input pulse signal. Part (B) of FIG. 67 illustrates a waveform of the clock signal. Part (C) of FIG. 67 illustrates a waveform of the strobe signal. In the case of this example, as illustrated in the figure, the strobe signal is sequentially outputted over the time period of a plurality of clock signals.

Part (D) of FIG. 67 illustrates a count value of the number of outputs of the strobe signals. In the case of the figure, seven strobe signals are outputted. The count value is, as described above, 6 (=7−1). Parts (E1) to (E7) of FIG. 67 illustrate numerical value sequences of delay output signals taken into the storage section 423 in each strobe signal input time.

In the case of the figure, the numerical value sequence of delay output signals taken from the delay circuit state 421 at the seventh strobe signal output time is given as "1111110000000000000000000000000." Where the delay output signal in the delay circuit state 421 proceeds by 10 stages of the delay elements during time period from output of the strobe signal to output of the next strobe signal, the emergence position of the change point is calculated by 66(=6*10+6). In the calculation of the emergence position, it is extremely important how many stages of delay elements the delay output signal propagates through during time period when one strobe signal is outputted in order to determine the position relation.

Figure 68:
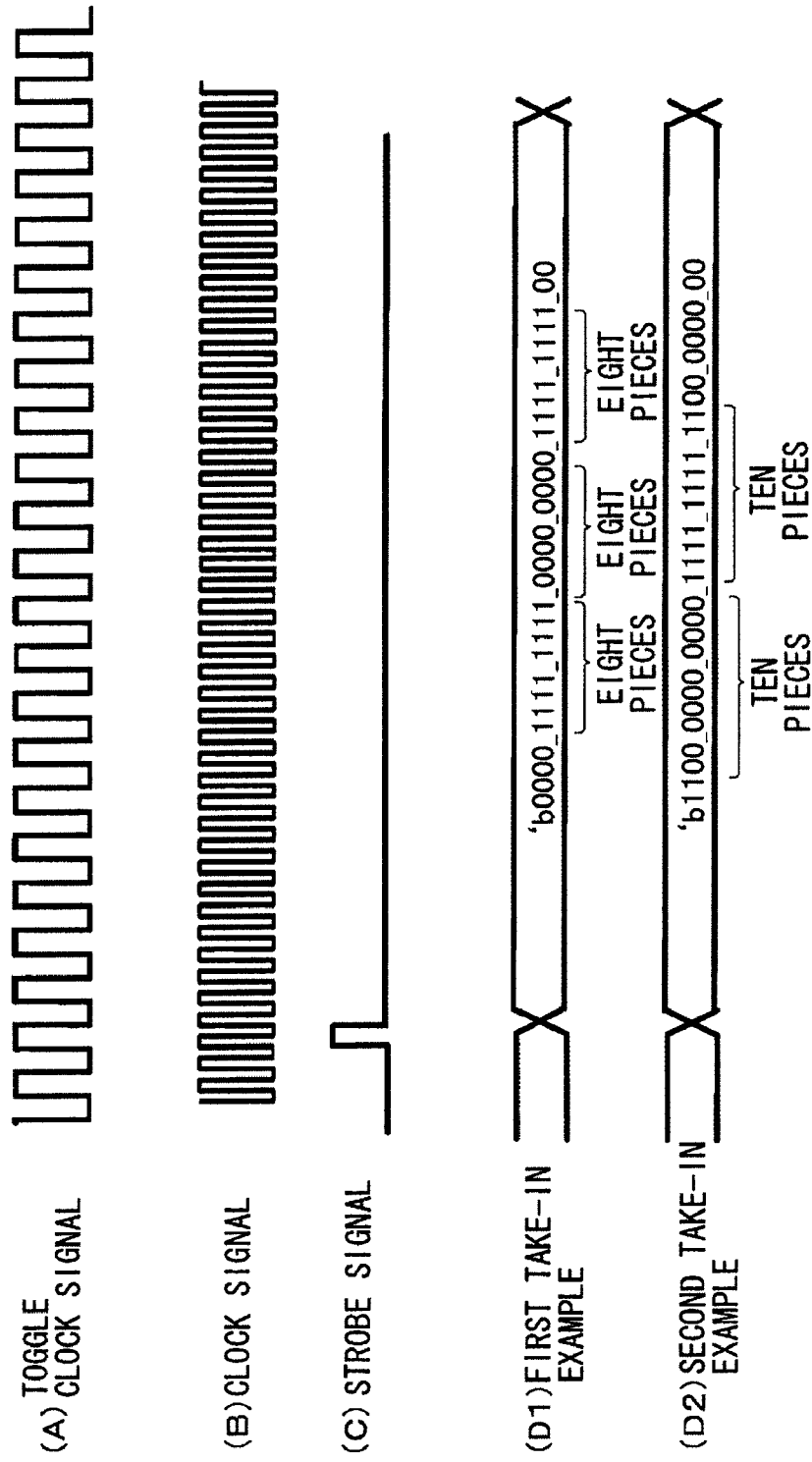
FIG. 68 is a diagram for explaining calibration operation.

As described above, the unit delay time of the delay element tends to be significantly changed according to external temperature or heat generation. A description will be hereinafter given on a specific example of calibration operation by using parts (A) to (D2) of FIG. 68. Part (A) of FIG. 68 illustrates a waveform of a toggle clock. Part (B) of FIG. 68 illustrates a waveform of a clock signal. Part (C) of FIG. 68 illustrates a waveform of a strobe signal. In the case of calibration operation, only one strobe signal is outputted. Parts (D1) and (D2) of FIG. 68 illustrate examples of numerical value of delay output signals taken into the storage section 423 by the strobe signal.

As described with reference to parts (A) and (B) of FIG. 66, the time period length in which the toggle clock is "1" or "0" corresponds with the time period length for one clock. Thus, the number of sequence of "1" or the number of sequence of "0" emerging in the numerical sequence taken into the storage section 423 by one strobe signal corresponds with the number of stages of delay elements through which the delay output signal progresses during time period when one strobe signal is outputted. Part (D1) of FIG. 68 illustrates an example that the time period length of one strobe signal corresponds to delay time of eight delay elements. Part (D2) of FIG. 68 illustrates an example that the time period length of one strobe signal corresponds to delay time of ten delay elements.

When calibration is executed, the change point detection section 431 counts the number of outputs of "0" or "1" sandwiched between "1" or "0" from the numerical value sequence read from the storage section 423, and thereby determines the time period length for one strobe signal.

[C-3 Contents of Processing Operation]

A description will be hereinafter given of processing operation of the capacitive sensor module 401 according to the operation flow of the sequencer 357. The operation flow of the sequencer 357 is the same as that of the first example of the present second embodiment. Thus, the sequencer 357 progresses the processing operation by the procedure illustrated in FIG. 62. Before the processing operation is executed, the above-mentioned calibration operation has been executed.

First, the sequencer 357 generates coordinates to designate the position on the operation face as a measurement target (S21). The sequencer 357 increases coordinate value X of the electrode patterns 5 on the top face side by only "1" for every one period of an input pulse signal. In the case of FIG. 62, when the increased coordinate value X reaches "5," the sequencer 357 decreases the coordinate value X back to "1," and increases coordinate value Y of the electrode patterns on the bottom face side by only "1." When the increased coordinate value Y reaches "5," the sequencer 357 decreases the coordinate value Y back to "1."

The coordinate values X and Y generated as above are given to the de-multiplexer 353, the multiplexer 355, the current value table 365, and the determination section 373. In the case where the frequency of the input pulse signal is 500 kHz (one period is 2 μs), determination operation of coordinate points of 16 locations determined by the four electrode patterns 5 and the four electrode patterns 7 is able to be executed within 32 μs.

Next, the sequencer 357 waits for detection of falling edge of the input pulse signal (S22). If the edge is detected, the sequencer 357 waits for elapse of the reference time tb as discharge start time (S23). If elapse of the reference time tb is detected, the sequencer 357 on-controls the discharge control switch 367, and directs discharge of the potential retained in the peak hold circuit 361 (S24). The current value of the variable current source 363 has been switched to the current value according to the measurement point by the direction of the current value table 365 by the time when discharge operation is started. Thus, after discharge start, discharge based on a current value corresponding to each measurement point is started.

Further, in the determination section 405, outputting the enable signal is started according to the direction of starting discharge operation.

When discharge operation of the capacitance C is started, in the delay circuit stage 421, the comparison output signal is delayed by every 2 ns, and is transferred to the next stage as the delay output signal. In the case of this example, the strobe signal is repeatedly generated with an input period of the clock signal.

Every time when the strobe signal is outputted, the delay output signals are taken into the storage section 423 all together from the delay circuit stage 421. In the change point detection section 431, whether or not "0" is included in the numerical sequences thereof is determined. In the case where only "1" emerges, generation of the enable signal is continued. In the case where "0" emerges, generation of the enable signal is stopped.

The sequencer 357 waits for completion of the detection processing of the change point (S25). After that, the sequencer 357 outputs an interruption request to the determination section 373 (S26). The determination section 373 to which the interruption request is inputted compares the detected count value to the reference value, and determines presence of input operation to the measurement point based on a result of comparison.

After that, the sequencer 357 determines whether or not a stop request exists (S27). If the stop request is not confirmed, the sequencer 357 returns to the generation operation of the XY coordinates again to repeat the foregoing operation. If the stop request is confirmed, the sequencer 357 finishes the operation.

[C-4. Conclusion]

As described above, in the case where the capacitance change measuring circuit 403 according to the second example of the present second embodiment is adopted, the number of elements necessary for the delay circuit stage 421 and the storage 423 is able to be decreased, and the circuit area is able to be decreased compared to that of the first example 1 of the present embodiment.

[D. Third Example]

[D-1. Detection Principle]

Figure 69:
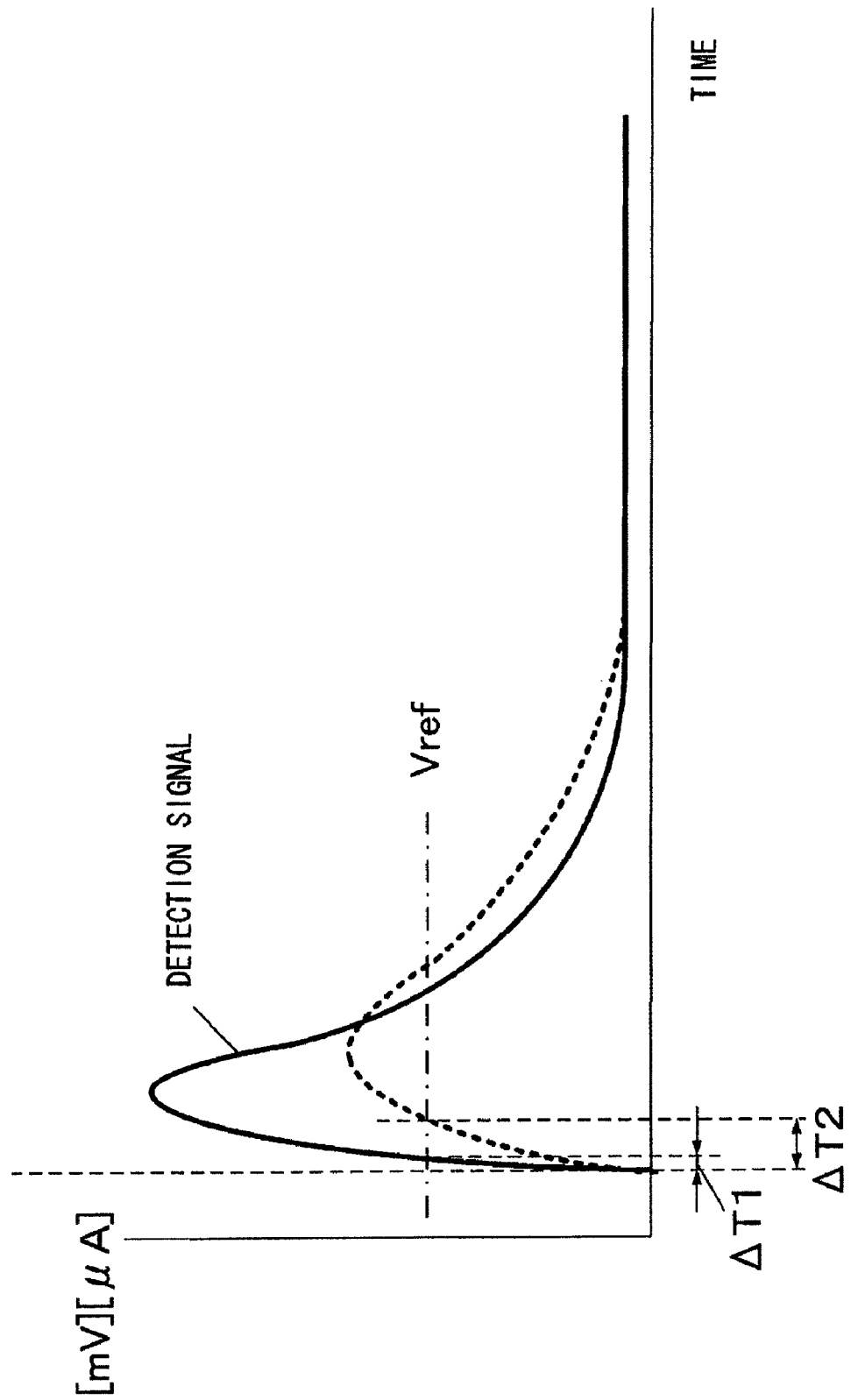
FIG. 69 is a diagram for explaining difference of measurement time length according to difference of amplitude of detection waveforms.

In this example, attention is focused on rising rate difference of detection signal to an input pulse signal. FIG. 69 illustrates a relation between a response waveform and time length ΔT to be measured focusing attention on a measurement point (closed circuit). In the figure, a detection signal in the case that no input operation is executed is indicated by a full line, and a detection signal in the case where input operation is executed is indicated by a dotted line.

As illustrated in the figure, compared to the case that no input operation is executed, the rising rate in the case where input operation is executed is slow. In this example, the time length from falling edge of the input pulse signal to the timing when the detection signal exceeds the reference potential Vref is measured.

In the figure, the horizontal axis indicates elapsed time from the falling timing of the input pulse signal. In the figure, the vertical axis indicates a current amount corresponding to the response waveform.

[D-2. System Configuration]

Figure 70:
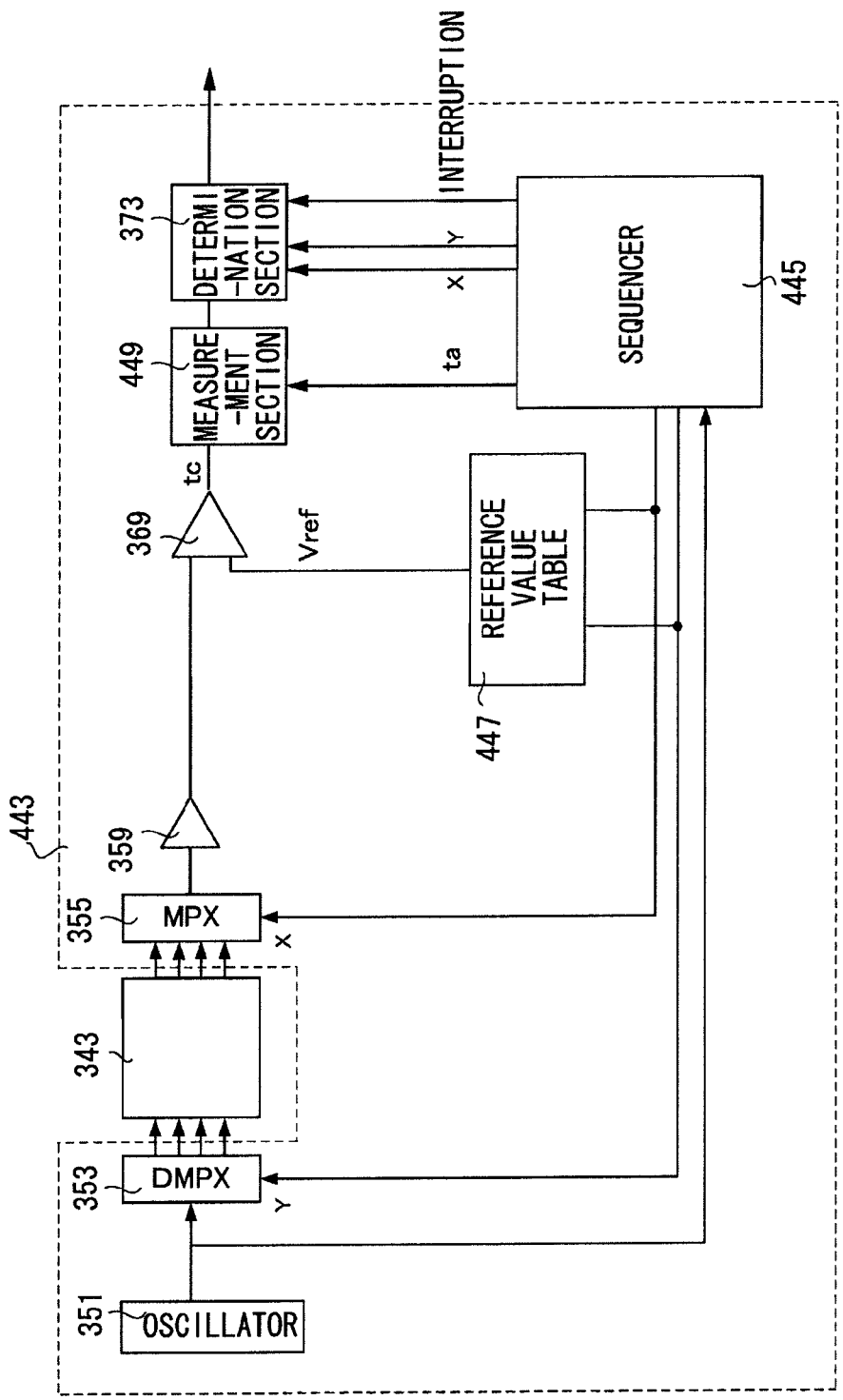
FIG. 70 is a diagram illustrating an example of functional structure of a capacitive sensor module.

FIG. 70 illustrates an example of system configuration of a capacitive sensor module 441 according to this example. In FIG. 70, elements corresponding to those in FIG. 49 according to the first example of the present second embodiment are affixed with the same referential symbols. The capacitive sensor module 441 includes the capacitive sensor device 343 and a capacitance change measuring circuit 443.

The capacitance change measuring circuit 443 includes the oscillator 351, the de-multiplexer 353, the multiplexer 355, a sequencer 445, the current input voltage output type amplifier 359, the comparator 369, a reference value table 447, a measurement section 449, and the determination section 373. In the case of this example, since the rising rate of the detection signal outputted from the current input voltage output type amplifier 359 is measured, the peak hold circuit and the discharge circuit thereof in the first example of the present second embodiment are not necessitated. A description will be hereinafter given of only new components adopted in this example of the present second embodiment.

[1. Sequencer]

The sequencer 445 is a circuit that outputs connection order to the electrode patterns 5 to which the input pulse signal is inputted and connection order to the electrode patterns 7 as an extraction source of the response waveform as coordinate information (X, Y). In this example, the sequencer 445 manages control timing based on falling edge of the input pulse signal. The function is the same as that of the first example of the present second embodiment.

The aspect that the sequencer 445 generates control timing of the measurement section 449 and the determination section 373 and the like in this example is similar to that of the first example. However, the sequencer 445 according to this example outputs the detection signal of the falling edge of the input pulse signal to the determination section 449, since in this example, difference of rising rate of detection signal is a measurement target.

[2. Reference Value Table]

The reference value table 447 is a storage region to store coordinates of a measurement point and the reference value Vref correspondingly. Since the amplitude and the waveform of the detection signal are largely changed according to the measurement point as illustrated in FIG. 54, the reference potential Vref is variable according to the measurement point. Further, in this example, in order to make the emergence range of the timing when the detection signal exceeds the reference potential Vref fall within the measurement range of the measurement section 449, the reference potential Vref is variable according to the measurement point.

[3. Measurement Section]

Figure 71:
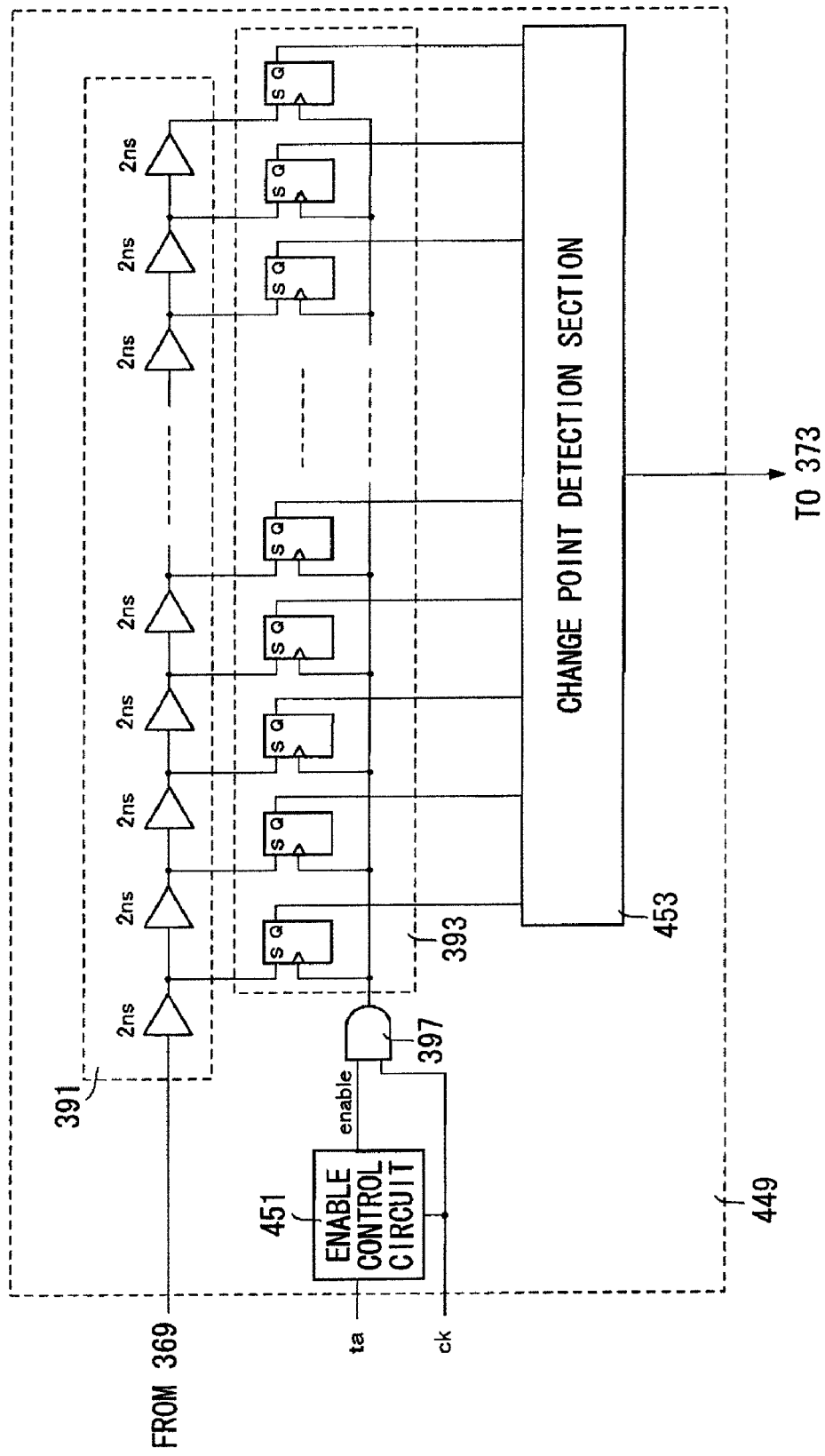
FIG. 71 is a diagram illustrating an example of internal structure of a measurement section.

The measurement section 449 is a circuit device to detect the change point of the logic output level shown in the comparison output signal inputted from the comparator 369. FIG. 71 illustrates an example of structure of the measurement section 449 according to this example. In FIG. 71, elements corresponding to those in FIG. 59 are affixed with the same referential symbols. The measurement section 449 includes the delay circuit stage 391, the storage section 393, an enable control circuit 451, the AND circuit 397, and a change point detection section 453.

In this example, the measurement section 449 adopts the delay circuit stage 391 having the same structure as that of the first example of the present second embodiment. That is, the delay circuit stage 391 includes a series circuit of delay elements that respectively have the same unit delay time. In this example, the delay elements having a unit delay time of 2 ns at ambient temperature are used as well.

In this example, the number of stages of the delay elements structuring the delay circuit stage 391 is set so that a time length of the delay output signals at a plurality of time points existing at the same time on the delay circuit stage 391 is longer than a time range in which the change point of the logic output level possibly emerges in the delay output signal. That is, the same detection method as that of the first example of the present second embodiment is adopted. It is also possible to adopt the same detection method as that of the second example of the present second embodiment. A description will be hereinafter given of a case in which the same detection method as that of the first example is adopted.

The storage section 393 includes a storage device that takes in the delay output signal emerging in each output stage of each delay element into a corresponding storage region in sync with a strobe pulse. In this example, the storage section 393 also includes the same number of flip-flop circuits as the number of the delay elements. Input terminals of the flip-flop circuits are connected to the respectively corresponding output terminals of the delay elements.

Further, output terminals of the flip-flop circuits are respectively connected to the change point detection section 453. Further, a clock terminal of the flip-flop circuit is used to input a strobe signal that specifies take-in timing of a signal value emerging in the input terminal.

The enable control circuit 451 and the AND circuit 397 are for generating the foregoing strobe signal. The enable control circuit 451 generates an enable signal that designates an output enable time period of the strobe signal. For example, the enable control circuit 451 includes a counter. The count operation of the enable control circuit 451 is started at the time point when the detection signal to of the falling edge of the input pulse signal is notified.

At this time, the enable control circuit 451 counts a clock signal inputted with 50 MHz, and finishes the count operation at the time point when the count value reaches a previously set value. The enable control circuit 451 outputs only one enable signal at such an end time point. The AND circuit 397 generates a strobe signal by AND operation of the enable signal and the clock signal.

The change point detection section 453 is a circuit device to detect timing when the detection signal is increased to the reference potential Vref or more based on the delay output signals at the plurality of time points taken into the storage section 393 at the output time point of the strobe signal. For example, in the time period in which the detection signal is smaller than the reference potential Vref, it results in a series of "0". Meanwhile, in the time period in which the detection signal is larger than the reference potential Vref, it results in a series of "1". In this example, the change point detection section 453 counts the number of "0" emerging until detection of "1," and outputs the count value as information of the change point.

Figure 72:
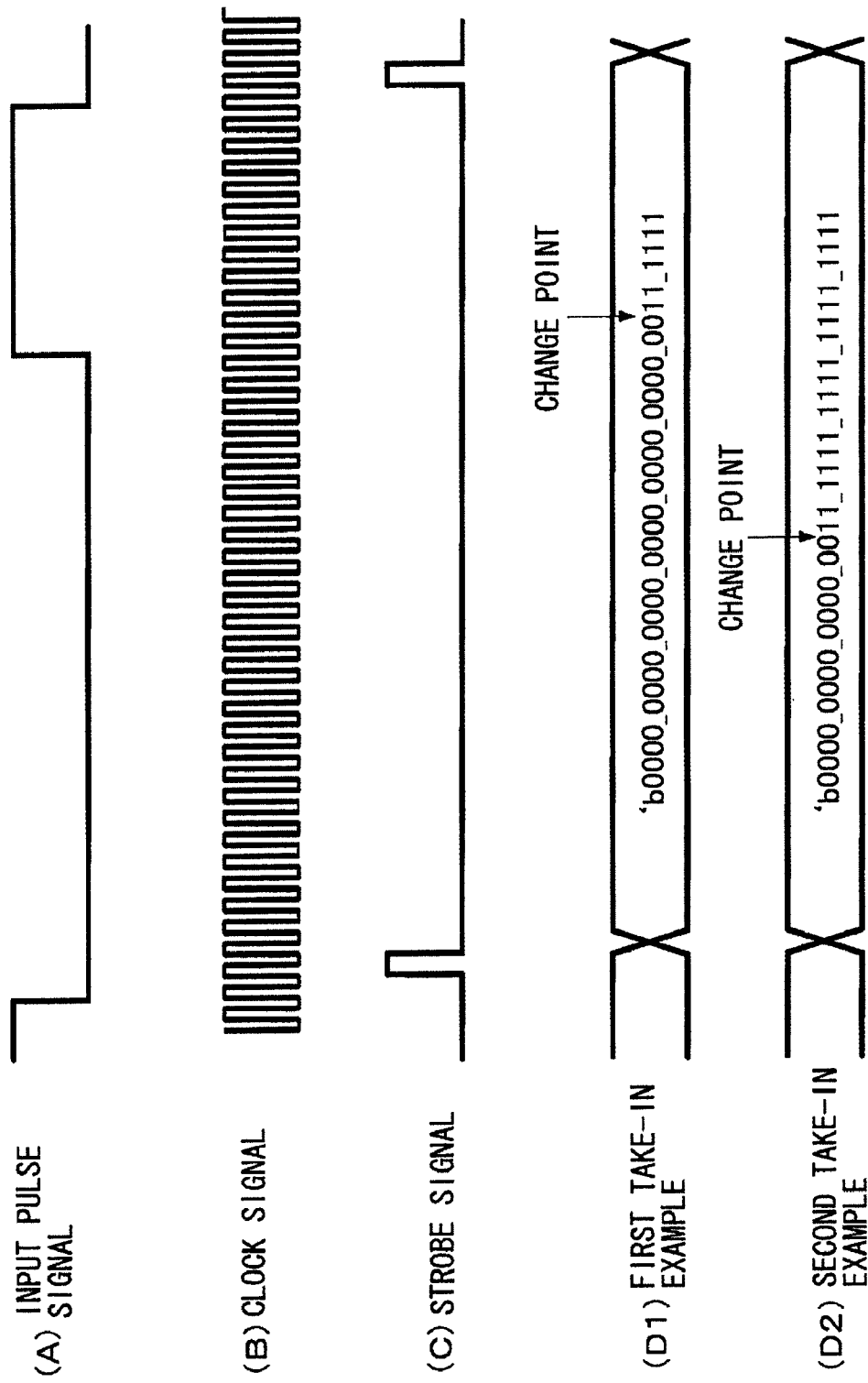
FIG. 72 is a diagram illustrating an example of numerical sequence of a delay output signal taken in by a strobe signal.

FIG. 72 specifically illustrates examples of numerical sequences taken into the change point detection section 453. Part (A) of FIG. 72 illustrates a waveform of an input pulse signal. Part (B) of FIG. 72 illustrates a waveform of a clock signal. As described above, the clock signal is given with 50 MHz (20 ns). Part (C) of FIG. 72 illustrates a waveform of a strobe signal. Part (D1) of FIG. 72 is a numerical sequence of a first take-in example corresponding to a case that input operation is executed. Part (D2) of FIG. 72 is a numerical sequence of a second take-in example corresponding to a case that no input operation is executed. As evidenced by comparison between parts (D1) and (D2) of FIG. 72, the number of "0" emerging until "1" is detected is significantly changed according to presence of input operation.

Count value difference by 1 corresponds to difference by 2 ns (500 MHz). However, to realize accurate execution of determination in the subsequent determination section 373, it is desirable that the number of count values in the case where no input operation is executed emerge in a reference point. That is, calibration operation is desirable. A method of calibration is similar to that of the first example of the present second embodiment.

[D-3. Contents of Processing Operation]

Figure 73:
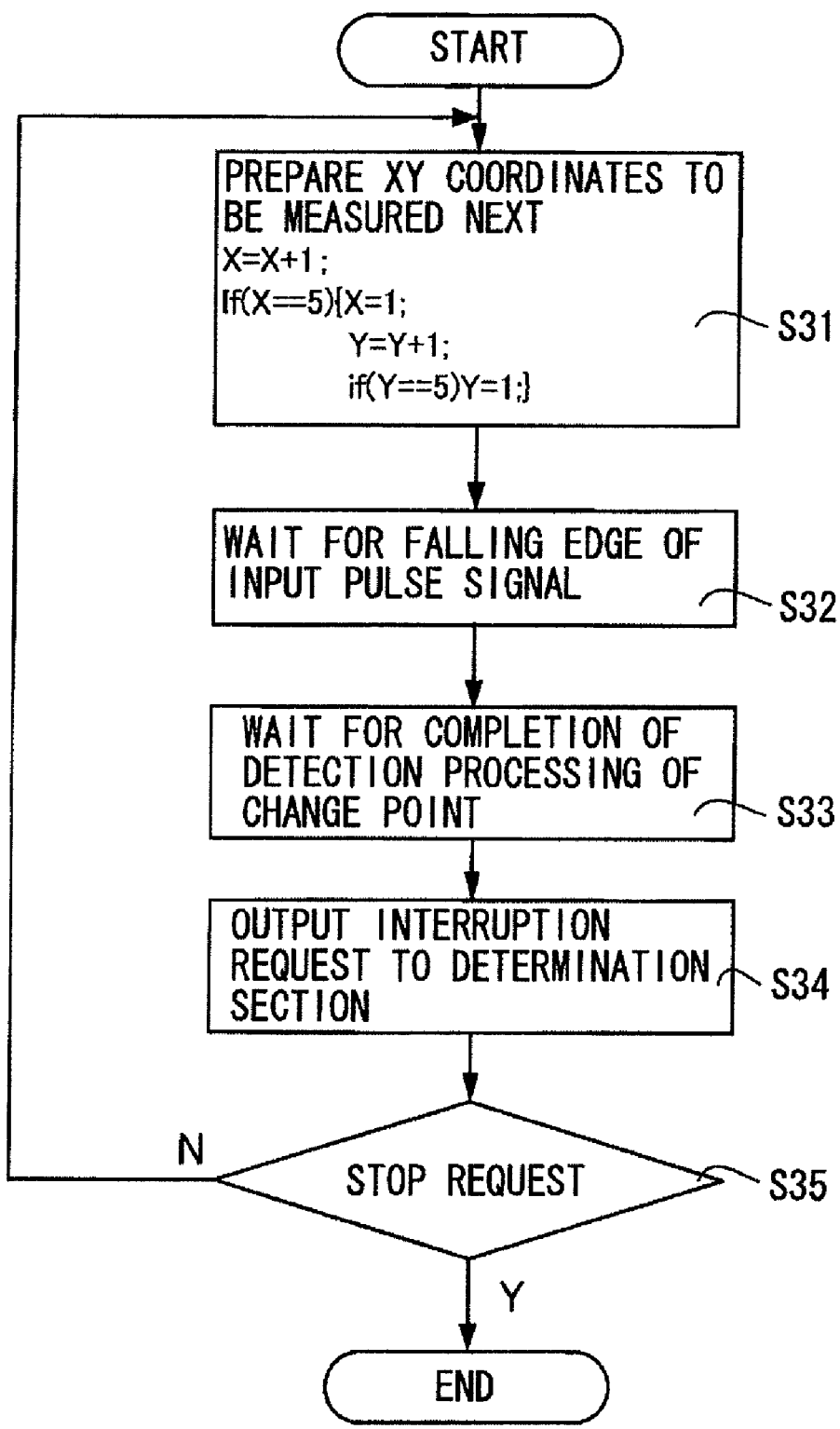
FIG. 73 is a flowchart for explaining an example of operation of a sequencer.

A description will be hereinafter given of processing operation of the capacitive sensor module 441 according to the operation flow of the sequencer 445 (FIG. 73).

First, the sequencer 445 generates coordinates to designate the position on the operation face as a measurement target (S31). The sequencer 445 increases coordinate value X of the electrode patterns 5 on the top face side by only "1" for every one period of an input pulse signal. In the case of FIG. 73, when the increased coordinate value X reaches "5," the sequencer 445 decreases the coordinate value X back to "1," and increases coordinate value Y of the electrode patterns on the bottom face side by only "1." When the increased coordinate value Y reaches "5," the sequencer 445 decreases the coordinate value Y back to "1."

The coordinate values X and Y generated as above are given to the de-multiplexer 353, the multiplexer 355, the reference value table 447, and the determination section 373. Thereby, the reference value Vref suitable for each measurement point is given from the reference value table 447 to the comparator 369. Further, in preparation for inputting the input pulse signal, the de-multiplexer 353 and the multiplexer 355 are switching-controlled.

Meanwhile, the sequencer 445 waits for detection of falling edge of the input pulse signal (S32). If the falling edge is detected, the sequencer 445 notifies the edge detection to the measurement section 449, and makes the enable control circuit 451 start outputting the enable signal.

At this time, in the delay circuit stage 391, the delay output signals having time difference by every 2 ns are generated. Delay output signals existing in inputting the strobe signal are taken into the storage section 393 all together.

After that, the change point detection section 453 detects the timing when the detection signal exceeds the reference potential Vref (that is, change point). The sequencer 445 waits for completion of the detection processing of the change point (S33). Next, the sequencer 445 outputs an interruption request to the determination section 373 (S34). The determination section 373 to which the interruption request is inputted compares the detected count value to the reference value, and determines presence of input operation to the measurement point based on a result of comparison.

After that, the sequencer 445 determines whether or not a stop request exists (S35). If the stop request is not confirmed, the sequencer 445 returns to the generation operation of the XY coordinates again to repeat the foregoing operation. If the stop request is confirmed, the sequencer 445 finishes the operation.

[E-4. Conclusion]

As described above, even in the case where presence of input operation is determined by detecting the time length until the detection signal exceeds the reference potential Vref, significantly high-speed determination operation is enabled as well compared to in the existing technologies. For example, in the case where determination processing for 10 locations is executed, time of 20 ms is necessitated in the existing technologies. On the other hand, in the case of this example, it is enough to take time of 20 µs. Thus, addressing high-speed input that has been difficult to deal in the existing technologies is enabled.

It is needless to say that the capacitance change measuring circuit 443 according to this example is able to be used for multi-location detection as well. Further, since operation is executed in the current mode until input stage of the current input voltage output amplifier 359. Thus, high noise resistance is prospective. That is, the capacitance change measuring circuit 443 according to this example is prospective to realize practically sufficient precision with regard to detection precision as well. Further, in the case of this example, while the clock signal with 50 MHz (20 ns) is used, emergence position of change point is able to be detected to precision equal to that in the case of using a clock signal with 500 MHz (2 ns).

That is, it is able to realize the capacitance change measuring circuit 443 operating with a lower frequency compared to that of the existing type. Since the frequency of the operation clock is able to be lowered, low electric power consumption of the capacitance change measuring circuit 443 is able to be realized. Such low electric consumption is advantageous to realizing long life of operation time particularly in the case where the capacitive sensor module 441 is mounted on a portable electronic device. Further, accordingly, mounting the capacitive sensor module 441 on a portable electronic device is promoted.

Further, since the frequency of the operation clock is able to be lowered, a clock progressive increase circuit such as a PLL (Phase-LockedLoop) circuit is able to be eliminated. Accordingly, integration of the capacitive sensor module 443 is able to be facilitated.

[E. Fourth Example]

[E-1. Detection Principle]

Figure 74:
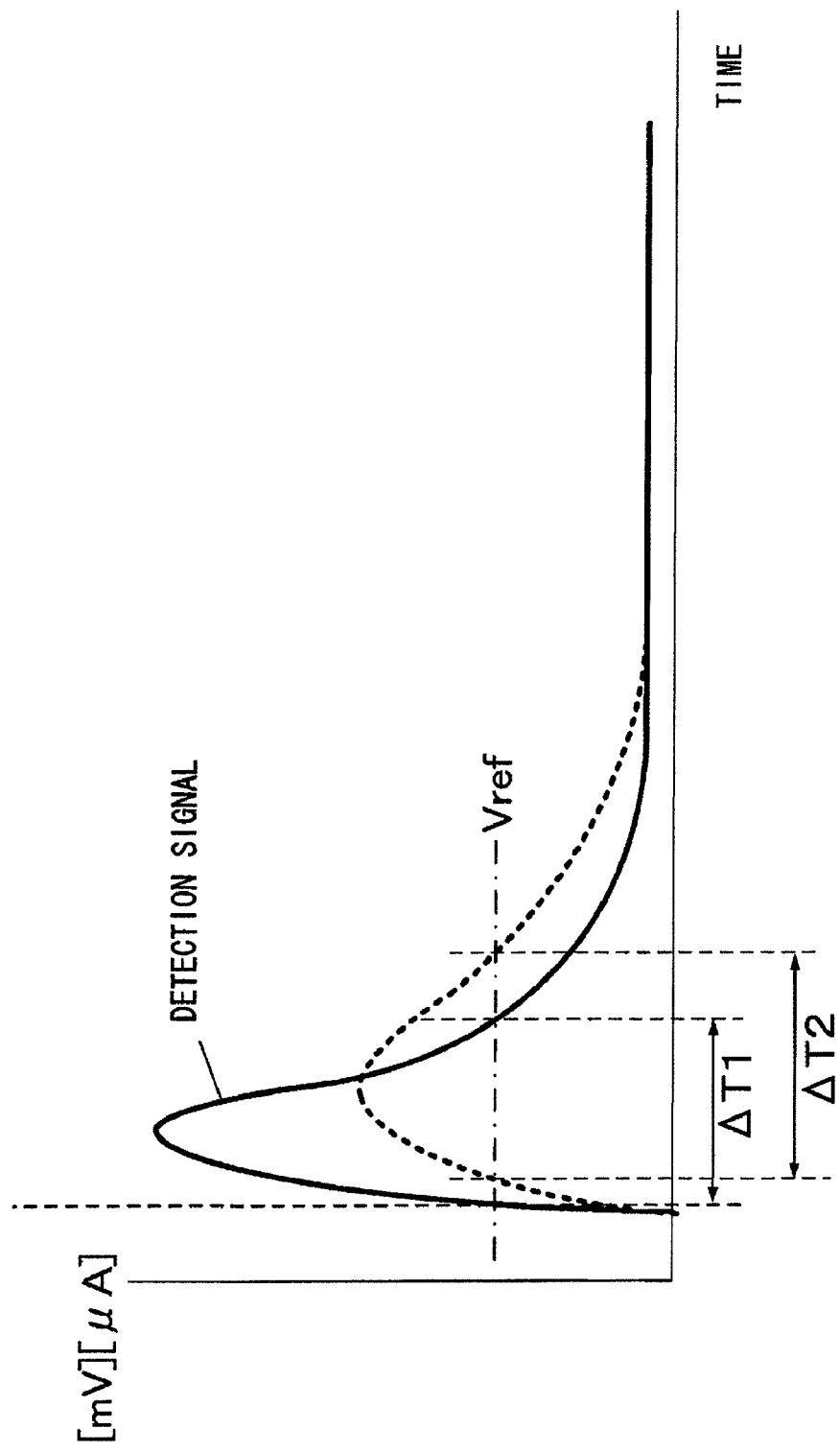
FIG. 74 is a diagram for explaining difference of measurement time length according to difference of amplitude of detection waveforms.

In this example, attention is focused on difference of pulse width of a detection signal to an input pulse signal. FIG. 74 illustrates a relation between a response waveform and pulse width ΔT to be measured focusing attention on a measurement point (closed circuit). In the figure, a detection signal in the case that no input operation is executed is indicated by a full line, and a detection signal in the case where input operation is executed is indicated by a dotted line.

As illustrated in the figure, compared to pulse width ΔT1 in the case where no input operation is executed, pulse width ΔT2 in the case where input operation is executed is longer. In this example, the time length in which the detection signal exceeds the reference potential Vref is measured as a pulse width. In the figure, the horizontal axis indicates elapsed time from the falling timing of the input pulse signal. In the figure, the vertical axis indicates a current amount corresponding to the response waveform.

[E-2. System Configuration]

Figure 75:
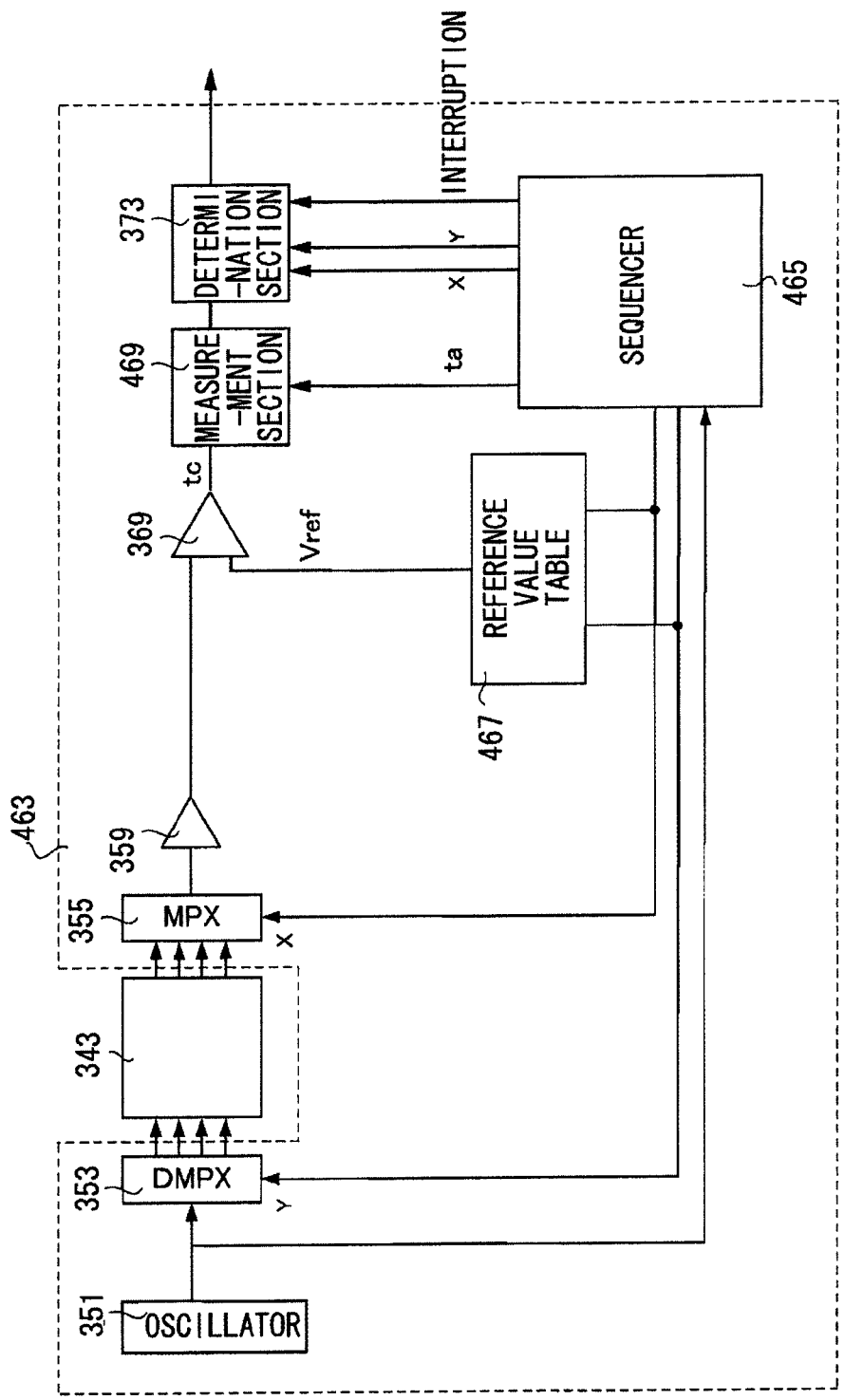
FIG. 75 is a diagram illustrating an example of functional structure of a capacitive sensor module.

FIG. 75 illustrates an example of system configuration of a capacitive sensor module 461 according to this example. In FIG. 75, elements corresponding to those in FIG. 49 according to the first example of the present second embodiment are affixed with the same referential symbols. The capacitive sensor module 461 includes the capacitive sensor device 343 and a capacitance change measuring circuit 463.

The capacitance change measuring circuit 463 includes the oscillator 351, the de-multiplexer 353, the multiplexer 355, a sequencer 465, the current input voltage output type amplifier 359, the comparator 369, a reference value table 467, a measurement section 469, and the determination section 373. In the case of this example, since the pulse width of the detection signal outputted from the current input voltage output type amplifier 359 is measured, the peak hold circuit and the discharge circuit thereof in the first example of the present second embodiment are not necessitated. A description will be hereinafter given of only new components adopted in this example.

[1. Sequencer]

The sequencer 465 is a circuit that outputs connection order to the electrode patterns 5 to which the input pulse signal is supplied and connection order to the electrode patterns 7 as an extraction source of the response signal as coordinate information (X, Y). In this example, the sequencer 465 manages control timing based on falling edge of the input pulse signal. The function is the same as that of the first example of the present second embodiment.

In this example, the sequencer 465 is similar to that of the first example of the present second embodiment as well, in that the sequencer 465 generates control timing of the measurement section 469, the determination section 373 and the like. However, the sequencer 465 according to this example outputs the detection signal of the falling edge of the input pulse signal to the measurement section 469, since in this example, difference of pulse width of detection signals is a measurement target.

[2. Reference Value Table]

The reference value table 467 is a storage region to store coordinates of a measurement point and the reference value Vref correspondingly. Since the amplitude and the waveform of the detection signal are significantly changed according to the measurement point as illustrated in FIG. 54, the reference potential Vref is variable according to the measurement point. Thus, in the case of this example, the reference potential Vref is optimized for every measurement point, and presence of input operation is able to be measured as pulse width change.

[3. Measurement Section]

Figure 76:
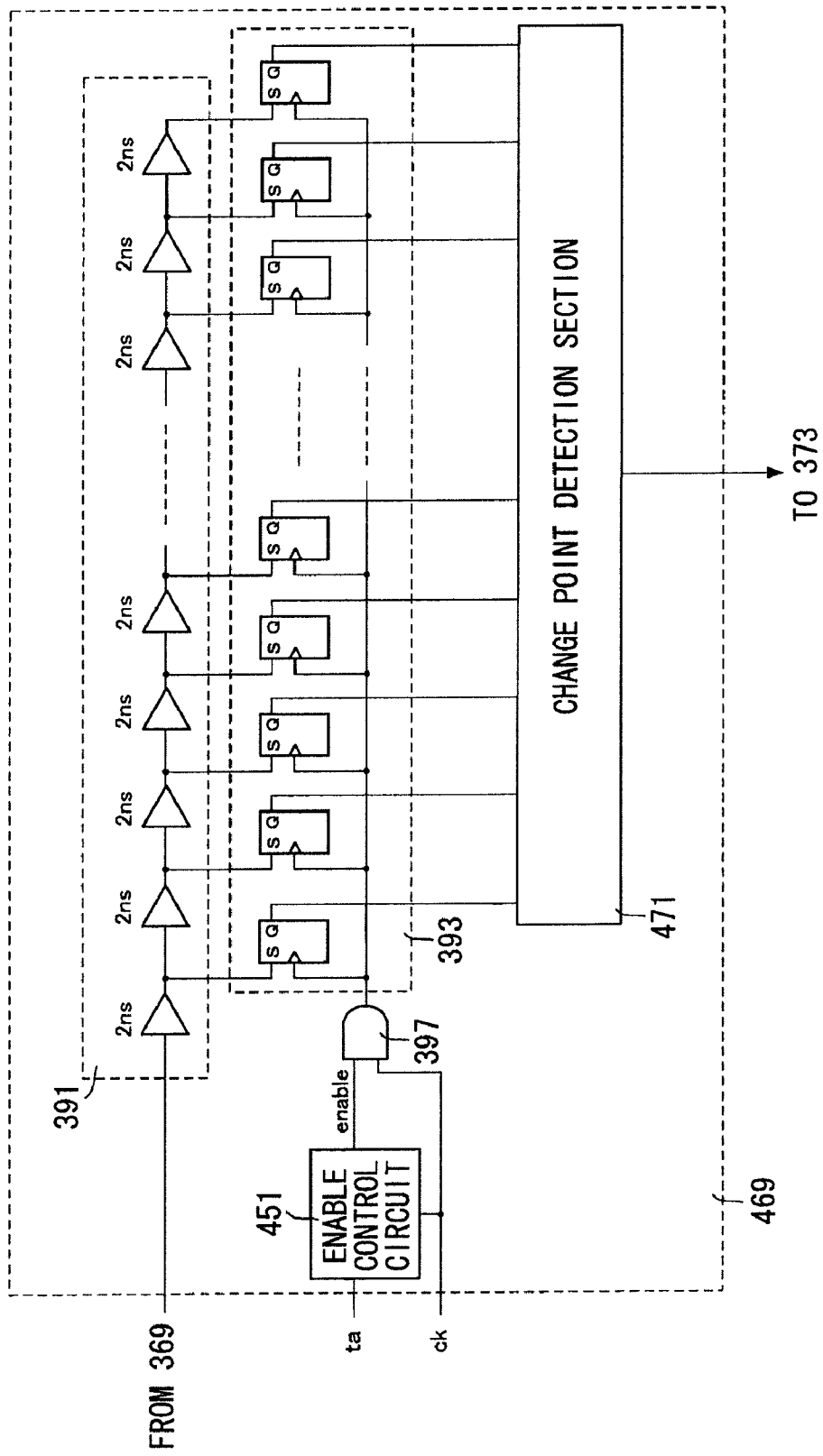
FIG. 76 is a diagram illustrating an example of internal structure of a measurement section.

The measurement section 469 is a circuit device to detect the change point of the logic output level shown in the comparison output signal inputted from the comparator 369. FIG. 76 illustrates an example of structure of the measurement section 469 according to this example. In FIG. 76, elements corresponding to those in FIG. 71 are affixed with the same referential symbols. The measurement section 469 includes the delay circuit stage 391, the storage section 393, the enable control circuit 451, the AND circuit 397, and a change point detection section 471.

In this example, the measurement section 469 adopts the delay circuit stage 391 having the same structure as that of the first example of the present second embodiment. That is, the delay circuit stage 391 includes a series circuit of delay elements that respectively have the same unit delay time. In this example, the delay elements having a unit delay time of 2 ns at ambient temperature are used as well.

In the case of this example, the number of stages of the delay elements structuring the delay circuit stage 391 is set so that a time length of the delay output signals at a plurality of time points existing at the same time on the delay circuit stage 391 is longer than a time range in which "1" possibly emerges as the delay output signal. That is, the same detection method as that of the first example of the present second embodiment is adopted. It is needless to say that the same detection method as that of the second example of the present second embodiment is able to be used. A description will be hereinafter given of a case in which the same detection method as that of the first example is adopted.

The storage section 393 includes a storage device that takes in the delay output signal emerging in each output stage of each delay element into a corresponding storage region in sync with a strobe pulse. In this example, the storage section 393 also includes the same number of flip-flop circuits as the number of the delay elements. Input terminals of the flip-flop circuits are connected to the respectively corresponding output terminals of the delay elements.

Further, output terminals of the flip-flop circuits are respectively connected to the change point detection section 471. Further, a clock terminal of the flip-flop circuit is used to input a strobe signal that specifies take-in timing of a signal value emerging in the input terminal.

The enable control circuit 451 and the AND circuit 397 are intended to generate the foregoing strobe signal. The enable control circuit 451 generates an enable signal that designates an output enable time period of the strobe signal. For example, the enable control circuit 451 includes a counter. The count operation of the enable control circuit 451 is started at the time point when the detection signal to of the falling edge of the input pulse signal is notified.

At this emit, the enable control circuit 451 counts a clock signal inputted with 50 MHz, and finishes the count operation at the time point when the count value reaches a previously set value. The end timing of count operation is desirably set for every measurement point, since a time period length necessary for measuring a pulse width largely varies according to the measurement point.

The enable control circuit 451 outputs only one enable signal at such an end time point. The AND circuit 397 generates a strobe signal by AND operation of the enable signal and the clock signal. The change point detection section 471 is a circuit device to detect a time period length in which the detection signal is the reference potential Vref or more based on the delay output signal at the plurality of time points taken into the storage section 393 at the output time point of the strobe signal. The change point detection section 471 counts the number of "1" emerging as the delay output signal.

Figure 77:
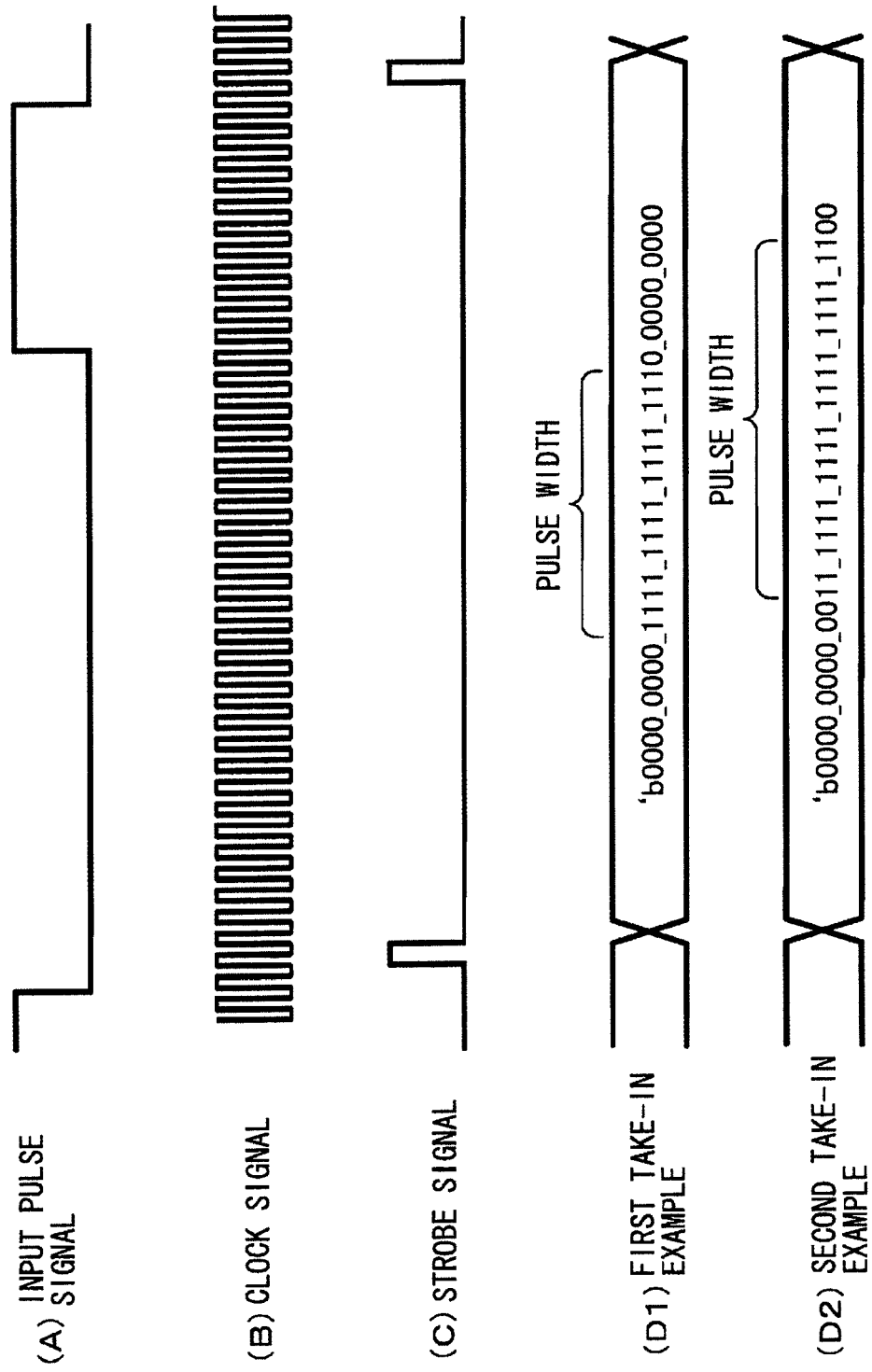
FIG. 77 is a diagram illustrating an example of numerical sequence of a delay output signal taken in by a strobe signal.

FIG. 77 specifically illustrates examples of numerical sequence taken into the change point detection section 471. Part (A) of FIG. 77 illustrates a waveform of an input pulse signal. Part (B) of FIG. 77 illustrates a waveform of a clock signal. As described above, the clock signal is given with 50 MHz (20 ns). Part (C) of FIG. 77 illustrates a waveform of a strobe signal.

Part (D1) of FIG. 77 illustrates a numerical sequence of a first take-in example corresponding to a case that no input operation is executed. Part (D2) of FIG. 77 illustrates a numerical sequence of a second take-in example corresponding to a case that input operation is executed. As can be seen from the comparison between parts (D1) and (D2) of FIG. 77, the number of "1" is significantly changed according to presence of input operation. Part (D1) of FIG. 77 illustrates a case that the pulse width of the detection signal is given by 14 delay elements. Part (D2) of FIG. 77 illustrates a case that the pulse width of the detection signal is given by 20 delay elements.

Count value difference by 1 corresponds to difference by 2 ns (500 MHz). However, to realize accurate execution of determination in the subsequent determination section 373, it is desirable that the number of count value in the case where no input operation is executed emerge in a reference point. That is, calibration operation is desirable. A method of calibration is similar to that of the first example.

[E-3. Contents of Processing Operation]

Figure 78:
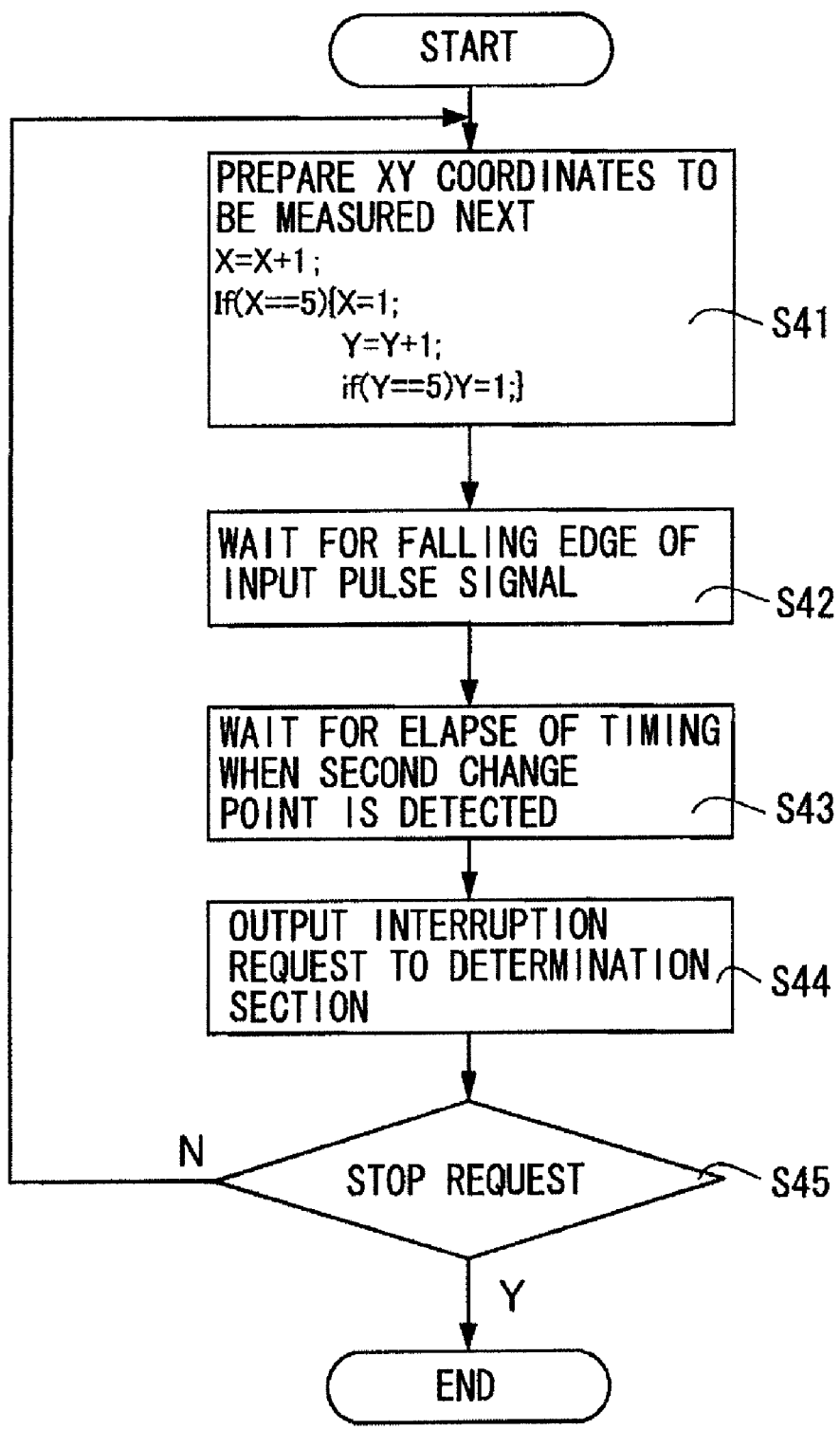
FIG. 78 is a flowchart for explaining an example of operation of a sequencer.

A description will be hereinafter given of processing operation of the capacitive sensor module 461 according to the operation flow of the sequencer 465 (FIG. 78).

First, the sequencer 465 generates coordinates to designate the position on the operation face as a measurement target (S41). The sequencer 465 increases coordinate value X of the electrodes patterns 5 on the top face side by only "1" for every one period of an input pulse signal. In the case of FIG. 78, when the increased coordinate value X reaches "5," the sequencer 465 decreases the coordinate value X back to "1," and increases coordinate value Y of the electrode patterns on the bottom face side by only "1." When the increased coordinate value Y reaches "5," the sequencer 465 decreases the coordinate value Y back to "1."

The coordinate values X and Y generated as above are given to the de-multiplexer 353, the multiplexer 355, the reference value table 467, and the determination section 373. Thereby, the reference value Vref suitable for each measurement position is given from the reference value table 467 to the comparator 369. Further, in preparation for inputting the input pulse signal, the de-multiplexer 353 and the multiplexer 355 are switching-controlled.

Meanwhile, the sequencer 465 waits for detection of falling edge of the input pulse signal (S42). If the falling edge is detected, the sequencer 465 notifies edge detection to the measurement section 469, and makes the enable control circuit 451 start outputting the enable signal. At this time, in the delay circuit stage 391, the delay output signals having time difference by every 2 ns are generated. The delay output signals existing in inputting the strobe signal are taken into the storage section 393 all together.

After that, the change point detection section 471 detects the length of a time period in which the detection signal exceeds the reference potential Vref (that is, pulse width) as the number of "1" in the read numerical sequence.

The sequencer 465 waits for elapse of emergence timing of the prospective second change point for the measurement point (S43). Next, the sequencer 465 outputs an interruption request to the determination section 373 (S44). The determination section 373 to which the interruption request is inputted compares the detected count value to the reference value, and determines presence of input operation for the measurement point based on a result of comparison.

After that, the sequencer 465 determines whether or not a stop request exists (S45). If the stop request is not confirmed, the sequencer 465 returns to the generation operation of the XY coordinates again to repeat the foregoing operation. If the stop request is confirmed, the sequencer 465 finishes the operation.

[F-4. Conclusion]

As described above, even in the case where presence of input operation is determined by detecting the length of time period in which the detection signal exceeds the reference potential Vref, significantly high-speed determination operation is enabled compared to in the existing technologies. For example, in the case where determination processing for 10 locations is executed, time of 20 ms is necessitated in the existing technologies. On the other hand, in the case of this example, it is enough to take time of 20 µs. Thus, addressing high-speed input that has been difficult to deal in the existing technologies is enabled.

It is needless to say that the capacitance change measuring circuit 463 according to this example is able to be used for multi-location detection as well. Further, since operation is executed in the current mode until input stage of the current input voltage output type amplifier 359. Thus, high noise resistance is prospective. That is, the capacitance change measuring circuit 463 according to this example is prospective to realize practically sufficient precision with regard to detection precision as well. Further, in the case of this example, while the clock signal with 50 MHz (20 ns) is used, emergence position of change point is able to be detected to precision equal to that in the case of using a clock signal with 500 MHz (2 ns).

That is, it is able to realize the capacitance change measuring circuit 463 operating with lower frequency compared to the existing type. Since the frequency of the operation clock is able to be lowered, low electric power consumption of the capacitance change measuring circuit 463 is able to be realized. Such low electric consumption is advantageous to realizing long life of operation time particularly in the case where the capacitive sensor module 461 is mounted on a portable electronic device. Further, in this case, mounting the capacitive sensor module 461 on a portable electronic device is promoted.

Further, since the frequency of the operation clock is able to be lowered, a clock progressive increase circuit such as a PLL (Phase-LockedLoop) circuit is able to be eliminated. Further, since the clock progressive increase circuit is not necessitated, charging operation of the condenser is not necessitated. Thereby, integration of the capacitance change measuring circuit 463 is able to be facilitated. Further, compared to a case that an external condenser is used, the number of pins necessary for the integrated circuit is able to be reduced.

F. OTHER EXAMPLES

[F-1. Other Structure 1 of Measurement Section]

In the foregoing examples, the description has been given of the case that the strobe signal is generated by AND operation of the enable signal and the clock signal. However, a circuit structure not generating the strobe signal may be used.

Figure 79:
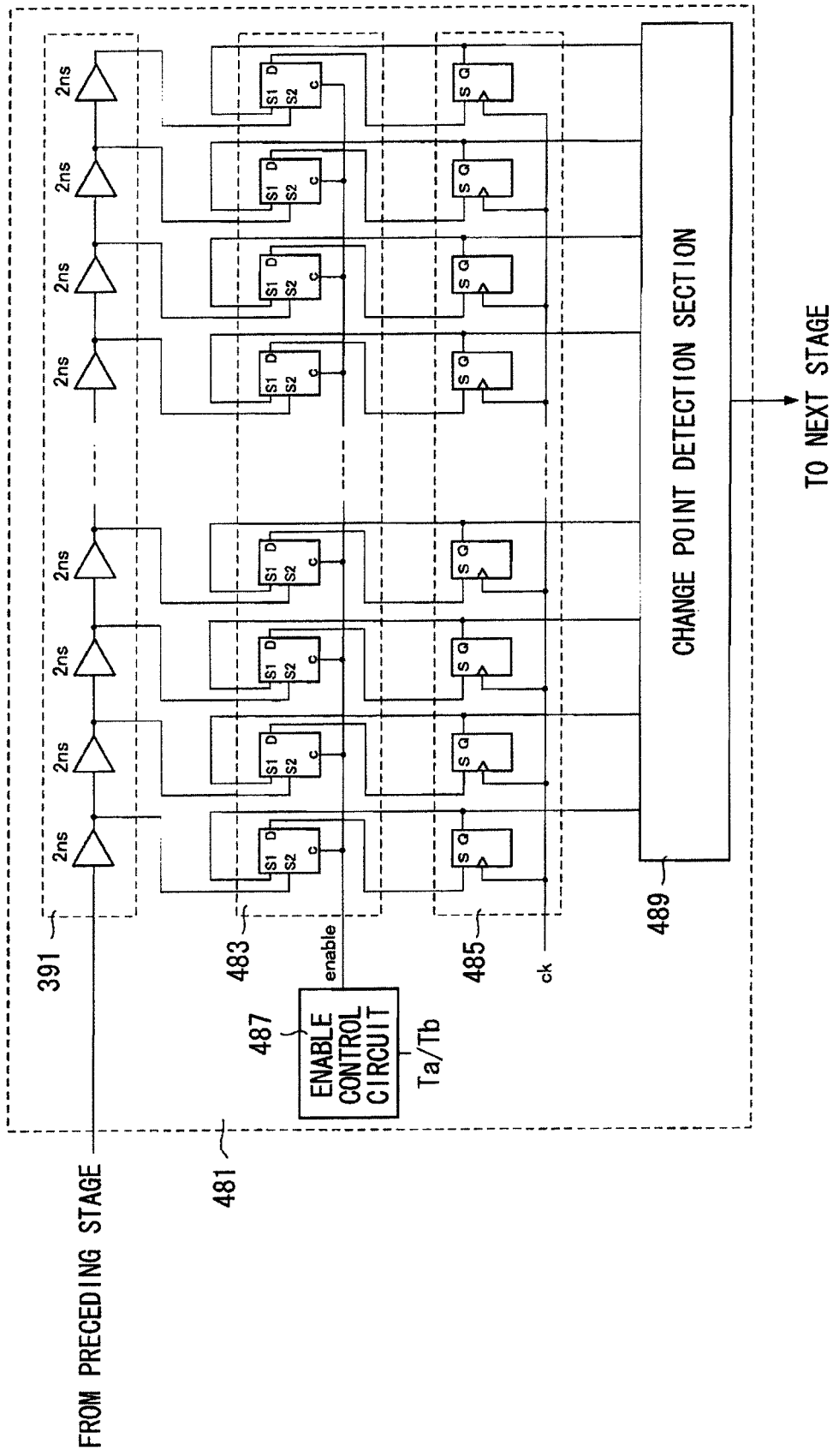
FIG. 79 is a diagram illustrating another example of internal structure of a measurement section.

FIG. 79 illustrates a circuit example of a determination section 481 corresponding to such a kind of structure. In FIG. 79, elements corresponding to those in FIG. 59 are affixed with the same referential symbols. The measurement section 481 includes the delay circuit stage 391, an input selection section 483, a storage section 485, an enable control circuit 487, and a change point detection section 489. As illustrated by affixing the same referential symbols thereto, the structure of the delay circuit stage 391 is similar to that of the foregoing examples. That is, the delay circuit stage 391 has a circuit structure in which delay elements that respectively have the same unit delay time are connected in series. Further, the number of stages of the delay elements is set according to the measurement time period length demanded in the foregoing each example.

Both the input selection section 483 and the storage section 485 are circuit devices which include multiplexers and flip-flops corresponding to the output terminals of the delay elements.

The multiplexer operates to select a delay output signal inputted from a corresponding delay element in the case where an enable signal is an effective value (corresponding to the H level of the foregoing examples). Meanwhile, the multiplexer operates to select an output signal of a corresponding flip-flop in the case where the enable signal is an ineffective value (corresponding to the L level of the foregoing examples).

That is, the multiplexer structuring the input selection section 483 is used to transfer the delay output signal of the corresponding delay element to the flip-flop during the time period when the enable signal is the effective value, and is used to loop the output value of the flip-flop in the other time periods.

Meanwhile, the flip-flop structuring the storage section 485 executes operation to take in an output signal of the multiplexer every time when a clock signal is inputted. As described above, operation equal to that of the foregoing respective examples is realized by the input selection section 483 and the storage section 485.

For the enable control circuit 487, a circuit device to generate the enable signal at the time corresponding to the foregoing respective examples is used. Further, for the change point detection section 489, a circuit device to detect a change point corresponding to the foregoing respective examples is used. That is, the determination section 481 having this circuit structure is able to be applied to the foregoing all examples.

[F-2. Other Structure 2 of Measurement Section]

In the foregoing all examples, the description has been given of the case that the delay circuit stage is structured by connecting the delay elements in series. However, the delay output signal having each delay amount different by unit delay time is able to be realized by other circuit structure.

Figure 80:
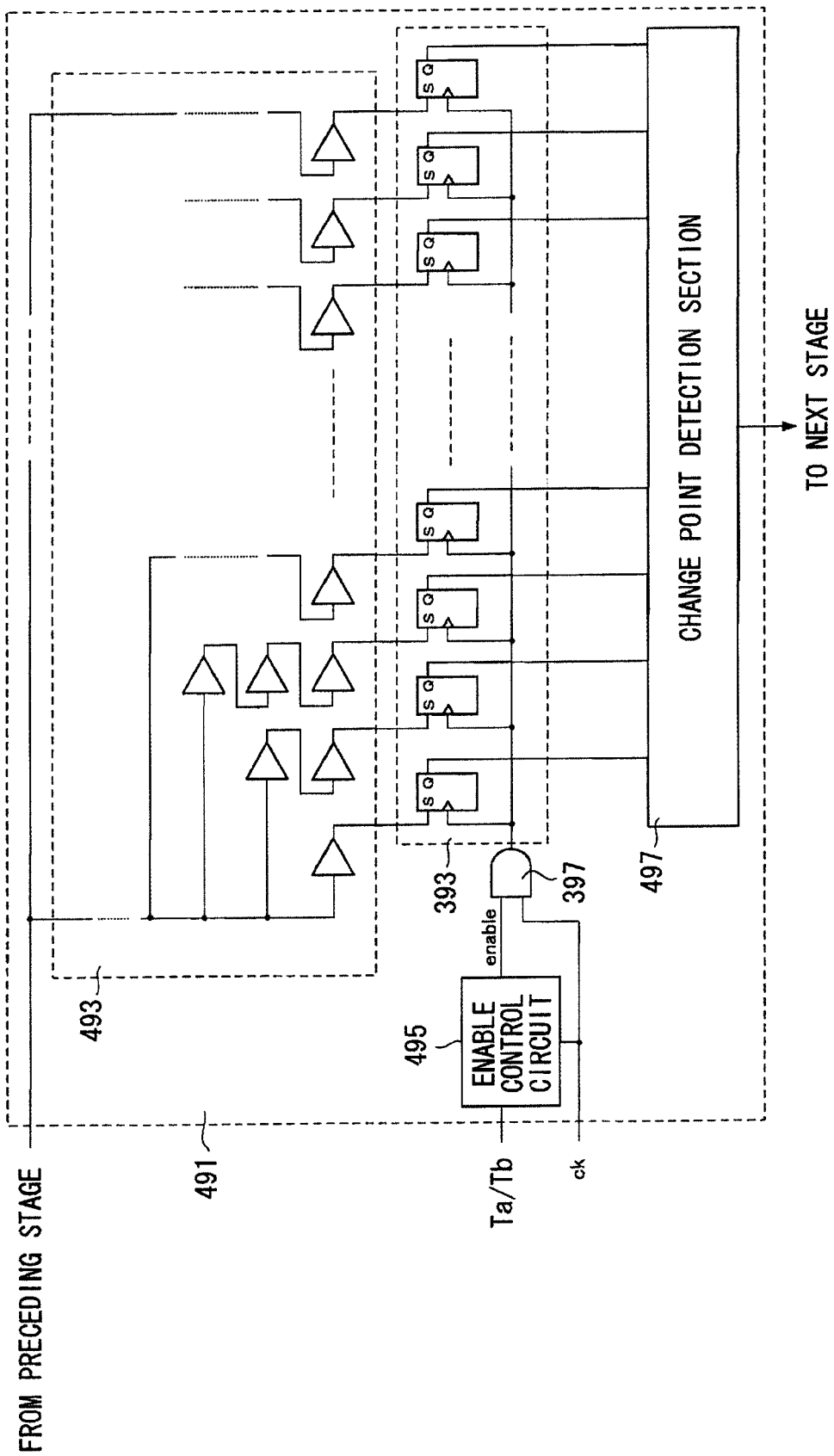
FIG. 80 is a diagram illustrating still another example of internal structure of a measurement section.
Figure 81:
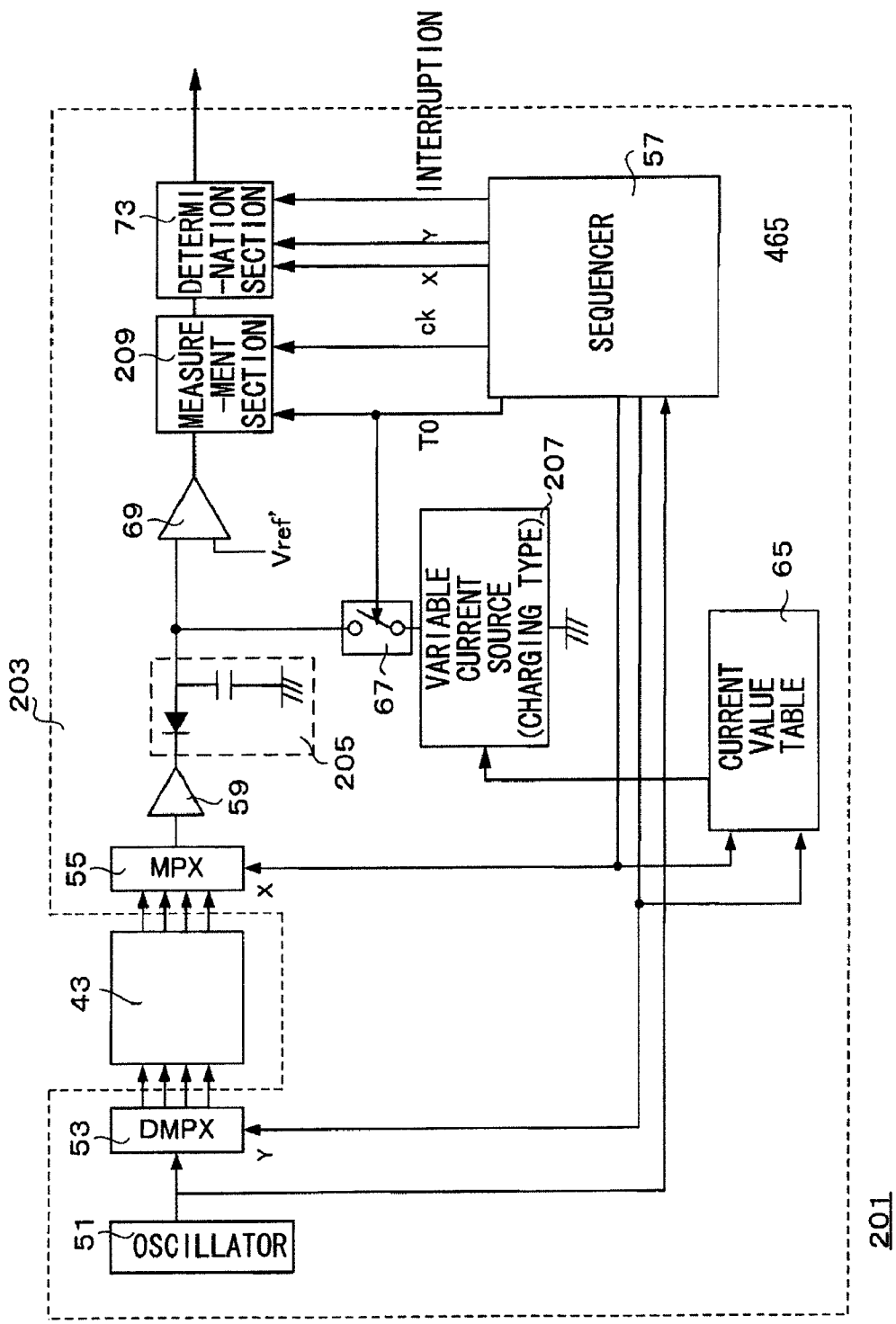
FIG. 81 is a diagram for explaining an example of another functional structure of the capacitive sensor module.

FIG. 80 illustrates a circuit example of a determination section 491 corresponding to such a kind of structure. In FIG. 80, elements corresponding to those in FIG. 59 are affixed with the same referential symbols. The measurement section 491 includes a delay circuit stage 493, the storage section 393, an enable control circuit 495, the AND circuit 394, and a change point detection section 497.

As illustrated in FIG. 80, the delay circuit stage 493 includes a parallel circuit in which the stage number of delay elements of each circuit is different by one stage.

That is, the delay circuit stage 493 includes a structure in which circuits having a different delay amount by unit delay time are connected in parallel, for example, a structure configured of a circuit having one delay element, a circuit having two delay elements, a circuit having three delay elements and the like. Such a circuit structure has a disadvantage that the larger the range of necessary delay time is, the larger the circuit area is. However, such a circuit structure is a sufficiently practical circuit structure in the case where it is enough that the range of delay time is small.

For the enable control circuit 495, a circuit device to generate an enable signal at the time corresponding to the foregoing respective examples is used. Further, for the change point detection section 497, a circuit device to detect a change point corresponding to the foregoing respective examples is used. That is, the measurement section 491 having this circuit structure is able to be applied to the foregoing all examples.

[Application]

PRODUCT EXAMPLES

[a. System Configuration]

In the foregoing descriptions, the structures and the operation contents of the capacitive sensor modules have been explained. However, the foregoing capacitive sensor module is also distributed as a form of product by being mounted on various electronic devices. Examples of mounting the capacitive sensor module on electronic devices will be hereinafter described.

Figure 82:
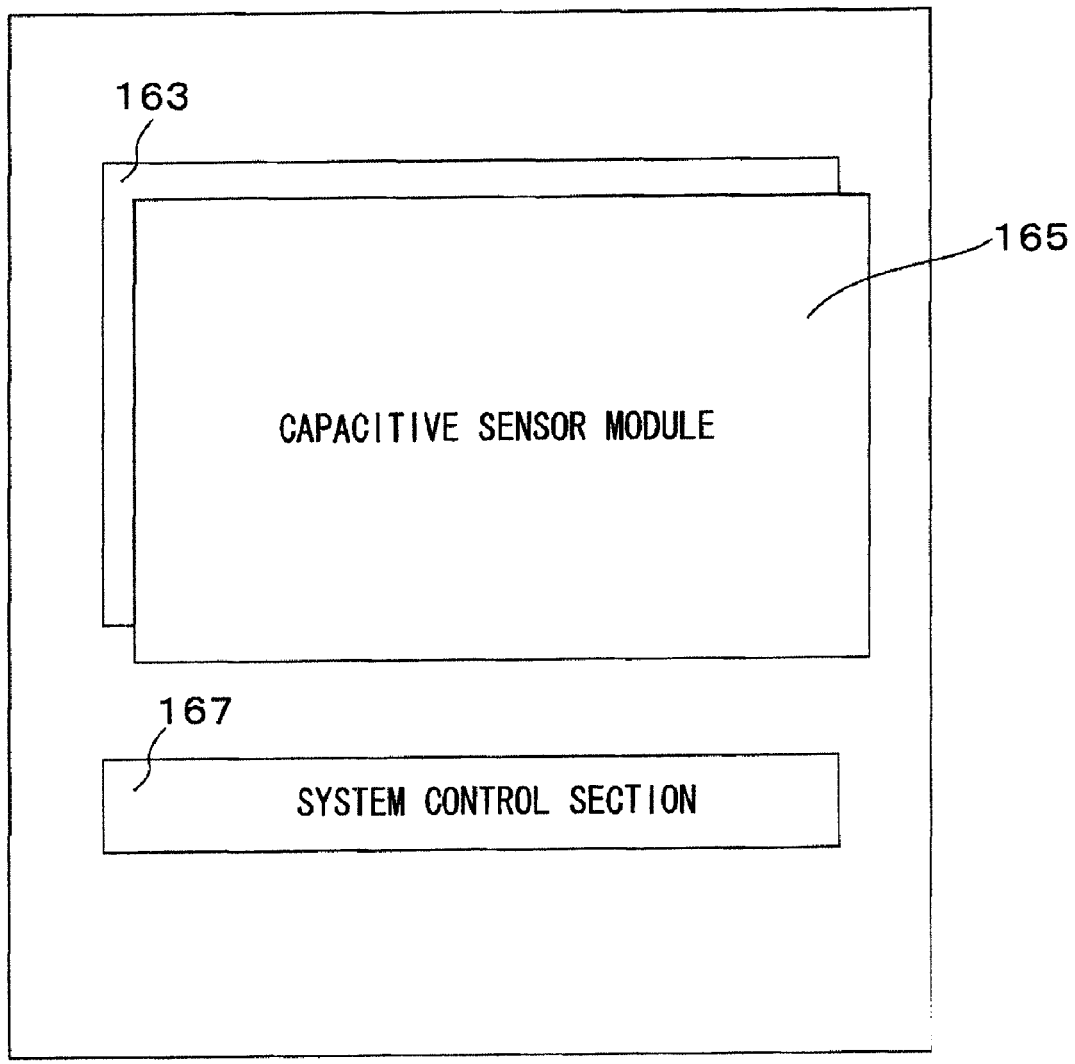
FIG. 82 is a view illustrating an example of conceptual structure of an electronic device.
Figure 83:
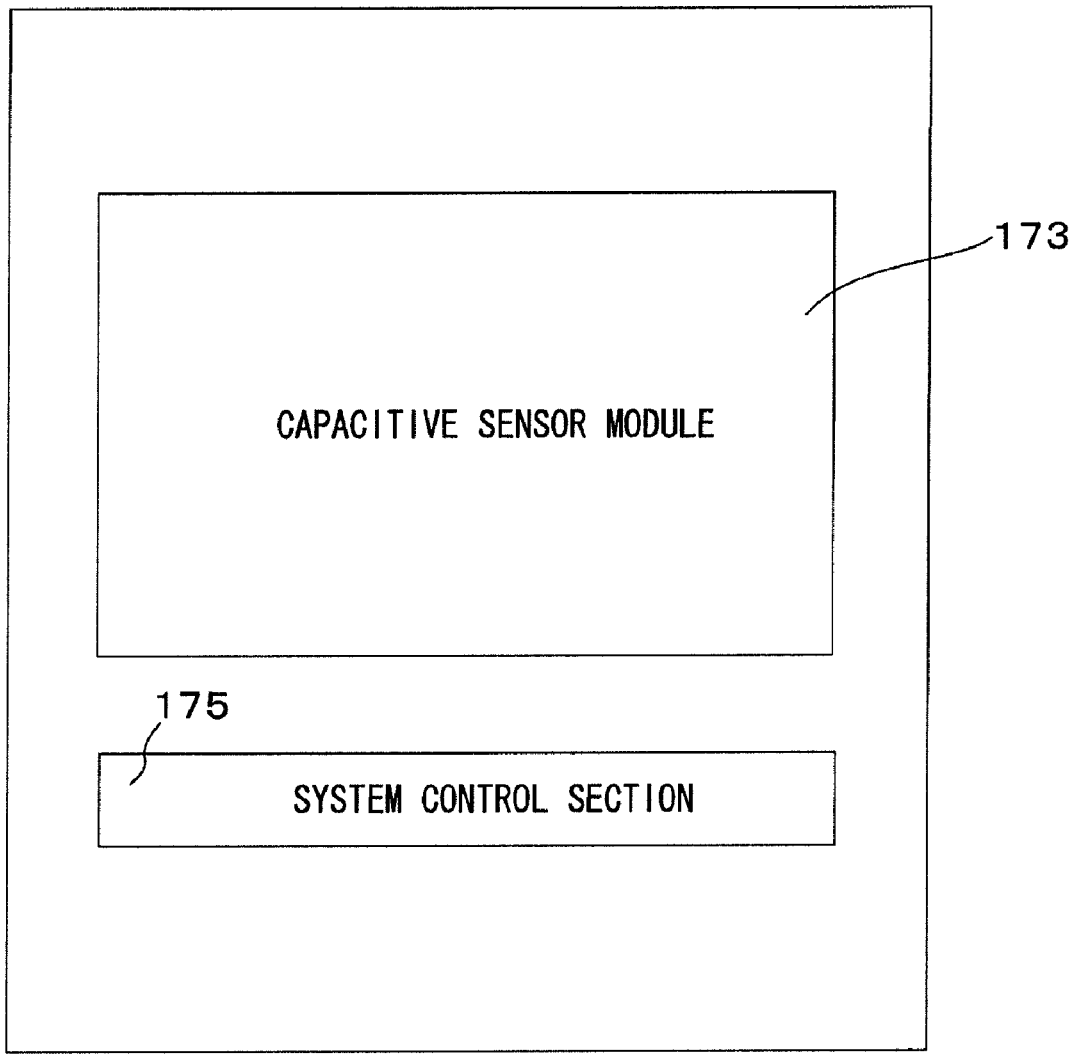
FIG. 83 is a view illustrating an example of conceptual structure of an electronic device.

FIG. 82 and FIG. 83 illustrate examples of functional structures of electronic devices.

An electronic device 161 illustrated in FIG. 82 has a functional structure as an electronic device in which a capacitive sensor module 165 is layered on the surface of a display device 163. A system control section 167 for controlling the whole system is mounted on the electronic device 161. As the display device 163, for example, a liquid crystal panel, an organic EL display panel, an FED panel, a plasma panel or the like is used.

An electronic device 171 illustrated in FIG. 83 has a functional structure as an electronic device in which a display device is not used. The electronic device 171 has a functional structure, for example, as a scanner or the like that designates an extraction range while transmitting the extraction range through a capacitive sensor module 173 and viewing the extraction range. It is needless to say that a system control section 175 for controlling the whole system is mounted on the electronic device 171.

[b. Specific Examples]

A description will be hereinafter given of specific appearance examples of electronic devices.

Figure 84:
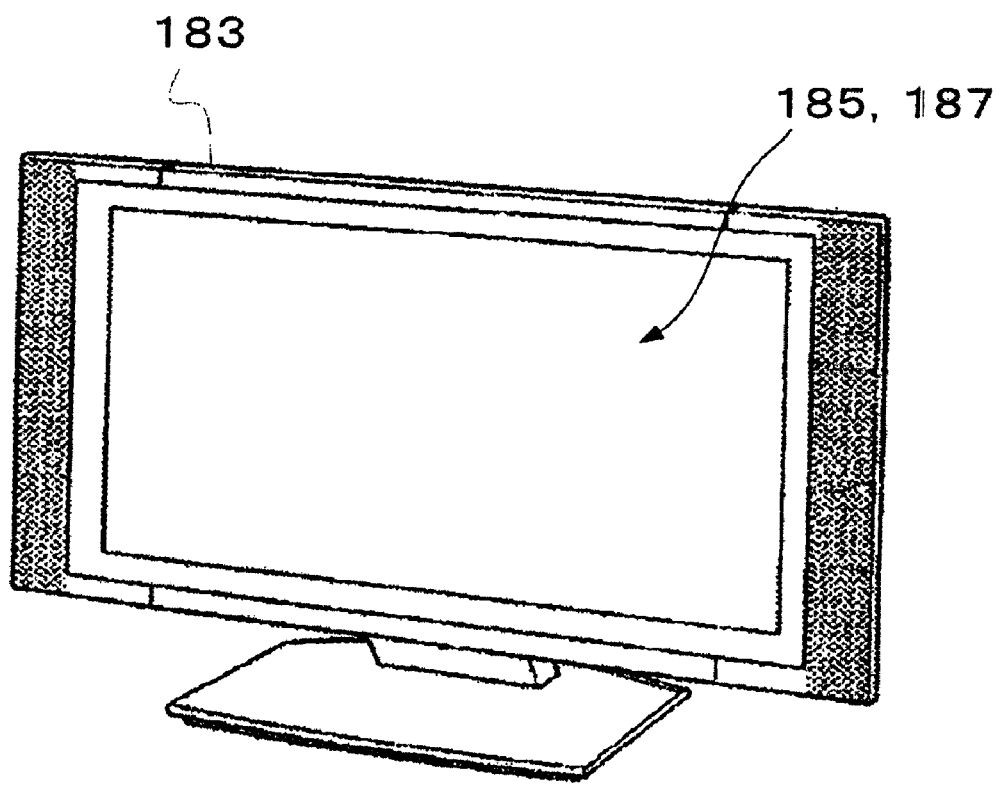
FIG. 84 is a view illustrating an example of electronic device product.

FIG. 84 illustrates an appearance example of a television receiver 181. The television receiver 181 has a structure in which a display screen 185 and a capacitive sensor module 187 are arranged on the front face of a housing 183. The foregoing various examples are applied to the capacitive sensor module 187.

Figure 85:
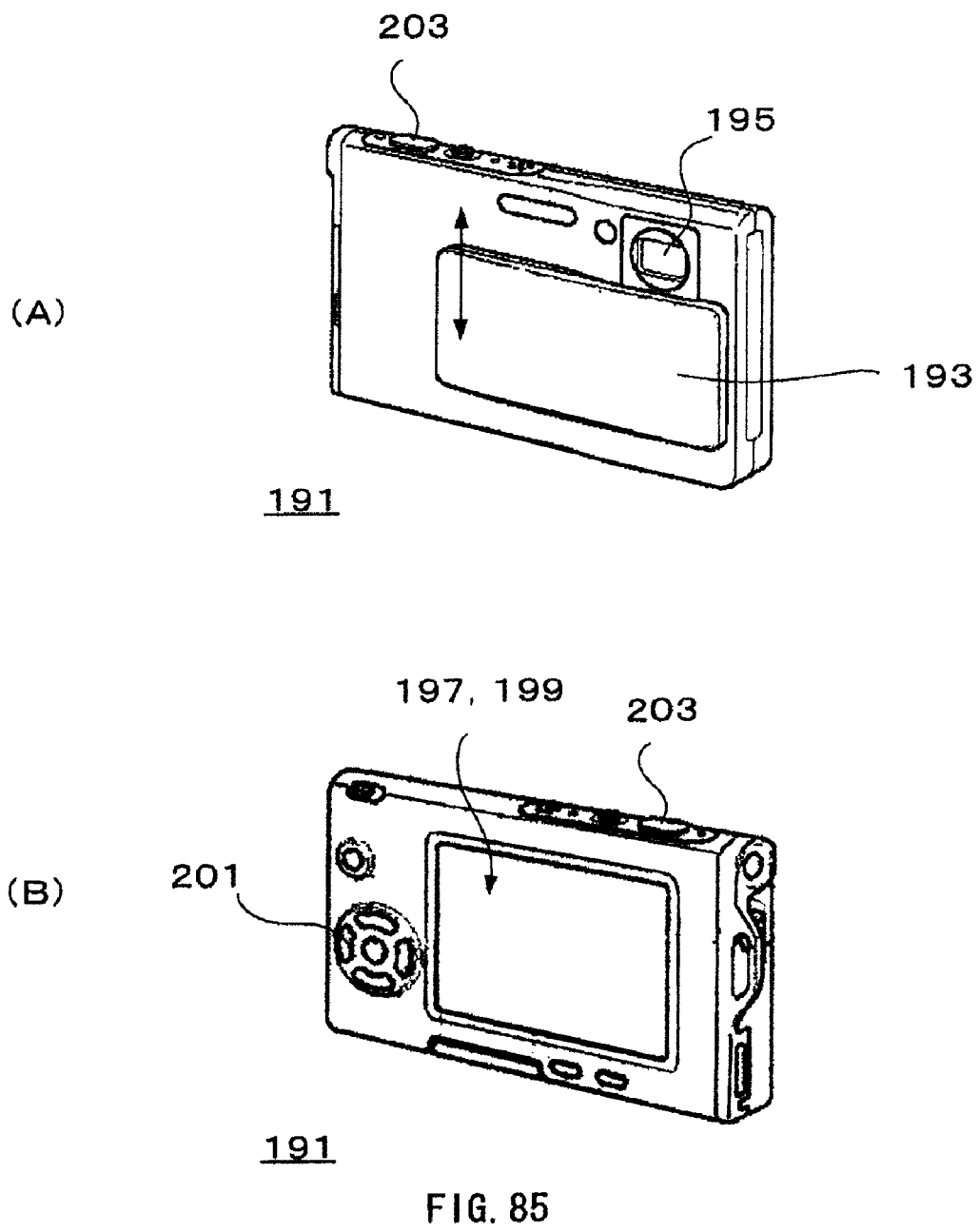
FIG. 85 is a view illustrating an example of electronic device product.

FIG. 85 illustrates an appearance example of a digital camera 191. Part (A) of FIG. 85 is an appearance example of the front face side (subject side), and part (B) of FIG. 85 is an appearance example of the rear face side (photographer side).

The digital camera 191 includes a protective cover 193, an imaging lens section 195, a display section 197, a capacitive sensor module 199, a control switch 201, and a shutter button 203. The foregoing various examples are applied to the capacitive sensor module 199.

Figure 86:
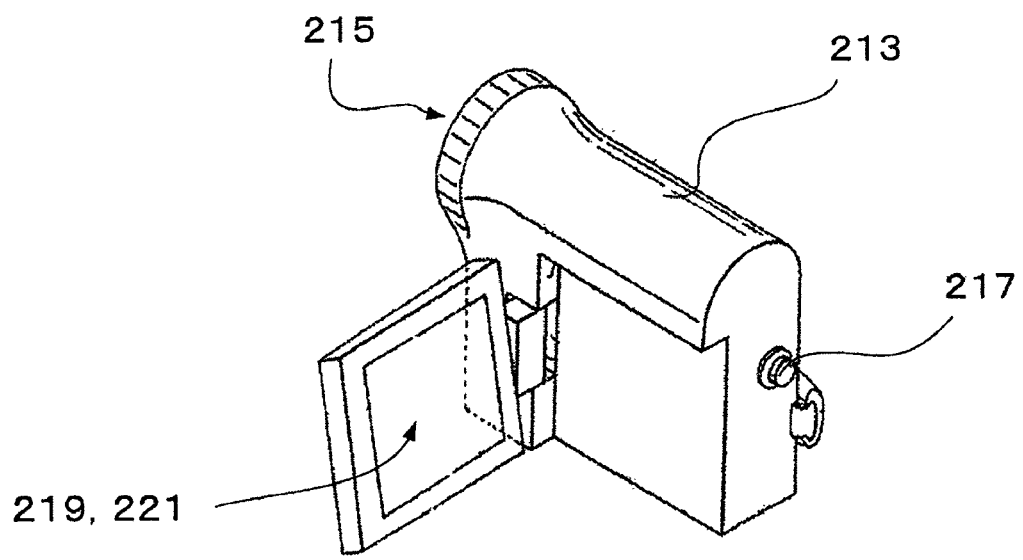
FIG. 86 is a view illustrating an example of electronic device product.

FIG. 86 illustrates an appearance example of a video camera 211. The video camera 211 includes an imaging lens 215 for taking an image of a subject located in the front of a main body 213, a capturing start/stop switch 217, a display screen 219, and a capacitive sensor module 221. The foregoing various examples are applied to the capacitive sensor module 221.

Figure 87:
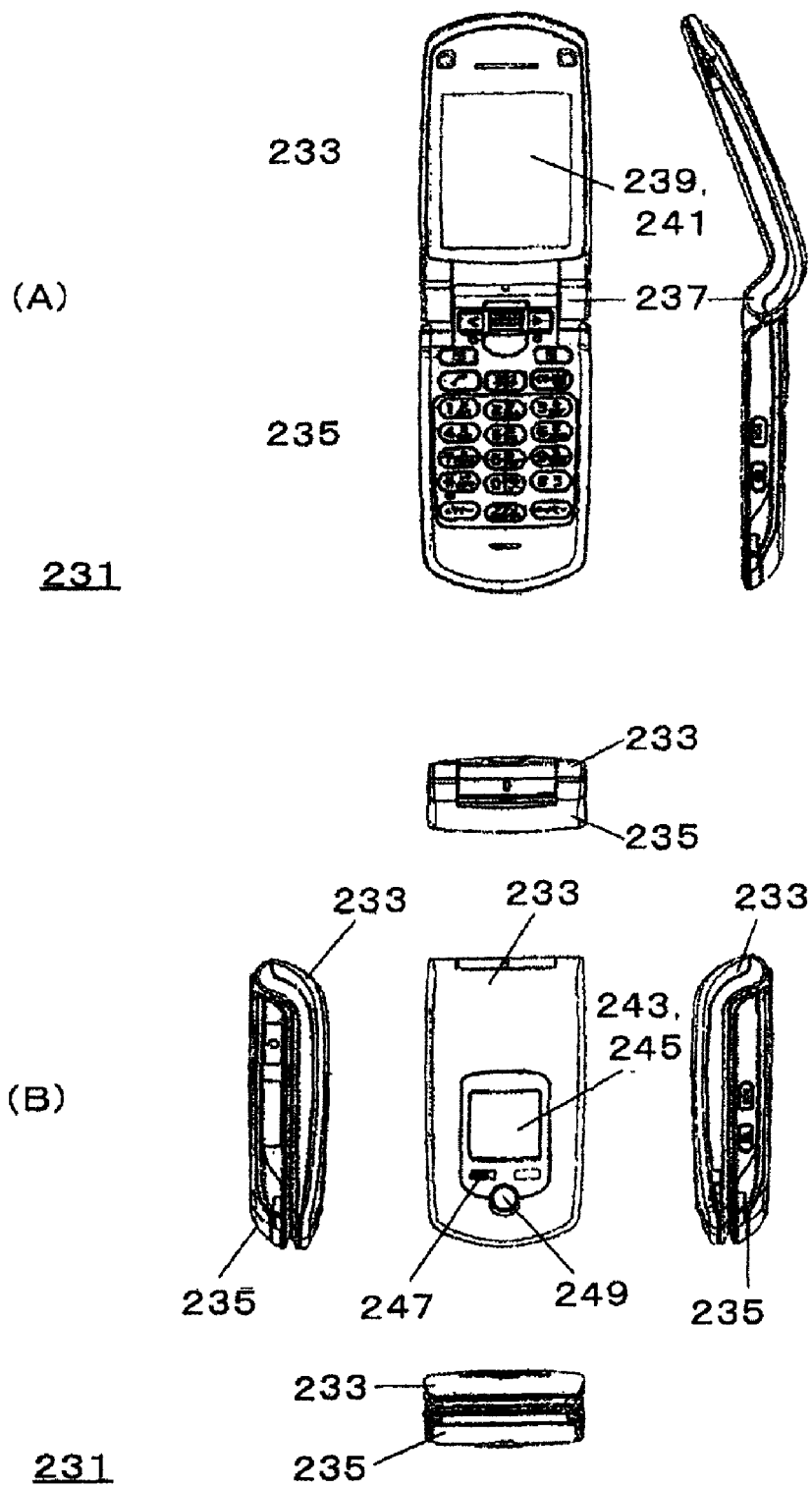
FIG. 87 is view illustrating an example of electronic device product.

FIG. 87 illustrates an appearance example of a mobile phone 231 as a mobile terminal device. The mobile phone 231 illustrated in parts (A) and (B) of FIG. 87 is a folding mobile phone. Part (A) of FIG. 87 illustrates an appearance example in a state that the housing is opened, and part (B) of FIG. 87 illustrates an appearance example in a state that the housing is folded.

The mobile phone 231 includes an upper package 233, a lower package 235, a joint section (hinge section in this example) 237, a main display screen 239, a capacitive sensor module 241, an auxiliary display screen 243, a capacitive sensor module 245, a picture light 247, and an imaging lens 249. The foregoing various examples are applied to the capacitive sensor modules 241 and 245.

Figure 88:
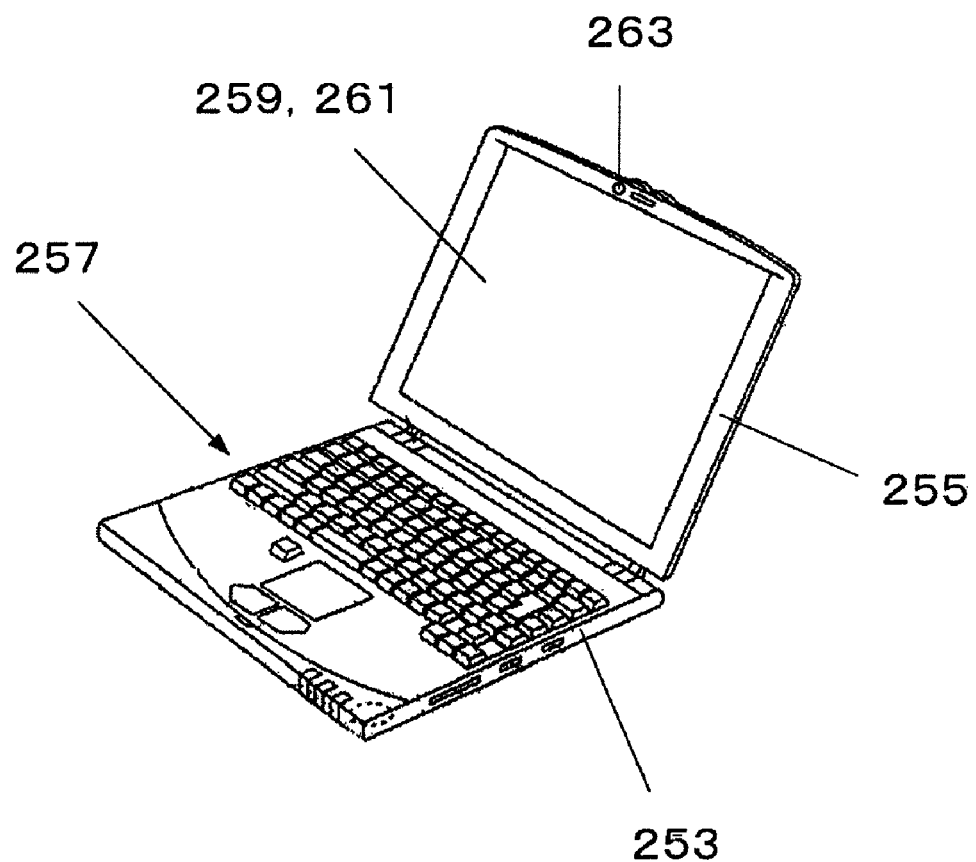
FIG. 88 is a view illustrating an example of electronic device product.

FIG. 88 illustrates an appearance example of a notebook personal computer 251. The notebook personal computer 251 illustrated in FIG. 88 includes a lower housing 253, an upper housing 255, a keyboard 257, a display screen 259, and a capacitive sensor module 261. The foregoing various examples are applied to the capacitive sensor modules 261.

In addition, "electronic devices" in the specification include a portable audio reproducer, a game machine, an electronic book, an electronic dictionary, a stationary household electrical appliance, an industrial machine, a business equipment and the like.

The following technologies are extractable from the above-described second embodiment of the present invention.

[A. Capacitance Change Detection Circuit of Capacitive Sensor Device]

For example, a capacitance change detection circuit of a capacitive sensor device including the following devices is proposed.

(1) An electrode drive section line-sequentially applying a pulse signal in a given period to a plurality of columns of first electrode patterns in a capacitive sensor device.
(2) A comparator comparing a detection signal, which is extracted from each of a plurality of columns of second electrode patterns crossing the first electrode patterns in other layer, to a reference value.
(3) A delay circuit stage sequentially delaying a comparison output signal of the comparator, and generating a plurality of delay output signals having different comparison time point by a unit delay time length.
(4) A storage section storing a plurality of signal values corresponding to the plurality of delay output signals.
(5) A detection section detecting a time amount as a measurement target with a precision of the unit delay time length, based on the plurality of signal values stored in the storage section.

Advantageously, a range of delay amount in the delay circuit stage is equal to or more than a time range in which a change point possibly emerges in the detection signal.

Advantageously, a range of delay amount in the delay circuit stage is under a time range in which a change point possibly emerges in a signal value of the detection signal, and the detection of the time amount as the measurement target is executed by repeating the storage operation of the signal values into the storage section and the detection operation at a plurality of time points.

[B. Capacitive Sensor Module]

Further, for example, a capacitive sensor module including the following devices is proposed.
(1) A capacitive sensor device having a plurality of columns of first electrode patterns, to which an input pulse signal with a given period is line-sequentially applied, and a plurality of columns of second electrode patterns crossing the first electrode patterns in other layer.
(2) An electrode drive section line-sequentially applying the pulse signal in the given period to the plurality of columns of the first electrode patterns.
(3) A comparator comparing a detection signal, which is extracted from each of the plurality of columns of the second electrode patterns, to a reference value.
(4) A delay circuit stage sequentially delaying a comparison output signal of the comparator, and generating a plurality of delay output signals having different comparison time point by a unit delay time length.
(5) A storage section storing a plurality of signal values corresponding to the plurality of delay output signals.
(6) A detection section detecting a time amount as a measurement target with a precision of the unit delay time length, based on the plurality of signal values stored in the storage section.
(7) A determination section determining an input operation using a human body or an object having electric characteristics equal to those of the human body, based on the time amount detected by the detection section.

[C. Method of Detecting Capacitance Change of Capacitive Sensor Device]

Further, for example, a method of detecting capacitance change of a capacitive sensor device including the following steps is proposed.
(1) Line-sequentially applying a pulse signal in a given period to a plurality of columns of first electrode patterns in a capacitive sensor device.
(2) Comparing a detection signal, which is extracted from each of a plurality of columns of second electrode patterns crossing the first electrode patterns in other layer, to a reference value.
(3) Sequentially delaying a comparison output signal obtained by the comparison, and generating a plurality of delay output signals having different comparison time point by a unit delay time length.
(4) Storing a plurality of signal values corresponding to the plurality of delay output signals in a storage section.
(5) Detecting a time amount as a measurement target with a precision of the unit delay time length, based on the plurality of signal values stored in the storage section.

[D. Electronic Device]

Further, for example, an electronic device including the following devices is proposed.
(1) A display device.
(2) A capacitive sensor device arranged on a surface of the display device, and having a plurality of columns of first electrode patterns, to which an input pulse signal with a given period is line-sequentially applied, and a plurality of columns of second electrode patterns crossing the first electrode patterns in other layer.
(3) An electrode drive section line-sequentially applying the pulse signal in the given period to the plurality of columns of the first electrode patterns.
(4) A comparator comparing a detection signal, which is extracted from each of the plurality of columns of the second electrode patterns, to a reference value.
(5) A delay circuit stage sequentially delaying a comparison output signal of the comparator, and generating a plurality of delay output signals having different comparison time point by a unit delay time length.
(6) A storage section storing a plurality of signal values corresponding to the plurality of delay output signals.
(7) A detection section detecting a time amount as a measurement target with a precision of the unit delay time length, based on the plurality of signal values stored in the storage section.
(8) A determination section determining an input operation using a human body or an object having electric characteristics equal to those of the human body, based on the time amount detected by the detection section.
(9) A system control section controlling operation of a whole system.

[E. Electronic Device]

Further, for example, an electronic device including the following devices is proposed.
(1) A capacitive sensor device having a plurality of columns of first electrode patterns, to which an input pulse signal with a given period is line-sequentially applied, and a plurality of columns of second electrode patterns crossing the first electrode patterns in other layer.
(2) An electrode drive section line-sequentially applying the pulse signal in the given period to the plurality of columns of the first electrode patterns.
(3) A comparator comparing a detection signal, which is extracted from each of the plurality of columns of the second electrode patterns, to a reference value.
(4) A delay circuit stage sequentially delaying a comparison output signal of the comparator, and generating a plurality of delay output signals having different comparison time point by a unit delay time length.
(5) A storage section storing a plurality of signal values corresponding to the plurality of delay output signals.
(6) A detection section detecting a time amount as a measurement target with a precision of the unit delay time length, based on the plurality of signal values stored in the storage section.
(7) A determination section determining an input operation using a human body or an object having electric characteristics equal to those of the human body, based on the time amount detected by the detection section.

(8) A system control section controlling operation of a whole system.

In the case of the embodiments of the invention, the comparison output signal as a result of comparison between the detection signal and the reference value is sequentially delayed in the delay circuit stage. At this time, in the delay circuit stage, the plurality of comparison output signals having the different comparison time point by the unit delay time length always exist. Each signal value of the plurality of comparison output signals existing in the delay circuit stage is taken out from the storage section to detect the time amount as the measurement target. The time amount to be detected is determined with the precision of the unit delay time length equivalent to one stage of delay elements in the delay circuit stage. As a result, even if the operation clock rate is low, waveform change of the detection signal associated with the input operation is able to be detected with a high precision.

The present application contains subject matters related to that disclosed in Japanese Priority Patent Application JP 2008-206443 filed in the Japan Patent Office on Aug. 8, 2008, and that disclosed in Japanese Priority Patent Application JP 2008-243081 filed in the Japan Patent Office on Sep. 22, 2008, the entire content of those are hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A capacitance change measuring circuit for a capacitive sensor device comprising:
   an electrode drive section line-sequentially applying an input pulse signal with a given period to a plurality of columns of first electrode patterns in the capacitive sensor device;
   a peak hold circuit storing a peak level of a detection signal, which is extracted from each of a plurality of columns of second electrode patterns crossing the first electrode patterns in other layer, into a capacitive element as a corresponding potential;
   a current source initializing the potential of the capacitive element within one period of the input pulse signal;
   a comparator comparing the potential held in the capacitive element with a reference value; and
   a plurality of determination sections each determining whether or not an input operation using a human body or an object having electric characteristics equal to those of the human body is executed, based on a timing information and a reference timing information, the timing information representing a timing when the potential held in the capacitive element crosses the reference value.

2. The capacitance change measuring circuit for a capacitive sensor device according to claim 1, wherein the reference timing information is provided for each of measurement points corresponding to intersection positions of the first and the second electrode patterns.

3. The capacitance change measuring circuit for a capacitive sensor device according to claim 2, wherein the timing information is defined as elapsed time from edge detection timing of the input pulse signal to timing when the potential held in the capacitive element crosses the reference value, and the reference timing information is defined as the elapsed time in no operation.

4. The capacitance change measuring circuit for a capacitive sensor device according to claim 1, wherein start timing of discharge operation by the current source is determined to be on or after timing when a prospective peak level of the detection signal comes on.

5. The capacitance change measuring circuit for a capacitive sensor device according to claim 1, wherein a pulse frequency of the input pulse signal is set for each of operation regions based on a total propagation path length determined by combination of a first propagation path length on the first and the second electrode patterns and a second propagation path length up to each electrode pattern.

6. The capacitance change measuring circuit for a capacitive sensor device according to claim 5, wherein for a first operation region in which the total propagation path length is shorter than a predetermined value, the pulse frequency of the input pulse signal is set to a first pulse frequency F1, and
   for a second operation region in which the total propagation path length is longer than the predetermined value, the pulse frequency of the input pulse signal is set to a second pulse frequency F2 (>F1).

7. The capacitance change measuring circuit for a capacitive sensor device according to claim 1, wherein a current amount of the current source is set for each of operation regions based on a total propagation path length determined by combination of a first propagation path length on the first and the second electrode patterns and a second propagation path length up to each electrode pattern.

8. The capacitance change measuring circuit for a capacitive sensor device according to claim 7, wherein for a first operation region in which the total propagation path length is shorter than a predetermined value, the current amount is set to a first current amount I1, and
   for a second operation region in which the total propagation path length is longer than the predetermined value, the current amount is set to a second current amount I2 (<I1).

9. The capacitance change measuring circuit for a capacitive sensor device according to claim 8, wherein for a third operation region in which the total propagation path length is shorter than a predetermined value, the pulse frequency of the input pulse signal is set to a first pulse frequency F1, and
   for a fourth operation region in which the total propagation path length is longer than the predetermined value, the pulse frequency of the input pulse signal is set to a second pulse frequency F2 (>F1).

10. The capacitance change measuring circuit for a capacitive sensor device according to claim 1, wherein the reference value of the comparator is set for each of operation regions based on a total propagation path length determined by combination of a first propagation path length on the first and the second electrode patterns and a second propagation path length up to each electrode pattern.

11. The capacitance change measuring circuit for a capacitive sensor device according to claim 10, wherein for a first operation region in which the total propagation path length is longer than a predetermined value, the reference value is set to a first reference value R1, and
   for a second operation region in which the total propagation path length is shorter than the predetermined value, the reference value is set to a second reference value R2 (>R1).

12. The capacitance change measuring circuit for a capacitive sensor device according to claim 1, wherein the peak hold circuit retains a peak level of a positive period of the detection signal.

13. The capacitance change measuring circuit for a capacitive sensor device according to claim 1, wherein the peak hold circuit retains a peak level of a negative period of the detection signal.

14. The capacitance change measuring circuit for a capacitive sensor device according to claim 1, wherein the peak hold circuit retains absolute values of a peak level of a positive period and a peak level of a negative period of the detection signal, and
the current source initializes the potential of the capacitive element within half a period of the input pulse signal.

15. A capacitive sensor module comprising:
a capacitive sensor device having a plurality of columns of first electrode patterns, to which an input pulse signal with a given period is line-sequentially applied, and a plurality of columns of second electrode patterns crossing the first electrode patterns in other layer;
a peak hold circuit storing a peak level of a detection signal, which is extracted from each of the plurality of columns of second electrode patterns, into a capacitive element as a corresponding potential;
a current source initializing the potential of the capacitive element within one period of the input pulse signal;
a comparator comparing the potential held in the capacitive element with a reference value; and
a plurality of determination sections each determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal.

16. A method of measuring capacitance change for a capacitive sensor device comprising the steps of:
line-sequentially applying an input pulse signal with a given period to a plurality of columns of first electrode patterns in the capacitive sensor device;
storing a peak level of a detection signal, which is extracted from each of a plurality of columns of second electrode patterns crossing the first electrode patterns in other layer, into a capacitive element as a corresponding potential;
initializing the potential of the capacitive element within one period of the input pulse signal;
comparing the potential held in the capacitive element with a reference value; and
determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal.

17. An electronic device comprising:
a display device;
a capacitive sensor device arranged on a surface of the display device, and having a plurality of columns of first electrode patterns, to which an input pulse signal with a given period is line-sequentially applied, and a plurality of columns of second electrode patterns crossing the first electrode patterns in other layer;
a peak hold circuit storing a peak level of a detection signal, which is extracted from each of the plurality of columns of second electrode patterns, into a capacitive element as a corresponding potential;
a current source initializing the potential of the capacitive element within one period of the input pulse signal;
a comparator comparing the potential held in the capacitive element with a reference value;
a plurality of determination sections each determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal; and
a system control section controlling operation of a whole system.

18. An electronic device comprising:
a capacitive sensor device formed from a transparent material, and having a plurality of columns of first electrode patterns, to which an input pulse signal with a given period is line-sequentially applied, and a plurality of columns of second electrode patterns crossing the first electrode patterns in other layer;
a peak hold circuit storing a peak level of a detection signal, which is extracted from each of the plurality of columns of second electrode patterns, into a capacitive element as a corresponding potential;
a current source initializing the potential of the capacitive element within one period of the input pulse signal;
a comparator comparing the potential held in the capacitive element with a reference value;
a plurality of determination sections each determining whether or not an input operation using a human body or an object having electric characteristics equal to those of the human body is executed, based on a timing information and a reference timing information, the timing information representing a timing when the potential held in the capacitive element crosses the reference value, and the reference timing information being set for each of propagation paths of the input pulse signal; and
a system control section controlling operation of a whole system.

* * * * *